United States Patent
Lee et al.

(10) Patent No.: US 12,396,362 B2
(45) Date of Patent: Aug. 19, 2025

(54) ORGANIC LIGHT-EMITTING DEVICE AND APPARATUS INCLUDING THE SAME

(71) Applicant: Samsung Display Co., Ltd., Yongin-si (KR)

(72) Inventors: Jonghyeon Lee, Yongin-si (KR); Hangeul Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 868 days.

(21) Appl. No.: 17/502,766

(22) Filed: Oct. 15, 2021

(65) Prior Publication Data

US 2022/0271234 A1 Aug. 25, 2022

(30) Foreign Application Priority Data

Feb. 25, 2021 (KR) ........................ 10-2021-0025963

(51) Int. Cl.
*H01L 51/50* (2006.01)
*H10K 85/30* (2023.01)
(Continued)

(52) U.S. Cl.
CPC ....... *H10K 85/6572* (2023.02); *H10K 85/346* (2023.02); *H10K 85/40* (2023.02); *H10K 85/633* (2023.02); *H10K 85/6574* (2023.02); *H10K 50/11* (2023.02); *H10K 85/622* (2023.02); *H10K 2101/10* (2023.02)

(58) Field of Classification Search
None
See application file for complete search history.

(56) References Cited

U.S. PATENT DOCUMENTS

| 10,418,573 B2 | 9/2019 | Kim et al. |
| 10,566,561 B2 | 2/2020 | Kim et al. |

(Continued)

FOREIGN PATENT DOCUMENTS

| KR | 10-2015-0059324 | 6/2015 |
| KR | 10-2016-0135261 | 11/2016 |

(Continued)

OTHER PUBLICATIONS

Jeong-Hwan Lee et al., "An Exciplex Forming Host for Highly Efficient Blue Organic Light Emitting Diodes with Low Driving Voltage", Advanced Functional Materials, 2014, pp. 361-366, vol. 25, Issue 3, DOI: 10.1002/adfm.201402707.

*Primary Examiner* — Gregory D Clark
(74) *Attorney, Agent, or Firm* — KILE PARK REED & HOUTTEMAN PLLC

(57) ABSTRACT

Provided are an organic light-emitting device and an apparatus including the same. The organic light-emitting device includes a first electrode, a second electrode, and an organic layer disposed between the first electrode and the second electrode. The organic layer includes an emission layer, a first region between the first electrode and the emission layer, a second region between the emission layer and the second electrode, and an auxiliary layer between the first region and the emission layer, and the emission layer includes a first compound, a second compound, a third compound, and a fourth compound. The organic light-emitting device exhibits a low driving voltage and a long lifespan.

20 Claims, 3 Drawing Sheets

(51) Int. Cl.
 *H10K 85/40* (2023.01)
 *H10K 85/60* (2023.01)
 *H10K 50/11* (2023.01)
 *H10K 101/10* (2023.01)

(56) References Cited

U.S. PATENT DOCUMENTS

| | | | | |
|---|---|---|---|---|
| 2015/0318506 A1* | 11/2015 | Zhou | ..................... | H10K 59/30 |
| | | | | 257/40 |
| 2017/0077418 A1 | 3/2017 | Stoessel et al. | | |
| 2018/0033987 A1* | 2/2018 | Kim | ..................... | H10K 50/11 |
| 2018/0182980 A1 | 6/2018 | Lennartz et al. | | |
| 2019/0157600 A1 | 5/2019 | Park et al. | | |
| 2021/0074940 A1* | 3/2021 | Song | ..................... | H10K 85/40 |
| 2021/0184151 A1 | 6/2021 | Lee et al. | | |

FOREIGN PATENT DOCUMENTS

| | | |
|---|---|---|
| KR | 10-1706752 | 2/2017 |
| KR | 10-2018-0035528 | 4/2018 |
| KR | 10-2019-0057179 | 5/2019 |
| KR | 10-2021-0075283 | 6/2021 |

* cited by examiner

ORGANIC LIGHT-EMITTING DEVICE AND APPARATUS INCLUDING THE SAME

CROSS-REFERENCE TO RELATED APPLICATION(S)

This application claims priority to and benefits of Korean Patent Application No. 10-2021-0025963 under 35 U.S.C. § 119, filed on Feb. 25, 2021 in the Korean Intellectual Property Office, the entire contents of which are incorporated herein by reference.

BACKGROUND

1. Technical Field

Embodiments relate to an organic light-emitting device and an apparatus including the same.

2. Description of the Related Art

Organic light-emitting devices are self-emissive devices that produce full-color images, and also have wide viewing angles, high contrast ratios, short response times, as well as excellent characteristics in terms of brightness, driving voltage, and response speed.

Organic light-emitting devices may include a first electrode located on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state to thereby generate light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments include an organic light-emitting device and an apparatus including the same.

Additional aspects will be set forth in part in the description, which follows and, in part, will be apparent from the description, or may be learned by practice of the embodiments of the disclosure.

According to embodiments, an organic light-emitting device may include a first electrode, a second electrode, and an organic layer disposed between the first electrode and the second electrode. The organic layer may include an emission layer, a first region between the first electrode and the emission layer, a second region between the emission layer and the second electrode, and an auxiliary layer between the first region and the emission layer. The emission layer may include a first compound, a second compound, a third compound, and a fourth compound, the first compound may be a hole transporting host compound, the second compound may be an electron transporting host compound or a bipolar host compound, the third compound may be a thermally activated delayed fluorescence (TADF) compound satisfying Equation 1 or an organometallic complex, the fourth compound may be a fluorescent dopant, the auxiliary layer may include two different fifth compounds, and the fifth compounds may each independently be the first compound or the second compound:

$$\Delta E_{ST}(C3) \leq 0.3 \text{ eV} \qquad [\text{Equation 1}]$$

In Equation 1, $\Delta E_{ST}(C3)$ may be a difference between a lowest singlet excitation energy level ($E_{S1}(C3)$) of the third compound and a lowest triplet excitation energy level ($E_{T1}(C3)$) of the third compound.

In an embodiment, the first electrode may be an anode, the second electrode may be a cathode, the first region may be a hole transport region including a hole injection layer, a hole transport layer, an emission auxiliary layer, an electron blocking layer, or any combination thereof, and the second region may be an electron transport region including a hole blocking layer, a buffer layer, an electron transport layer, an electron injection layer, or any combination thereof.

In an embodiment, the auxiliary layer may directly contact the emission layer.

In an embodiment, the auxiliary layer may include a first compound and a second compound, or the auxiliary layer may include two different first compounds, or the auxiliary layer may include two different second compounds.

In an embodiment, the first compound, the second compound, and the third compound may be different from each other.

In an embodiment, a distance between a maximum peak wavelength of an absorption spectrum of the fourth compound and a maximum peak wavelength of an emission spectrum of the fourth compound may be equal to or less than about 35 nm.

In an embodiment, a concentration of the fourth compound in the emission layer may be equal to or less than about ⅓ of a concentration of the third compound in the emission layer.

In an embodiment, the second region may include a first layer and a second layer that each include an organic compound.

In an embodiment, the electron transporting host compound may include an electron withdrawing group (EWG), and the bipolar host compound may include an EWG and an electron donating group (EDG).

According to embodiments, an electronic apparatus includes the organic light-emitting device.

In an embodiment, the electronic apparatus may further include a thin-film transistor. The thin-film transistor may include a source electrode and a drain electrode, and the first electrode of the organic light-emitting device may be electrically connected to at least one of the source electrode and the drain electrode of the thin-film transistor.

In an embodiment, the electronic apparatus may further include a color filter, a color conversion layer, a touch screen layer, a polarizing layer, or any combination thereof.

BRIEF DESCRIPTION OF THE DRAWINGS

The above and other aspects and features of the disclosure will become more apparent by describing in detail embodiments thereof with reference to the accompanying drawings, in which.

DETAILED DESCRIPTION OF THE EMBODIMENTS

Figure 1:
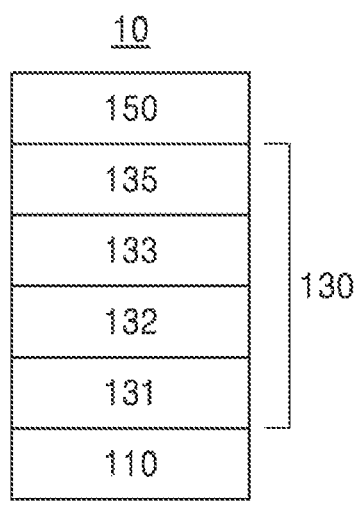
FIG. 1 is a schematic cross-sectional view of a structure of a light-emitting device included in an electronic apparatus according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

The term "organic layer" as used herein may refer to a single layer and/or multiple layers disposed between the first electrode and the second electrode of the organic light-emitting device. A material included in the "organic layer" is not limited to an organic material.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

An organic light-emitting device according to an embodiment of the disclosure may include a first electrode; a second electrode; and an organic layer between the first electrode and the second electrode. The organic layer may include: an emission layer; a first region between the first electrode and the emission layer; a second region between the emission layer and the second electrode; and an auxiliary layer between the first region and the emission layer. The emission layer may include a first compound, a second compound, a third compound, and a fourth compound, the first compound may be a hole transporting host compound, the second compound may be an electron transporting host compound or a bipolar host compound, the third compound may be a thermally activated delayed fluorescence (TADF) compound satisfying Equation 1 or an organometallic complex, the fourth compound may be a fluorescent dopant, the auxiliary layer may include two different fifth compounds, and the fifth compounds may each independently be the first compound or the second compound.

$$\Delta E_{ST}(C3) \leq 0.3 \text{ eV} \qquad \text{[Equation 1]}$$

In Equation 1, $\Delta E_{ST}(C3)$ may be a difference between a lowest singlet excitation energy level ($E_{S1}(C3)$) of the third compound and a lowest triplet excitation energy level ($E_{T1}(C3)$) of the third compound.

In an embodiment, the first electrode may be an anode, the second electrode may be a cathode, the first region may be a hole transport region including a hole injection layer, a hole transport layer, an emission auxiliary layer, an electron blocking layer, or any combination thereof, and the second region may be an electron transport region including a hole blocking layer, a buffer layer, an electron transport layer, an electron injection layer, or any combination thereof.

For example, the first region may include a first hole transport layer and a second hole transport layer, and the first hole transport layer and the second hole transport layer may both include an organic compound. For example, the second region may include a first electron transport layer and a second electron transport layer, and the first electron transport layer and the second electron transport layer may both include an organic compound.

In an embodiment, the auxiliary layer may further include the fourth compound.

In an embodiment, the auxiliary layer may directly contact the emission layer.

In embodiments, the emission layer may include two or more emission layers, and the auxiliary layer may directly contact the two or more emission layers.

In an embodiment, the auxiliary layer may include a first compound and a second compound, or the auxiliary layer may include two different first compounds, or the auxiliary layer may include two different second compounds.

In an embodiment, the emission layer may include a first emission layer and a second emission layer.

In embodiments, the emission layer may further include a third emission layer between the first emission layer and the second emission layer.

In an embodiment, the first compound, the second compound, and the third compound may be different from each other.

In an embodiment, a distance between a maximum peak wavelength of an absorption spectrum of the fourth compound and a maximum peak wavelength of an emission spectrum of the fourth compound may be equal to or less than about 35 nm.

In an embodiment, a concentration of the fourth compound in the emission layer may be equal to or less than about ⅓ of a concentration of the third compound in the emission layer. When the concentration of the fourth compound exceeds ⅓ of the concentration of the third compound, hole trapping and charge transfer delay may occur in the emission layer, thus causing difficulty in maintaining charge balance, and thus lifespan characteristics may be deteriorated.

In an embodiment, the second region may include a first layer and a second layer that each include an organic compound.

In an embodiment, the first layer of the second region and the second layer of the second region may each respectively be a first electron transport layer and a second electron transport layer.

In an embodiment, the first layer of the second region and the second layer of the second region may each independently include a sixth compound, and the sixth compound may be different from the first compound, the second compound, and the fourth compound.

For example, the sixth compound may be an electron transport material, and the details thereof are the same as described in connection with the electron transport region to be described later.

In an embodiment, the first compound may be represented by Formula 1 below:

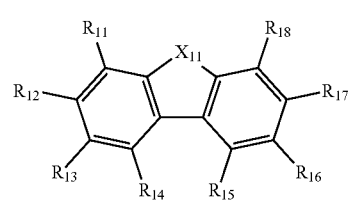

[Formula 1]

In Formula 1, $X_{11}$ may be selected from O, S, N($R_{19}$), and C($R_{19}$)($R_{20}$), $R_{11}$ to $R_{20}$ may each independently be selected from: a group represented by *-$(L_{11})_{a11}$-$A_{11}$, hydrogen, deuterium, a $C_1$-$C_{60}$ alkyl group, a π electron-deficient nitrogen-free cyclic group, —C($Q_1$)($Q_2$)($Q_3$), —Si($Q_1$)($Q_2$)($Q_3$), —B($Q_1$)($Q_2$), and —N($Q_1$)($Q_2$);

a π electron-deficient nitrogen-free cyclic group substituted with at least one selected from deuterium, a $C_1$-$C_{60}$ alkyl group, a π electron-deficient nitrogen-free cyclic group, —C($Q_{31}$)($Q_{32}$)($Q_{33}$), —Si($Q_{31}$)($Q_{32}$)($Q_{33}$), —B($Q_{31}$)($Q_{32}$), and —N($Q_{31}$)($Q_{32}$), and a π electron-deficient nitrogen-free cyclic group substituted with a π electron-deficient nitrogen-free cyclic group substituted with at least one selected from deuterium, a $C_1$-$C_{60}$ alkyl group, a π electron-deficient nitrogen-free cyclic group, —C($Q_{21}$)($Q_{22}$)($Q_{23}$), —Si($Q_{21}$)($Q_{22}$)($Q_{23}$), —B($Q_{21}$)($Q_{22}$), and —N($Q_{21}$)($Q_{22}$), $L_{11}$ may be selected from: a π electron-deficient nitrogen-free cyclic group, —C($Q_1$)($Q_2$)-, —Si($Q_1$)($Q_2$)-, —B($Q_1$)-, and —N($Q_1$)-; and a π electron-deficient nitrogen-free cyclic group substituted with at least one selected from deuterium, a $C_1$-$C_{60}$ alkyl group, a π electron-deficient nitrogen-free cyclic group, —C($Q_{31}$)($Q_{32}$)($Q_{33}$), —Si($Q_{31}$)($Q_{32}$)($Q_{33}$), —B($Q_{31}$)($Q_{32}$), and —N($Q_{31}$)($Q_{32}$), a11 may be selected from 1, 2, and 3, $A_{11}$ may be selected from: a π electron-deficient nitrogen-free cyclic group;

a π electron-deficient nitrogen-free cyclic group substituted with at least one selected from deuterium, a $C_1$-$C_{60}$ alkyl group, a π electron-deficient nitrogen-free cyclic group, —C($Q_{31}$)($Q_{32}$)($Q_{33}$), —Si($Q_{31}$)($Q_{32}$)($Q_{33}$), —B($Q_{31}$)($Q_{32}$), and —N($Q_{31}$)($Q_{32}$), and a π electron-deficient nitrogen-free cyclic group substituted with a π electron-deficient nitrogen-free cyclic group substituted with at least one selected from deuterium, a $C_1$-$C_{60}$ alkyl group, a π electron-deficient nitrogen-free cyclic group, —C($Q_{21}$)($Q_{22}$)($Q_{23}$), —Si($Q_{21}$)($Q_{22}$)($Q_{23}$), —B($Q_{21}$)($Q_{22}$), and —N($Q_{21}$)($Q_{22}$), and any two or more neighboring groups of $R_{11}$ to $R_{20}$ may optionally be linked to each other to form a group selected from: a π electron-deficient nitrogen-free cyclic group; and a π electron-deficient nitrogen-free cyclic group substituted with at least one selected from deuterium, a $C_1$-$C_{60}$ alkyl group, a π electron-deficient nitrogen-free cyclic group, —C($Q_{31}$)($Q_{32}$)($Q_{33}$), —Si($Q_{31}$)($Q_{32}$)($Q_{33}$), —B($Q_{31}$)($Q_{32}$), and —N($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

For example, at least one selected from $R_{11}$ to $R_{19}$ in Formula 1 may each independently be a group represented by *-$(L_{11})_{a11}$-$A_{11}$.

For example, $R_{11}$ to $R_{20}$ in Formula 1 may each independently be selected from: a group represented by *-$(L_{11})_{a11}$-$A_{11}$, hydrogen, deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_1)(Q_2)(Q_3)$, —$Si(Q_1)(Q_2)(Q_3)$, —$B(Q_1)(Q_2)$, and —$N(Q_1)(Q_2)$;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_{31})(Q_{32})(Q_{33})$, —$Si(Q_{31})(Q_{32})(Q_{33})$, —$B(Q_{31})(Q_{32})$, and —$N(Q_{31})(Q_{32})$; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group that are each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_{21})(Q_{22})(Q_{23})$, —$Si(Q_{21})(Q_{22})(Q_{23})$, —$B(Q_{21})(Q_{22})$, and —$N(Q_{21})(Q_{22})$.

For example, $L_{11}$ in Formula 1 may be selected from: a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, a dibenzothiophene group, —$C(Q_1)(Q_2)$-, and —$Si(Q_1)(Q_2)$-; and a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, and a dibenzothiophene group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_{31})(Q_{32})(Q_{33})$, and —$Si(Q_{31})(Q_{32})(Q_{33})$.

In an embodiment, $L_{11}$ in Formula 1 may be selected from: a benzene group, a fluorene group, a carbazole group, a dibenzofuran group, a dibenzothiophene group, —$C(Q_1)(Q_2)$-, and —$Si(Q_1)(Q_2)$-; and a benzene group, a fluorene group, a carbazole group, a dibenzofuran group, and a dibenzothiophene group, each substituted with at least one selected from deuterium, a $C_1$-$C_{20}$ alkyl group, a phenyl group, a biphenyl group, a terphenyl group, a fluorenyl group, a carbazolyl group, a dibenzofuranyl group, a dibenzothiophenyl group, —$C(Q_{31})(Q_{32})(Q_{33})$, and —$Si(Q_{31})(Q_{32})(Q_{33})$.

For example, a11 in Formula 1 may be 1 or 2.

For example, $A_{11}$ in Formula 1 may be selected from: a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —C($Q_{31}$)($Q_{32}$)($Q_{33}$), —Si($Q_{31}$)($Q_{32}$)($Q_{33}$), —B($Q_{31}$)($Q_{32}$), and —N($Q_{31}$)($Q_{32}$); and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group that are each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —C($Q_{21}$)($Q_{22}$)($Q_{23}$), —Si($Q_{21}$)($Q_{22}$)($Q_{23}$), —B($Q_{21}$)($Q_{22}$), and —N($Q_{21}$)($Q_{22}$), wherein $Q_{21}$ to $Q_{23}$ and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, $A_{11}$ in Formula 1 may be selected from: a phenyl group, a biphenyl group, a terphenyl group, a fluorenyl group, a carbazolyl group, a dibenzofuranyl group, and a dibenzothiophenyl group;

a phenyl group, a biphenyl group, a terphenyl group, a fluorenyl group, a carbazolyl group, a dibenzofuranyl group, and a dibenzothiophenyl group, each substituted with at least one selected from deuterium, a $C_1$-$C_{20}$ alkyl group, a phenyl group, a biphenyl group, a terphenyl group, a fluorenyl group, a carbazolyl group, a dibenzofuranyl group, a dibenzothiophenyl group, —C($Q_{31}$)($Q_{32}$)($Q_{33}$), and —Si($Q_{31}$)($Q_{32}$)($Q_{33}$); and a phenyl group, a biphenyl group, a terphenyl group, a fluorenyl group, a carbazolyl group, a dibenzofuranyl group, and a dibenzothiophenyl group, each substituted with at least one selected from a phenyl group, a biphenyl group, a terphenyl group, a fluorenyl group, a carbazolyl group, a dibenzofuranyl group, and a dibenzothiophenyl group that are each substituted with at least one selected from deuterium, a $C_1$-$C_{20}$ alkyl group, a phenyl group, a biphenyl group, a terphenyl group, a fluorenyl group, a carbazolyl group, a dibenzofuranyl group, a dibenzothiophenyl group, —C($Q_{21}$)($Q_{22}$)($Q_{23}$), and —Si($Q_{21}$)($Q_{22}$)($Q_{23}$).

In embodiments, $A_{11}$ in Formula 1 may be a group represented by one of Formulae 8-1 to 8-5 below:

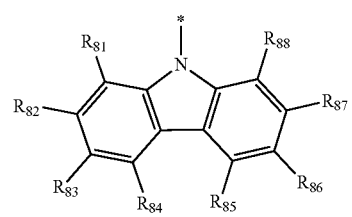

8-1

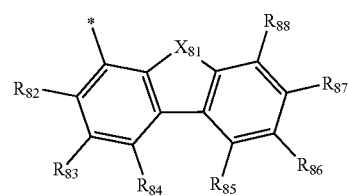

8-2

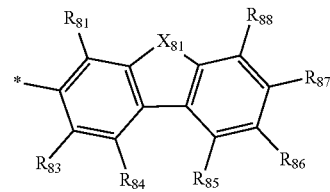

8-3

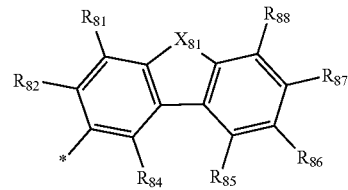

8-4

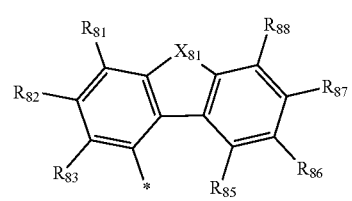

8-5

In Formulae 8-1 to 8-5, $X_{81}$ may be selected from O, S, N($R_{89}$), and C($R_{89}$)($R_{90}$), $R_{81}$ to $R_{90}$ may each independently be selected from hydrogen, deuterium, a $C_1$-$C_{20}$ alkyl group, a phenyl group, a biphenyl group, a terphenyl group, a fluorenyl group, a carbazolyl group, a dibenzofuranyl group, and a dibenzothiophenyl group, and

* indicates a binding site to an adjacent atom.

In an embodiment, the first compound may be represented by one of Formulae 1-1 to 1-15 below:

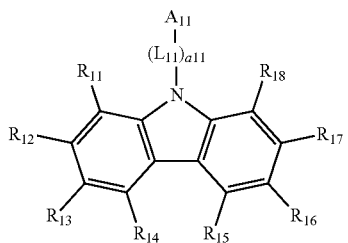
1-1
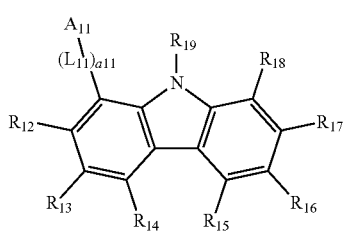
1-2
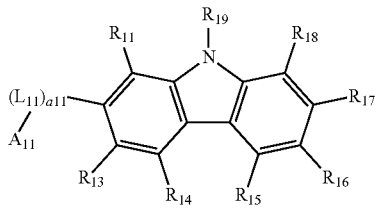
1-3
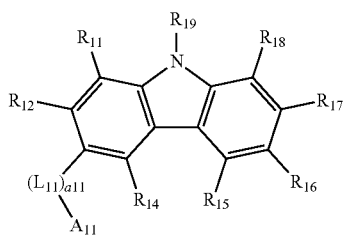
1-4
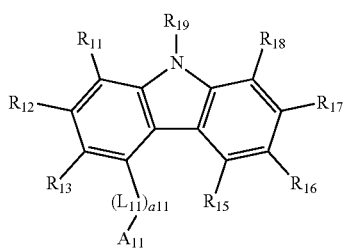
1-5
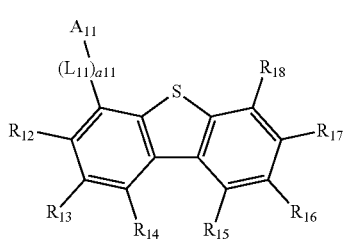
1-6
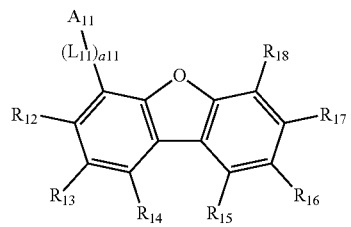
1-7
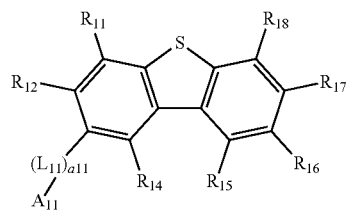
1-8
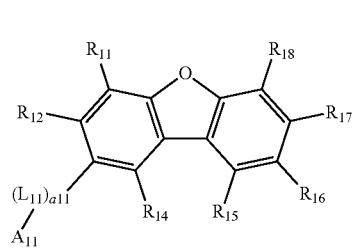
1-9
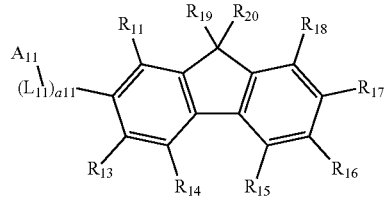
1-10
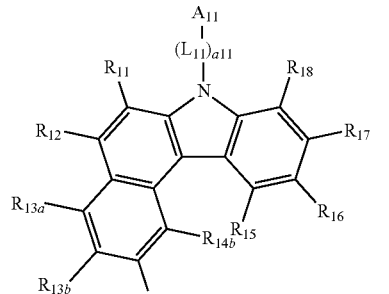
1-11
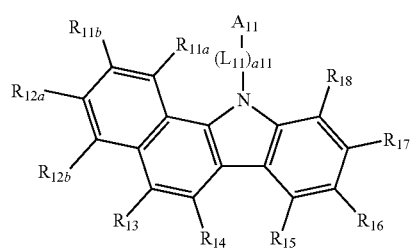
1-12

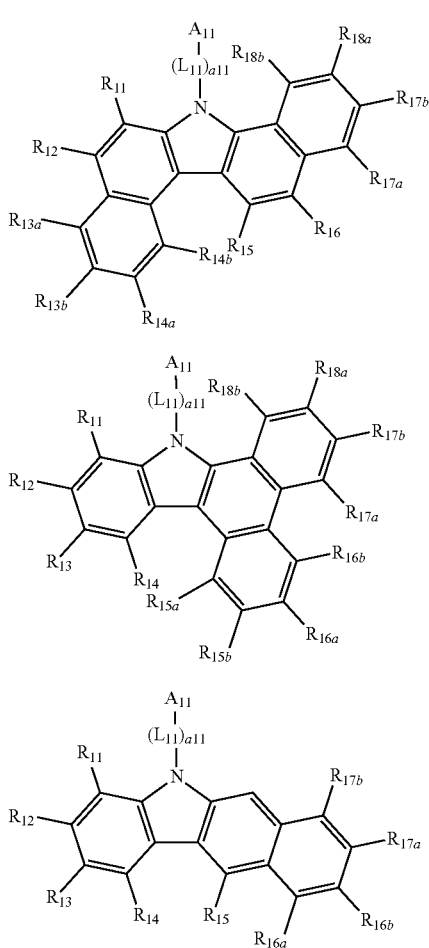

1-13

1-14

1-15

In Formulae 1-1 to 1-15, $L_{11}$, a11, $A_{11}$, and $R_{11}$ to $R_{20}$ may each be the same as defined in connection with Formula 1, and $R_{11a}$, $R_{11b}$, $R_{12a}$, $R_{12b}$, $R_{13a}$, $R_{13b}$, $R_{14a}$, $R_{14b}$, $R_{15a}$, $R_{15b}$, $R_{16a}$, $R_{16b}$, $R_{17a}$, $R_{17b}$, $R_{18a}$, and $R_{18b}$ may be the same as defined in connection with $R_{11}$ to $R_{20}$ in Formula 1.

In an embodiment, the electron transporting host compound may include an electron withdrawing group (EWG), and the bipolar host compound may include an EWG and an electron donating group (EDG).

For example, the EWG may include at least one selected from a π electron-deficient nitrogen-containing ring, —F, —Cl, —Br, —I, a cyano group, and a $C_1$-$C_{60}$ alkyl group substituted with at least one of —F, —Cl, —Br, —I, and a cyano group, and the EDG may include at least one selected from a carbazole group and an amine group.

In an embodiment, the second compound may be represented by one of Formulae 2-1 and 2-2:

[Formula 2-1]

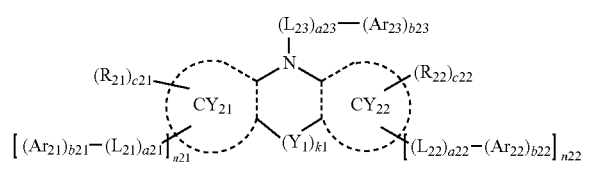

[Formula 2A]

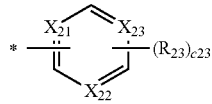

[Formula 2-2]

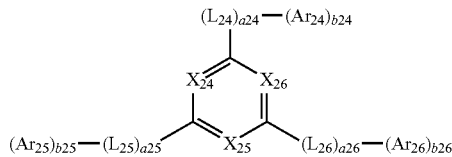

In Formulae 2-1, 2A, and 2-2, $Y_1$ may be selected from a single bond, —O—, —S—, —C($R_{24}$)($R_{25}$)—, —N($R_{24}$)—, Si($R_{24}$)($R_{25}$)—, —C(=O)—, —S(=O)$_2$—, —B($R_{24}$)—, —P($R_{24}$)—, and —P(=O)($R_{24}$)($R_{25}$)—, k1 may be 0 or 1, $CY_{21}$ and $CY_{22}$ may each independently be a $C_3$-$C_{60}$ carbocyclic group or a $C_1$-$C_{60}$ heterocyclic group, $L_{21}$ to $L_{27}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $Ar_{21}$ to $Ar_{27}$ may each independently be selected from a group represented by Formula 2A, a $C_3$-$C_{60}$ carbocyclic group unsubstituted or substituted with at least one $R_{10a}$, and a $C_1$-$C_{60}$ heterocyclic group unsubstituted or substituted with at least one $R_{10a}$, at least one of $Ar_{21}$ to $Ar_{23}$ may be a group represented by Formula 2A, a21 to a27 may each independently be an integer from 0 to 3, b21 to b27 may each independently be an integer from 1 to 8, c21 and c22 may each independently be an integer from 1 to 20, n21 and n22 may each independently be an integer from 1 to 8, $X_{21}$ to $X_{23}$ may each independently be C or N, when each of $X_{21}$ to $X_{23}$ is C, at least one selected from $R_{21}$ to $R_{23}$ may be: —F; a cyano group; or a $C_1$-$C_{60}$ alkyl group substituted with at least one selected from —F and a cyano group, $X_{24}$ to $X_{26}$ may each independently be C($R_{26}$) or N, at least one selected from $X_{24}$ to $X_{26}$ may be N, $R_{21}$ to $R_{26}$ may each independently be selected from *-($L_{27}$)$_{a27}$-($Ar_{27}$)$_{b27}$, hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), and —P(=O)($Q_1$)($Q_2$), and any two or more neighboring groups of $Ar_{21}$ to $Ar_{27}$ and $R_{21}$ to $R_{26}$ may optionally be bonded to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,

* indicates a binding site to a neighboring atom, wherein $Q_1$ to $Q_3$ may each independently be selected from: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, and any combination thereof.

In an embodiment, $CY_{21}$ and $CY_{22}$ in Formula 2 may each independently be selected from a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azafluorene group, and an azacarbazole group.

In an embodiment, $CY_{21}$ and $CY_{22}$ in Formula 2 may each independently be selected from a benzene group, a naphthalene group, a fluorene group, a carbazole group, a pyridine group, a phenanthroline group, an azafluorene group, and an azacarbazole group.

In an embodiment, $L_{21}$ to $L_{27}$ in Formula 2 may each independently be selected from: a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), and —P(=O)(Q$_{31}$)(Q$_{32}$), wherein Q$_{31}$ to Q$_{33}$ may each independently be selected from a C$_1$-C$_{10}$ alkyl group, a C$_1$-C$_{10}$ alkoxy group, a phenyl group, a phenyl group substituted with a C$_1$-C$_{10}$ alkyl group, a biphenyl group, a terphenyl group, and a naphthyl group.

In an embodiment, Ar$_{21}$ to Ar$_{27}$ in Formula 2 may each independently be a group represented by one selected from Formulae 5-1 to 5-26 and 6-1 to 6-55, wherein at least one of Ar$_{21}$ to Ar$_{23}$ may be a group represented by one selected from Formulae 6-1 to 6-55:

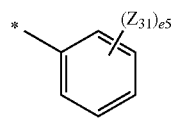
5-1

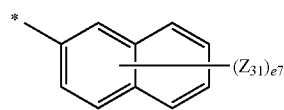
5-2

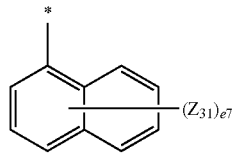
5-3

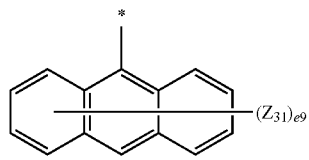
5-4

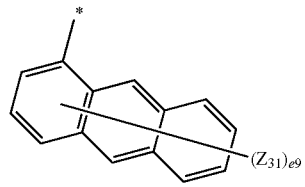
5-5

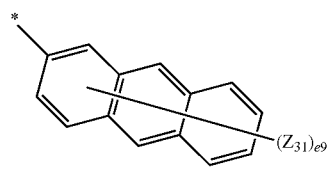
5-6

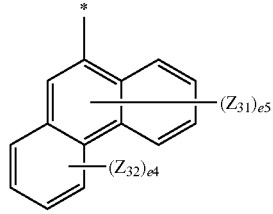
5-7

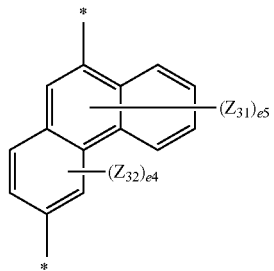
5-8

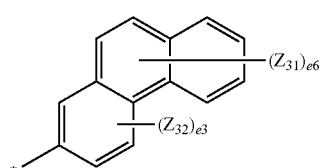
5-9

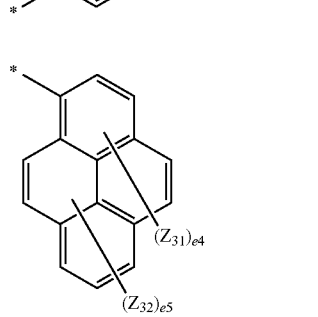
5-10

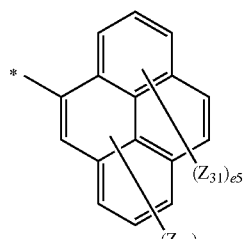
5-11

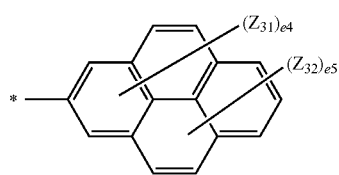
5-12

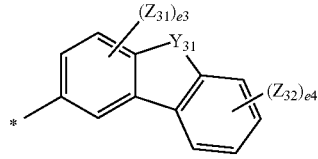
5-13

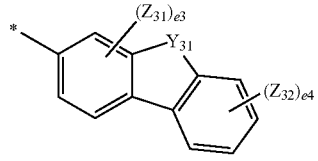
5-14

5-15 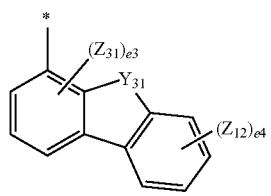
5-16 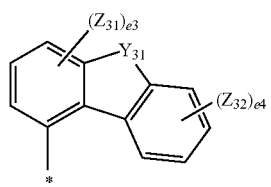
5-17 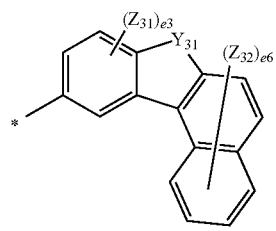
5-18 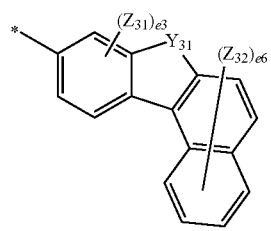
5-19 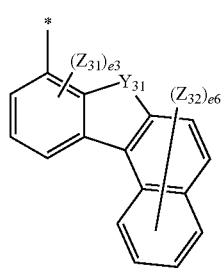
5-21 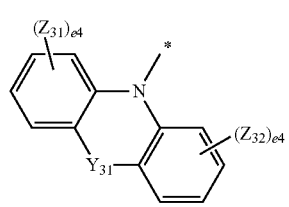
5-22 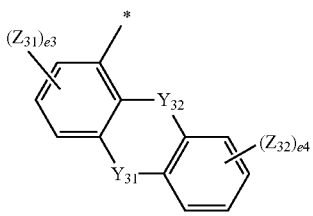
5-23 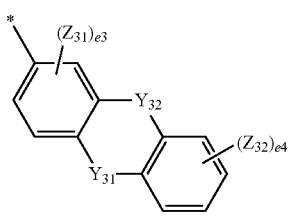
5-24 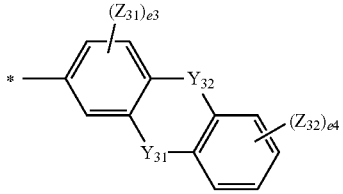
5-25 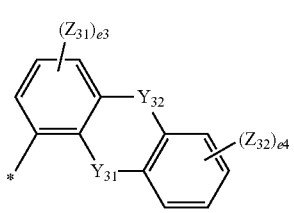
5-26 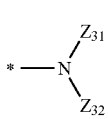
6-1 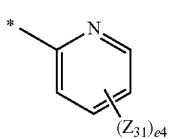
6-2 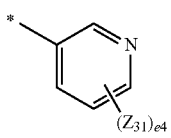
6-3 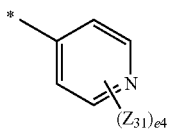
6-4 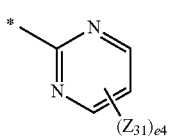
5-20 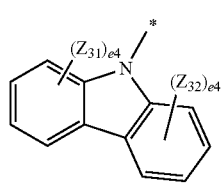

-continued
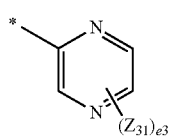
6-5
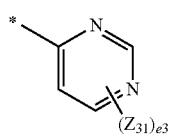
6-6
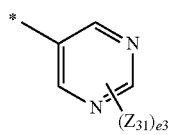
6-7
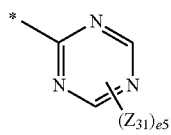
6-8
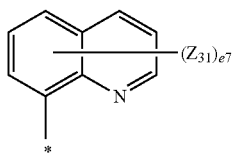
6-9
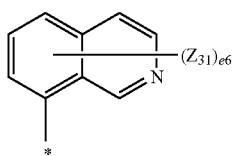
6-10
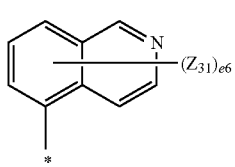
6-11
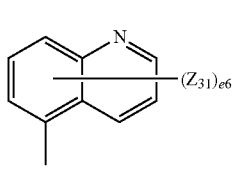
6-12
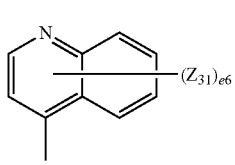
6-13
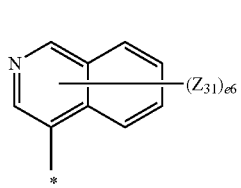
6-14
-continued
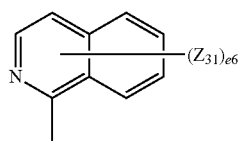
6-15
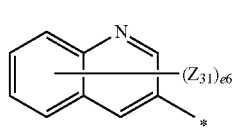
6-16
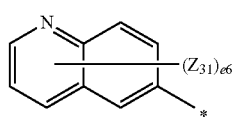
6-17
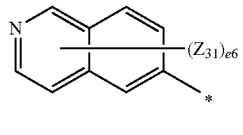
6-18
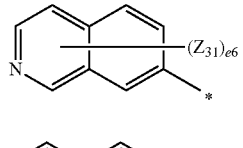
6-19
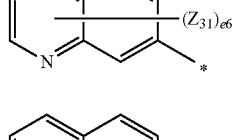
6-20
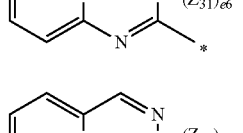
6-21
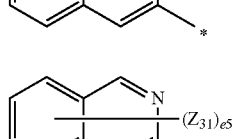
6-22
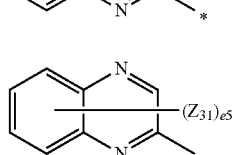
6-23
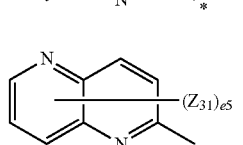
6-24
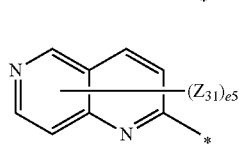
6-25
6-26

6-27 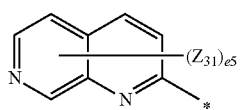
6-28 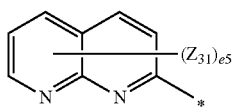
6-29 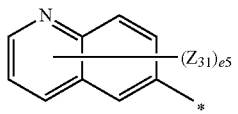
6-30 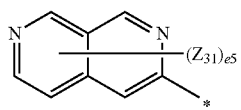
6-31 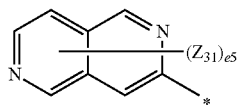
6-32 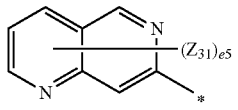
6-33 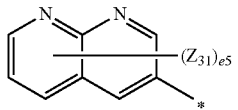
6-34 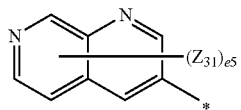
6-35 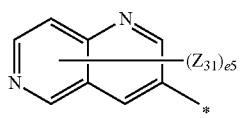
6-36 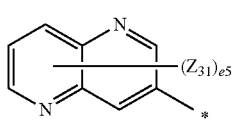
6-37 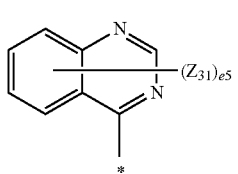
6-38 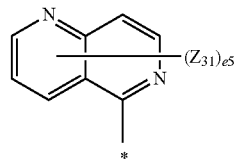
6-39 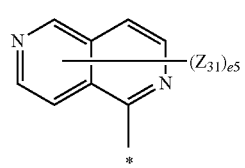
6-40 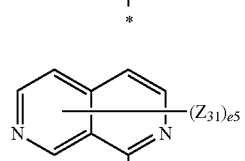
6-41 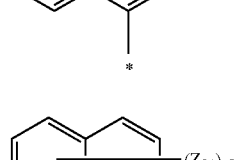
6-42 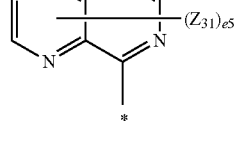
6-43 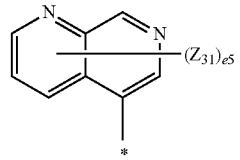
6-44 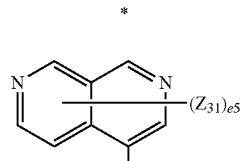
6-45 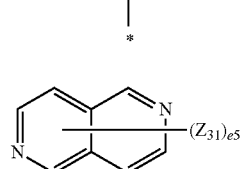
6-46 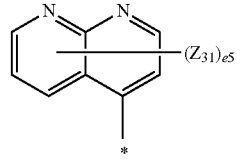

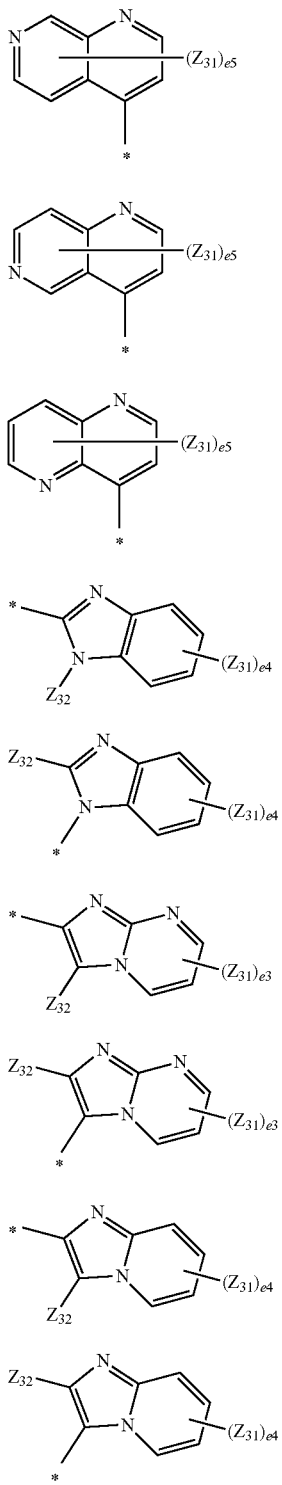

In Formulae 5-1 to 5-26 and 6-1 to 6-55,
Y$_{31}$ and Y$_{32}$ may each independently be O, S, C(Z$_{34}$)(Z$_{35}$), N(Z$_{34}$), or Si(Z$_{34}$)(Z$_{35}$),
Z$_{31}$ to Z$_{35}$ may each independently be selected from hydrogen, deuterium, —F, —Cl, —Br, —I, a hydroxyl group, a cyano group, a nitro group, an amidino group, a hydrazino group, a hydrazono group, a C$_1$-C$_{20}$ alkyl group, a C$_1$-C$_{20}$ alkenyl group, a C$_1$-C$_{20}$ alkynyl group, a C$_1$-C$_{20}$ alkoxy group, a phenyl group, a biphenyl group, a terphenyl group, a naphthyl group, a fluorenyl group, a spiro-bifluorenyl group, a phenanthrenyl group, an anthracenyl group, a triperylenyl group, a pyridinyl group, a pyrimidinyl group, a carbazolyl group, and a triazinyl group,
e2 may be 1 or 2,
e3 may be an integer from 1 to 3,
e4 may be an integer from 1 to 4,
e5 may be an integer from 1 to 5,
e6 may be an integer from 1 to 6,
e7 may be an integer from 1 to 7,
e9 may be an integer from 1 to 9, and
* indicates a binding site to a neighboring atom.

In an embodiment, R$_{21}$ to R$_{26}$ in Formula 2 may each independently be selected from: *-(L$_{27}$)$_{a27}$-(Ar$_{27}$)$_{b27}$, hydrogen, deuterium, —F, —Cl, —Br, —I, a hydroxyl group, a cyano group, a nitro group, a C$_1$-C$_{20}$ alkyl group, a C$_1$-C$_{20}$ alkoxy group, a cyclopentyl group, a cyclohexyl group, a cycloheptyl group, a cyclopentenyl group, a cyclohexenyl group, a phenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, a biphenyl group, and a terphenyl group; and a cyclopentyl group, a cyclohexyl group, a cycloheptyl group, a cyclopentenyl group, a cyclohexenyl group, a phenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, a biphenyl group, and a terphenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, a biphenyl group, and a terphenyl group.

In an embodiment, the third compound may be represented by any one of Formulae 3 and 4-1 to 4-3:

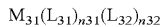

[Formula 3]

[Formula 3A]

[Formula 3B]

[Formula 3C]

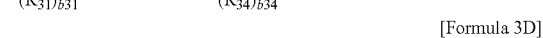

[Formula 3D]

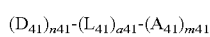

[Formula 4-1]

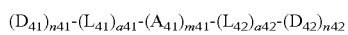

[Formula 4-2]

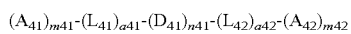

[Formula 4-3]

In Formulae 3, 3A to 3D, and 4-1 to 4-3, $M_{31}$ may be selected from a first-row transition metal of the Periodic Table of Elements, a second-row transition metal of the Periodic Table of Elements, and a third-row transition metal of the Periodic Table of Elements, $L_{31}$ may be a ligand represented by one of Formulae 3A to 3D, $L_{32}$ may be selected from a monodentate ligand, a bidentate ligand, and a tridentate ligand, n31 may be 1 or 2, n32 may be selected from 0, 1, 2, 3, and 4, $A_{31}$ to $A_{34}$ may each independently be selected from a $C_5$-$C_{30}$ carbocyclic group and a $C_1$-$C_{30}$ heterocyclic group, $T_{31}$ to $T_{34}$ may each independently be selected from a single bond, a double bond, *—O—*', *—S—*', *—C(=O)—*', *—S(=O)—*', *—C($R_{35}$)($R_{36}$)—*', *—C($R_{35}$)=C($R_{36}$)—*', *—C($R_{35}$)=*', *—Si($R_{35}$)($R_{36}$)—*', *—B($R_{35}$)—*', *—N($R_{35}$)—*', and *—P($R_{35}$)—*', k31 to k34 may each independently be selected from 1, 2, and 3, $Y_{31}$ to $Y_{34}$ may each independently be selected from a single bond, *—O—*', *—S—*', *—C($R_{37}$)($R_{38}$)—*', *—Si($R_{37}$)($R_{38}$)—*', *—B($R_{37}$)—*', *—N($R_{37}$)—*', and *—P($R_{37}$)—*',

*$_1$, *$_2$, *$_3$, and *$_4$ each indicate a binding site to $M_{31}$, $R_{31}$ to $R_{38}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), and $R_{31}$ to $R_{38}$ may optionally be bonded to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, b31 to b34 may each independently be an integer from 0 to 10, $A_{41}$ and $A_{42}$ may each independently be selected from: a π electron-deficient nitrogen-containing cyclic group, —Si($R_{41}$)($R_{42}$)($R_{43}$), —B($R_{41}$)($R_{42}$), and —N($R_{41}$)($R_{42}$);

a π electron-deficient nitrogen-containing cyclic group substituted with at least one selected from deuterium, a $C_1$-$C_{60}$ alkyl group, a π electron-deficient nitrogen-containing cyclic group, —C($Q_{31}$)($Q_{32}$)($Q_{33}$), —Si($Q_{31}$)($Q_{32}$)($Q_{33}$), —B($Q_{31}$)($Q_{32}$), and —N($Q_{31}$)($Q_{32}$); and a π electron-deficient nitrogen-containing cyclic group substituted with a π electron-deficient nitrogen-containing cyclic group substituted with at least one selected from deuterium, a $C_1$-$C_{60}$ alkyl group, a π electron-deficient nitrogen-containing cyclic group, —C($Q_{21}$)($Q_{22}$)($Q_{23}$), —Si($Q_{21}$)($Q_{22}$)($Q_{23}$), —B($Q_{21}$)($Q_{22}$), and —N($Q_{21}$)($Q_{22}$), $R_{41}$ to $R_{43}$ may each independently be optionally bonded with $L_{41}$ or $L_{42}$ through *—($Z_{41}$)—*' to form a $C_5$-$C_{30}$ carbocyclic group or a $C_1$-$C_{30}$ heterocyclic group, $Z_{41}$ may be a selected from a single bond, O, S, N, Se, Si($R_{44}$)($R_{45}$), and C($R_{44}$)($R_{45}$), $R_{41}$ to $R_{45}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group unsubstituted or substituted with at least one $R_{10a}$, a $C_2$-$C_{60}$ alkenyl group unsubstituted or substituted with at least one $R_{10}$, a $C_2$-$C_{60}$ alkynyl group unsubstituted or substituted with at least one $R_{10}$, a $C_1$-$C_{60}$ alkoxy group unsubstituted or substituted with at least one $R_{10}$, a $C_6$-$C_{60}$ aryloxy group unsubstituted or substituted with at least one $R_{10}$, a $C_6$-$C_{60}$ arylthio group unsubstituted or substituted with at least one $R_{10}$, a $C_3$-$C_{60}$ carbocyclic group unsubstituted or substituted with at least one $R_{10}$, a $C_1$-$C_{60}$ heterocyclic group unsubstituted or substituted with at least one $R_{10}$, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), m41 and m42 may each independently be selected from 1, 2, and 3, $D_{41}$ and $D_{42}$ may each independently be selected from: —F, a cyano group, a π electron-deficient nitrogen-free cyclic group, a group containing C(=O), a group containing P(=O), and a group containing P(=S);

a π electron-deficient nitrogen-free cyclic group, a group containing C(=O), a group containing P(=O), and a group containing P(=S), each substituted with at least one selected from deuterium, —F, a cyano group, a $C_1$-$C_{60}$ alkyl group, and a π electron-deficient nitrogen-free cyclic group;

a $C_1$-$C_{60}$ alkyl group and a π electron-deficient nitrogen-free cyclic group, each substituted with at least one selected from deuterium, —F, a cyano group, and a π electron-deficient nitrogen-free cyclic group;

a π electron-deficient nitrogen-free cyclic group, a group containing C(=O), a group containing P(=O), and a group containing P(=S), each substituted with at least one from a $C_1$-$C_{60}$ alkyl group and a π electron-deficient nitrogen-free cyclic group that are each substituted with at least one selected from deuterium, —F, a cyano group, a $C_1$-$C_{60}$ alkyl group, and a π electron-deficient nitrogen-free cyclic group;

a $C_1$-$C_{60}$ alkyl group and a π electron-deficient nitrogen-free cyclic group, each substituted with a π electron-deficient nitrogen-free cyclic group substituted with at least one selected from deuterium, —F, a cyano group, a $C_1$-$C_{60}$ alkyl group, and a π electron-deficient nitrogen-free cyclic group; and a $C_1$-$C_{60}$ alkyl group and a π electron-deficient nitrogen-free cyclic group, each substituted with at least one selected from a $C_1$-$C_{60}$ alkyl group and a π electron-deficient nitrogen-free cyclic group that are each substituted with at least one selected from deuterium, —F, a cyano group, and a π electron-deficient nitrogen-free cyclic group, n41 and n42 may each independently be selected from 1, 2, and 3, $L_{41}$ and $L_{42}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and a11 may be selected from 0, 1, 2, and 3, wherein $Q_1$ to $Q_3$ may each independently be selected from: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, and any combination thereof.

For example, $M_{31}$ in Formula 3 may be selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm).

In an embodiment, $M_{31}$ in Formula 3 may be selected from Pt and Ir.

For example, $A_{31}$ to $A_{34}$ in Formulae 3A to 3D may each independently be a first ring, a second ring, a condensed ring in which two or more first rings are condensed with each other, a condensed ring in which two or more second rings are condensed with each other, or a condensed ring in which one or more first rings and one or more second rings are condensed with each other, wherein the first ring may be selected from a cyclopentane group, a cyclopentene group, a cyclopentadiene group, a furan group, a thiophene group, a pyrrole group, a borole group, a phosphole group, a silole group, a germole group, a selenophene group, an oxazole group, a dihydroxazole group, an isoxazole group, a dihydroisoxazole group, an oxadiazole group, a dihydroxadiazole group, an isoxadiazole group, a dihydroisoxadiazole group, an oxatriazole group, a dihydroxatriazole group, an isoxatriazole group, a dihydroisoxatriazole group, a thiazole group, a dihydrothiazole group, an isothiazole group, a dihydroisothiazole group, a thiadiazole group, a dihydrothiadiazole group, an isothiadiazole group, a dihydroisothiadiazole group, a thiatriazole group, a dihydrothiatriazole group, an isothiatriazole group, a dihydroisothiatriazole group, a pyrazole group, a dihydropyrazole group, an imidazole group, a dihydroimidazole group, a triazole group, a dihydrotriazole group, a tetrazole group, a dihydrotetrazole group, an azasilole group, a diazasilole group, and a triazasilole group, and the second ring may be selected from a cyclohexane group, a cyclohexene group, a cyclohexadiene group, an adamantane group, a norbornane group, a norbornene group, a benzene group, a pyridine group, a dihydropyridine group, a tetrahydropyridine group, a pyrimidine group, a dihydropyrimidine group, a tetrahydropyrimidine group, a pyrazine group, a dihydropyrazine group, a tetrahydropyrazine group, a pyridazine group, a dihydropyridazine group, a tetrahydropyridazine group, and a triazine group.

In an embodiment, $A_{31}$ to $A_{34}$ in Formulae 3A to 3D may each independently be selected from a benzene group, a naphthalene group, an anthracene group, a phenanthrene group, a triphenylene group, a pyrene group, a chrysene group, a furan group, a thiophene group, a silole group, an indene group, a fluorene group, a benzofuran group, a dibenzofuran group, a benzothiophene group, a dibenzothiophene group, a benzosilole group, a dibenzosilole group, an indole group, a carbazole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a pyridine group, a pyrimidine group, a pyrazine group, a pyridazine group, a triazine group, a quinoline group, an isoquinoline group, a quinoxaline group, a quinazoline group, a cinnoline group, a phthalazine group, a phenanthroline group, a pyrrole group, a pyrazole group, an imidazole group, a dihydroimidazole group, a triazole group, a dihydrotriazole group, an oxazole group, a dihydroxazole group, an isoxazole group, a thiazole group, a dihydrothiazole group, an isothiazole group, an oxadiazole group, a dihydroxaddiazole group, a thiadiazole group, a dihydrothiadiazole group, a benzopyrazole group, a benzimidazole group, a dihydrobenzimidazole group, an imidazopyridine group, an imidazopyrimidine group, an imidazopyrazine group, a benzoxazole group, a dihydrobenzoxazole group, a benzothiazole group, a dihydrobenzothiazole group, a benzoxadiazole group, a dihydrobenzoxadiazole group, a benzothiadiazole group, and a dihydrobenzothiadiazole group.

For example, $T_{31}$ to $T_{34}$ in Formulae 3A to 3D may each independently be selected from a single bond, a double bond, *—O—*', *—S—*', *—C($R_{35}$)($R_{36}$)—*', and *—N($R_{35}$)—*'.

For example, $Y_{31}$ to $Y_{34}$ in Formulae 3A to 3D may each independently be selected from a single bond, *—O—*', and *—S—*'.

For example, $R_{31}$ to $R_{38}$ in Formulae 3A to 3D may each independently be selected from: hydrogen, deuterium, —F, —Cl, —Br, —I, a cyano group, a $C_1$-$C_{20}$ alkyl group, and a $C_1$-$C_{20}$ alkoxy group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each substituted with at least one selected from deuterium, —F, —Cl, —Br, —I, a cyano group, a $C_1$-$C_{20}$ alkyl group, a $C_1$-$C_{20}$ alkoxy group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group; and —$B(Q_1)(Q_2)$ and —$N(Q_1)(Q_2)$, and $Q_1$ and $Q_2$ may each independently be selected from: hydrogen, deuterium, and a $C_1$-$C_{20}$ alkyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group.

In an embodiment, $R_{31}$ to $R_{38}$ in Formulae 3A to 3D may each independently be selected from: hydrogen, deuterium, —F, —Cl, —Br, —I, a cyano group, a methyl group, an ethyl group, an n-propyl group, an isopropyl group, an n-butyl group, an isobutyl group, a sec-butyl group, a tert-butyl group, a methoxy group, an ethoxy group, a propoxy group, and a butoxy group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group, each substituted with at least one selected from deuterium, —F, —Cl, —Br, —I, a cyano group, a methyl group, an ethyl group, an n-propyl group, an isopropyl group, an n-butyl group, an isobutyl group, a sec-butyl group, a tert-butyl group, a methoxy group, an ethoxy group, a propoxy group, a butoxy group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group; and —$B(Q_1)(Q_2)$ and —$N(Q_1)(Q_2)$, and $Q_1$ and $Q_2$ may each independently be selected from: hydrogen, deuterium, a methyl group, an ethyl group, an n-propyl group, an isopropyl group, an n-butyl group, an isobutyl group, a sec-butyl group, and a tert-butyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group, each substituted with at least one selected from deuterium, a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group.

In an embodiment, the third compound may be represented by one selected from Formulae 3-1 and 3-2 below:

[Formula 3-1]

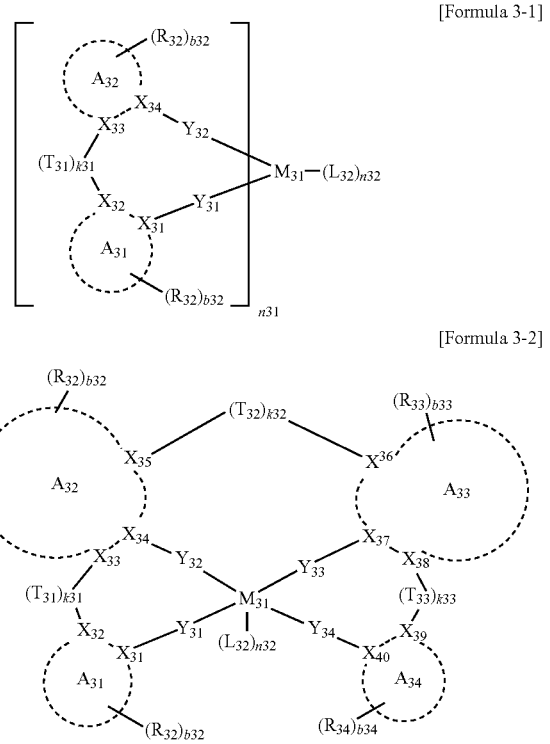

[Formula 3-2]

In Formulae 3-1 and 3-2, $X_{31}$ to $X_{40}$ may each independently be selected from N and C, and $M_{31}$, $L_{32}$, n31, n32, $A_{31}$ to $A_{34}$, $T_{31}$ to $T_{33}$, k31 to k33, $Y_{31}$ to $Y_{34}$, $R_{32}$ to $R_{38}$, b32 to b34 may be the same as defined in connection with Formulae 3 and 3A to 3D.

In Formulae 3-1 and 3-2, $X_{31}$ and $X_{32}$ may each independently be a ring member of $A_{31}$, and $X_{33}$ to $X_{40}$ may be also understood by referring to descriptions provided in connection with Formulae 3-1 and 3-2, $X_{31}$, and $X_{32}$.

In an embodiment, $D_{41}$ and $D_{42}$ in Formulae 4-1 to 4-3 may each independently be a group represented by Formula 12:

[Formula 12]

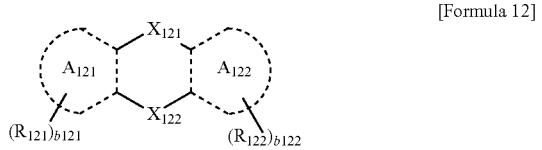

In Formula 12, $X_{121}$ may be selected from O, S, $N(R_{123})$, and $C(R_{123})(R_{124})$, $X_{122}$ may be selected from a single bond, O, S, $N(R_{125})$, and $C(R_{125})(R_{126})$, $A_{121}$ and $A_{122}$ may each independently be a π electron-deficient nitrogen-free cyclic group, $R_{121}$ to $R_{126}$ may each independently be selected from: a binding site, hydrogen, deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzo-fluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, $-Si(Q_{31})(Q_{32})(Q_{33})$, $-B(Q_{31})(Q_{32})$, and $-N(Q_{31})(Q_{32})$, and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, $-Si(Q_{21})(Q_{22})(Q_{23})$, $-B(Q_{21})(Q_{22})$, and $-N(Q_{21})(Q_{22})$, wherein $R_{123}$ and $R_{124}$ may optionally be linked to each other to form a π electron-deficient nitrogen-free cyclic group, $R_{125}$ and $R_{126}$ may optionally be linked to each other to form a π electron-deficient nitrogen-free cyclic group, and at least one selected from $R_{121}$ to $R_{126}$ may be a binding site, b121 and b122 may each independently be selected from 1, 2, 3, 4, 5, and 6, and $Q_{21}$ to $Q_{23}$ and $Q_{31}$ to $Q_{33}$ may each be the same as described in the specification.

For example, $A_{41}$ and $A_{42}$ in Formulae 4-1 to 4-3 may each independently be selected from: —F, a cyano group, a pyrazole group, an imidazole group, a triazole group, an oxazole group, an isoxazole group, an oxadiazole group, an isoxadiazole group, a thiazole group, an isothiazole group, a thiadiazole group, isothiadiazole group, a pyridine group, a pyrazine group, a pyridazine group, a pyrimidine group, a triazine group, a quinoline group, an isoquinoline group, a naphthyridine group, a quinoxaline group, a quinazoline group, $-B(R_{41})(R_{42})$, and a group represented by Formulae 13-1 to 13-2;

a pyrazole group, an imidazole group, a triazole group, an oxazole group, an isoxazole group, an oxadiazole group, an isoxadiazole group, a thiazole group, an isothiazole group, a thiadiazole group, an isothiadiazole group, a pyridine group, a pyrazine group, a pyridazine group, a pyrimidine group, a triazine group, a quinoline group, an isoquinoline group, a naphthyridine group, a quinoxaline group, and a quinazoline group, each substituted with at least one selected from deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group;

a $C_1$-$C_{20}$ alkyl group, a benzene group, a biphenyl group, a terphenyl group, a naphthalene group, a phenanthrene group, a triphenylene group, a chrysene group, a fluoranthene group, a fluorene group, a carbazole group, a dibenzofuran group, a dibenzothiophene group, a benzofluorene group, a benzocarbazole group, a benzonaphthofuran group, a benzonaphthothiophene group, a dibenzofluorene group, a dibenzocarbazole group, a dinaphthofuran group, and a dinaphthothiophene group, each substituted with at least one selected from deuterium, —F, a cyano group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group;

a pyrazole group, an imidazole group, a triazole group, an oxazole group, an isoxazole group, an oxadiazole group, an isoxadiazole group, a thiazole group, an isothiazole group, a thiadiazole group, an isothiadiazole group, a pyridine group, a pyrazine group, a pyridazine group, a pyrimidine group, a triazine group, a quinoline group, an isoquinoline group, a naphthyridine group, a quinoxaline group, and a quinazoline group, each substituted with at least one selected from a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group that are each substituted with at least one selected from deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group; and a $C_1$-$C_{20}$ alkyl group, a benzene group, a biphenyl group, a terphenyl group, a naphthalene group, a phenanthrene group, a triphenylene group, a chrysene group, a fluoranthene group, a fluorene group, a carbazole group, a dibenzofuran group, a dibenzothiophene group, a benzofluorene group, a benzocarbazole group, a benzonaphthofuran group, a benzonaphthothiophene group, a dibenzofluorene group, a dibenzocarbazole group, a dinaphthofuran group, and a dinaphthothiophene group, each substituted with at least one selected from a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group that are each substituted with at least one selected from deuterium, —F, a cyano group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group:

[Formula 13-1]

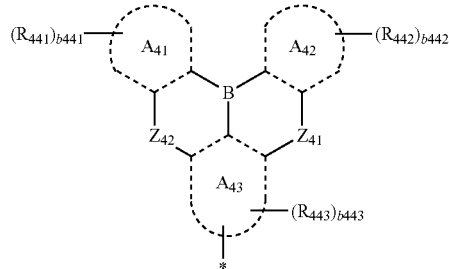

[Formula 13-2]

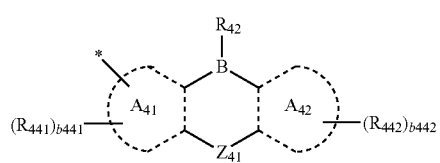

In Formulae 13-1 and 13-2, $A_{41}$ to $A_{43}$ may each independently be selected from a $C_5$-$C_{30}$ carbocyclic group and a $C_1$-$C_{30}$ heterocyclic group, $R_{42}$ and $R_{441}$ to $R_{443}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group unsubstituted or substituted with at least one $R_{10a}$, a $C_2$-$C_{60}$ alkenyl group unsubstituted or substituted with at least one $R_{10}$, a $C_2$-$C_{60}$ alkynyl group unsubstituted or substituted with at least one $R_{10}$, a $C_1$-$C_{60}$ alkoxy group unsubstituted or substituted with at least one $R_{10}$, a $C_6$-$C_{60}$ aryloxy group unsubstituted or substituted with at least one $R_{10}$, a $C_6$-$C_{60}$ arylthio group unsubstituted or substituted with at least one $R_{10}$, a $C_3$-$C_{60}$ carbocyclic group unsubstituted or substituted with at least one $R_{10}$, a $C_1$-$C_{60}$ heterocyclic group unsubstituted or substituted with at least one $R_{10}$, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), b441 to b443 may each independently be an integer from 0 to 10, $Z_{41}$ and $Z_{42}$ may be the same as described in connection with $Z_{41}$ in Formulae 4-1 to 4-3, and

* indicates a binding site to a neighboring group.

For example, $A_{41}$ to $A_{43}$ in Formulae 13-1 and 13-2 may each independently be selected from a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, and a dibenzothiophene group.

For example, $R_{42}$ and $R_{441}$ to $R_{443}$ in Formulae 13-1 and 13-2 may each independently be selected from: hydrogen, deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group; and a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group, each substituted with at least one selected from deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyrazolyl group, an imidazolyl group, a triazolyl group, an oxazolyl group, an isoxazolyl group, an oxadiazolyl group, an isoxadiazolyl group, a thiazolyl group, an isothiazolyl group, a thiadiazolyl group, an isothiadiazolyl group, a pyridinyl group, a pyrazinyl group, a pyridazinyl group, a pyrimidinyl group, a triazinyl group, a quinolinyl group, an isoquinolinyl group, a naphthyridinyl group, a quinoxalinyl group, and a quinazolinyl group, and b441 to b443 may each independently be selected from 1, 2, 3, 4, 5, and 6.

For example, $L_{41}$ and $L_{42}$ in Formulae 4-1 to 4-3 may each independently be selected from: a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, a dibenzothiophene group, —C(Q₁)(Q₂)—, and —Si(Q₁)(Q₂)—; and a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, and a dibenzothiophene group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —C(Q₃₁)(Q₃₂)(Q₃₃), and —Si(Q₃₁)(Q₃₂)(Q₃₃), and $Q_1$, $Q_2$, and $Q_{31}$ to $Q_{33}$ may be the same as described above.

In an embodiment, $L_{41}$ and $L_{42}$ in Formulae 4-1 to 4-3 may each independently be selected from: a benzene group, a fluorene group, a carbazole group, a dibenzofuran group, and a dibenzothiophene group, —C(Q₁)(Q₂)—, and —Si(Q₁)(Q₂)—; and a benzene group, a fluorene group, a carbazole group, a dibenzofuran group, and a dibenzothiophene group, each substituted with at least one selected from deuterium, a $C_1$-$C_{20}$ alkyl group, a phenyl group, a biphenyl group, a terphenyl group, a fluorenyl group, a carbazolyl group, a dibenzofuranyl group, a dibenzothiophenyl group, —C(Q₃₁)(Q₃₂)(Q₃₃), and —Si(Q₃₁)(Q₃₂)(Q₃₃), and $Q_1$, $Q_2$, and $Q_{31}$ to $Q_{33}$ may be the same as described above.

In an embodiment, the fourth compound may be represented by any one of Formulae 5(1), 5(2), 5(3), and 501:

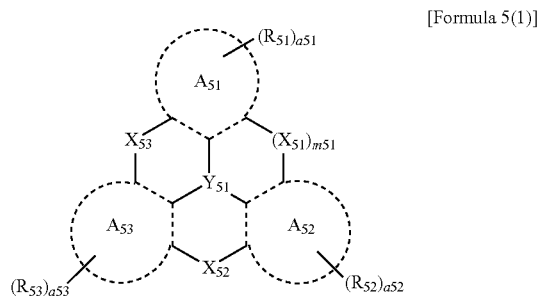

[Formula 5(1)]

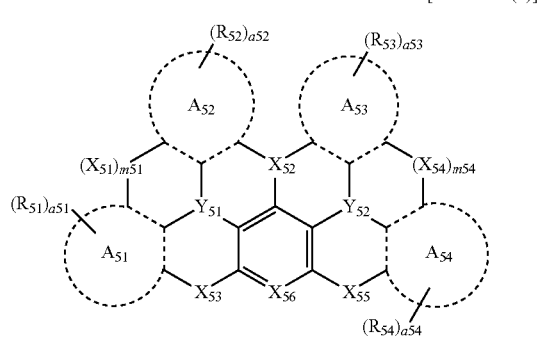

[Formula 5(2)]

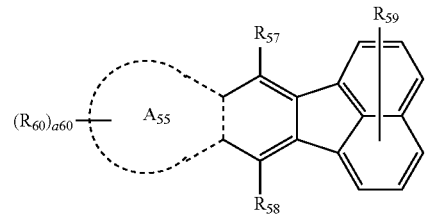

[Formula 5(3)]

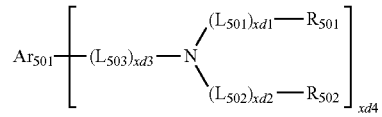

[Formula 501]

In Formulae 5(1) to 5(3), $Y_{51}$ and $Y_{52}$ may each independently be N, B, or P, $X_{51}$ to $X_{55}$ may each independently be a single bond, O, S, N(R₅₅), C(R₅₅)(R₅₆), or Si(R₅₅)(R₅₆), m51 and m52 may each independently be 0, 1, or 2, wherein, when m51 is 0, $A_{5i}$ and $A_{52}$ may not be linked to each other, and when m54 is 0, $A_{53}$ and $A_{54}$ may not be linked to each other, $A_{51}$ to $A_{55}$ may each independently be a $C_5$-$C_{60}$ carbocyclic group or a $C_1$-$C_{60}$ heterocyclic group, and $R_{51}$ to $R_{60}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si(Q₁)(Q₂)(Q₃), —B(Q₁)(Q₂), —C(=O)(Q₁), —N(Q₁)(Q₂), —P(=O)(Q₁)(Q₂), and —S(=O)₂(Q₁)(Q₂).

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6, wherein $Q_1$ to $Q_3$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, the first compound may be selected from compounds of Group I, the second compound may be selected from compounds of Group II, the third compound may be selected from compounds of Group III-1 and Group III-2, and the fourth compound may be selected from compounds of Group IV:
[Group I]
1-1
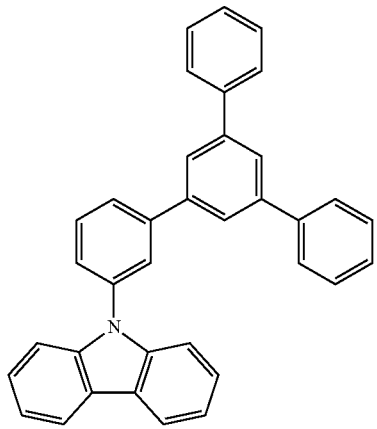
1-2
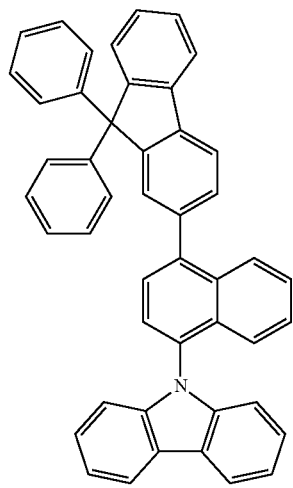
1-3
1-4
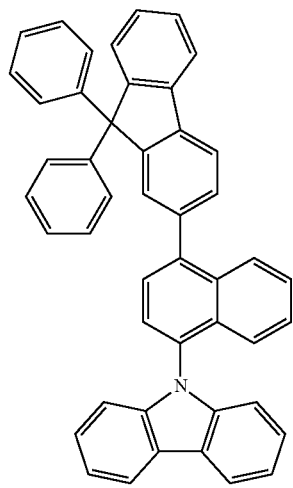
1-5
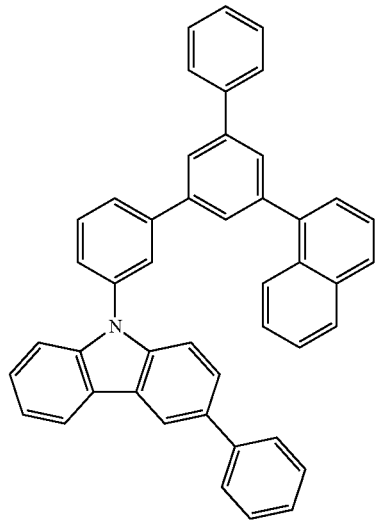
1-6
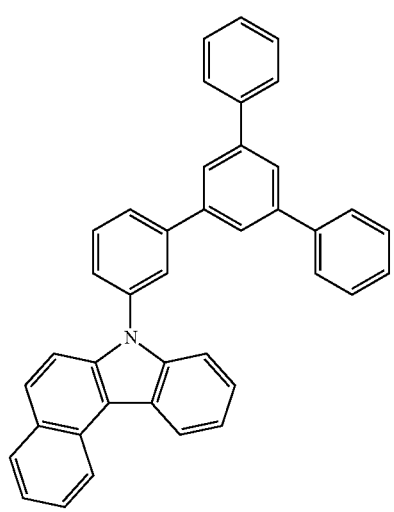

1-7
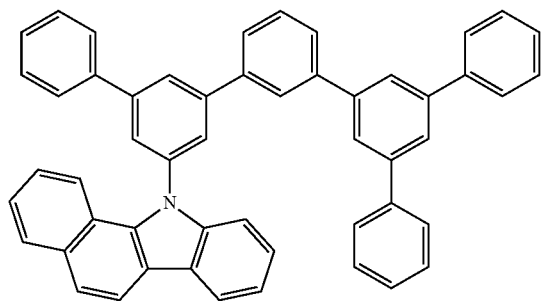
1-8
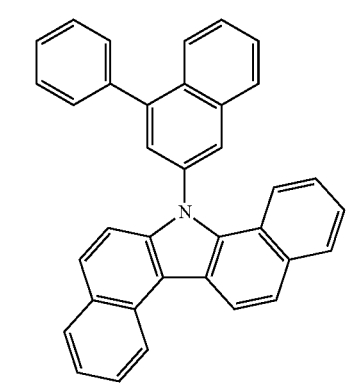
1-9
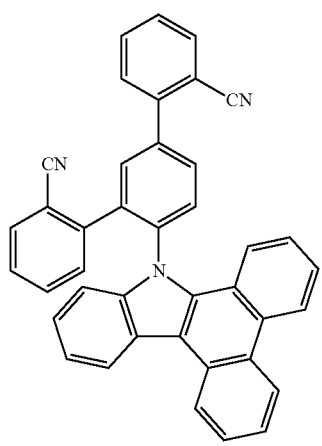
1-10
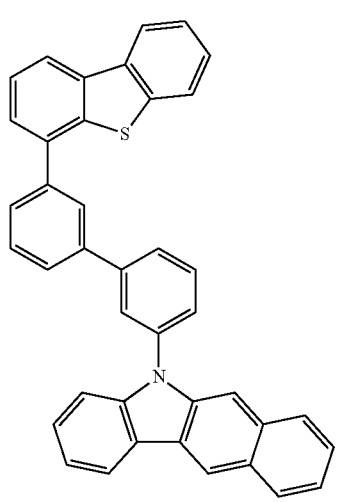
1-11
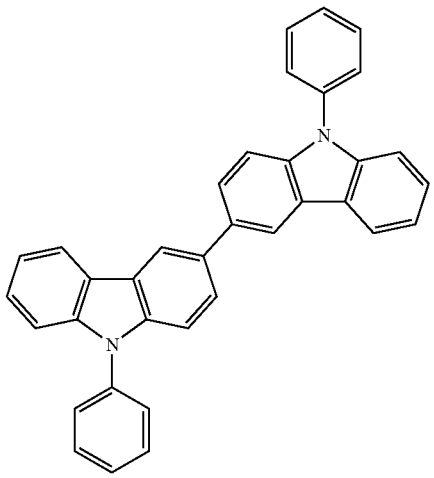
1-12
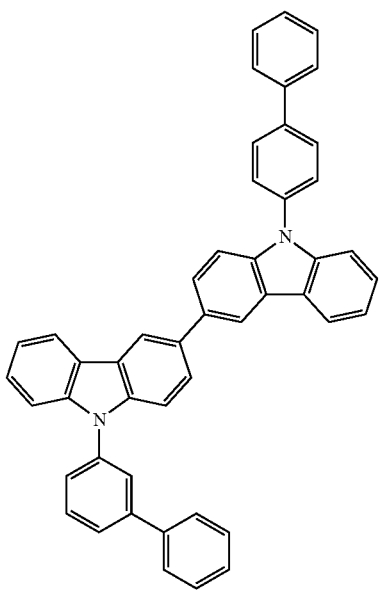
1-13
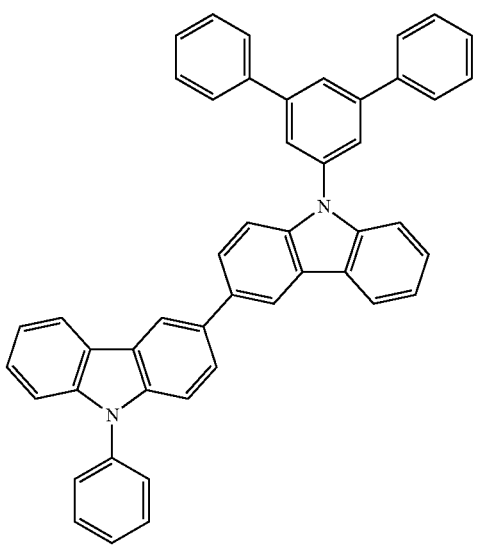

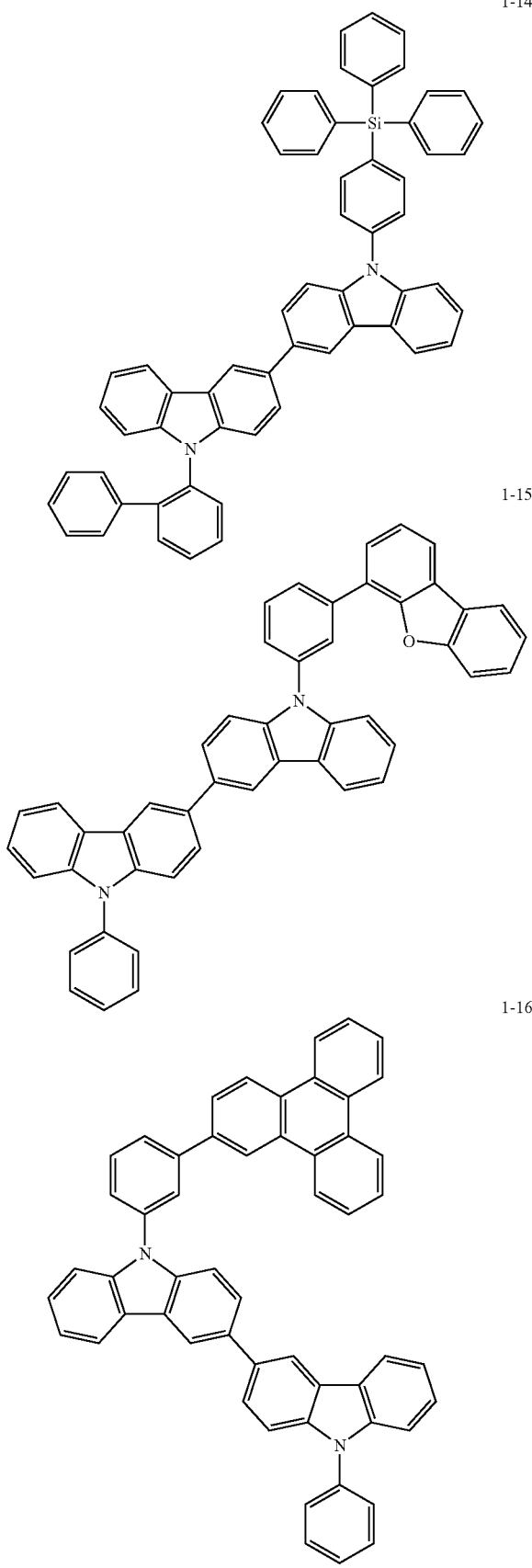
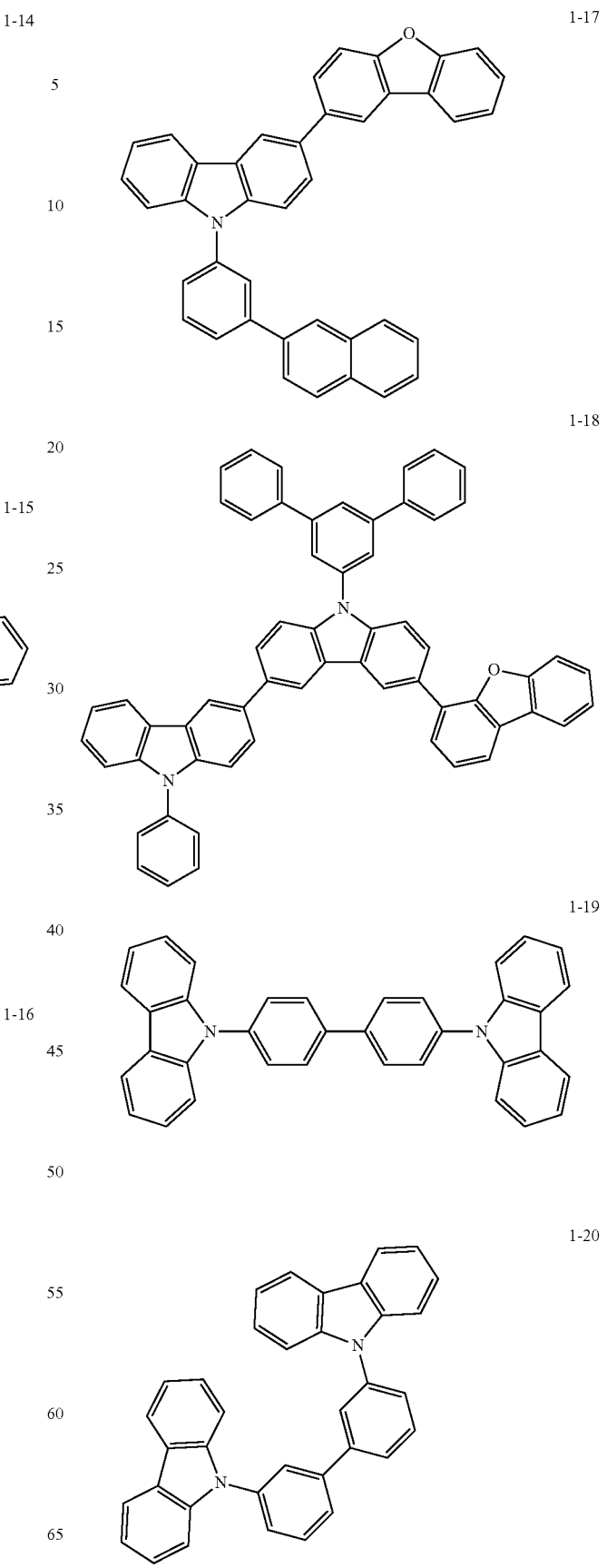

1-21
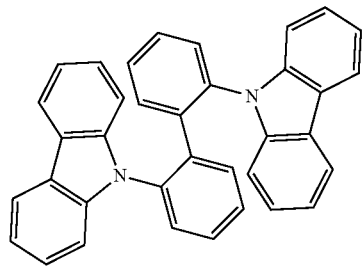
1-22
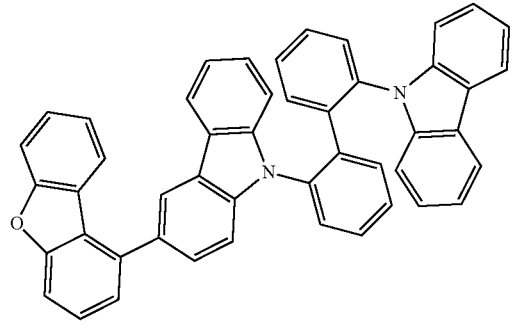
[Group II]
2-1
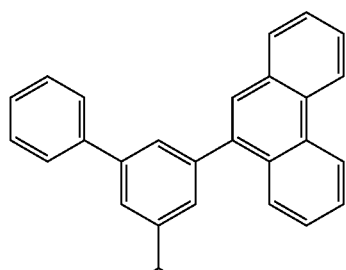
2-2
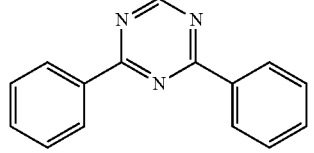
2-3
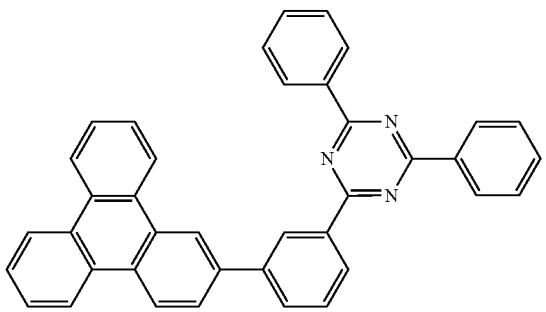
2-4
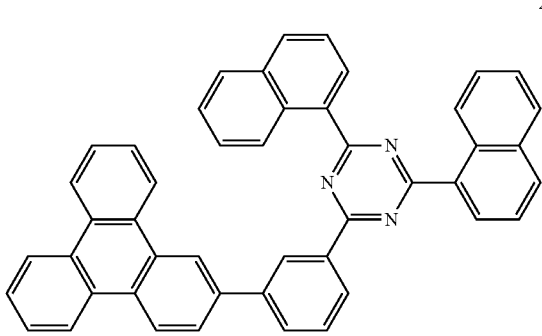
2-5
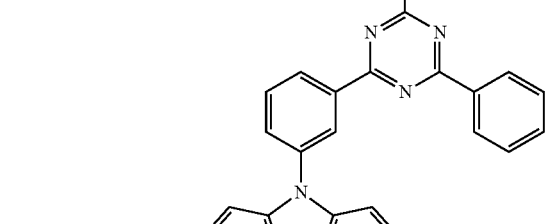

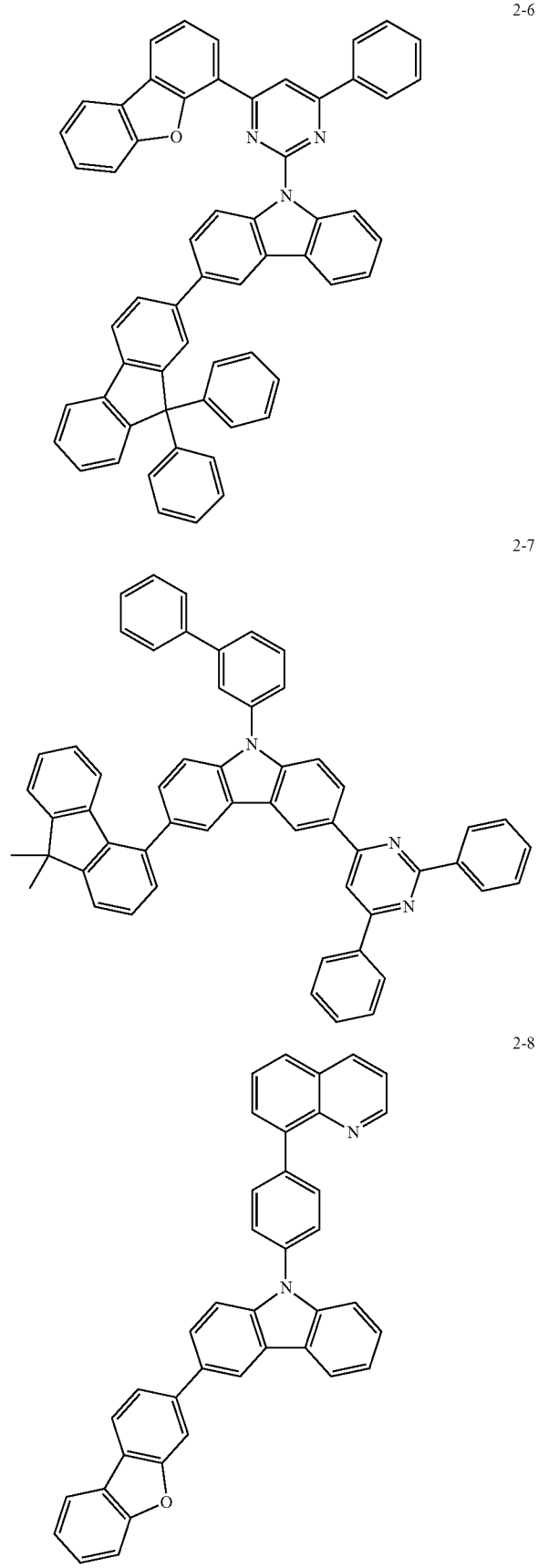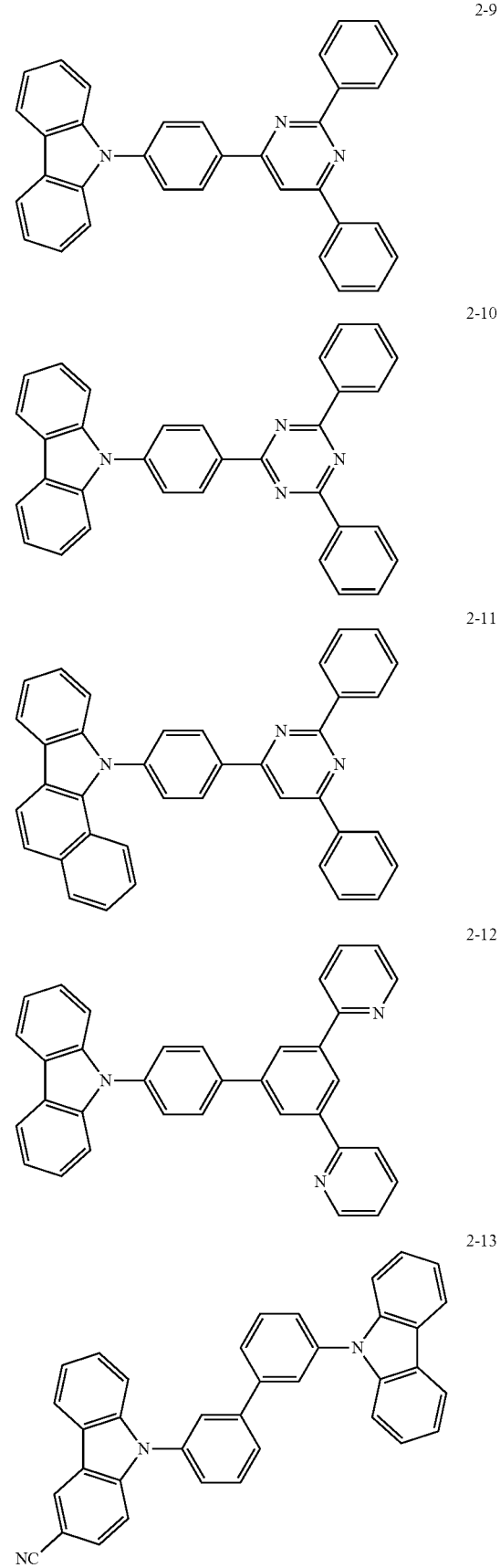

2-14
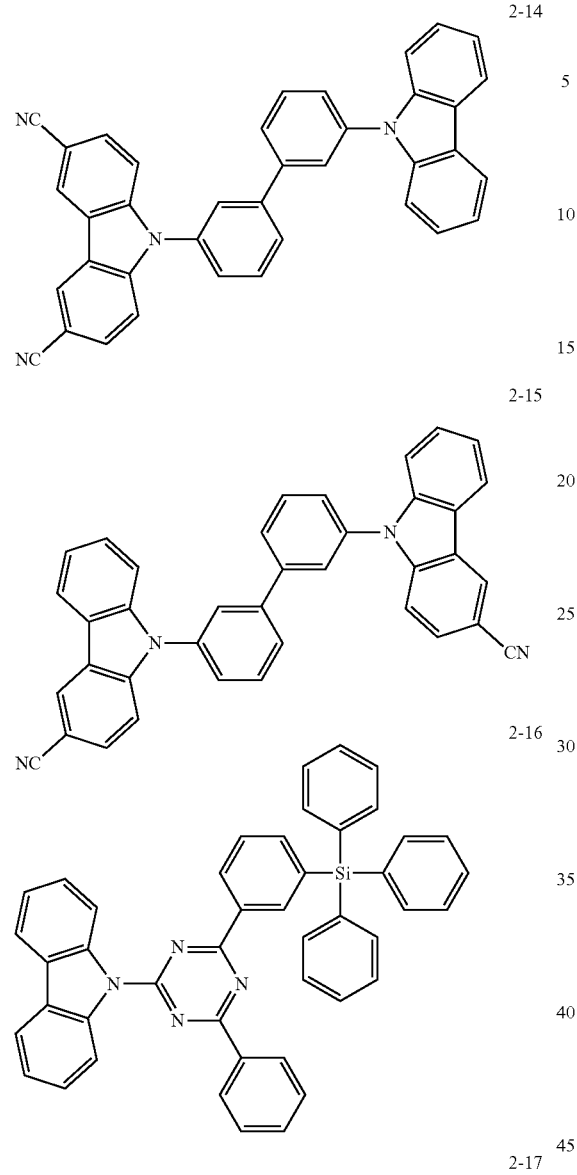
2-15
2-16
2-17
2-18
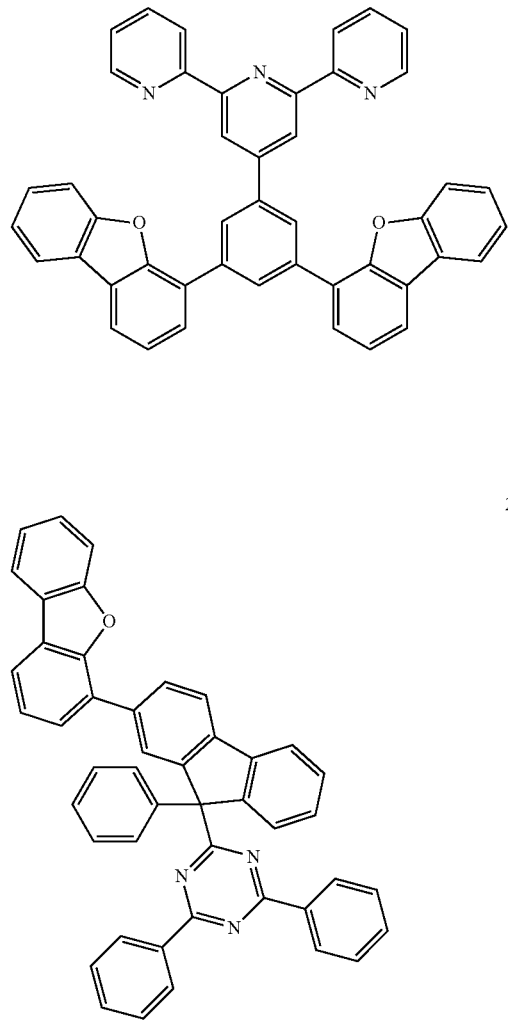
2-19
2-20
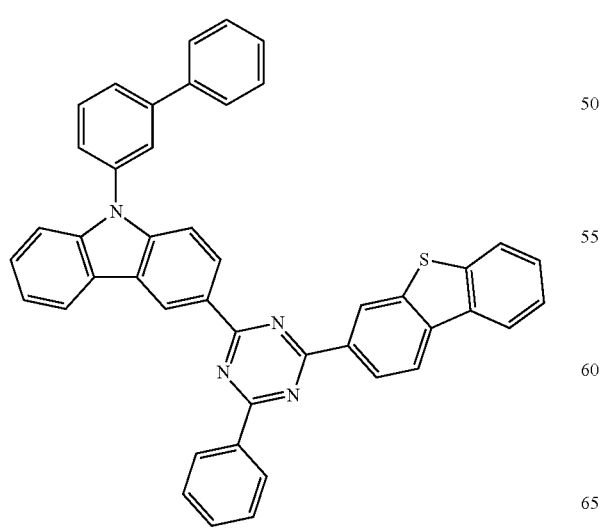
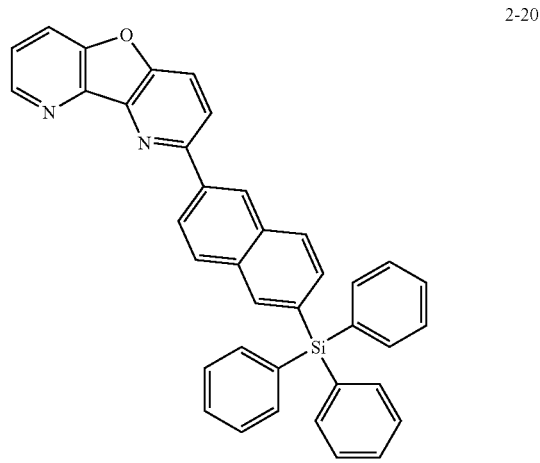

2-21
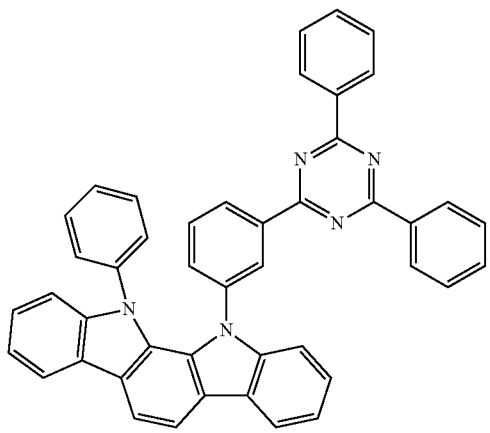
2-22
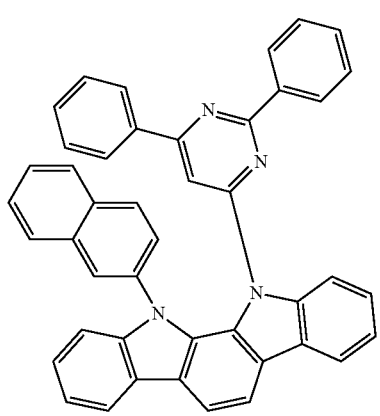
2-23
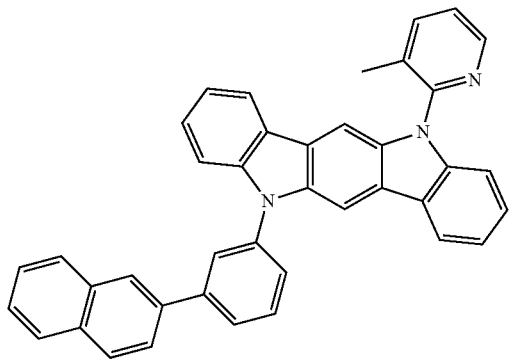
2-24
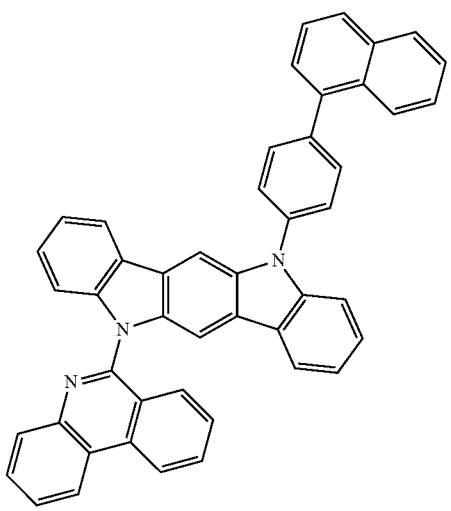
2-25
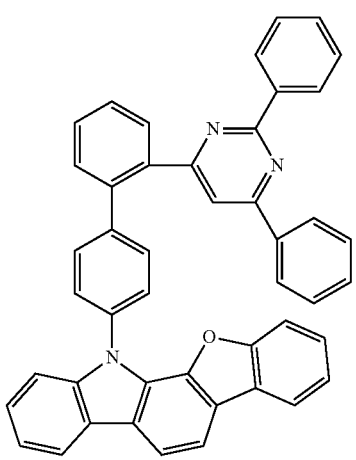
2-26
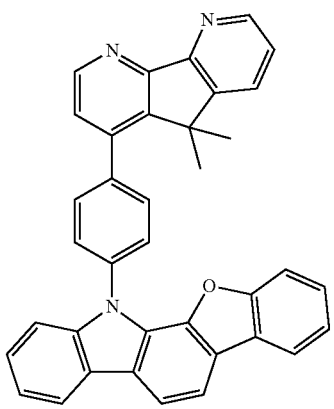

2-27
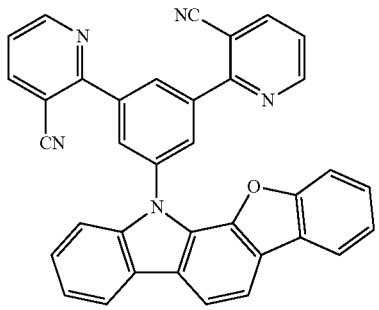
2-28
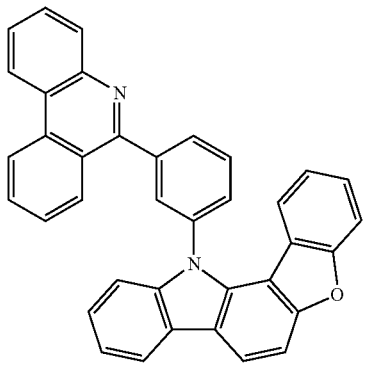
2-29
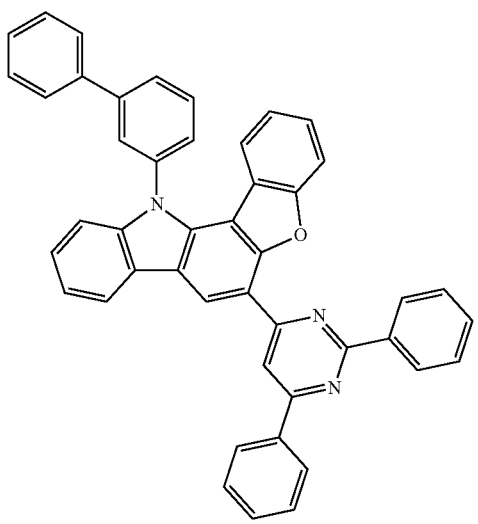
[Group III-1]
3-1
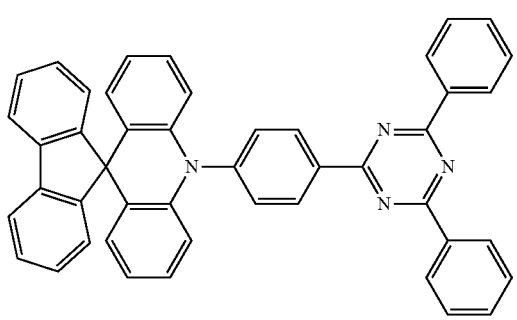
3-2
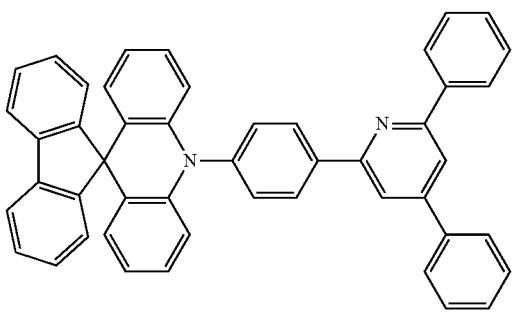
3-3
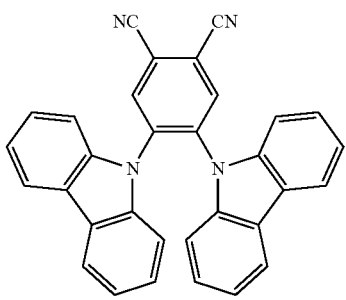
3-4
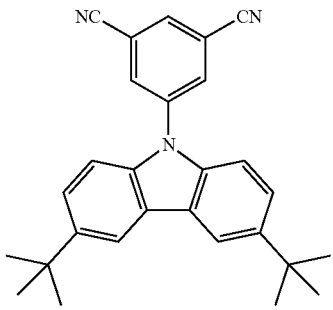
3-5
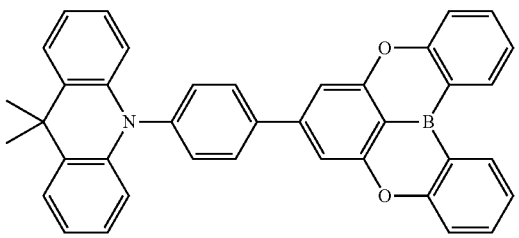
3-6
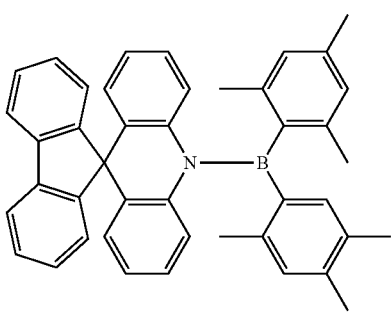

3-7
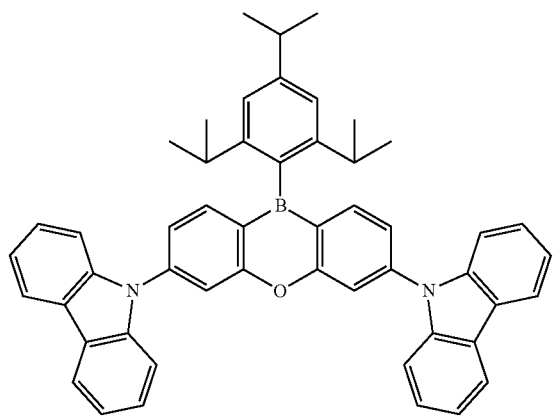
3-8
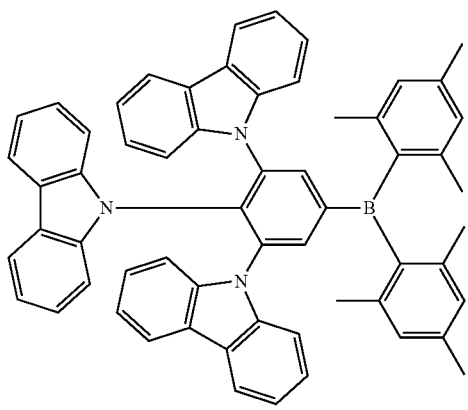
3-9
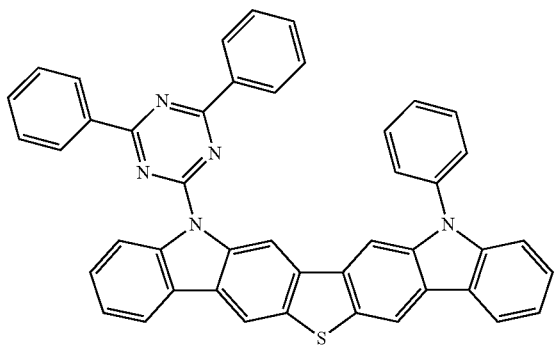
3-10
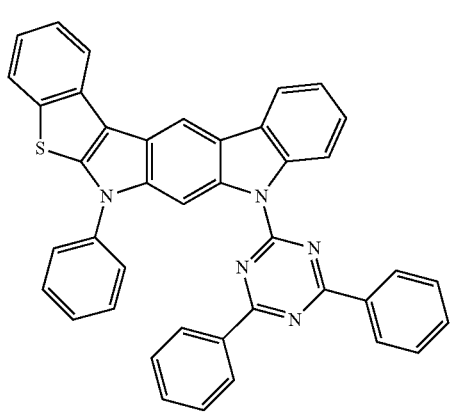
[Group III-2]
3-11
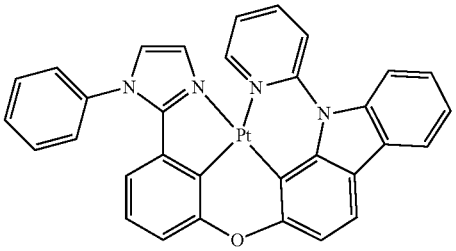
3-12
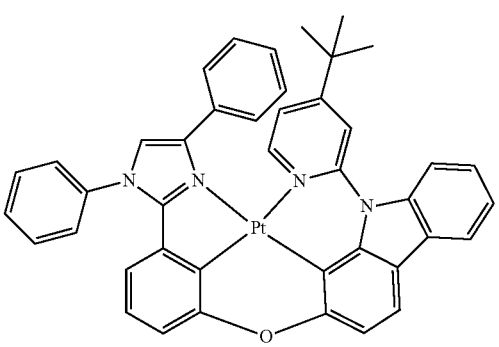
3-13
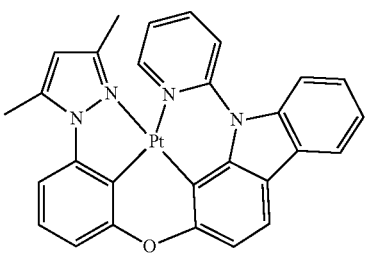
3-14
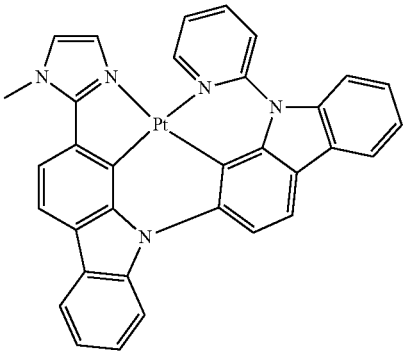
3-15
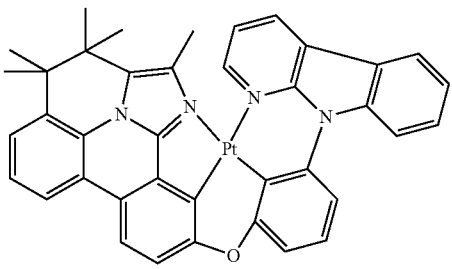

3-16
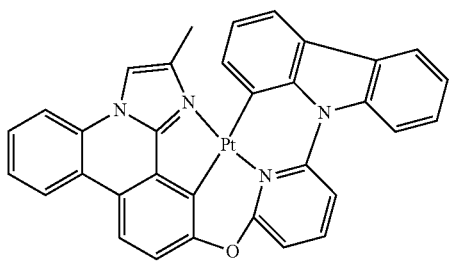
3-17
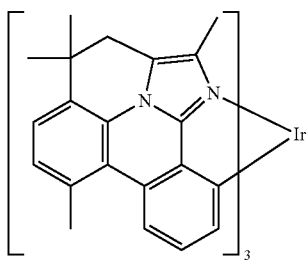
3-18
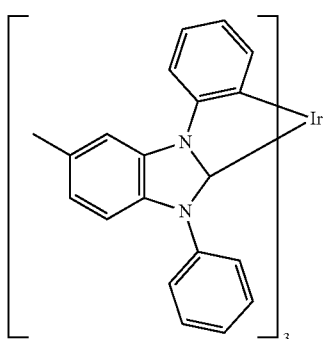
[Group IV]
4-1
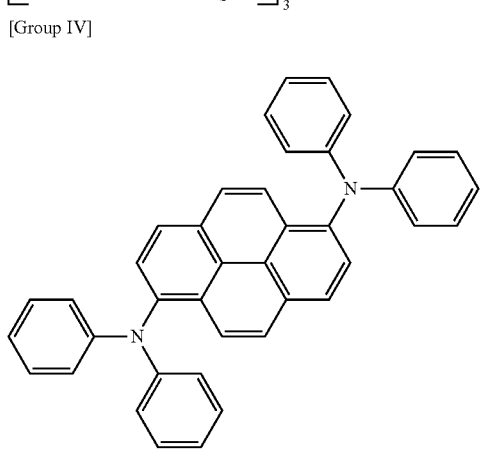
4-2
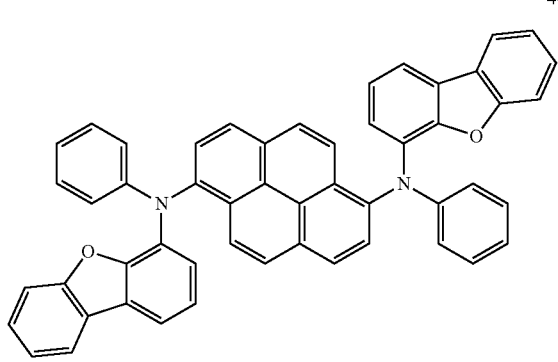
4-3
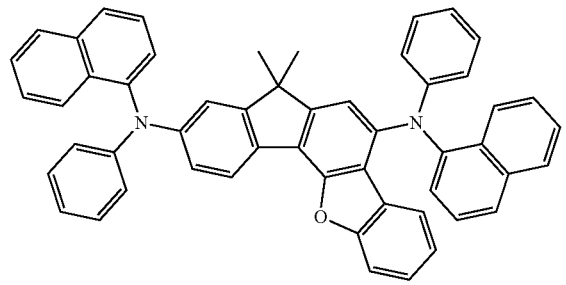
4-4
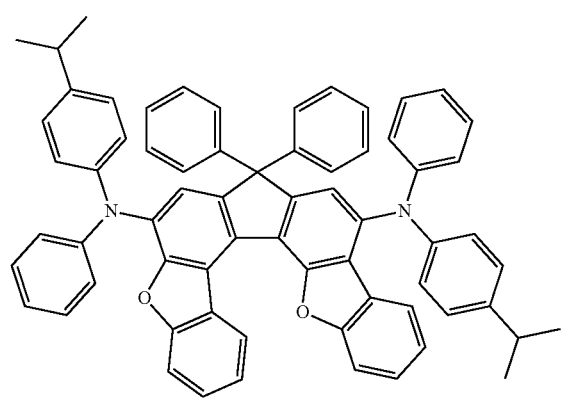
4-5
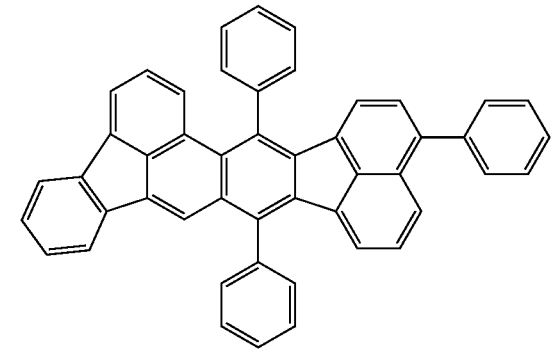
4-6
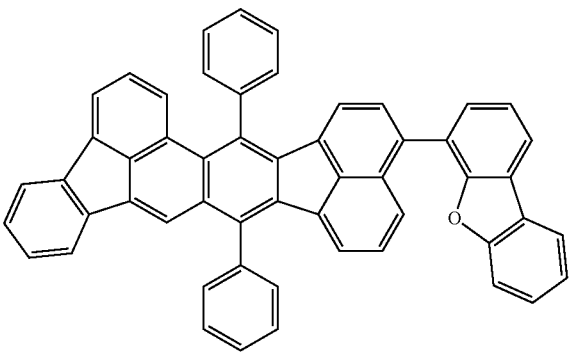

4-7
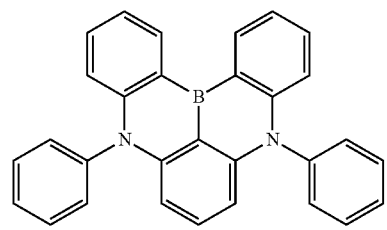

4-8
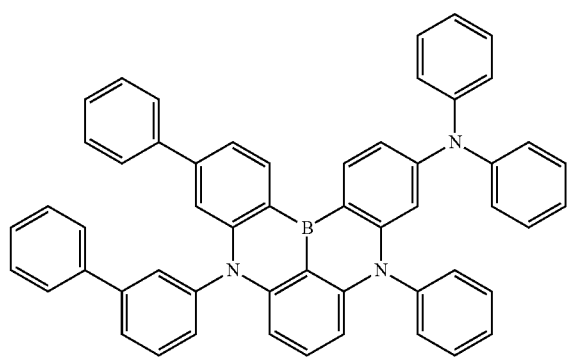

4-9
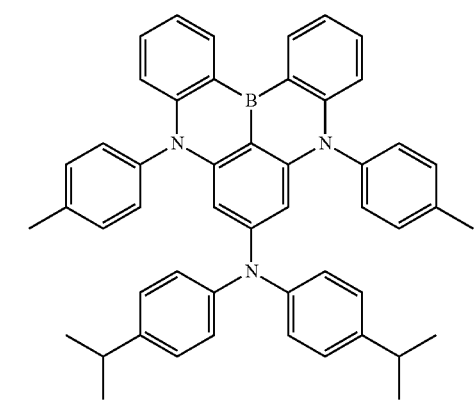

4-10
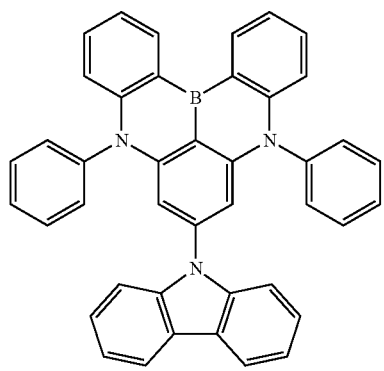

4-11
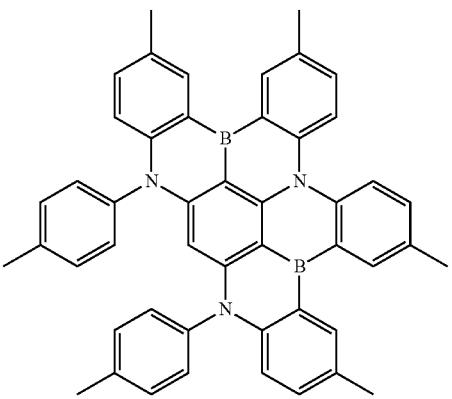

4-12
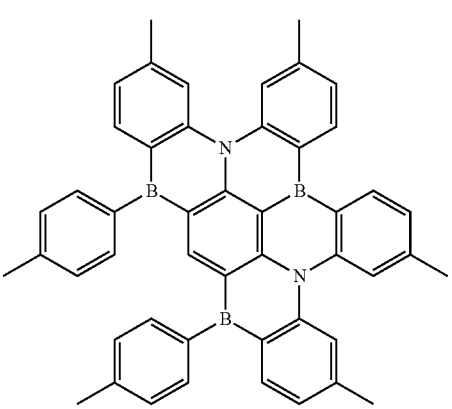

The first compound and the second compound may not substantially emit light.

For example, the third compound and the fourth compound may emit light.

For example, the third compound may be a TADF compound and may be a TADF emitter.

For example, the third compound may be a phosphorescence metal complex and may be a phosphorescence emitter.

The third compound may have a maximum emission wavelength in a range of about 450 nm to about 550 nm, but embodiments of the disclosure are not limited thereto.

In an embodiment, the third compound in the emission layer may receive energy from a formed exciton and emit blue delayed fluorescence or blue phosphorescence, without directly participating in forming excitons.

The inclusion of the auxiliary layer between the hole transport region and the emission layer may affect hole injection to thereby achieve delocalization of excitons which are dispersed on the surface of the emission layer, resulting in an increase of efficiency and lifespan.

By including two or more different host materials in the auxiliary layer, the quantity of holes injected from the hole transport layer to the emission layer may be controlled, the generation of excitons and triplet-polaron quenching (TPQ) due to excessive holes may be reduced, and charge balance may be stabilized, resulting in the improvement of device efficiency and lifespan characteristics.

Optionally, by including two or more layers of electron transport layers in the electron transport region, the electron movement speed may be easily controlled and thus the holes and electrons may be balanced, thereby decreasing driving current and increasing driving lifespan.

By including a first compound (a hole transporting compound), a second compound (an electron transporting compound), a third compound (an organic compound satisfying ΔEst≤0.3 or an organometallic complex), and a fourth compound (a fluorescent dopant) in the emission layer, energy transmission to the dopant may be facilitated, and through hyper fluorescence mechanism, efficiency may be improved and triplet exciton bonding effect may be obtained.

When electrons are not efficiently injected from the electron transport region to the emission layer, charges are accumulated at the interface between the emission layer and the electron transport region, thus deteriorating the interface. When holes are not efficiently injected from the hole transport region to the emission layer, charges are accumulated at the interface between the emission layer and the hole transport region, thus deteriorating the interface. Accordingly, the lifespan of the organic light-emitting device may be lowered.

Since the second compound essentially includes an electron transporting group, the second compound may be easily used to adjust the electron transporting characteristics of the organic light-emitting device. Since the first compound essentially includes a hole transporting group, the first compound may be easily used to adjust the hole transporting characteristics of the organic light-emitting device. In this manner, it is possible to optimize the charge balance in the emission layer of the organic light-emitting device.

An amount of the first compound in the emission layer may be in a range of about 10 wt % to about 90 wt % based on the total weight of the emission layer.

An amount of the second compound in the emission layer may be in a range of about 10 wt % to about 90 wt % based on the total weight of the emission layer.

An amount of the third compound in the emission layer may be equal to or less than an amount of the first compound and an amount of the second compound.

An amount of the fourth compound in the emission layer may be equal to or less than an amount of the first compound and an amount of the second compound.

An amount of the third compound in the emission layer may be equal to or greater than an amount of the fourth compound.

An amount of the fourth compound in the emission layer may be in a range of about 0.1 wt % to about 5 wt % based on the total weight of the emission layer.

An amount of the fourth compound may be in a range of about 0.01 parts by weight to about 30 parts by weight based on 100 parts by weight of the sum of the amount of the first compound and the amount of the second compound.

When the first compound, the second compound, the third compound, and the fourth compound are within these ranges, an organic light-emitting device having both improved efficiency and improved lifespan may be provided.

In an embodiment, the emission layer may consist of the first compound, the second compound, the third compound, and the fourth compound, but embodiments of the disclosure are not limited thereto.

[Description of FIG. 1]

FIG. 1 is a schematic cross-sectional view of an organic light-emitting device 10 according to an embodiment. The organic light-emitting device 10 includes a first electrode 110, an interlayer 130, and a second electrode 150.

Hereinafter, the structure of the organic light-emitting device 10 according to an embodiment and a method of manufacturing the organic light-emitting device 10 will be described in connection with FIG. 1.

[First Electrode 110]

In FIG. 1, a substrate may be further included under the first electrode 110 or above the second electrode 150. The substrate may be a glass substrate or a plastic substrate. In embodiments, the substrate may be a flexible substrate, and may include plastics with excellent heat resistance and durability, such as polyimide, polyethylene terephthalate (PET), polycarbonate, polyethylene napthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combinations thereof. In embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as a material for forming a first electrode 110.

The first electrode 110 may have a structure consisting of a single layer or a structure including multiple layers. For example, the first electrode 110 may have a three-layered structure of ITO/Ag/ITO.

[Organic Layer 130]

An organic layer 130 may be disposed on the first electrode 110. The organic layer 130 may include an emission layer 133.

The organic layer 130 may further include a first region 131 located between the first electrode 110 and the emission layer 133, for example, a hole transport region, and a second region 135 located between the emission layer 133 and the second electrode 150, for example, an electron transport region.

The organic layer 130 may further include an auxiliary layer 132 located between the first region 131 and the emission layer. The auxiliary layer 132 is the same as described above.

The organic layer 130 may further include, in addition to various organic materials, metal-containing compounds such as organometallic compounds, inorganic materials such as quantum dots, and the like.

In embodiments, the organic layer 130 may include two or more emitting units sequentially stacked between the first electrode 110 and the second electrode 150 and a charge generation layer between the two or more emitting units. When the organic layer 130 includes two or more emitting units and a charge generation layer as described above, the light-emitting device 10 may be a tandem light-emitting device.

[Hole Transport Region in Organic Layer 130]

The hole transport region may have a structure consisting of a layer consisting of a single material, a structure consisting of a layer consisting of different materials, or a multi-layered structure including layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers may be stacked from the first electrode 110 in its respective stated order.

The hole transport region may include a compound represented by Formula 201, a compound represented by Formula 202, or any combination thereof:

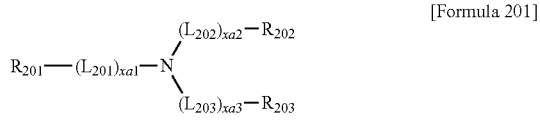

[Formula 201]

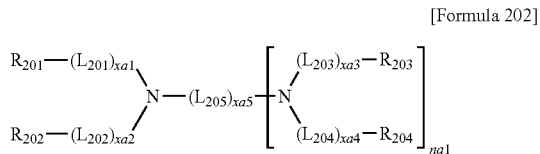

[Formula 202]

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In embodiments, each of Formulae 201 and 202 may include at least one of groups represented by Formulae CY201 to CY217.

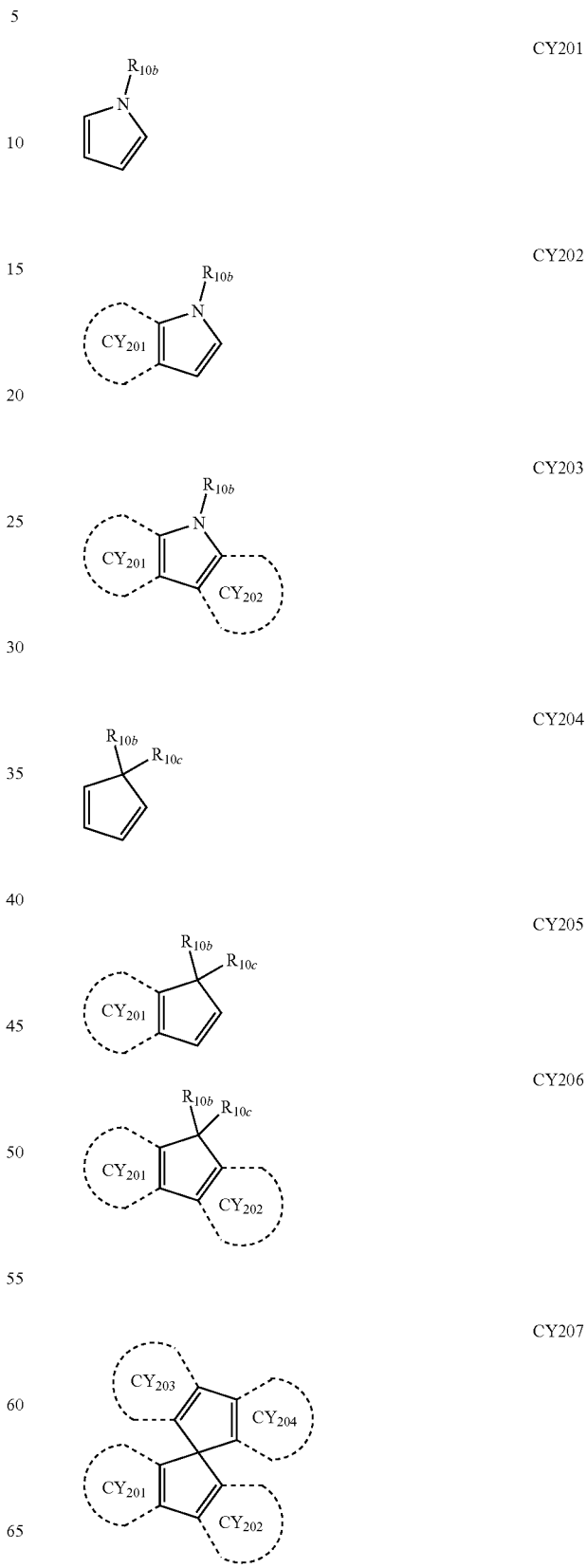

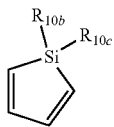

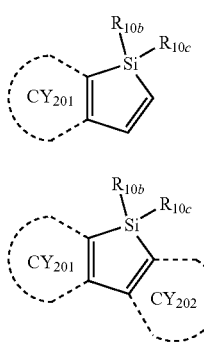

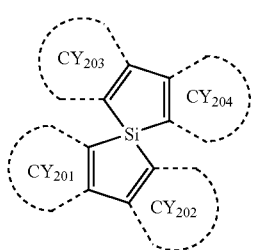

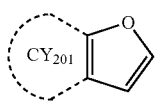

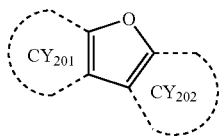

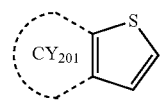

CY208

CY209

CY2010

CY211

CY212

CY213

CY214

CY215

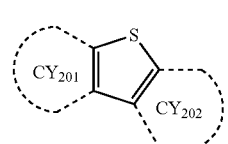

CY216

CY217

In Formulae CY201 to CY217, $R_{10b}$ and $R_{10c}$ may each independently be the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In embodiments, ring $CY_{201}$ to ring $CY_{204}$ in Formulae CY201 to CY217 may each independently be a benzene group, a naphthalene group, a phenanthrene group, or an anthracene group.

In embodiments, each of Formulae 201 and 202 may include at least one of groups represented by Formulae CY201 to CY203.

In embodiments, Formula 201 may include at least one of groups represented by Formulae CY201 to CY203 and at least one of groups represented by Formulae CY204 to CY217.

In embodiments, xa1 in Formula 201 may be 1, $R_{201}$ may be a group represented by one of Formulae CY201 to CY203, xa2 may be 0, and $R_{202}$ may be a group represented by one of Formulae CY204 to CY207.

In embodiments, each of Formulae 201 and 202 may not include a group represented by one of Formulae CY201 to CY203.

In embodiments, each of Formulae 201 and 202 may not include a group represented by one of Formulae CY201 to CY203, and may include at least one of groups represented by Formulae CY204 to CY217.

In embodiments, each of Formulae 201 and 202 may not include a group represented by one of Formulae CY201 to CY217.

In an embodiment, the hole transport region may include one of Compounds HT1 to HT44, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

71 HT1
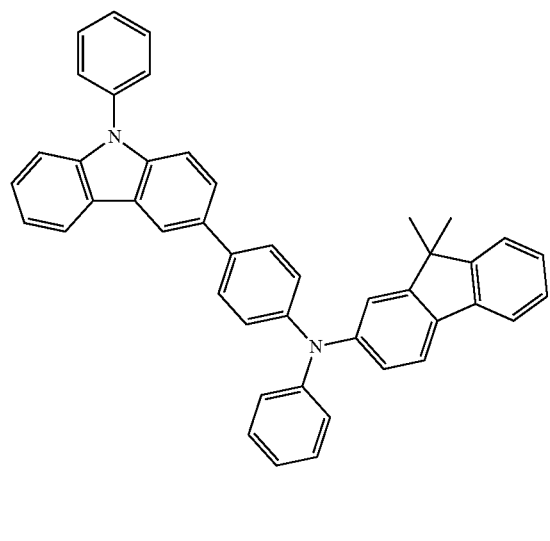
72 HT2
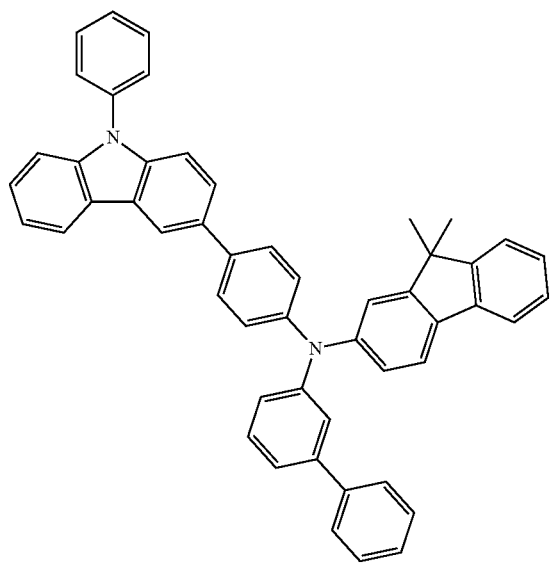
HT3
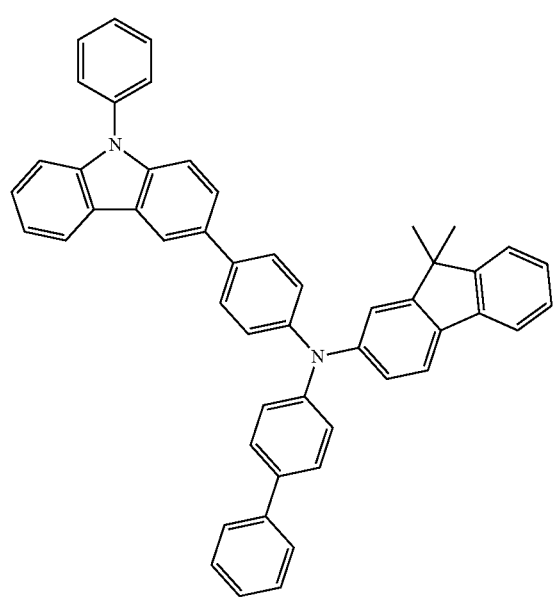
HT4
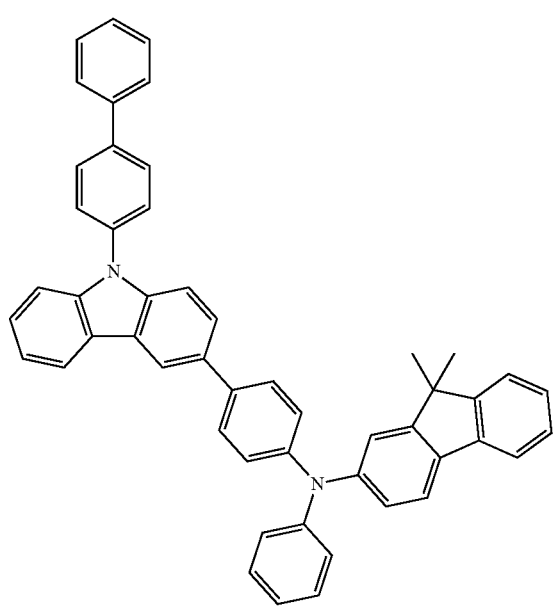

-continued
HT5
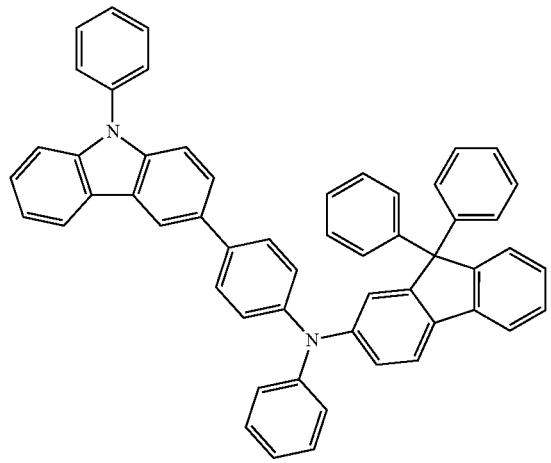
HT6
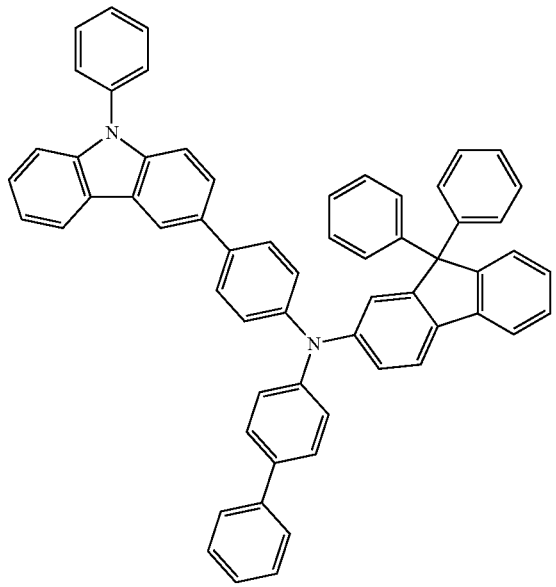
HT7
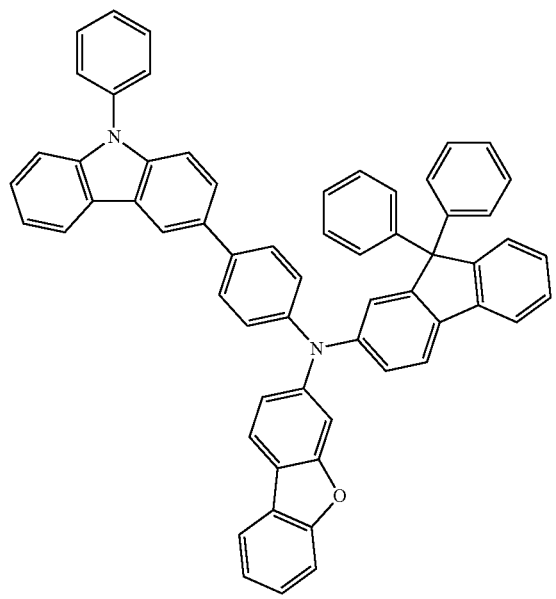
HT8
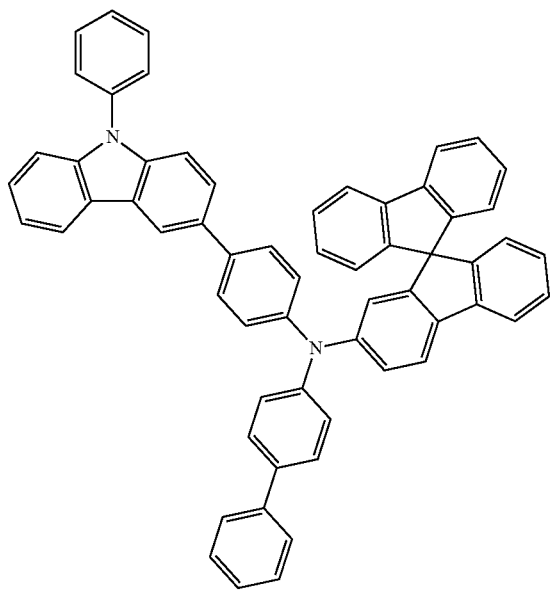

-continued
HT9
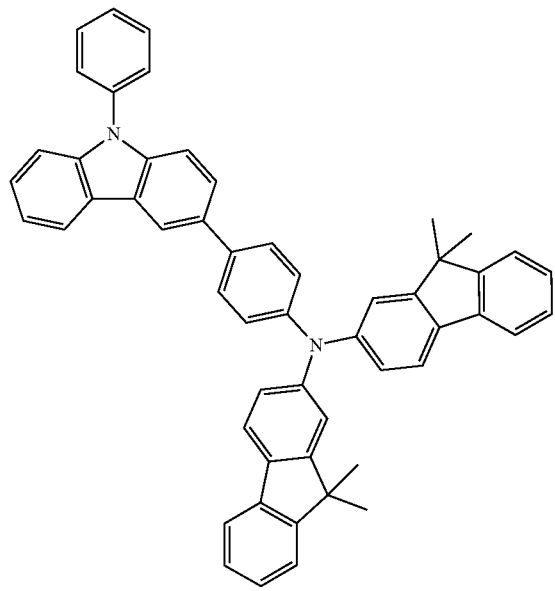
HT10
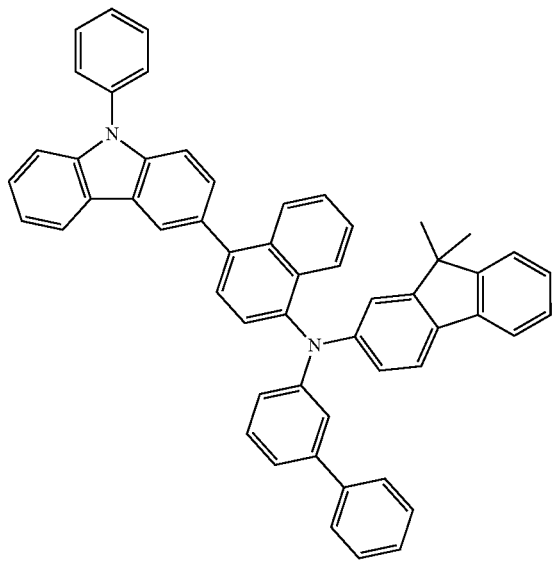
HT11
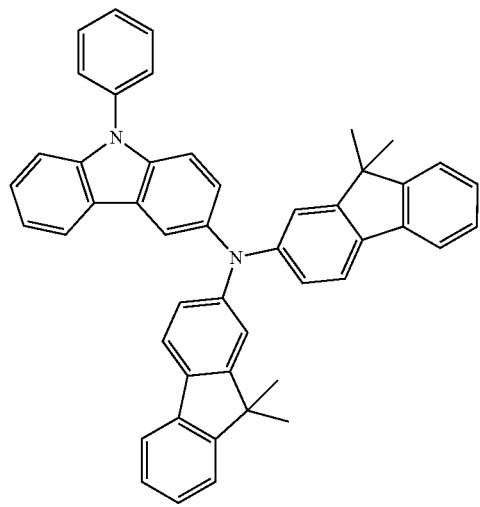
HT12
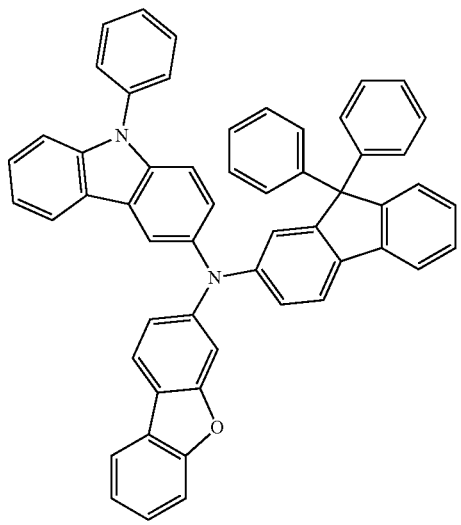

-continued
HT13
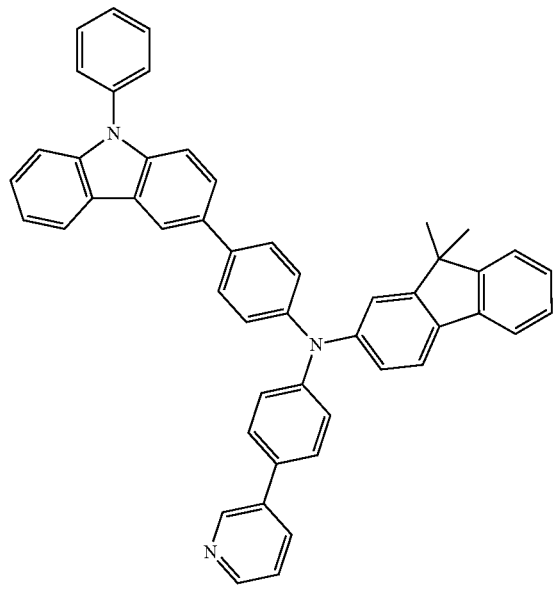
HT14
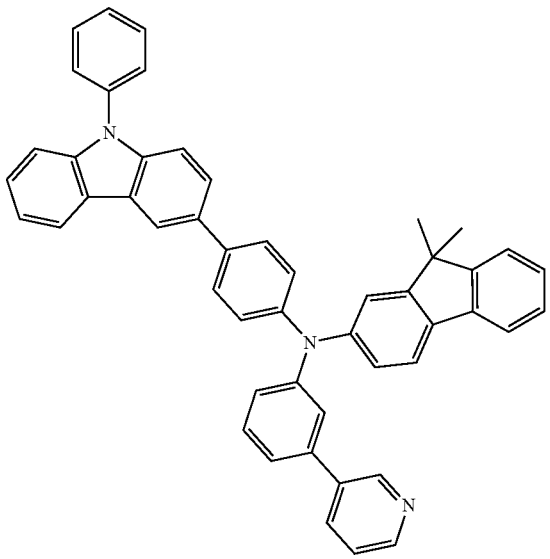
HT15
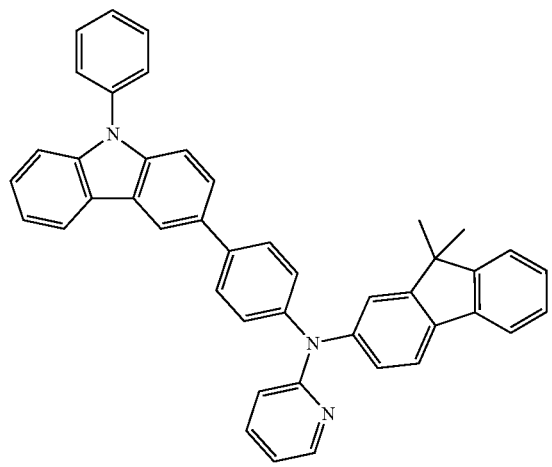
HT16
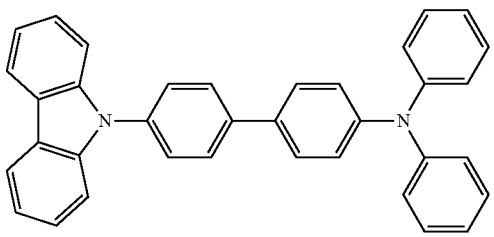
HT17
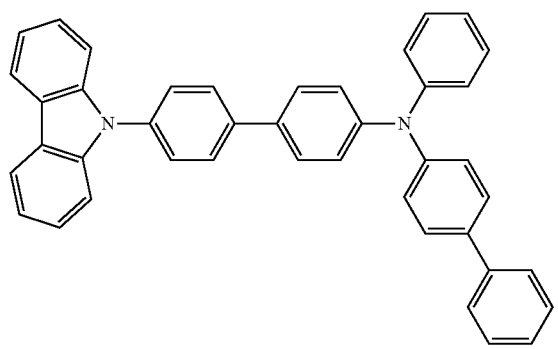
HT18
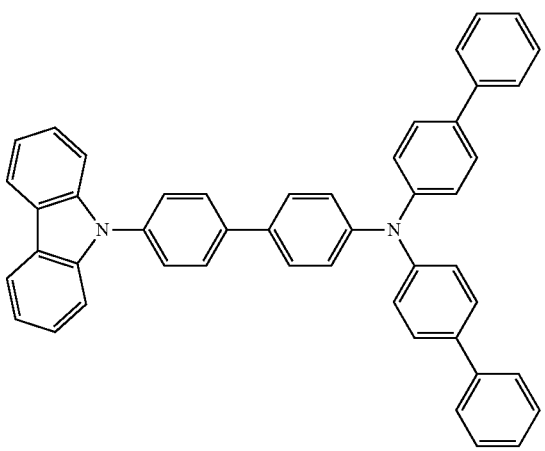

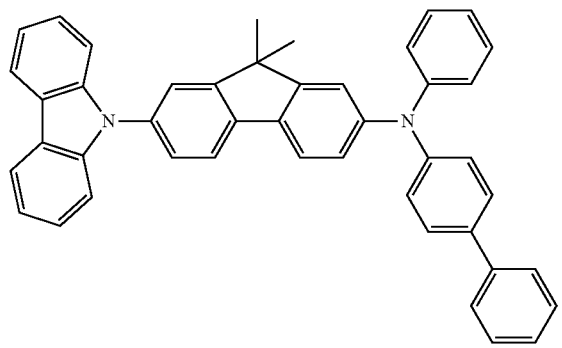
HT19
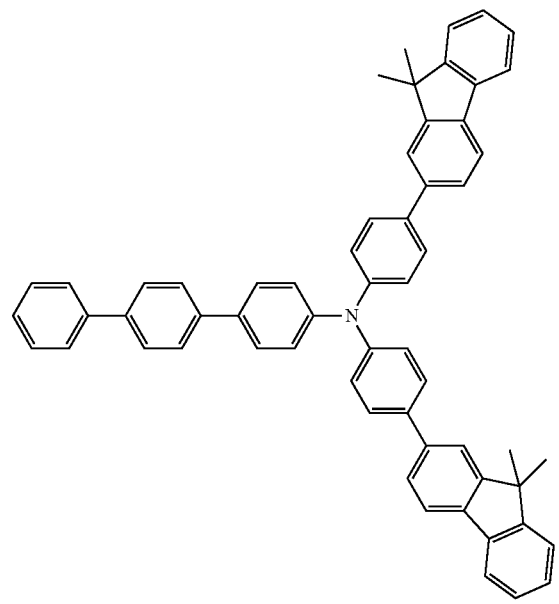
HT20
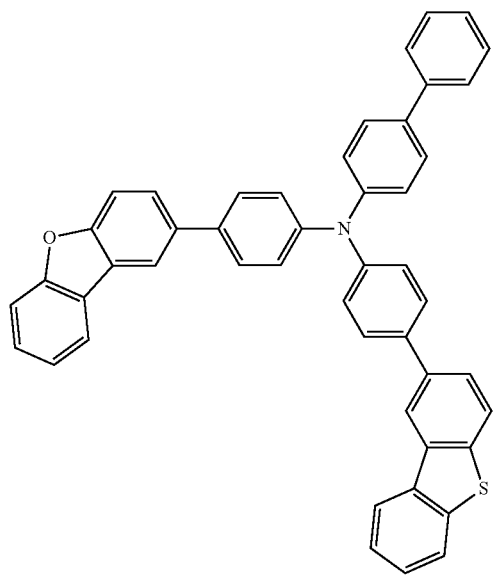
HT21
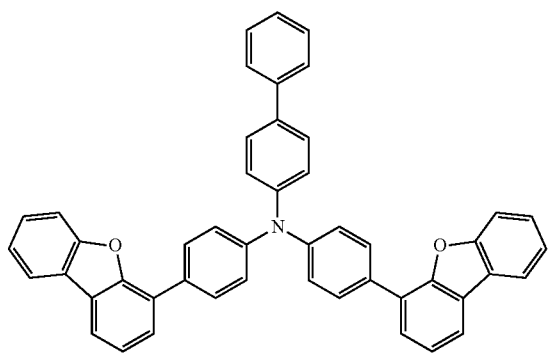
HT22

HT23
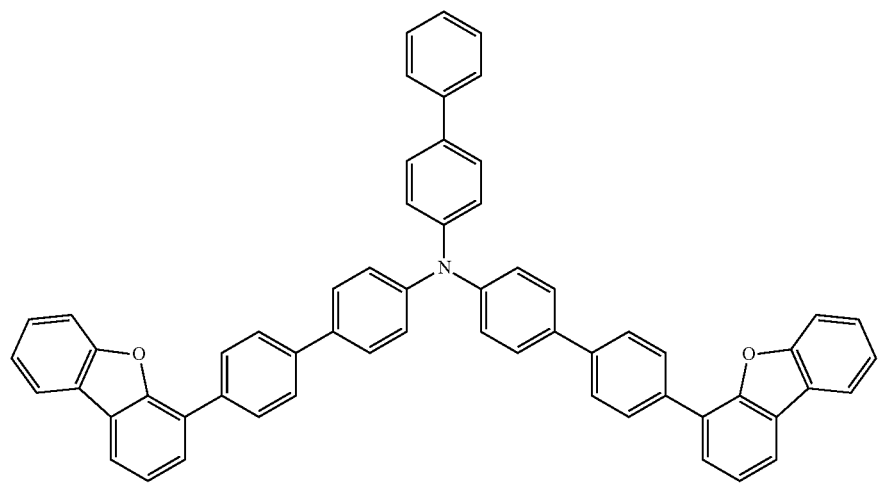
HT24
HT25
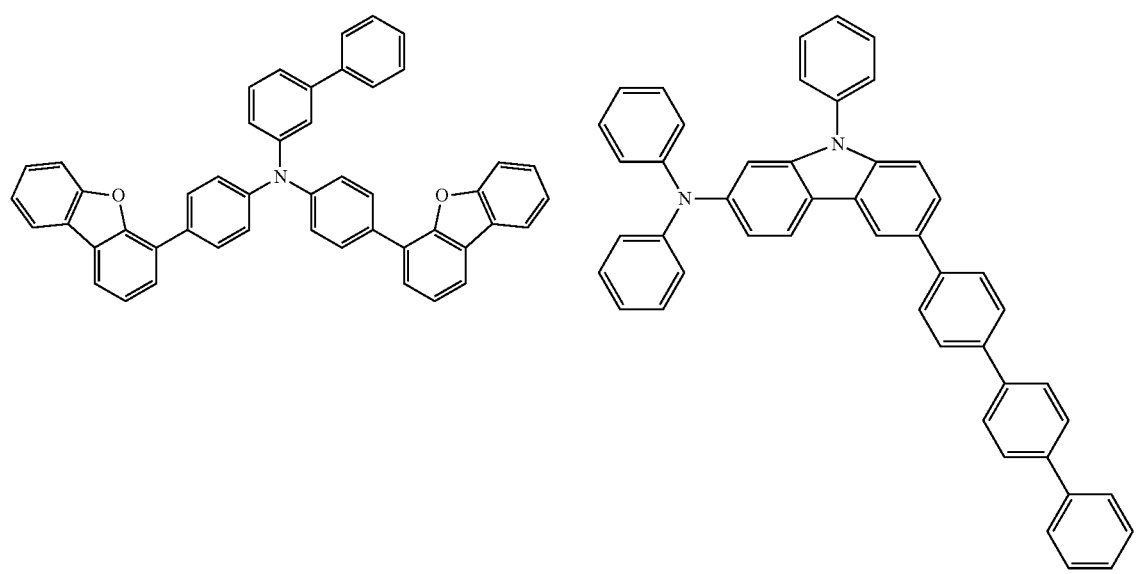
HT26
HT27
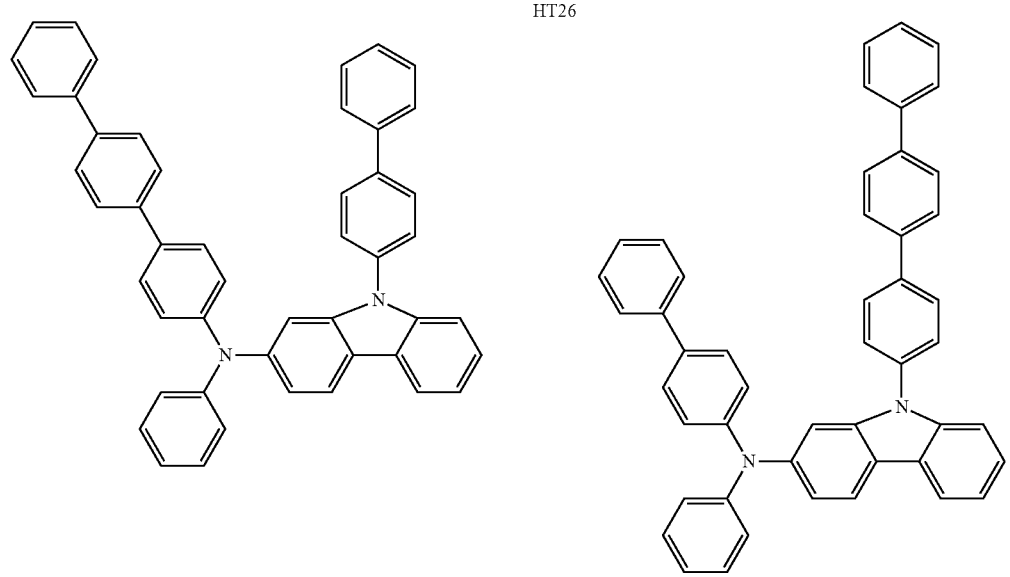

-continued
HT28
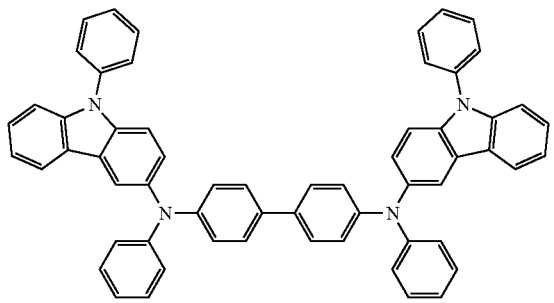
HT29
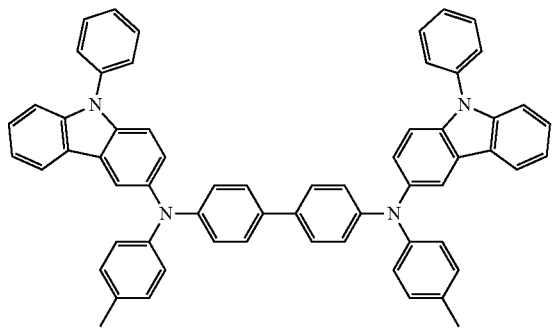
HT30
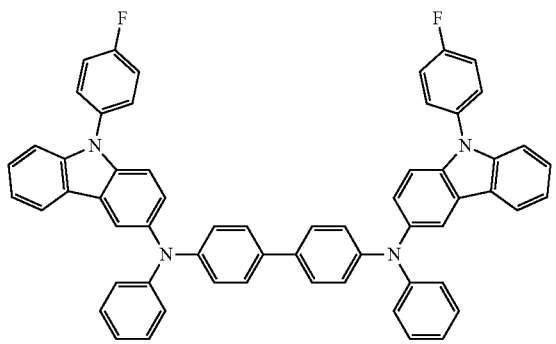
HT31
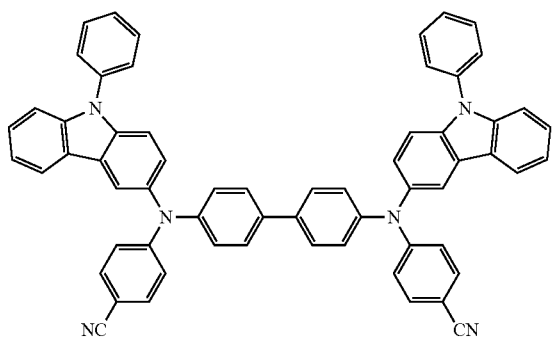
HT32
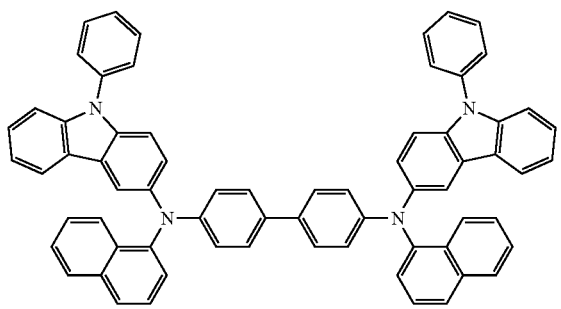
HT33
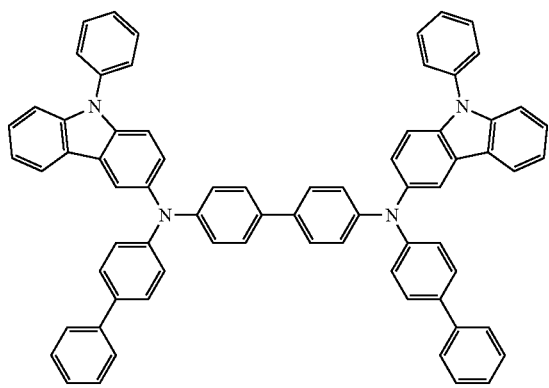
HT34
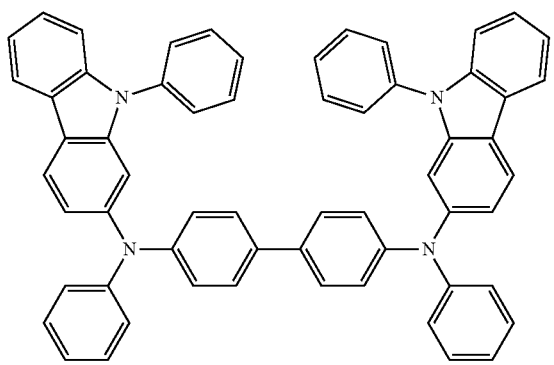
HT35
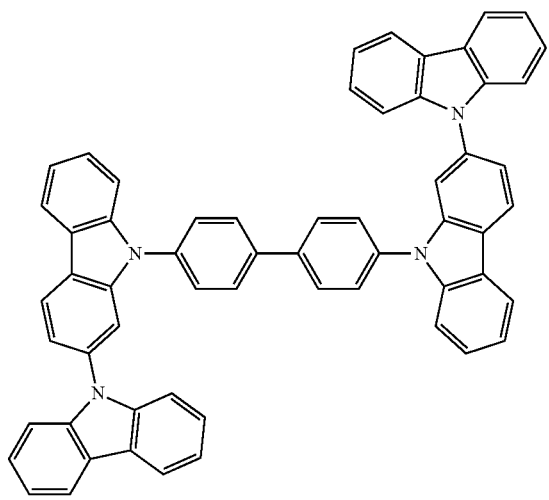

-continued
HT36
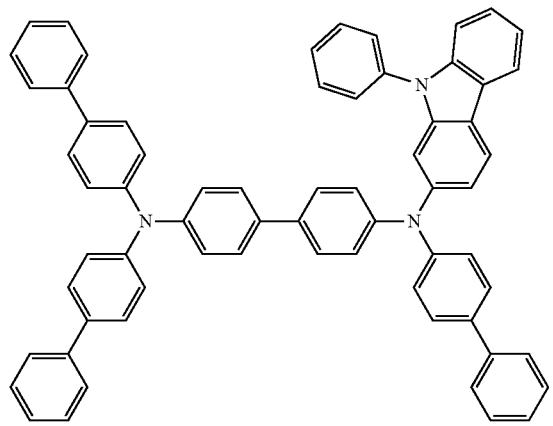
HT37
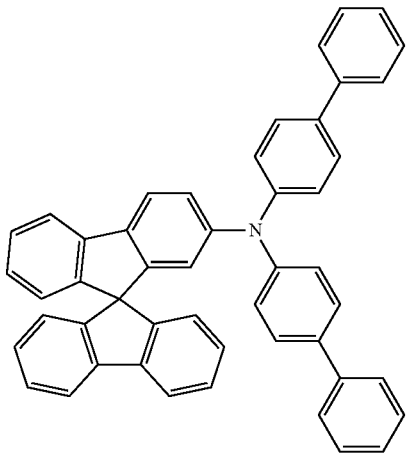
HT38
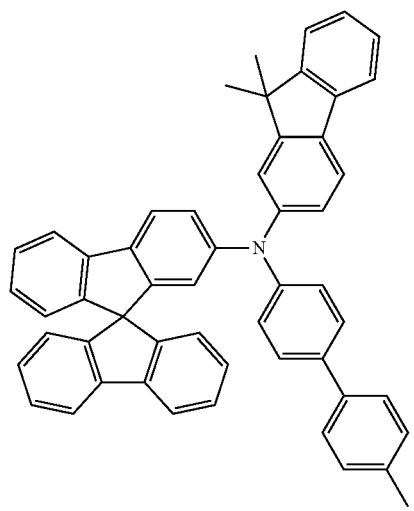
HT39
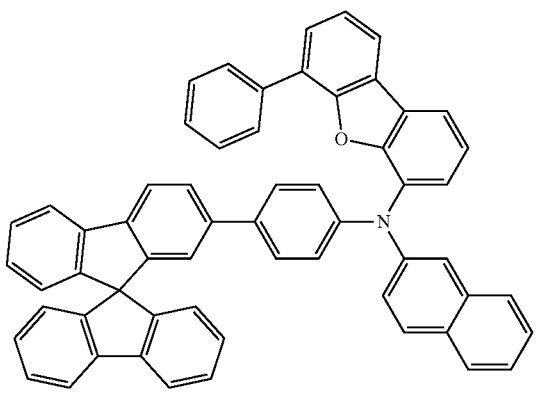
HT40
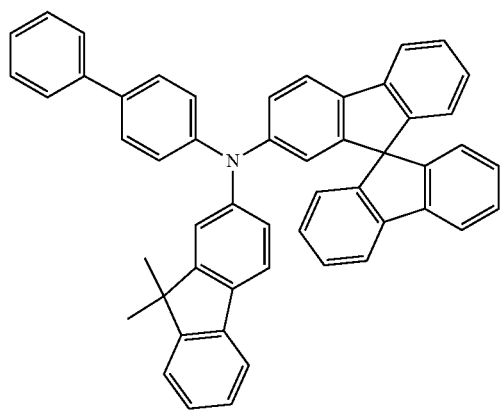
HT41
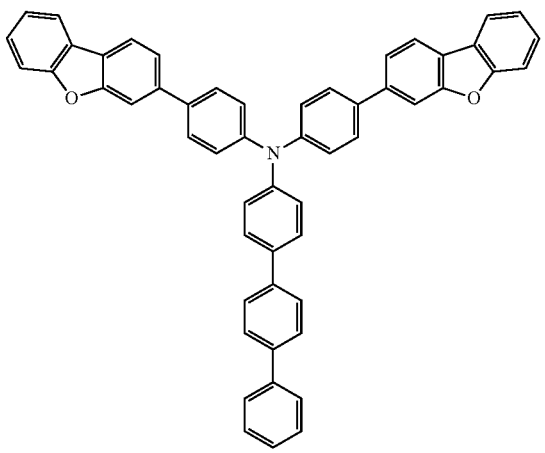

HT42
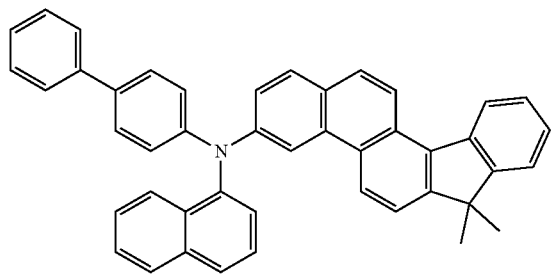
HT43
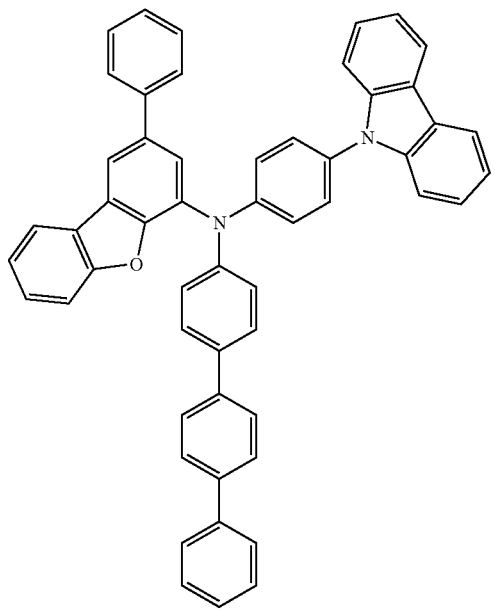
HT44
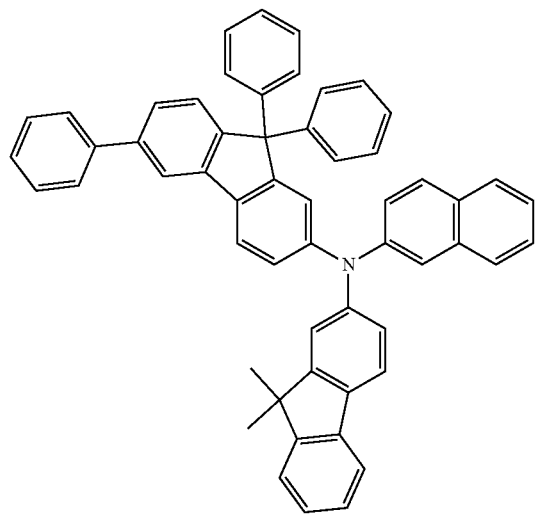

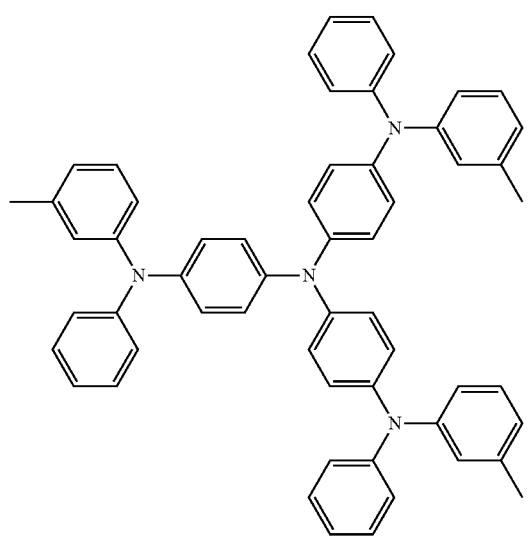
m-MTDATA
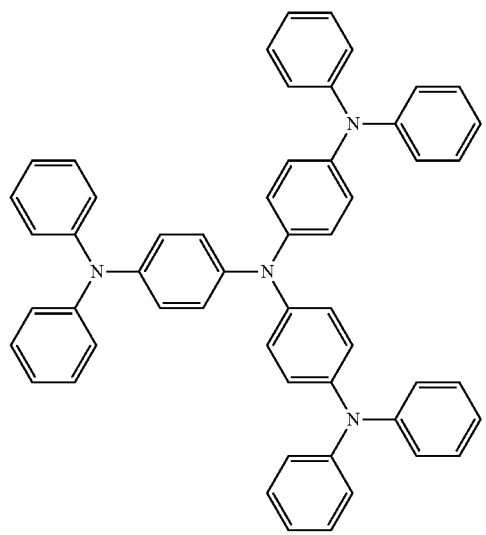
TDATA
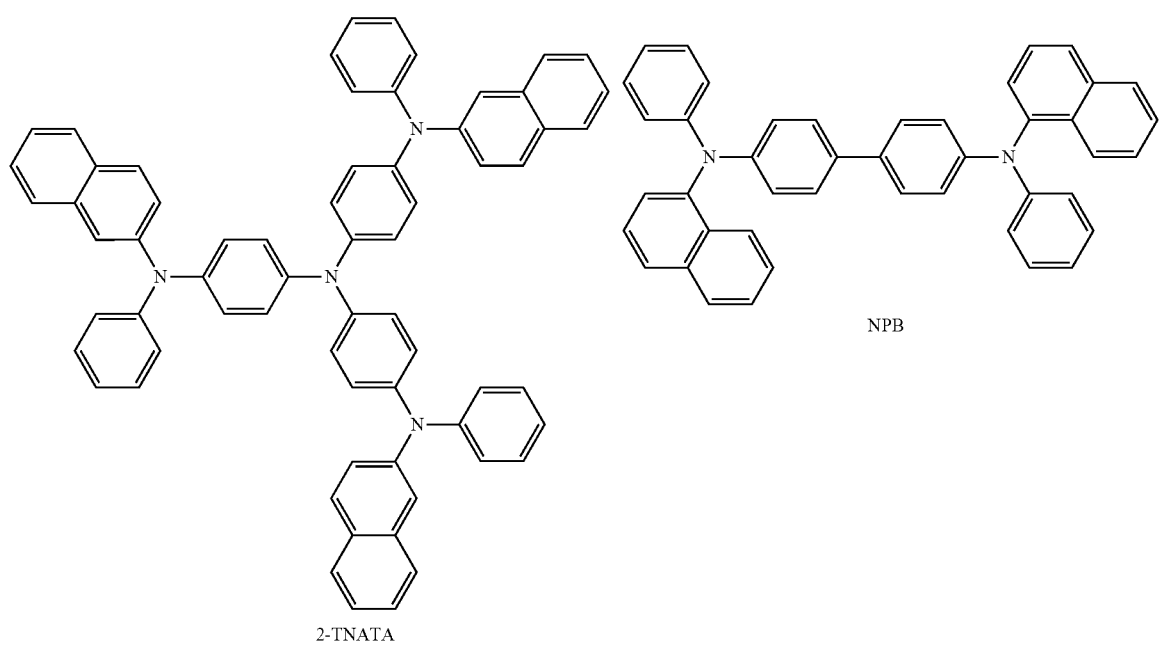
2-TNATA
NPB
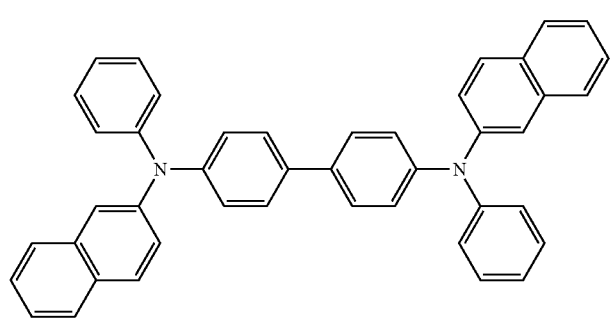
β-NPB

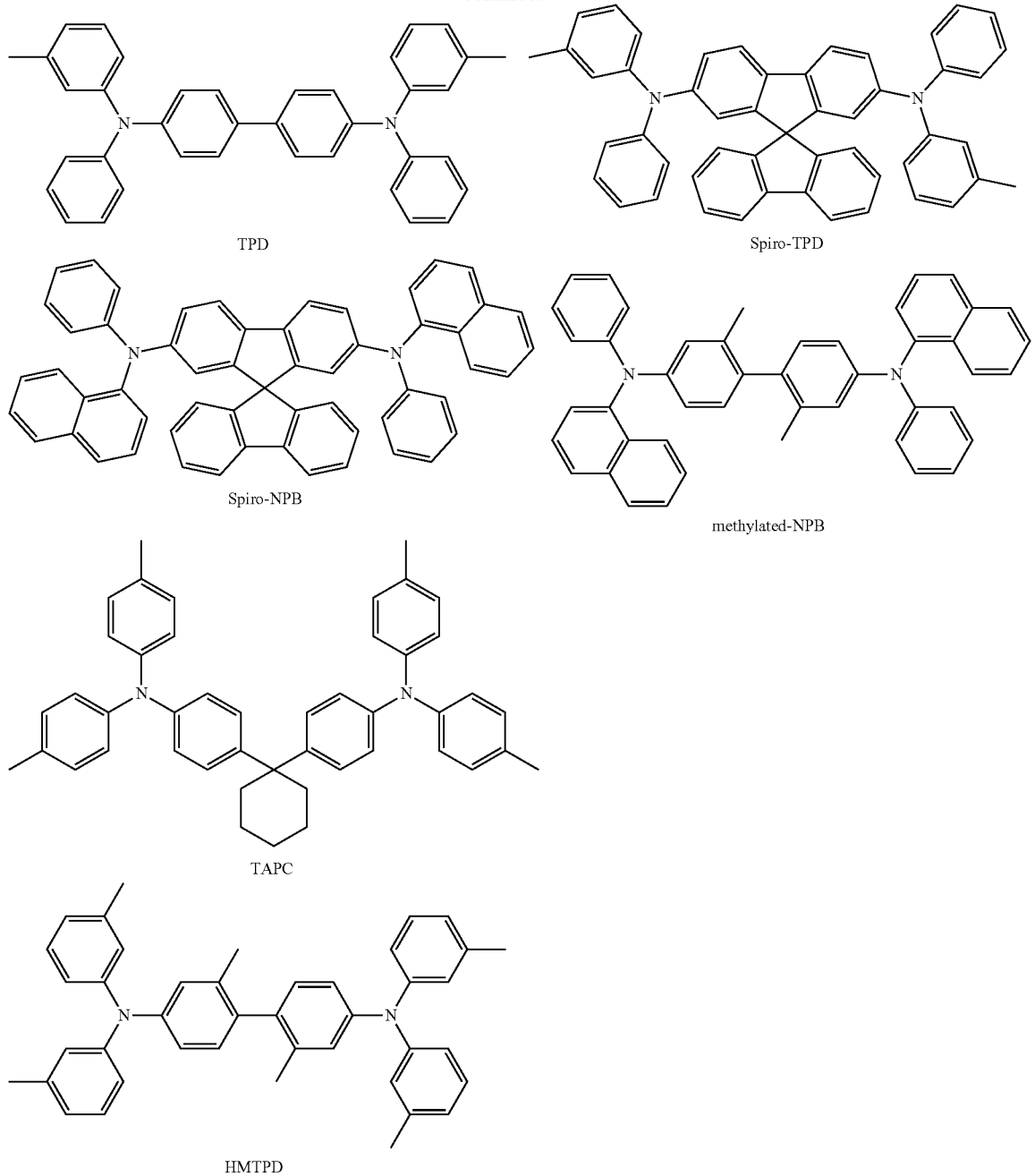

A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of 100 Å to about 1,000 Å. For example, the thickness of the hole transport layer may be in a range of about 100 Å to about 1,500 Å. When the thicknesses of the hole transport region, the hole injection layer and the hole transport layer are within these ranges, satisfactory hole transporting characteristics may be obtained without a substantial increase in driving voltage.

The emission auxiliary layer may increase light-emission efficiency by compensating for an optical resonance distance according to a wavelength of light emitted by an emission layer 133, and the electron blocking layer may block the flow of electrons from an electron transport region. The emission auxiliary layer and the electron blocking layer may include the materials as described above.

[p-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

In embodiments, a lowest unoccupied molecular orbital (LUMO) energy level of the p-dopant may be equal to or less than about −3.5 eV.

In embodiments, the p-dopant may include a quinone derivative, a cyano group-containing compound, a compound containing element EL1 and element EL2, or any combination thereof.

Examples of the quinone derivative may include TCNQ, F4-TCNQ, etc.

Examples of the cyano group-containing compound may include HAT-CN, and a compound represented by Formula 221 below.

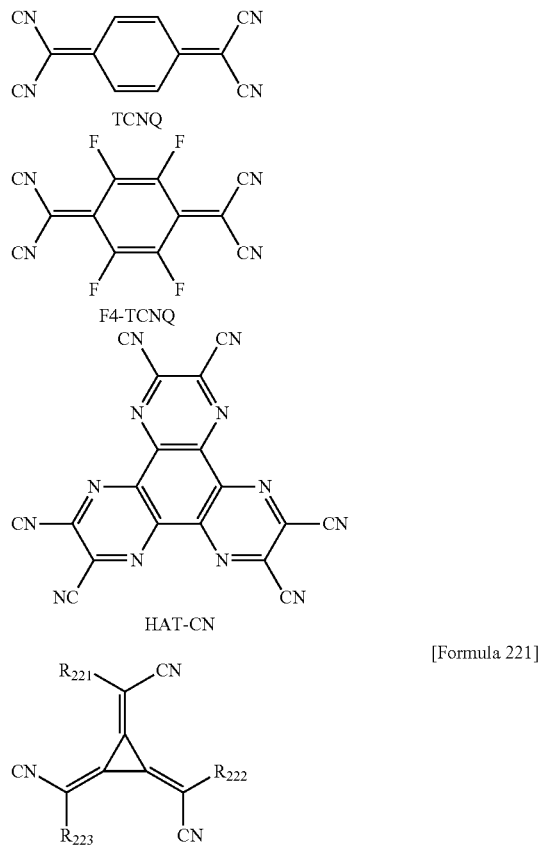

[Formula 221]

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or any combination thereof, and element EL2 may be a non-metal, a metalloid, or any combination thereof.

Examples of the metal may include an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and a halogen (for example, F, Cl, Br, I, etc.).

In embodiments, examples of the compound containing element EL1 and element EL2 may include a metal oxide, a metal halide (for example, metal fluoride, metal chloride, metal bromide, or metal iodide), a metalloid halide (for example, metalloid fluoride, metalloid chloride, metalloid bromide, or metalloid iodide), a metal telluride, or any combination thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide may include zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, and $SmI_3$.

An example of the metalloid halide may include antimony halide (for example, $SbCl_5$, etc.).

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

[Emission Layer 133 in Organic Layer 130]

When the organic light-emitting device 10 is a full-color light-emitting device, the emission layer 133 may be patterned into a red emission layer, a green emission layer, and/or a blue emission layer, according to a subpixel. In embodiments, the emission layer 133 may have a stacked structure of two or more layers of a red emission layer, a green emission layer, and a blue emission layer, in which the two or more layers may contact each other or may be separated from each other. In embodiments, the emission layer may include two or more materials of a red light-emitting material, a green light-emitting material, and a blue light-emitting material, in which the two or more materials are mixed with each other in a single layer to emit white light.

The emission layer 133 may be the same as described above. Thus, the emission layer 133 may include the first compound, the second compound, the third compound, and the fourth compound; the first compound may be a hole transporting host compound; the second compound may be an electron transporting host compound or a bipolar host compound; and the third compound may be a TADF compound or an organometallic complex.

The emission layer 133 may further include a host, a dopant, a quantum dot, a delayed fluorescence material, which will be described layer, or any combination thereof.

A thickness of the emission layer 133 may be in a range of about 100 Å to about 1,000 Å. For example, the thickness of the emission layer 133 may be in a range of about 200 Å to about 600 Å. When the thickness of the emission layer 133 is within these ranges, excellent light emission characteristics may be obtained without a substantial increase in driving voltage.

[Host]

The host may include a compound represented by Formula 301 below:

$$[Ar_{301}]_{xb11}-[(L_{301})_{xb1}-R_{301}]_{xb21} \quad \text{[Formula 301]}$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ may each independently be the same as described in connection with $Q_1$.

For example, when xb11 in Formula 301 is 2 or more, two or more of $Ar_{301}$(s) may be linked to each other via a single bond.

In embodiments, the host may include a compound represented by Formula 301-1, a compound represented by Formula 301-2, or any combination thereof:

[Formula 301-1]

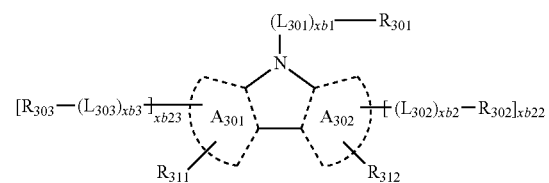

Formula 301-2

-continued

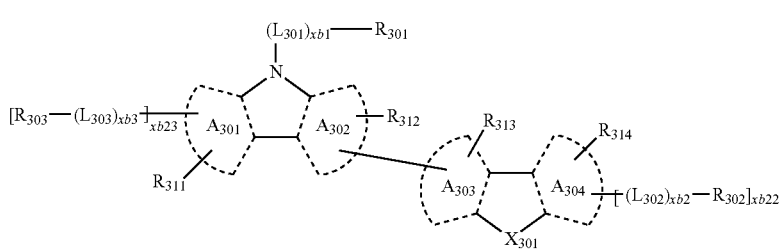

[Formula 301-2]

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], $C(R_{304})(R_{305})$, or $Si(R_{304})(R_{305})$, xb22 and xb23 may each independently be 0, 1, or 2, $L_{301}$, xb1, and $R_{301}$ may each respectively be the same as described in connection with $L_{301}$, xb1, and $R_{301}$ as provided in the specification, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$ in the specification.

In embodiments, the host may include an alkaline earth-metal complex. In embodiments, the host may include a Be complex (for example, Compound H55), an Mg complex, a Zn complex, or any combination thereof.

In embodiments, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), 3,3-di(9H-carbazol-9-yl)biphenyl (mCBP), or any combination thereof:

H1

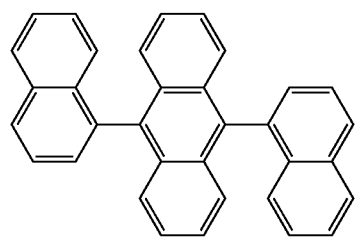

H2

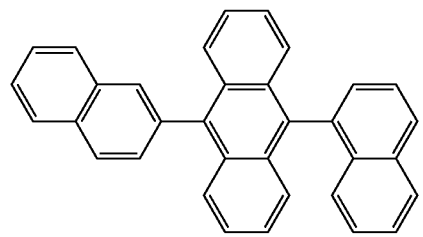

H3

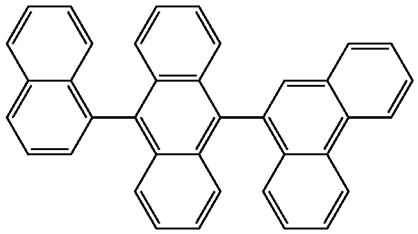

H4

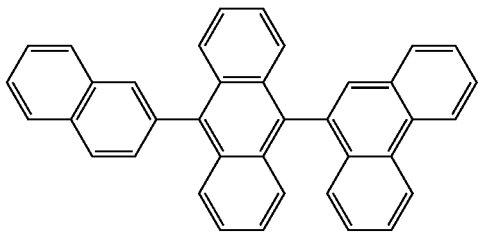

H5

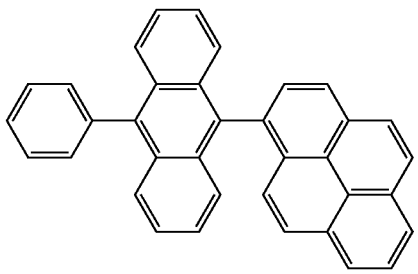

H6

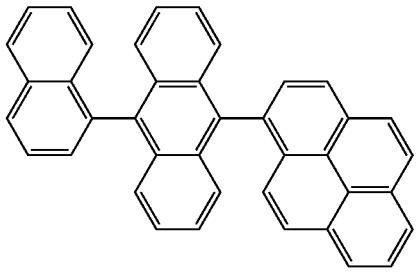

H7

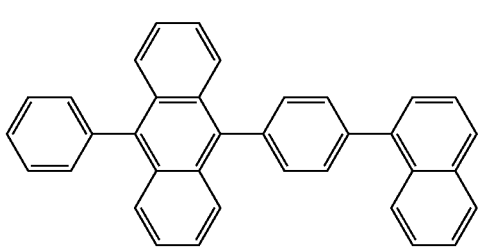

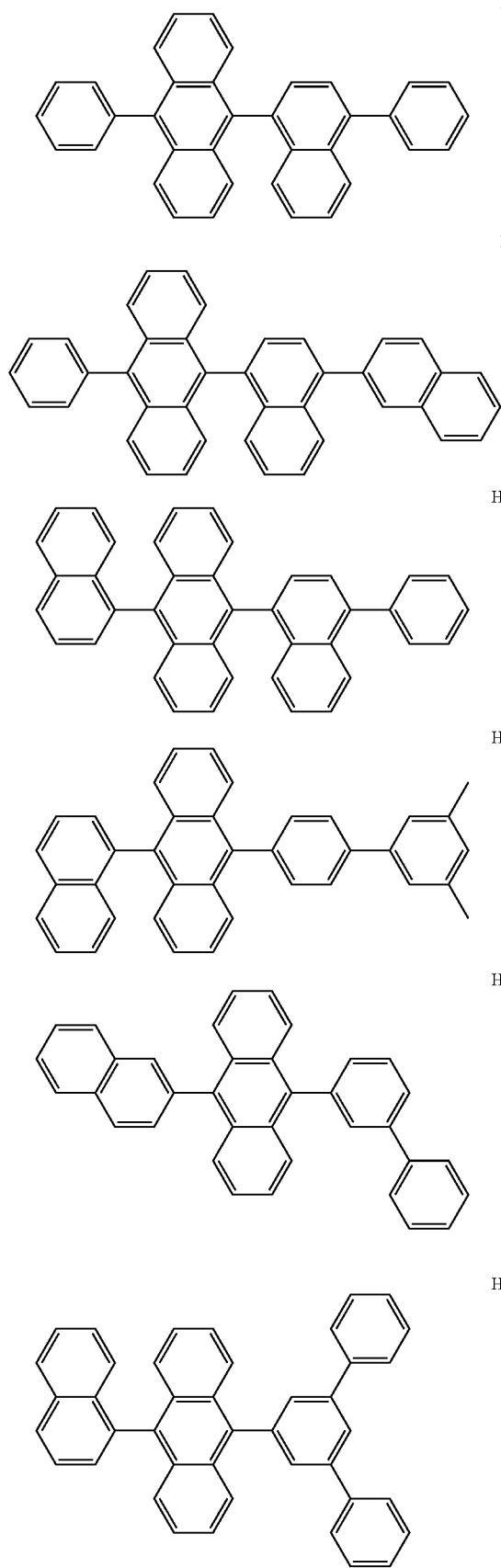
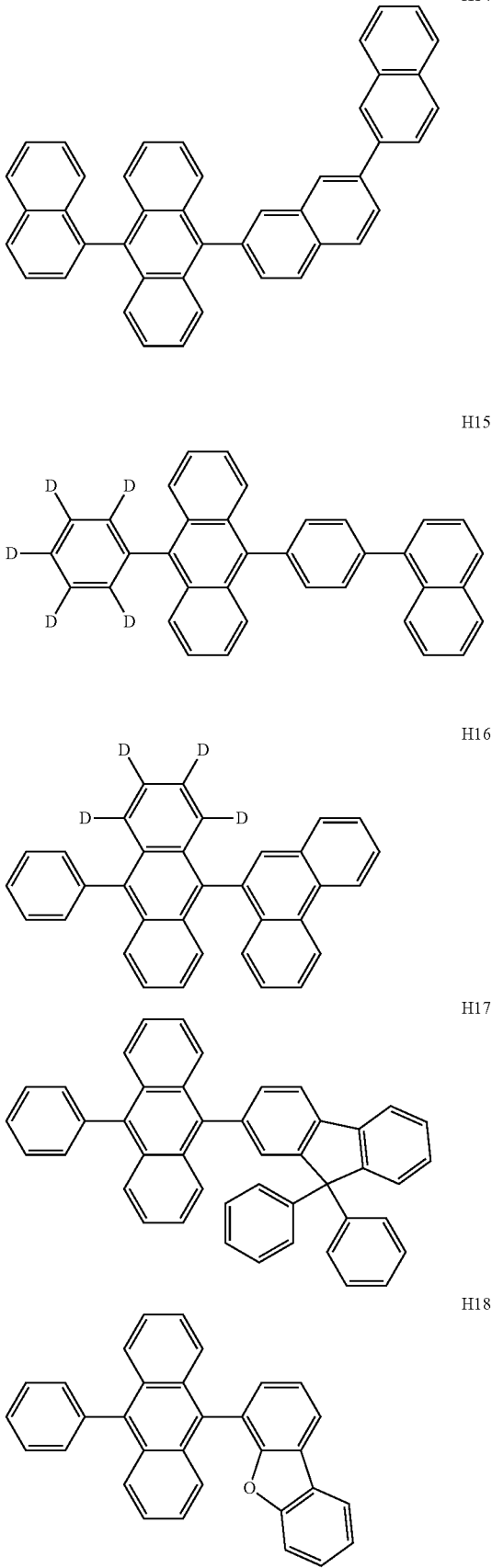

H19
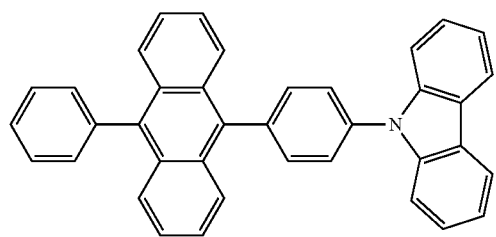
H20
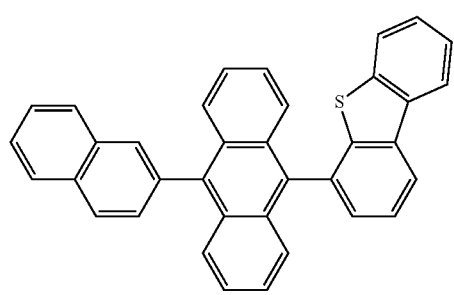
H21
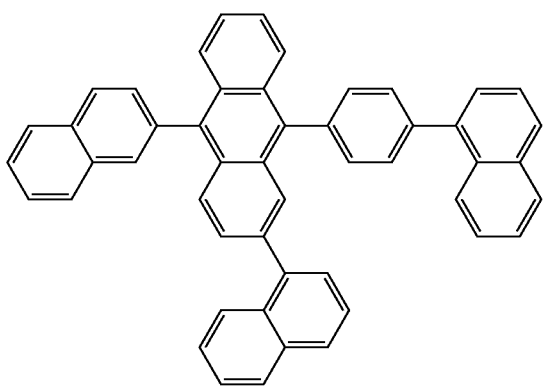
H22
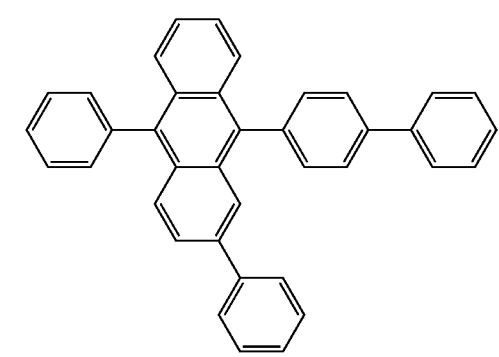
H23
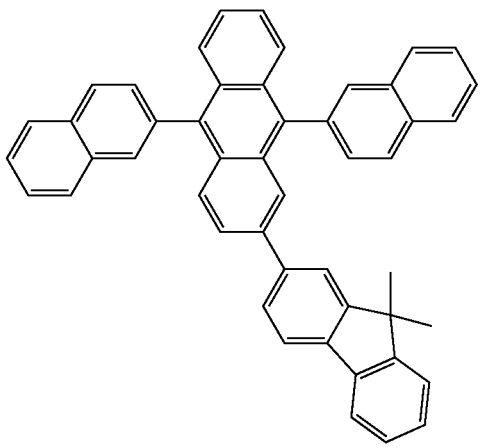
H24
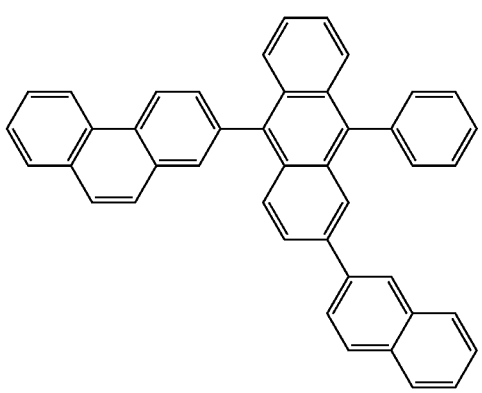
H25
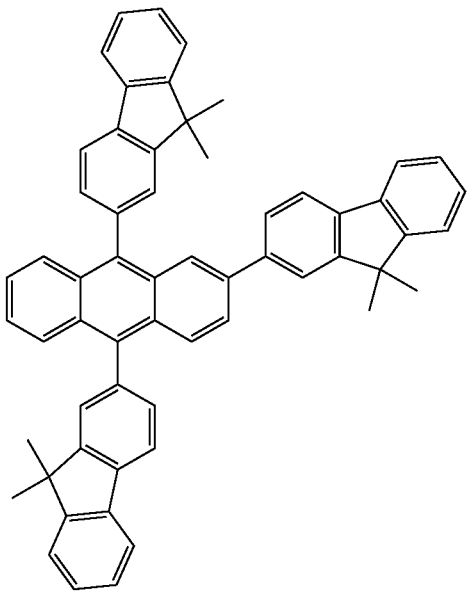

103
-continued
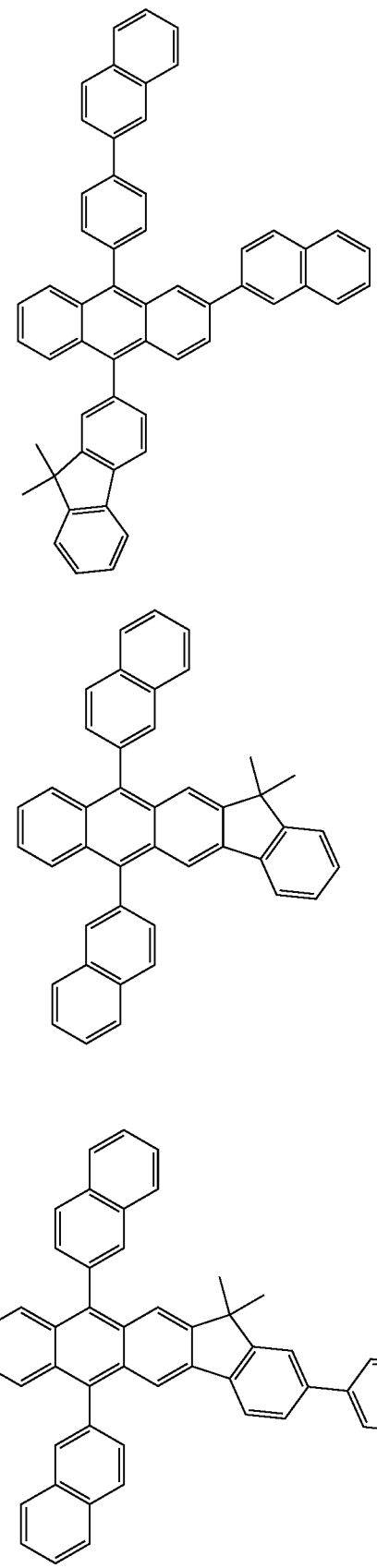
H26
H27
H28
104
-continued
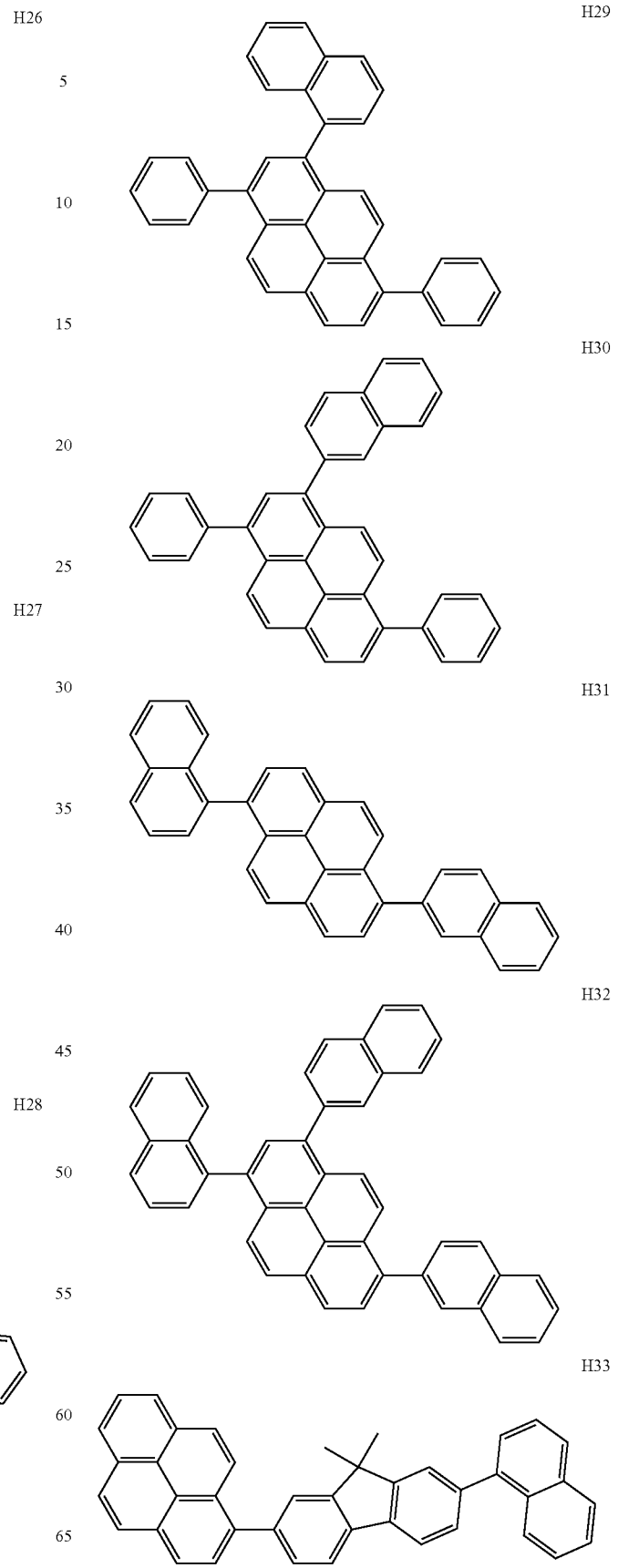
H29
H30
H31
H32
H33

-continued
H34
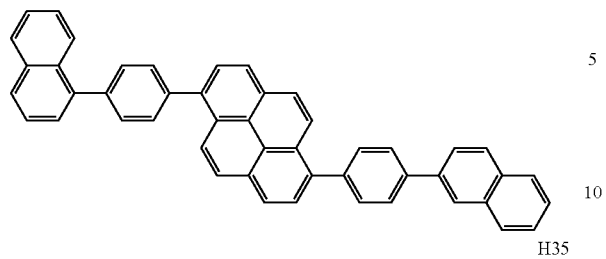
H35
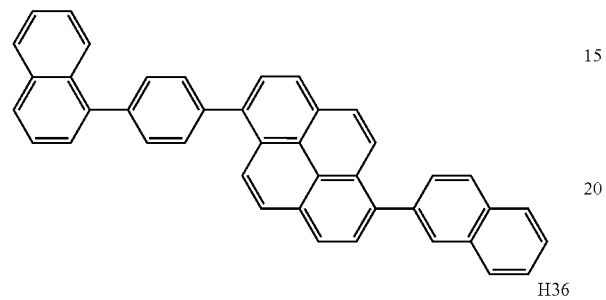
H36
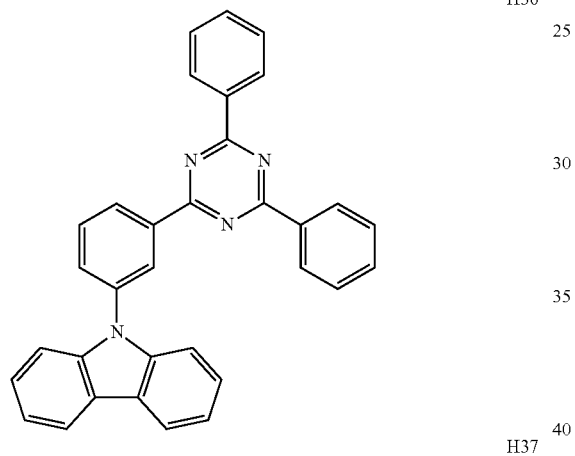
H37
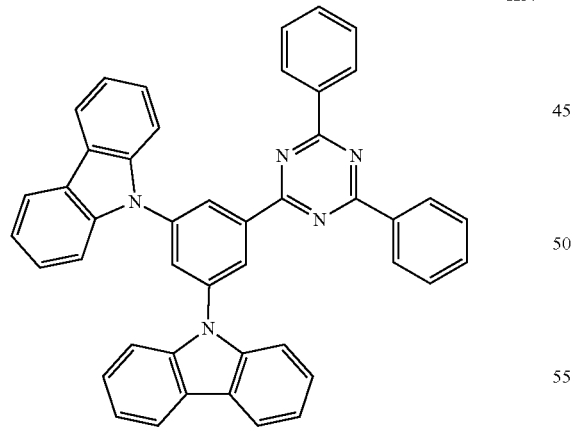
H38
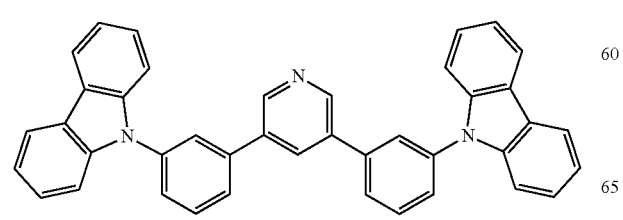
-continued
H39
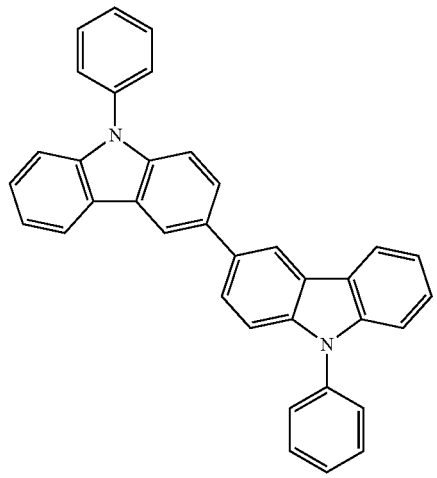
H40
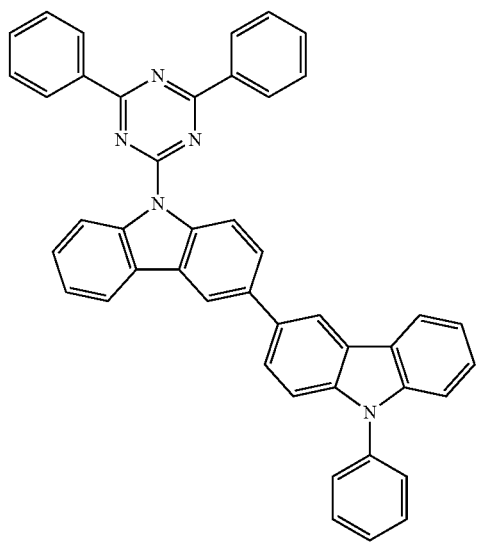
H41
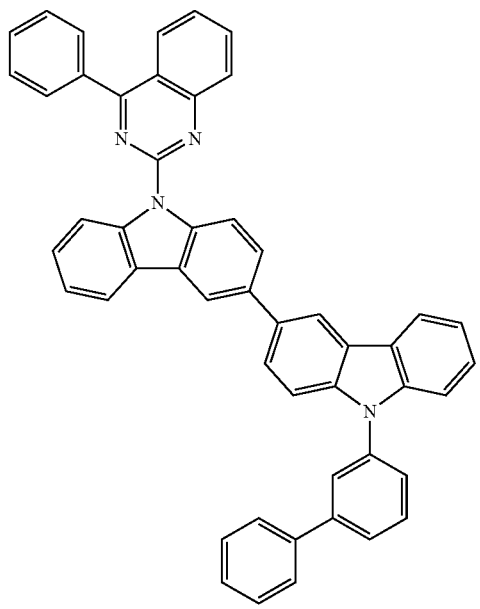

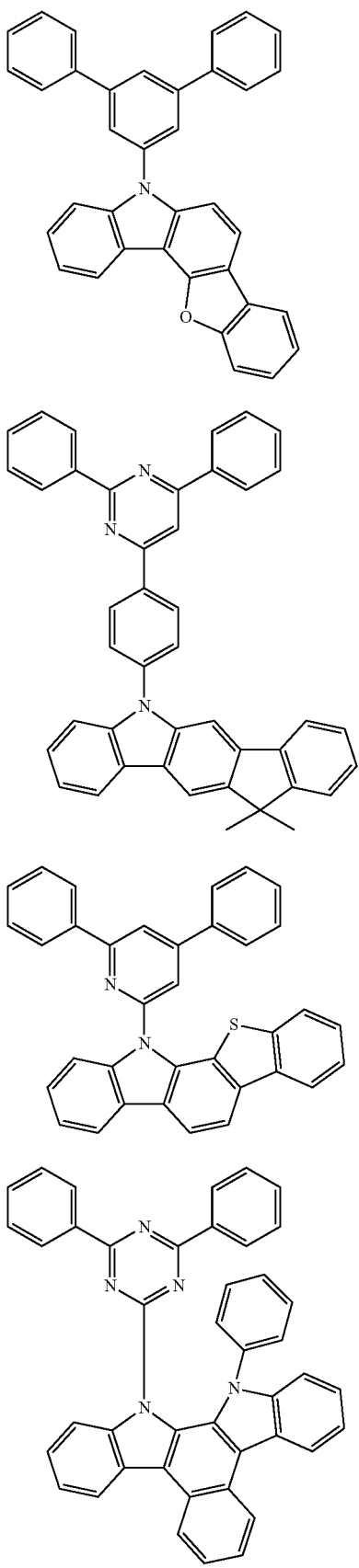

H52
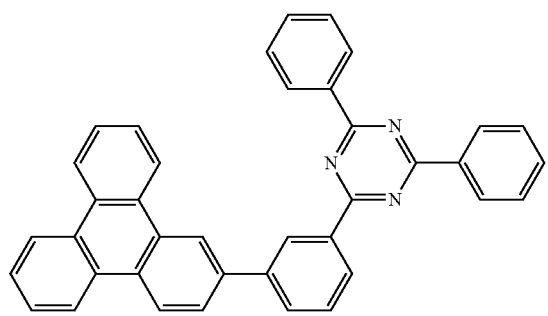
H53
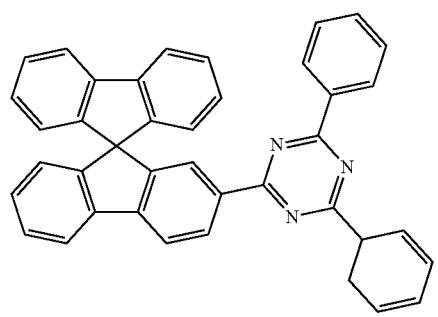
H54
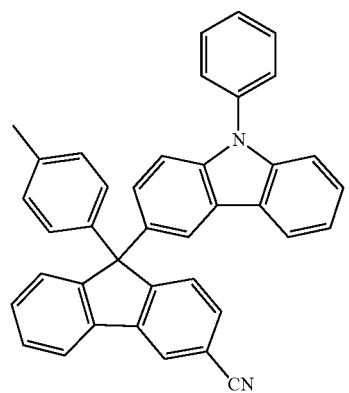
H55
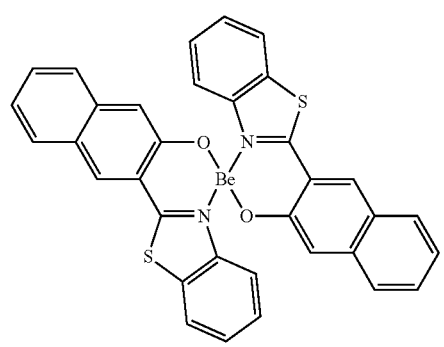
H56
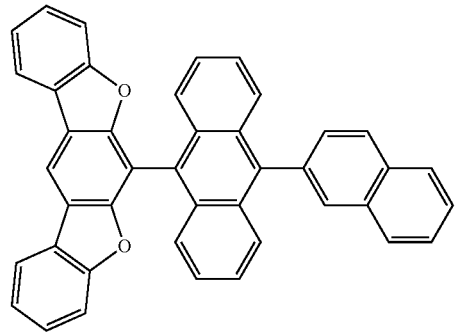
H57
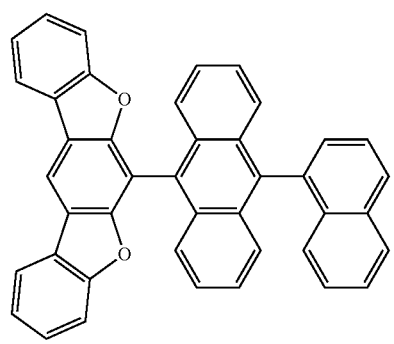
H58
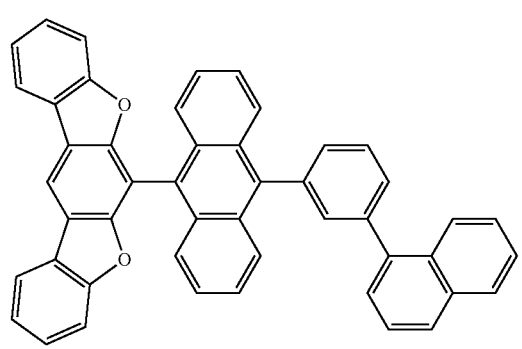
H59

H60
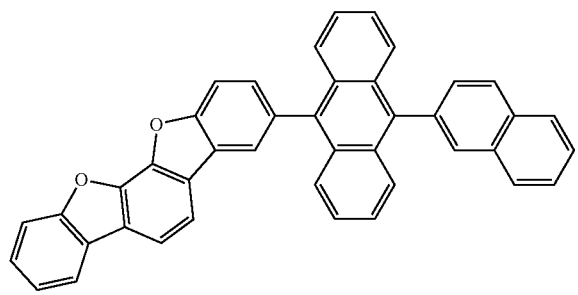
H61
H62
H63
H64
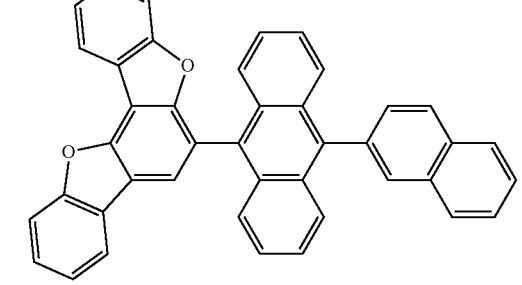
H65
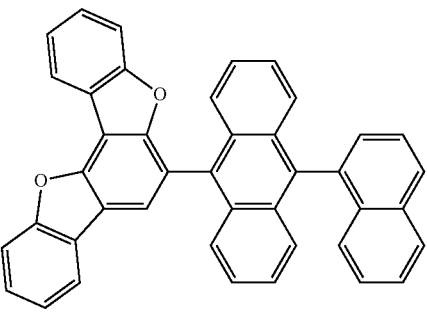
H66
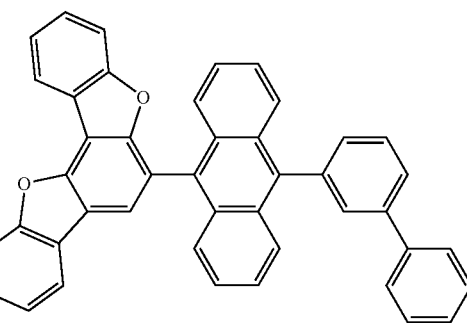
H67
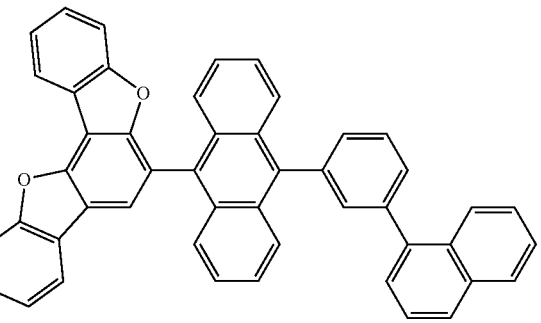
H68
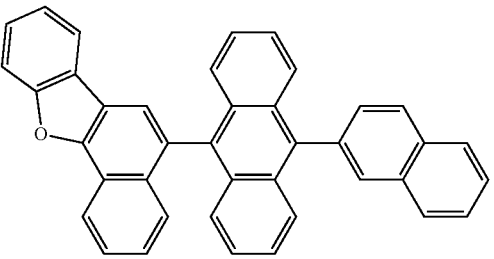
H69
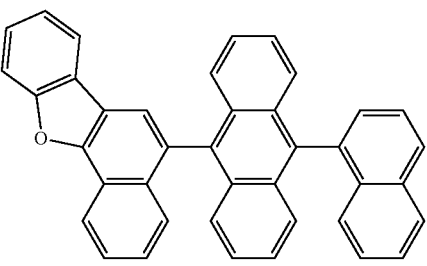

H70
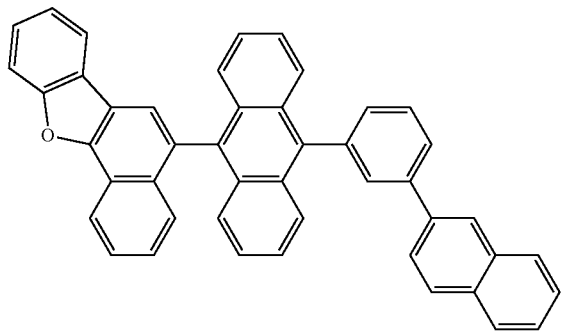
H71
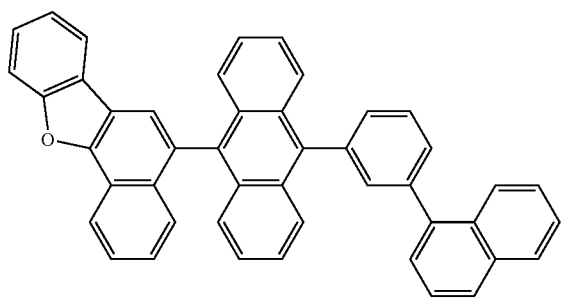
H72
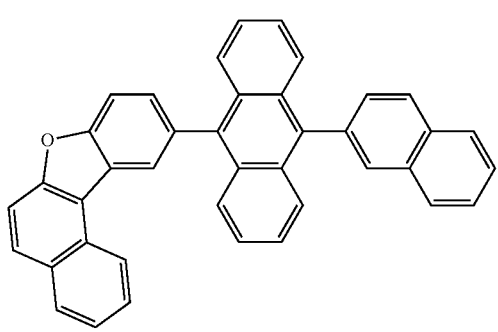
H73
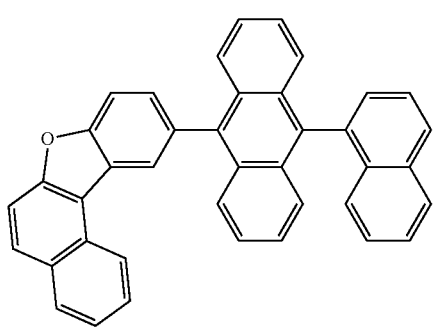
H74
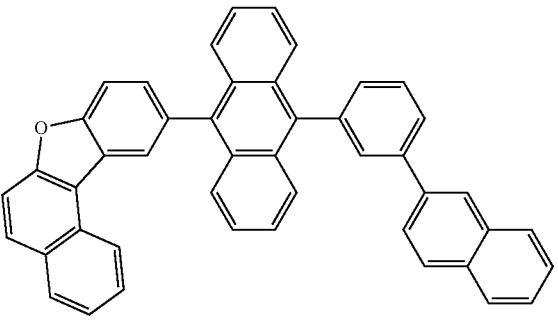
H75
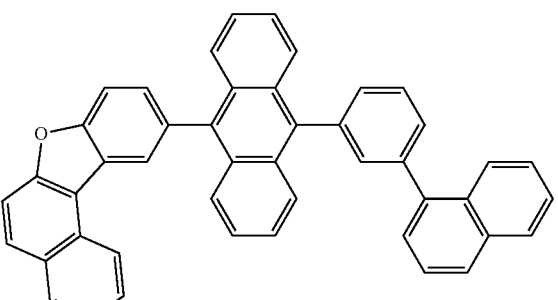
H76
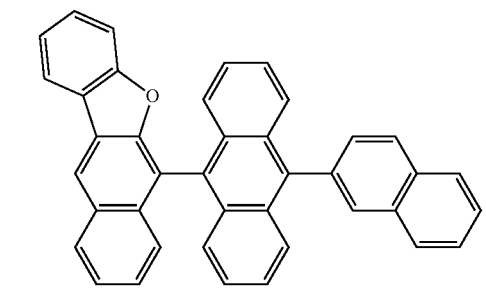
H77
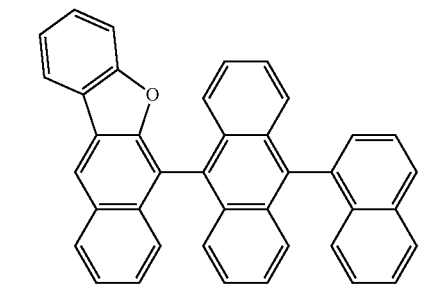
H78
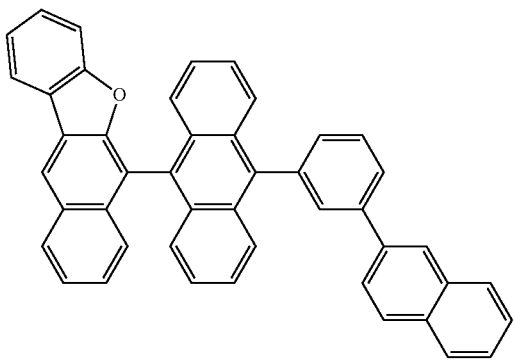

H79
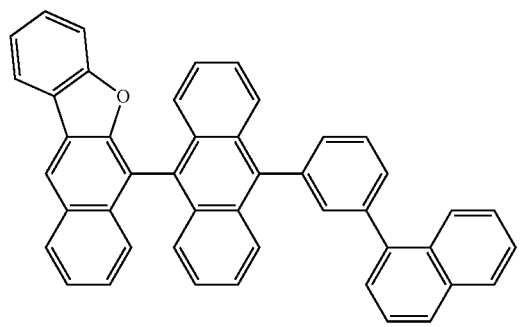
H80
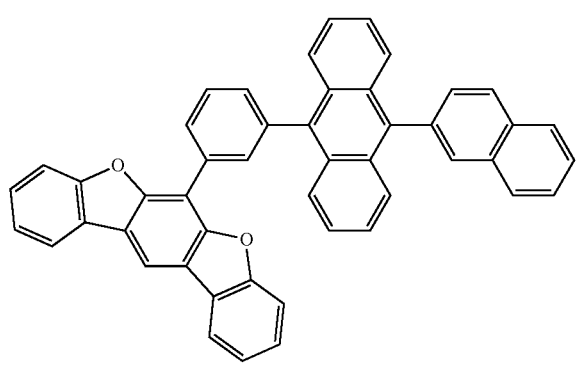
H81
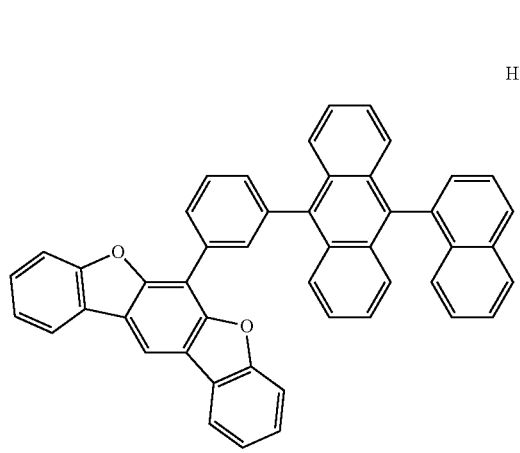
H82
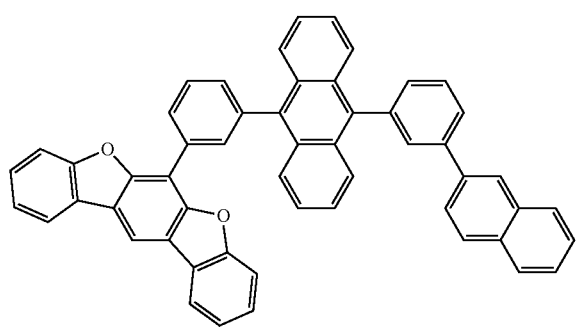
H83
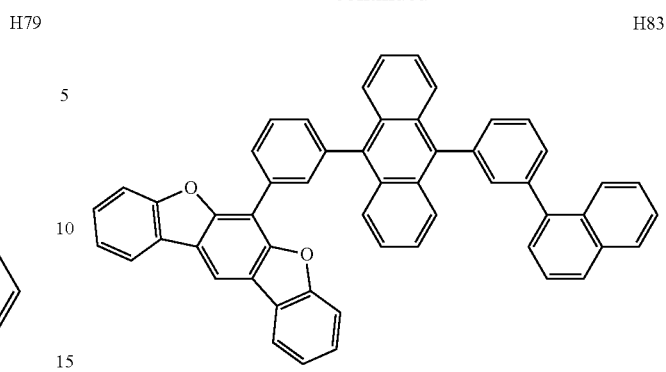
H84
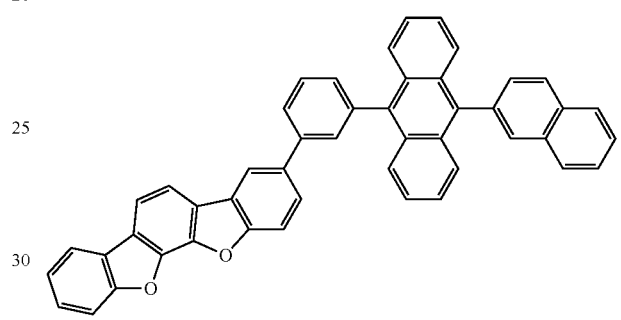
H85
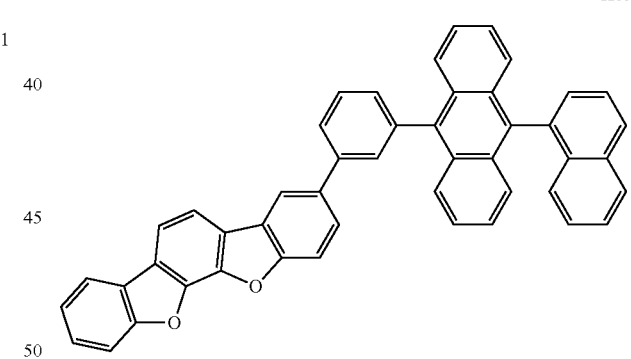
H86
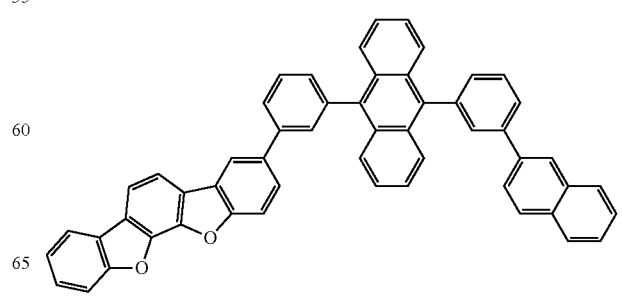

H87
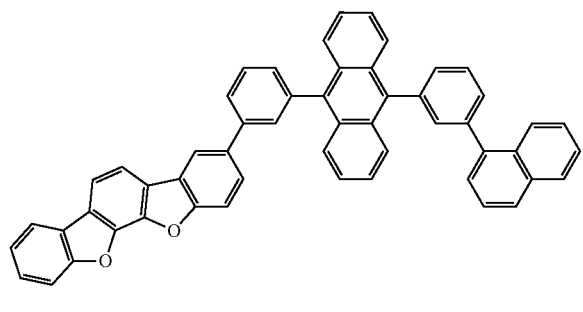
H88
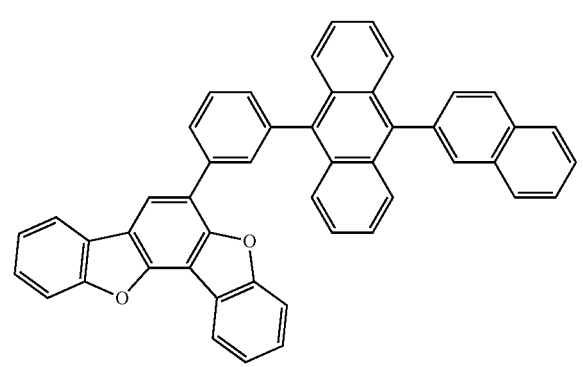
H89
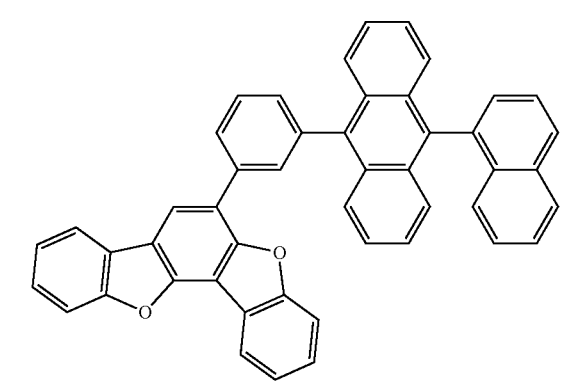
H90
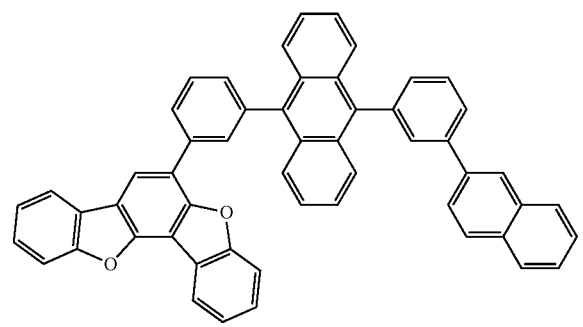
H91
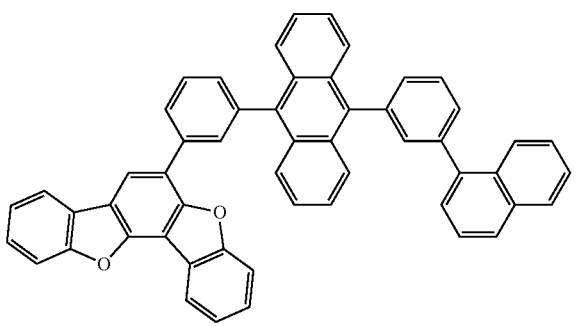
H92
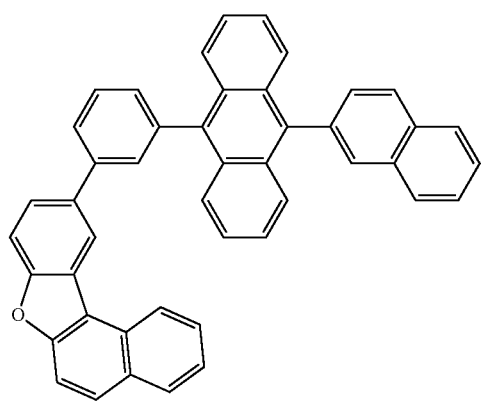
H93
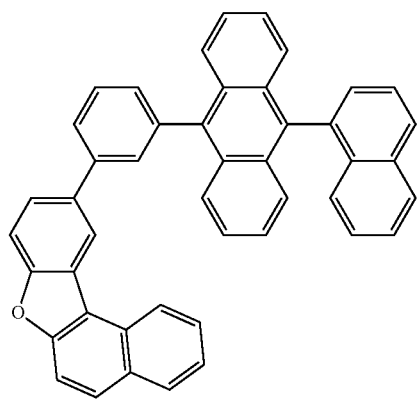
H94
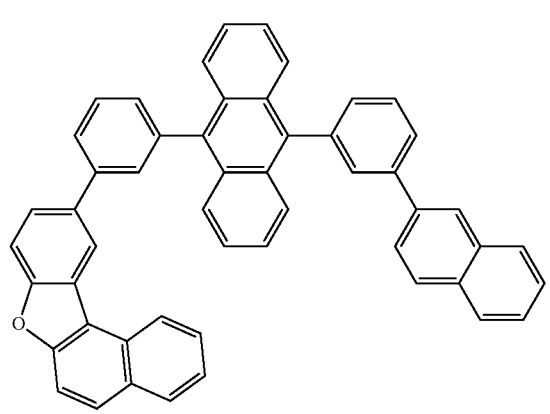

-continued
H95
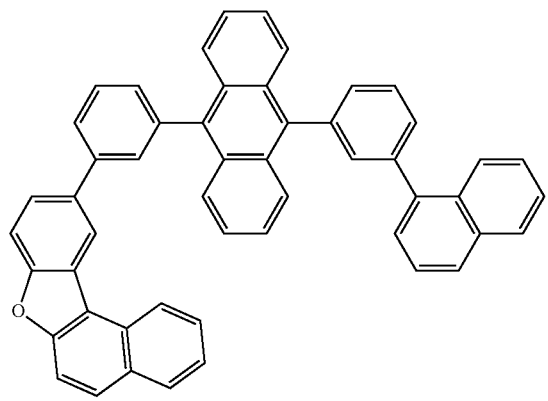
H96
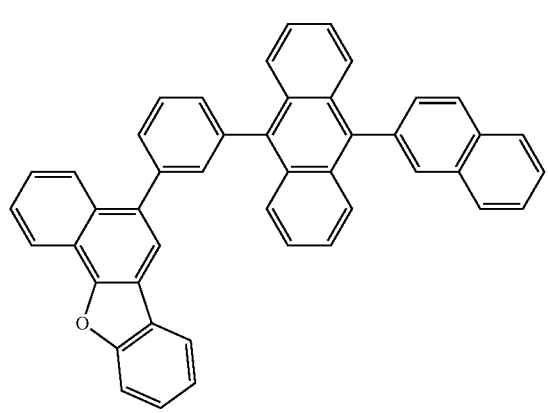
H97
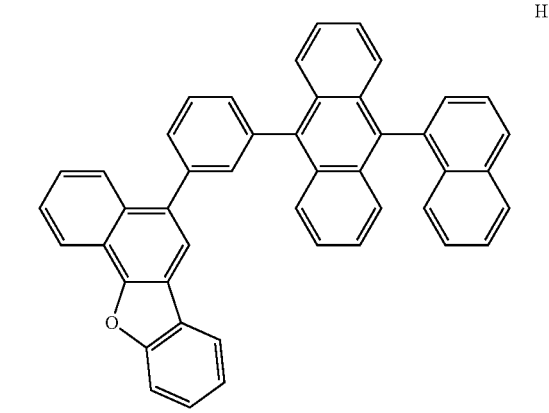
H98
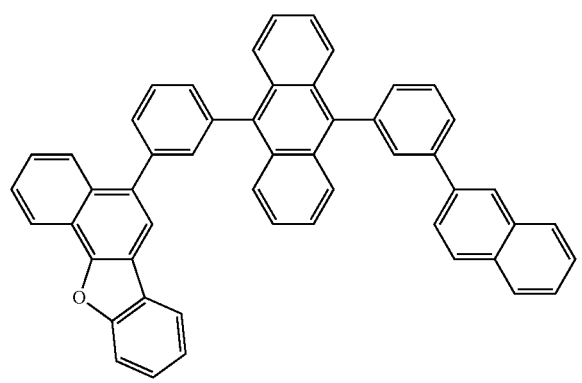
-continued
H99
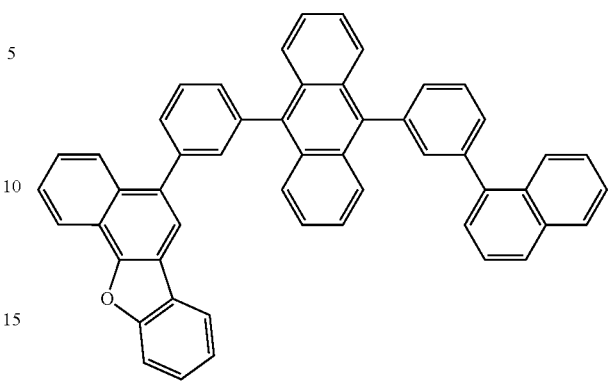
H100
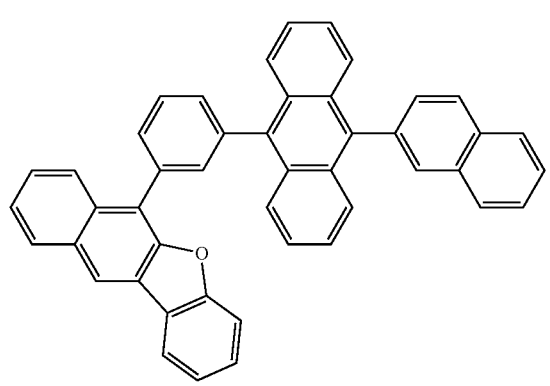
H101
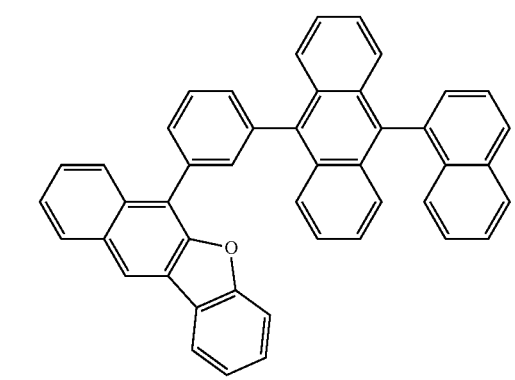
H102
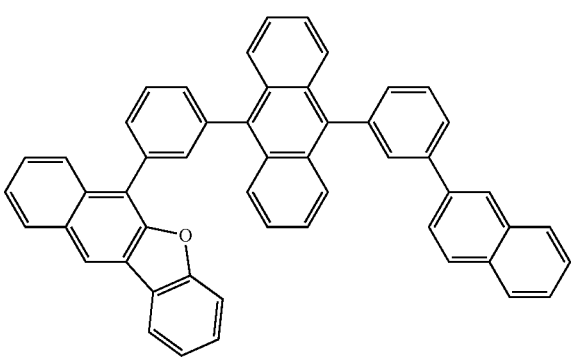

-continued
H103
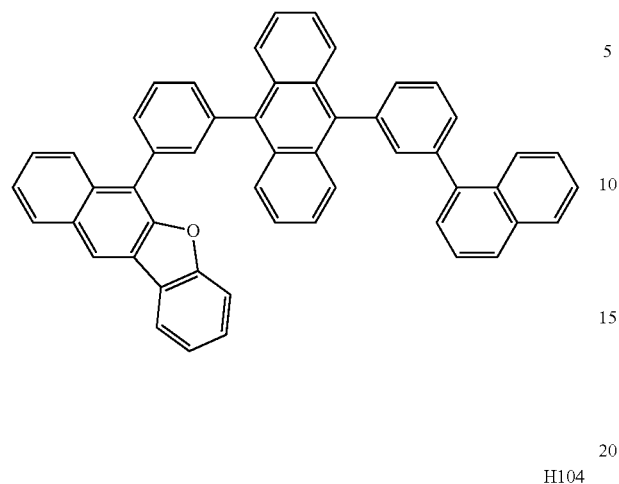
H104
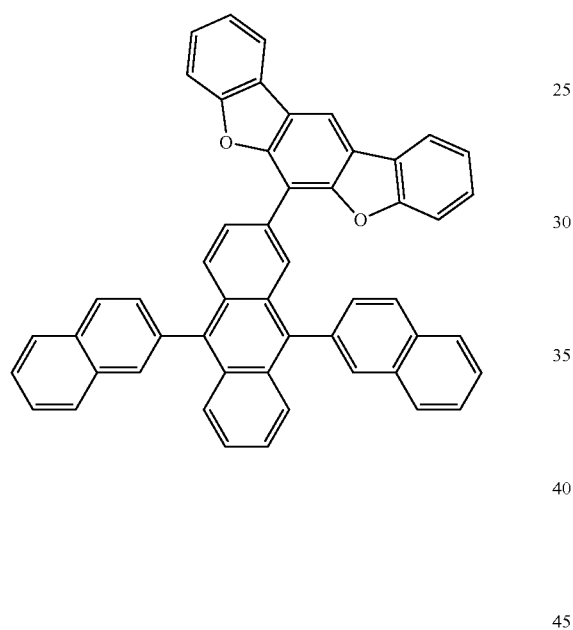
H105
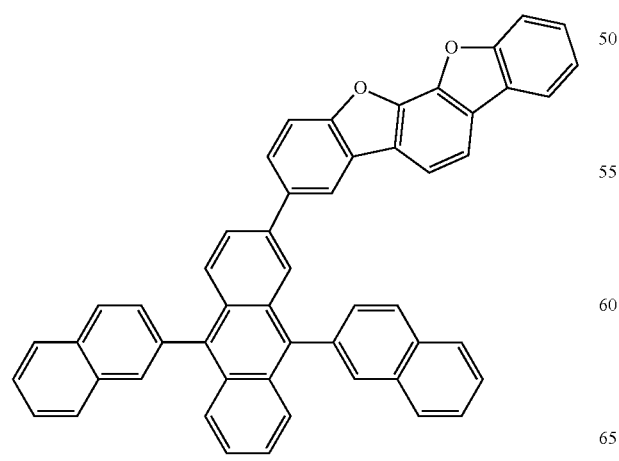
-continued
H106
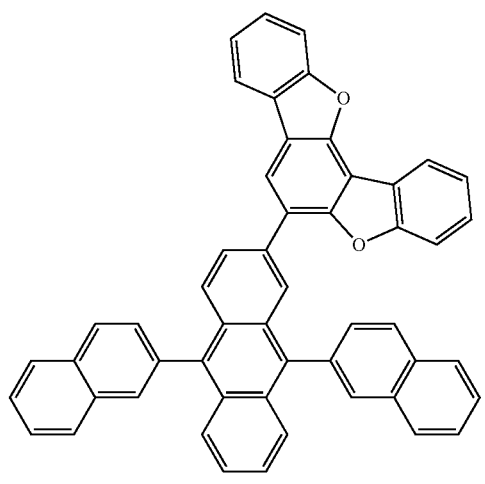
H107
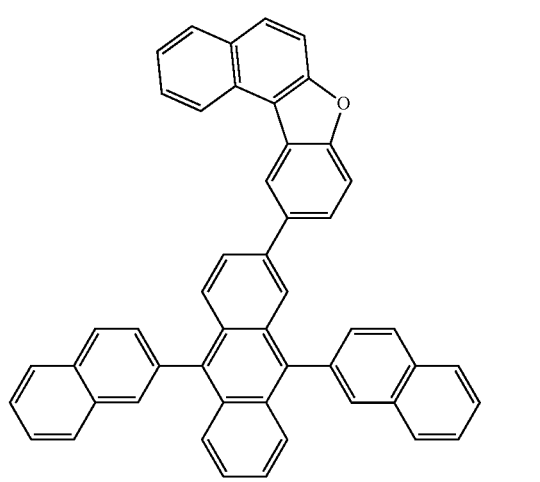
H108
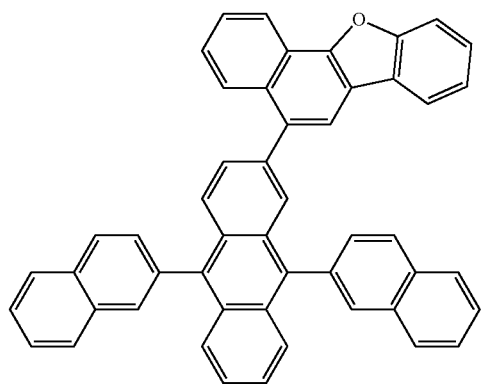

H109
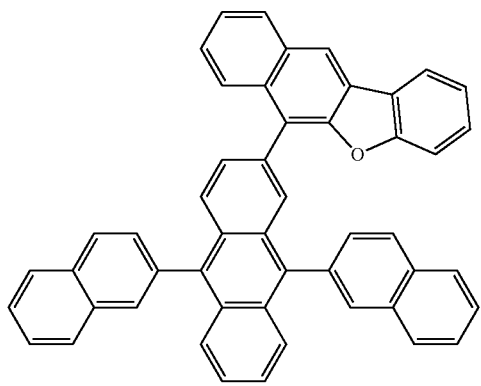
H110
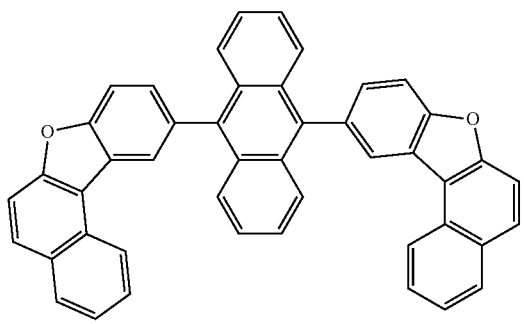
H111
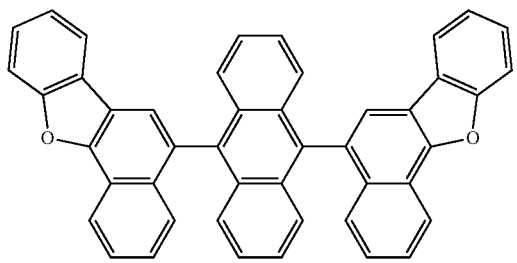
H112
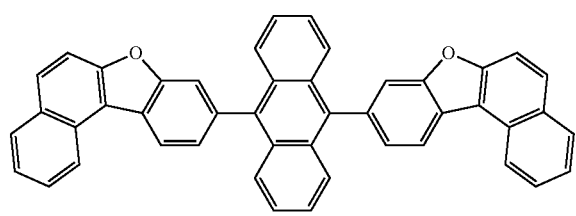
H113
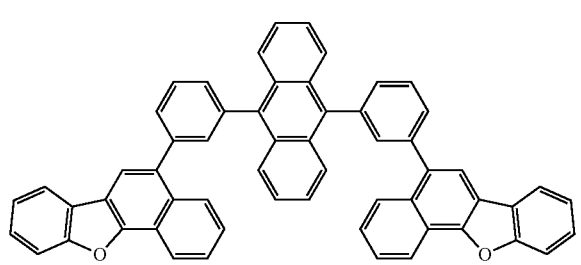
H114
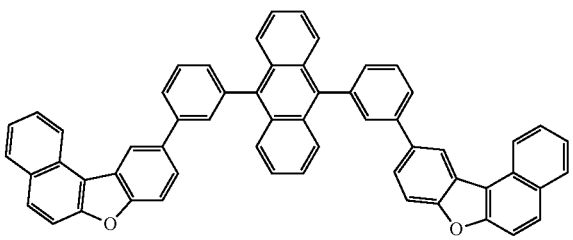
H115
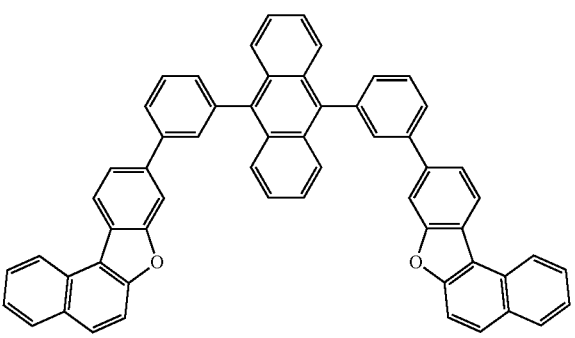
H116
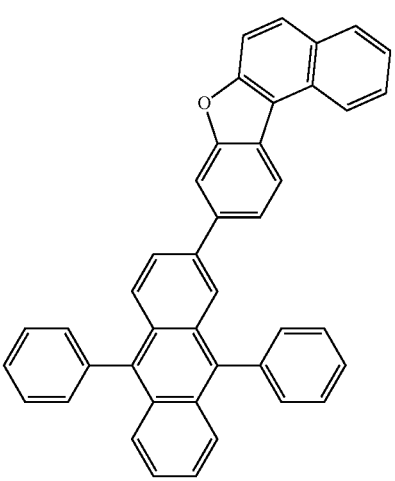
H117
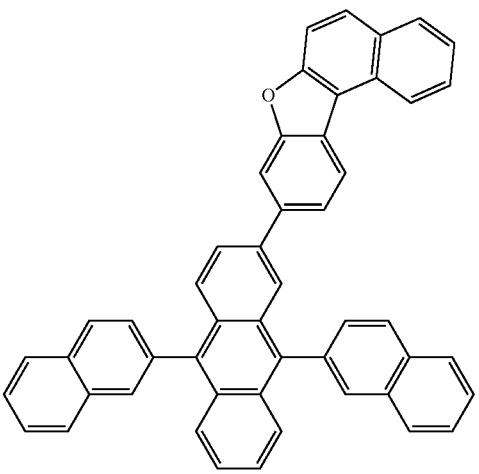

125
-continued
H118
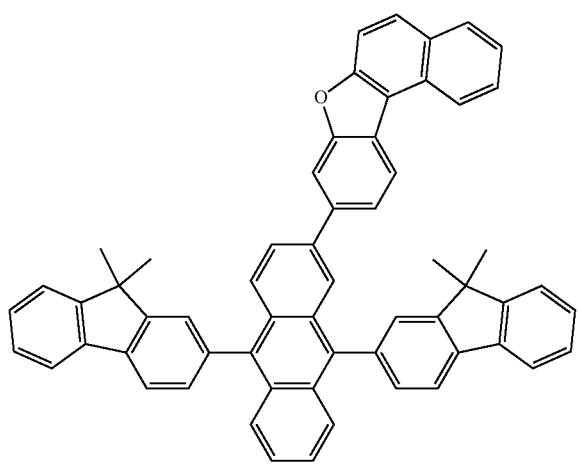
H119
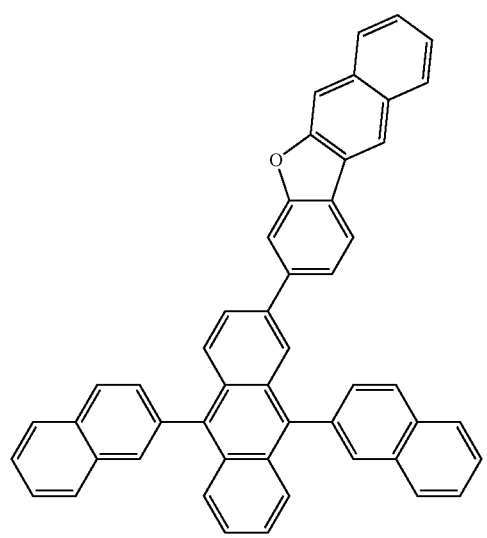
H120
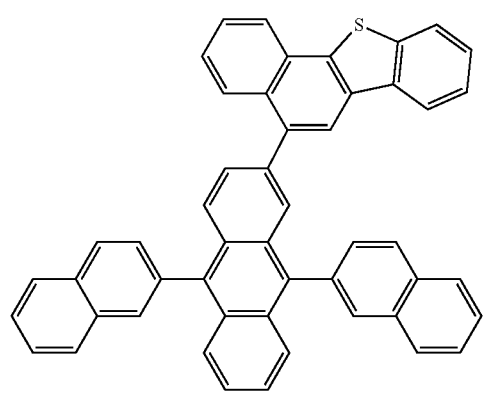
126
-continued
H121
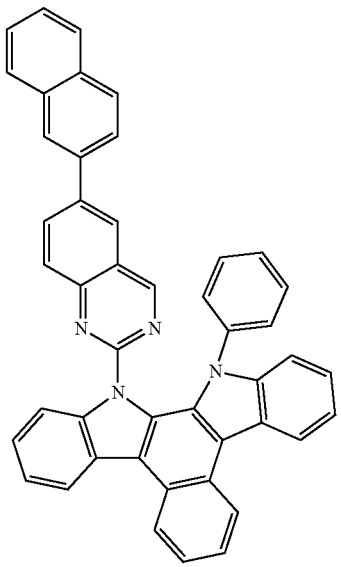
H122
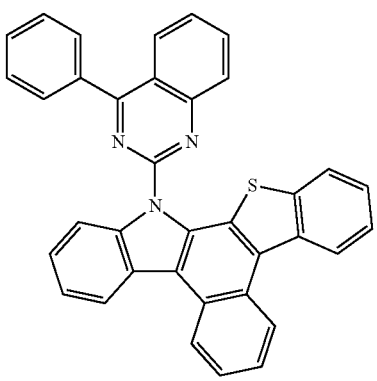
H123
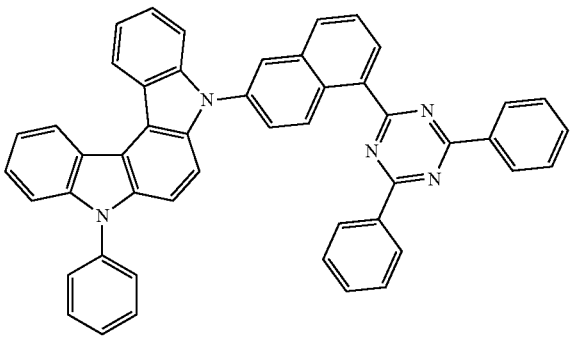

-continued

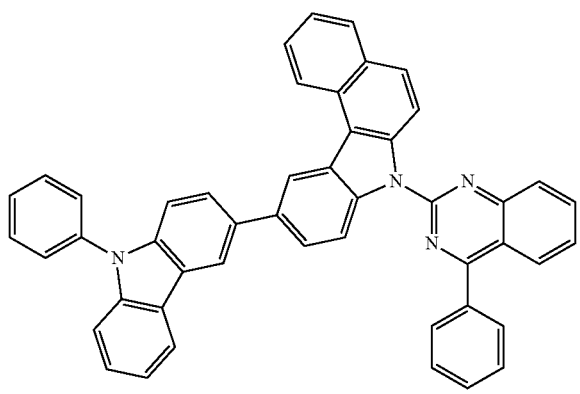

H124

[Phosphorescent Dopant]

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may include an organometallic compound represented by Formula 401:

$$M(L_{401})_{xc1}(L_{402})_{xc2}$$ [Formula 401]

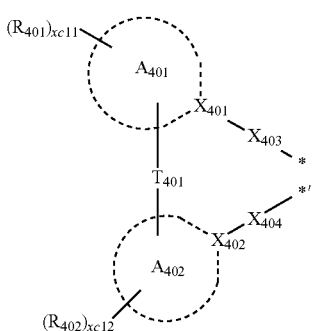

[Formula 402]

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401}$ (s) may be identical to or different from each other, $L_{402}$ may be an organic ligand, and xc2 may be 0, 1, 2, 3, or 4, and when xc2 is 2 or more, two or more of $L_{402}$(s) may be identical to or different from each other, $X_{401}$ and $X_{402}$ may each independently be nitrogen (N) or carbon (C), ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-', *—C($Q_{411}$)($Q_{412}$)-*', *—C($Q_{411}$)=C($Q_{412}$)-*', *—C($Q_{411}$)=*', or *=C($Q_{411}$)=*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10, and

* and *' in Formula 402 each indicate a binding site to M in Formula 401.

For example, in Formula 402, $X_{401}$ may be nitrogen and $X_{402}$ may be carbon, or each of $X_{401}$ and $X_{402}$ may be nitrogen.

In embodiments, when xc1 in Formula 402 is 2 or more, two ring $A_{401}$ in two or more of $L_{401}$(s) may be optionally linked to each other via $T_{402}$, which is a linking group, and two ring $A_{402}$ are optionally linked to each other via $T_{403}$, which is a linking group (see Compounds PD1 to PD4 and PD7). $T_{402}$ and $T_{403}$ may each independently be the same as described in connection with $T_{401}$.

$L_{402}$ in Formula 401 may be an organic ligand. For example, $L_{402}$ may include a halogen group, a diketone group (for example, an acetylacetonate group), a carboxylic acid group (for example, a picolinate group), —C(=O), an isonitrile group, —CN group, a phosphorus group (for example, a phosphine group, a phosphite group, etc.), or any combination thereof.

The phosphorescent dopant may include, for example, one of compounds PD1 to PD25, or any combination thereof:

PD1

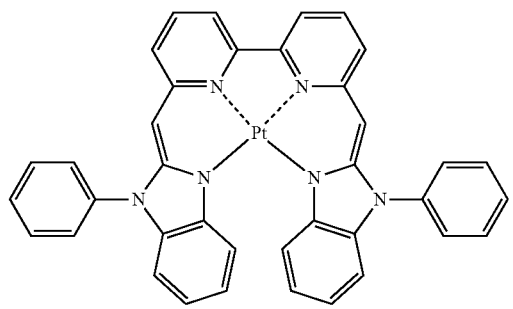

-continued
PD2
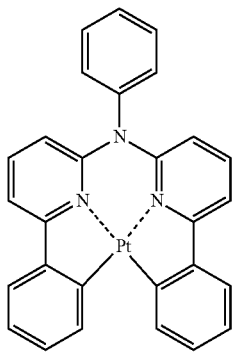
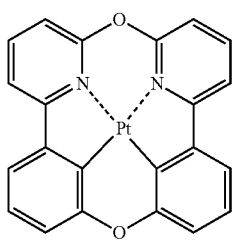
PD3
PD4
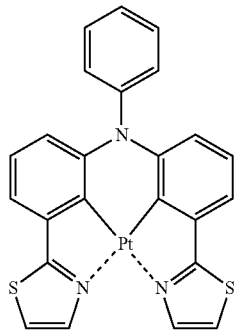
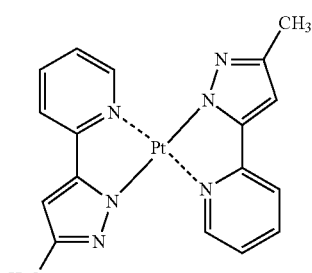
PD5
PD6
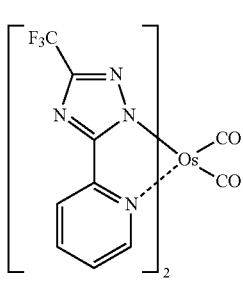
-continued
PD7
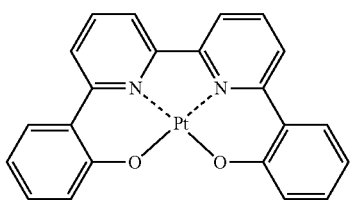
PD8
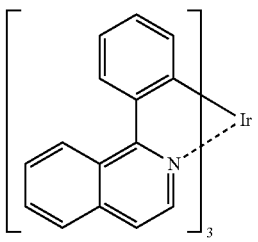
PD9
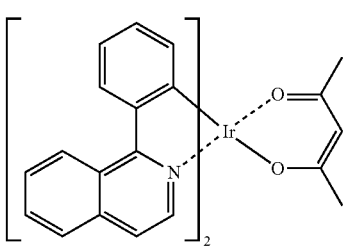
PD10
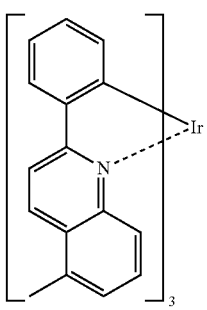
PD11
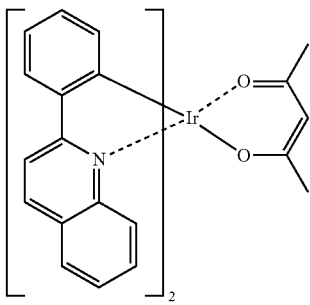

PD12 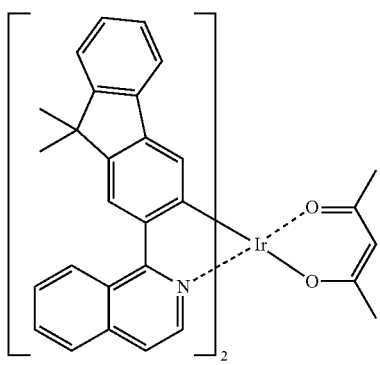
PD13 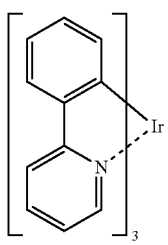
PD14 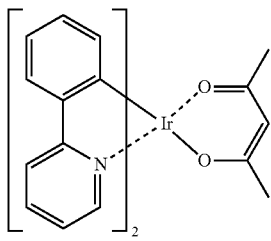
PD15 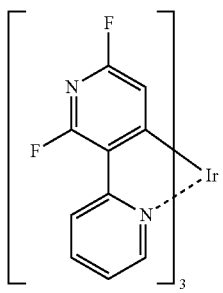
PD16 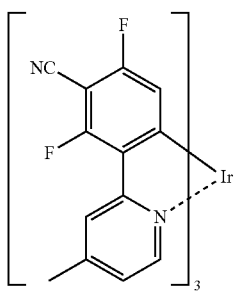
PD17 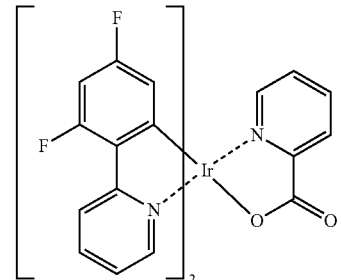
PD18 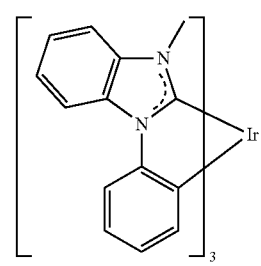
PD19 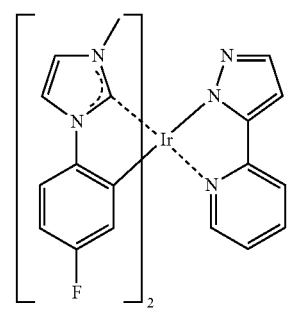
PD20 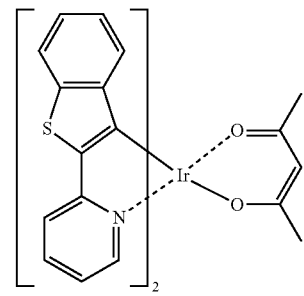
PD21 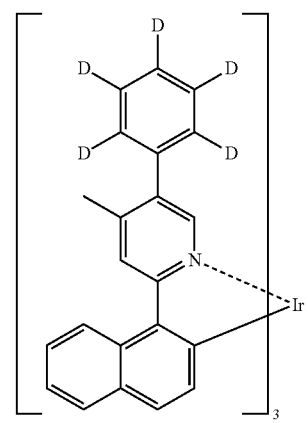

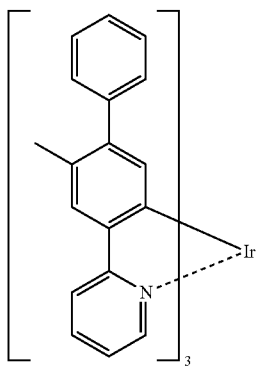

PD22

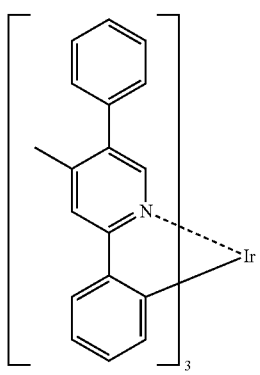

PD23

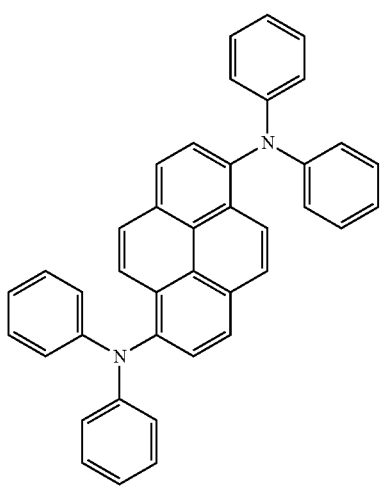

PD24

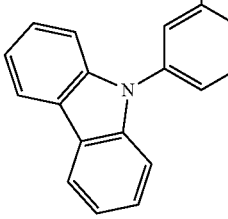

PD25

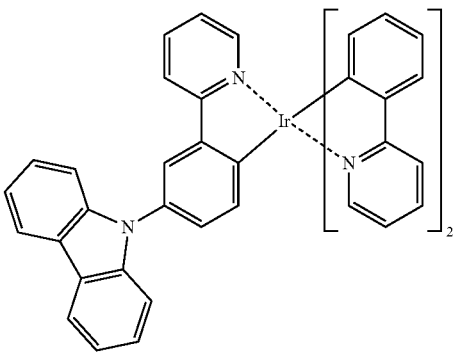

[Fluorescent Dopant]

The fluorescent dopant may include an amine group-containing compound, a styryl group-containing compound, or any combination thereof.

In embodiments, the fluorescent dopant may include a compound represented by Formula 501:

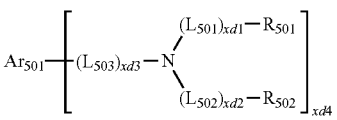

[Formula 501]

In Formula 501,

Ar$_{501}$, L$_{501}$ to L$_{503}$, R$_{501}$, and R$_{502}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, xd1 to xd3 may each independently be 0, 1, 2, or 3, and xd4 may be 1, 2, 3, 4, 5, or 6.

In embodiments, Ar$_{501}$ in Formula 501 may be a condensed cyclic group (for example, an anthracene group, a chrysene group, or a pyrene group) in which three or more monocyclic groups are condensed together.

In embodiments, xd4 in Formula 501 may be 2.

In embodiments, the fluorescent dopant may include one of Compounds FD1 to FD36, DPVBi, DPAVBi, or any combination thereof:

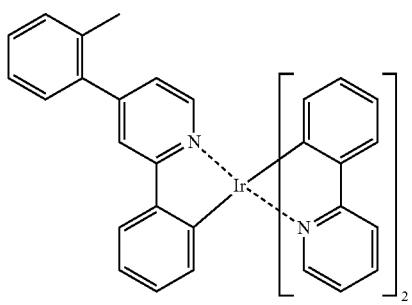

FD1

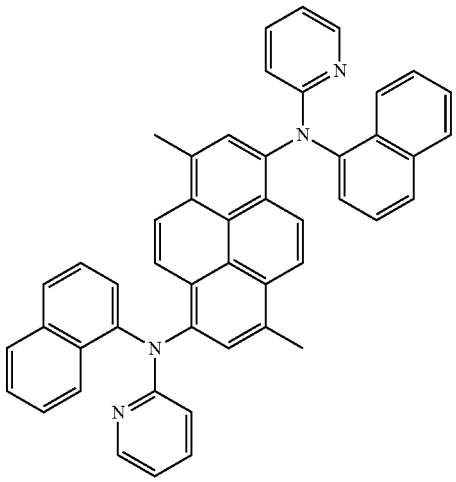

FD2

-continued
FD3
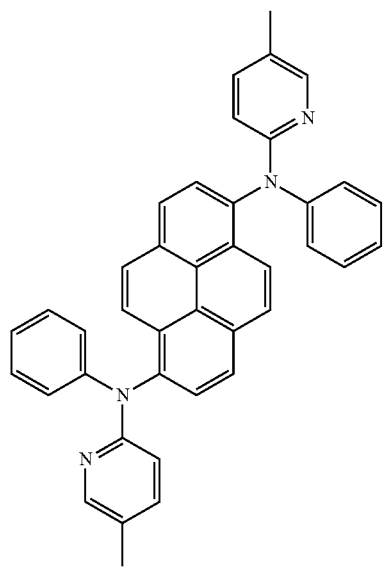
FD4
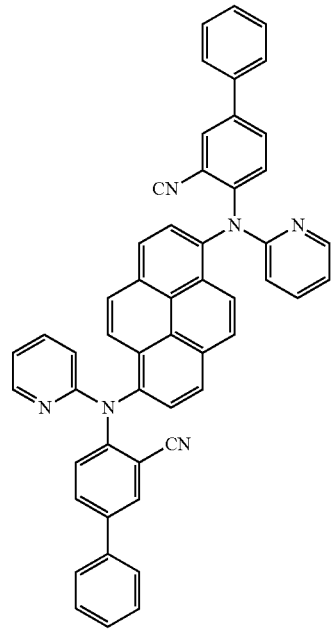
FD5
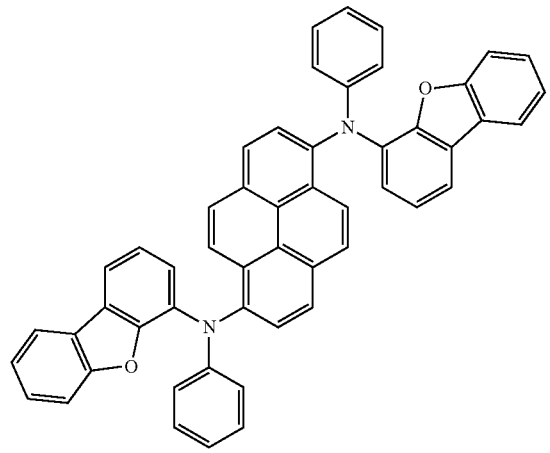
FD6
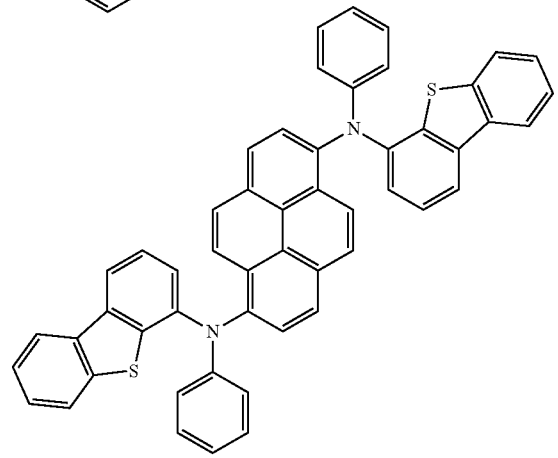
FD7
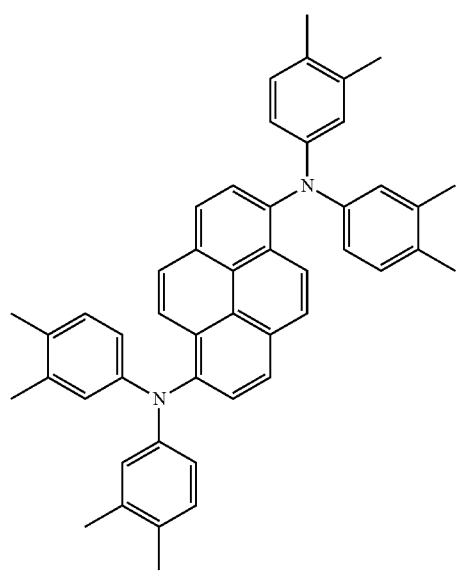
FD8
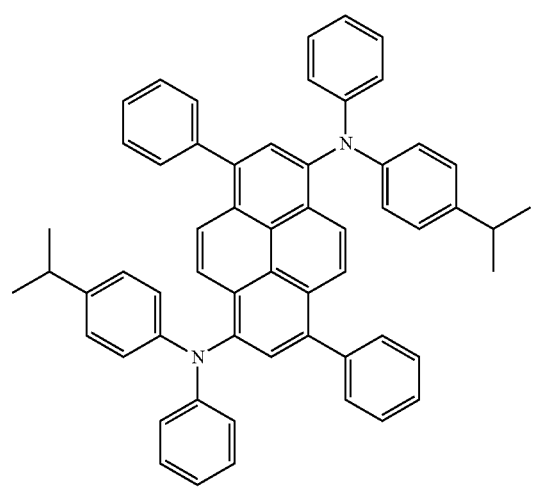

-continued
FD9
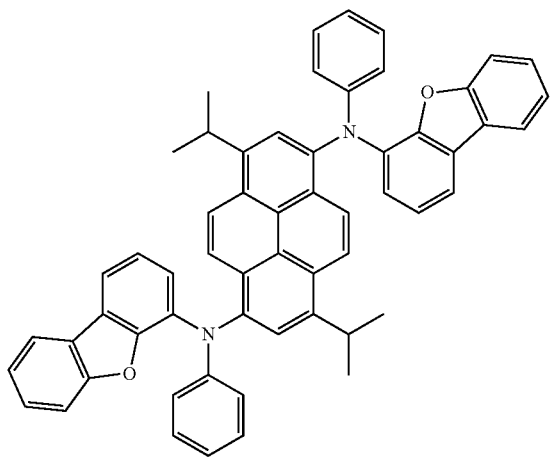
FD10
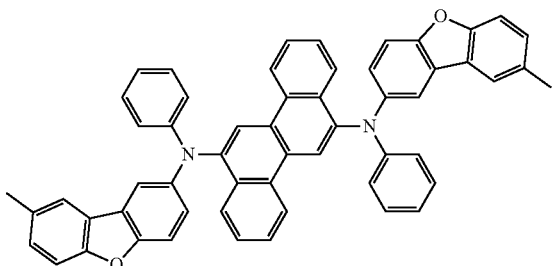
FD11
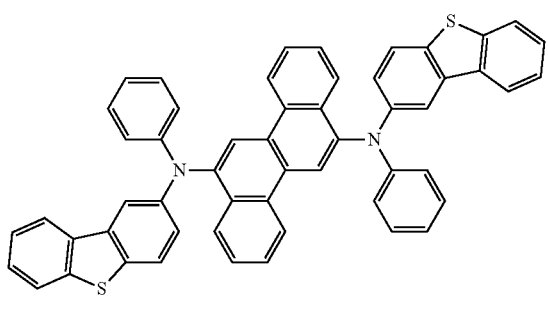
FD12
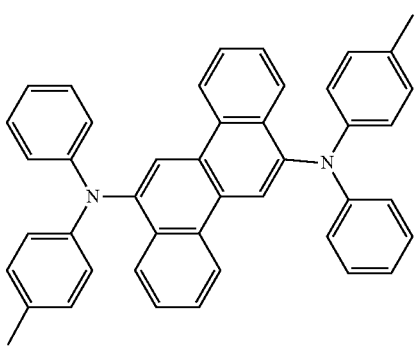
FD13
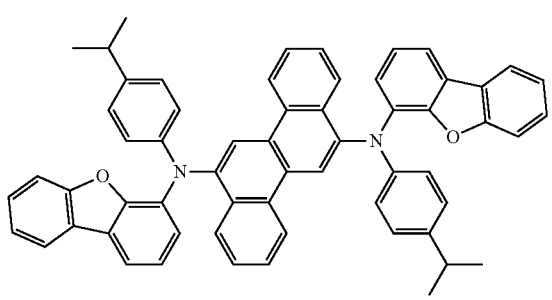
FD14
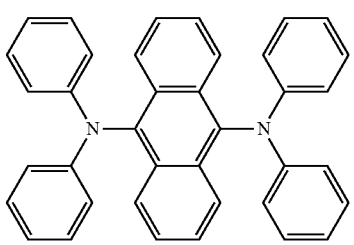
FD15
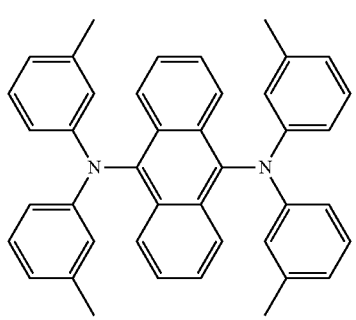
FD16
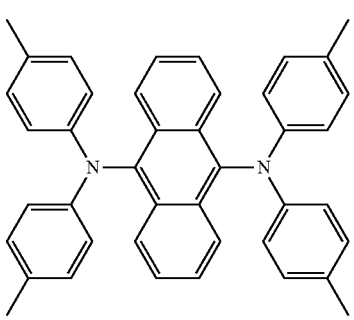

-continued
FD17
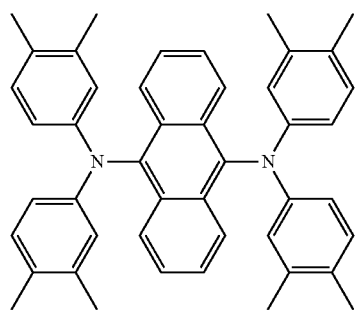
FD18
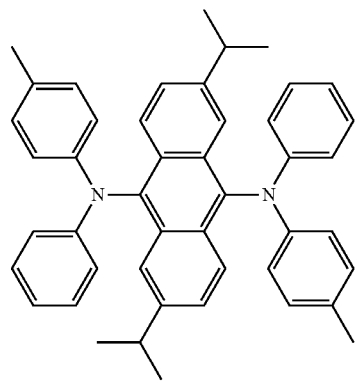
FD19
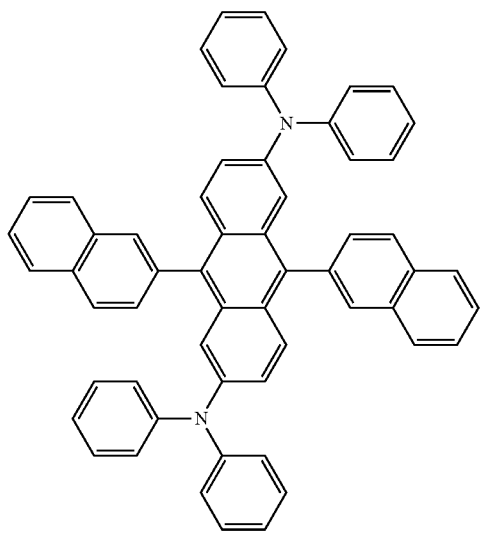
FD20
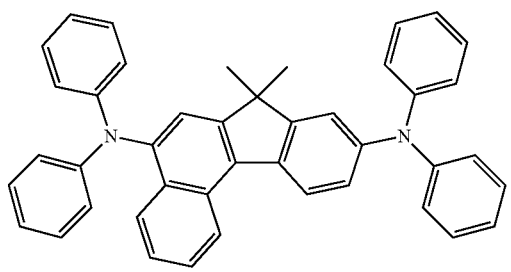
FD21
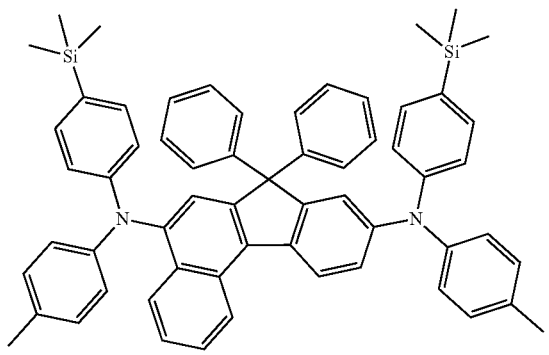
FD22
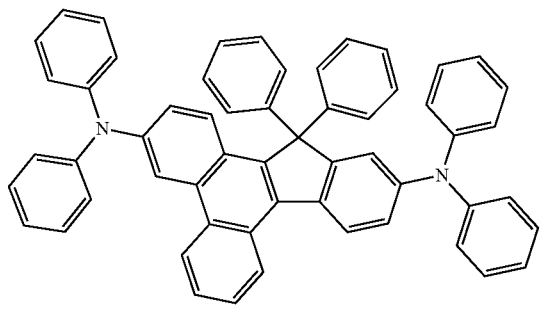

-continued
FD23
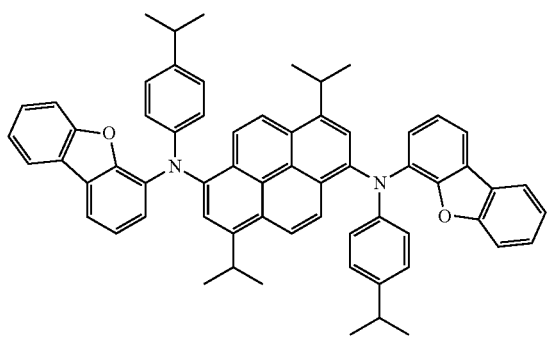
FD24
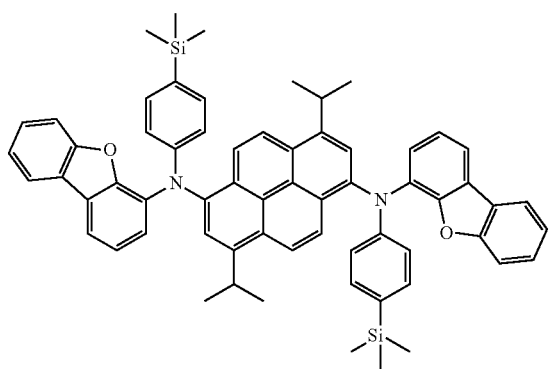
FD25
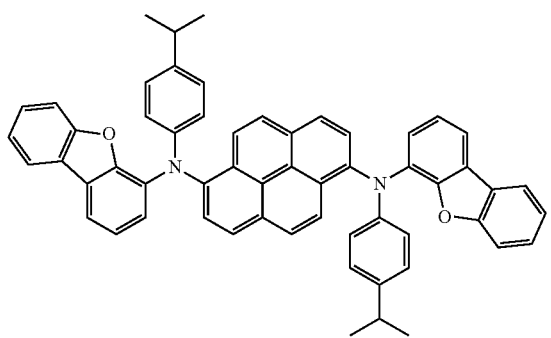
FD26
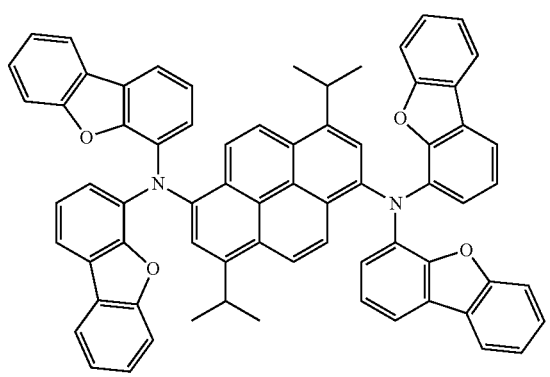
FD27
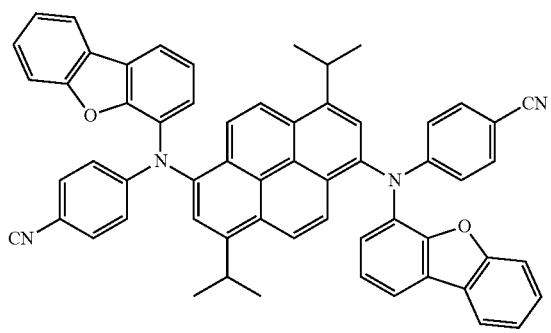
FD28
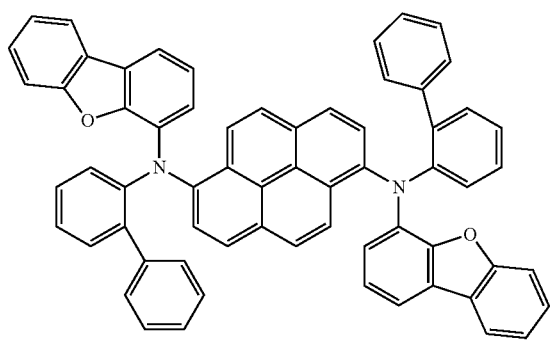
FD29
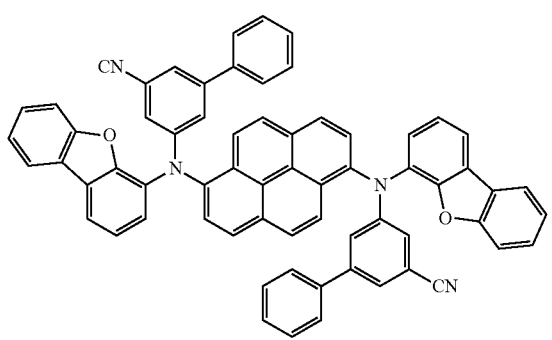
FD30
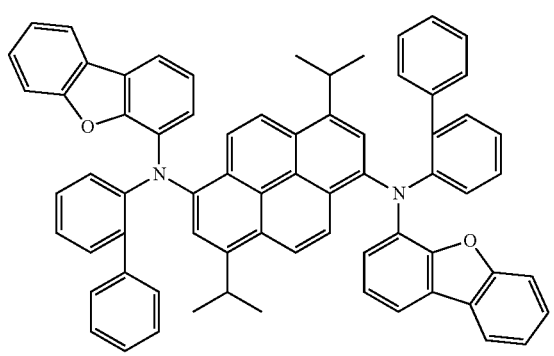

-continued
| FD31 | FD32 |
|---|---|
| 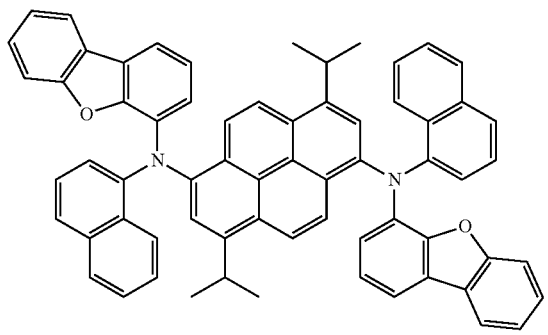 | 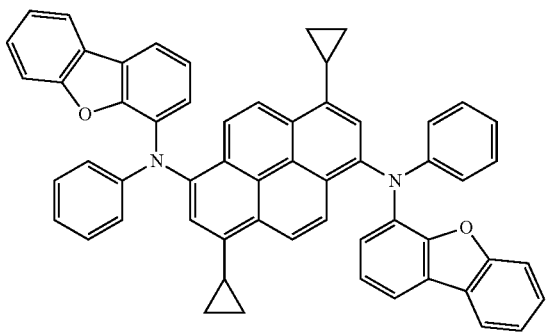 |
| FD33 | FD34 |
|---|---|
| 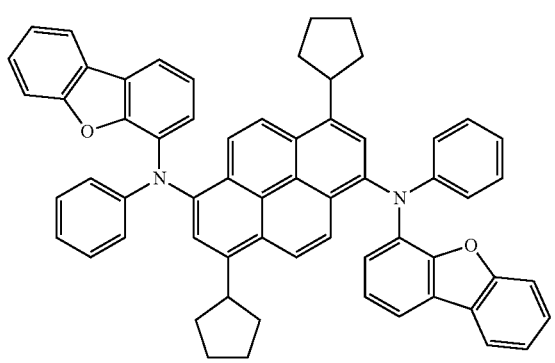 | 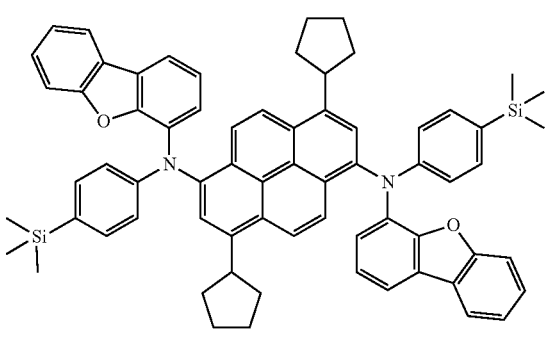 |
| FD35 | FD36 |
|---|---|
| 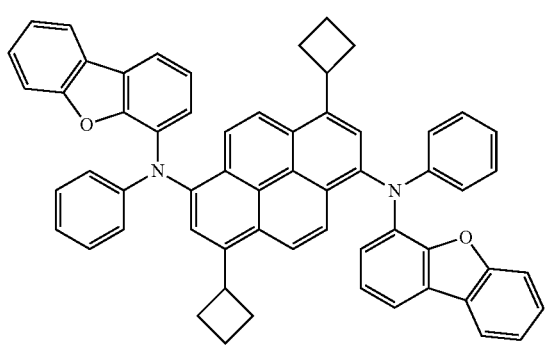 | 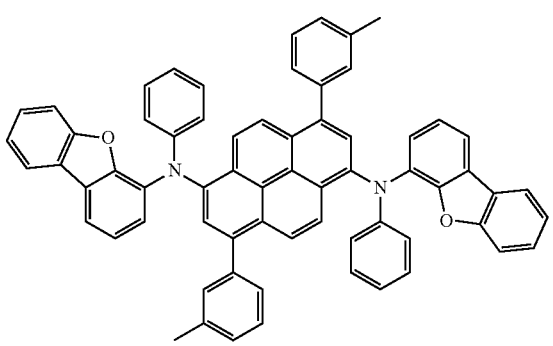 |
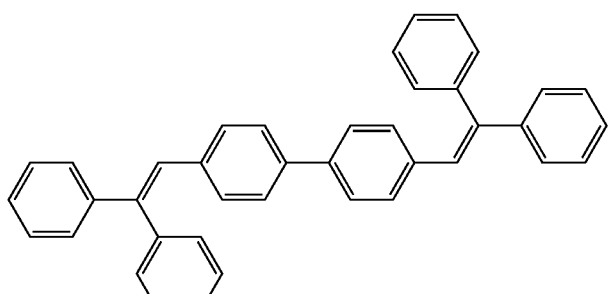
DPVBi

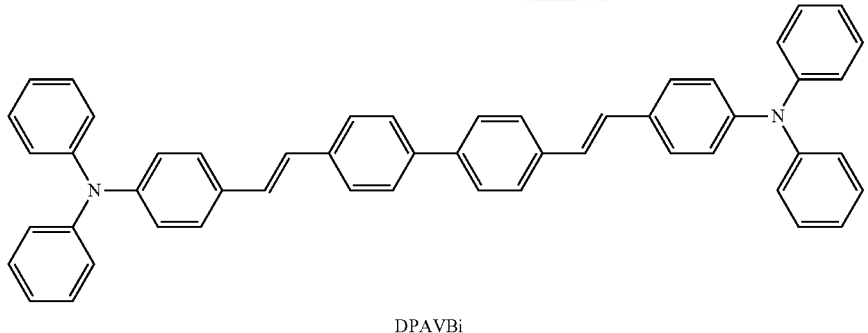

DPAVBi

[Delayed Fluorescence Material]

The emission layer 133 may include a delayed fluorescence material.

In the specification, the delayed fluorescence material may be selected from compounds capable of emitting delayed fluorescence based on a delayed fluorescence emission mechanism.

The delayed fluorescence material included in the emission layer 133 may act as a host or a dopant depending on the type of other materials included in the emission layer 133.

In embodiments, a difference between the triplet energy level (eV) of the delayed fluorescence material and the singlet energy level (eV) of the delayed fluorescence material may be in a range of about 0 eV to about 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the organic light-emitting device 10 may be improved.

In embodiments, the delayed fluorescence material may include a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and a material including a $C_8$-$C_{60}$ polycyclic group in which two or more cyclic groups are condensed while sharing boron (B).

In embodiments, the delayed fluorescence material may include at least one of the following compounds DF1 to DF9:

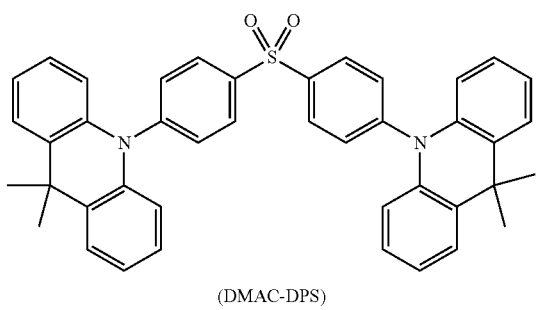

(DMAC-DPS)
DF1

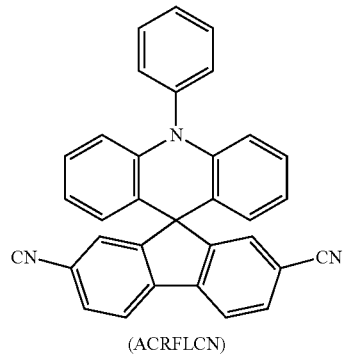

(ACRFLCN)
DF2

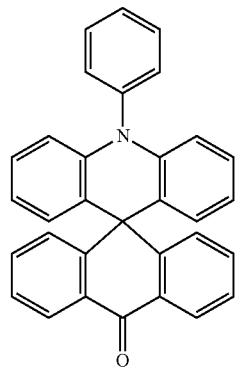

(ACRSA)
DF3

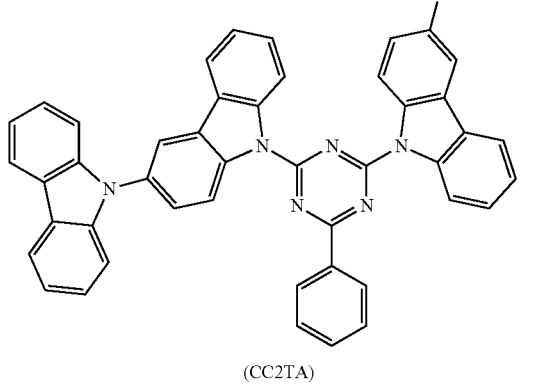

(CC2TA)
DF4

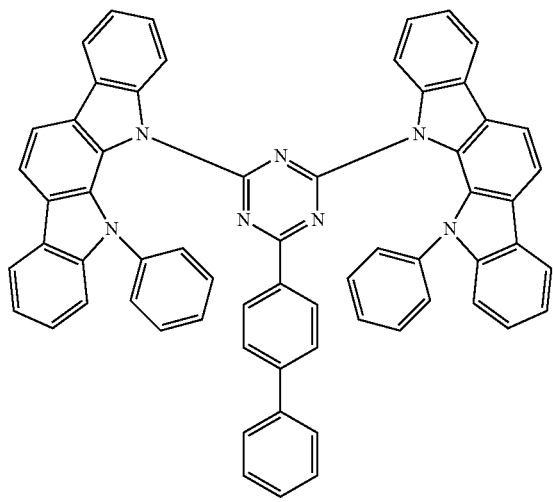

(PIC-TRZ)

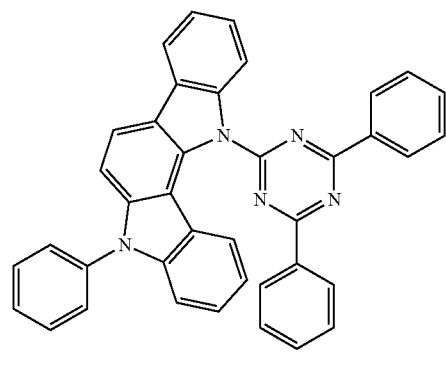

(PIC-TRZ2)

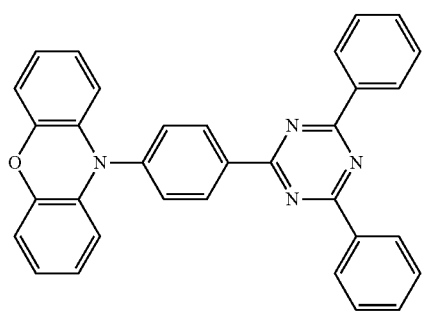

(PXZ-TRZ)

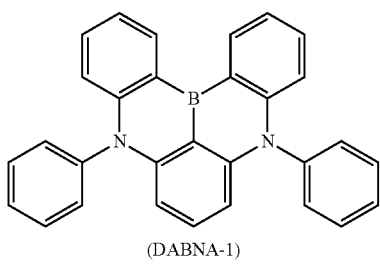

(DABNA-1)

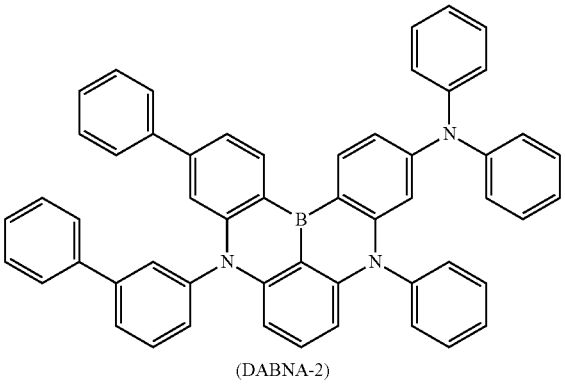

(DABNA-2)

[Quantum Dot]

In embodiments, the emission layer 133 may include a quantum dot.

In the specification, a quantum dot may be a crystal of a semiconductor compound, and may include any material capable of emitting light of various emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles can be controlled through a process which is more easily performed than vapor deposition methods, such as metal organic chemical vapor deposition (MOCVD) or molecular beam epitaxy (MBE), and which requires low costs.

The quantum dot may include Group II-VI semiconductor compounds, Group III-V semiconductor compounds, Group III-VI semiconductor compounds, Group semiconductor compounds, Group IV-VI semiconductor compounds, a Group IV element or compound; or any combination thereof.

Examples of the Group II-VI semiconductor compound may include a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Group III-V semiconductor compound may include a binary compound, such as GaN, GaP, GaAs, GaSb, AlN, AlP, AlAs, AlSb, InN, InP, InAs, InSb, or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, or the like; a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or the like; or any combination thereof. The Group III-V semiconductor compound may further include Group II elements. Examples of the Group III-V semiconductor compound further including Group II elements may include InZnP, InGaZnP, InAlZnP, etc.

Examples of the Group III-VI semiconductor compound may include a binary compound, such as GaS, GaSe, $Ga_2Se_3$, GaTe, InS, InSe, $In_2S_3$, $In_2Se_3$, or InTe; a ternary compound, such as $InGaS_3$, or $InGaSe_3$; and any combination thereof.

Examples of the Group semiconductor compound may include a ternary compound, such as AgInS, $AgInS_2$, CuInS, $CuInS_2$, $CuGaO_2$, $AgGaO_2$, or $AgAlO_2$; or any combination thereof.

Examples of the Group IV-VI semiconductor compound may include a binary compound, such as SnS, SnSe, SnTe, PbS, PbSe, PbTe, or the like; a ternary compound, such as SnSeS, SnSeTe, SnSTe, PbSeS, PbSeTe, PbSTe, SnPbS, SnPbSe, SnPbTe, or the like; a quaternary compound, such as SnPbSSe, SnPbSeTe, SnPbSTe, or the like; or any combination thereof.

The Group IV element or compound may include a single element compound, such as Si or Ge; a binary compound, such as SiC or SiGe; or any combination thereof.

Each element included in a multi-element compound such as the binary compound, the ternary compound, and the quaternary compound, may exist in a particle at a uniform concentration or at a non-uniform concentration.

The quantum dot may have a single structure or a core-shell structure. In the case of the quantum dot having a single structure, the concentration of each element included in the corresponding quantum dot may be uniform. In embodiments, the material contained in the core and the material contained in the shell may be different from each other.

The shell of the quantum dot may be a protective layer that prevents chemical degeneration of the core to maintain semiconductor characteristics and/or may be a charging layer that imparts electrophoretic characteristics to the quantum dot. The shell may be a single layer or a multi-layer. The interface between the core and the shell may have a concentration gradient that decreases toward the center of the element present in the shell.

Examples of the shell of the quantum dot may include an oxide of a metal, an oxide of a metalloid, or an oxide of a non-metal, a semiconductor compound, and any combination thereof. Examples of the oxide of metal, metalloid, or non-metal may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; and any combination thereof. Examples of the semiconductor compound may include, as described herein, Group II-VI semiconductor compounds; Group III-V semiconductor compounds; Group III-VI semiconductor compounds; Group semiconductor compounds; Group IV-VI semiconductor compounds; and any combination thereof. In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be equal to or less than about 45 nm. For example, a FWHM of an emission wavelength spectrum of the quantum dot may be equal to or less than about 40 nm. For example, a FWHM of an emission wavelength spectrum of the quantum dot may be equal to or less than about 30 nm. Within these ranges, color purity or color gamut may be increased. Light emitted through the quantum dot may be emitted in all directions, and a wide viewing angle can be improved.

The quantum dot may be a spherical particle, a pyramidal particle, a multi-arm particle, a cubic nanoparticle, a nanotube particle, a nanowire particle, a nanofiber particle, or a nanoplate particle.

Since the energy band gap can be adjusted by controlling the size of the quantum dot, light having various wavelength bands can be obtained from the quantum dot emission layer. Therefore, by using quantum dots of different sizes, an organic light-emitting device that emits light of various wavelengths may be implemented. In embodiments, the size of the quantum dot may be selected to emit red, green, and/or blue light. The size of the quantum dot may be configured to emit white light by combining light of various colors.

[Electron Transport Region in Organic Layer 130]

The electron transport region may have a structure consisting of a layer consisting of a single material, a structure consisting of a layer consisting of different materials, or a multi-layered structure including layers including different materials.

The electron transport region may include a buffer layer, a hole blocking layer, an electron control layer, an electron transport layer, an electron injection layer, or any combination thereof.

In embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers may be stacked from the emission layer 133 in its respective stated order.

In an embodiment, the electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601 below:

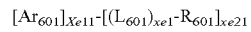  [Formula 601]

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ may each independently be the same as described in connection with $Q_1$, xe21 may be 1, 2, 3, 4, or 5, at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked via a single bond.

In embodiments, $Ar_{601}$ in Formula 601 may be a substituted or unsubstituted anthracene group.

In an embodiment, the electron transport region may include a compound represented by Formula 601-1:

[Formula 601-1]

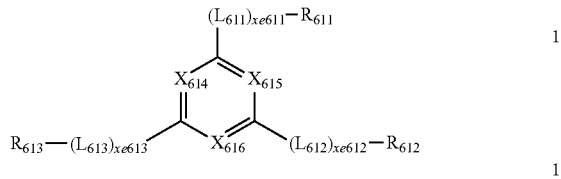

In Formula 601-1, $X_{614}$ may be N or $C(R_{614})$, $X_{615}$ may be N or $C(R_{615})$, $X_{616}$ may be N or $C(R_{616})$, wherein at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), Alq$_3$, BAlq, TAZ, NTAZ, diphenyl(4-(triphenylsilyl)phenyl)-phosphine oxide (TSPO1), or any combination thereof:

ET1

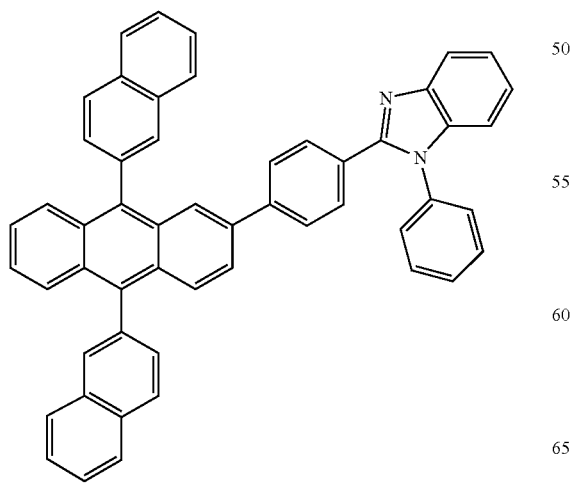

-continued

ET2

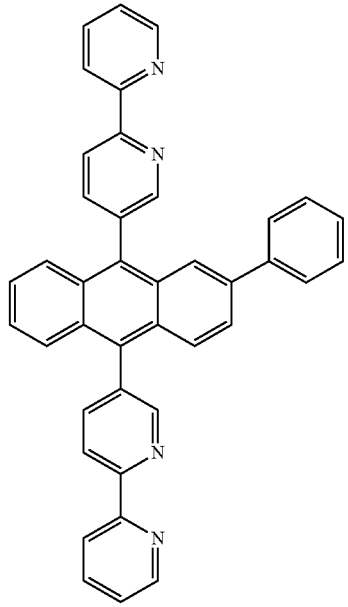

ET3

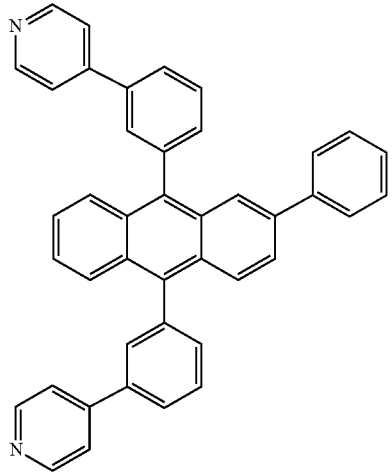

ET4

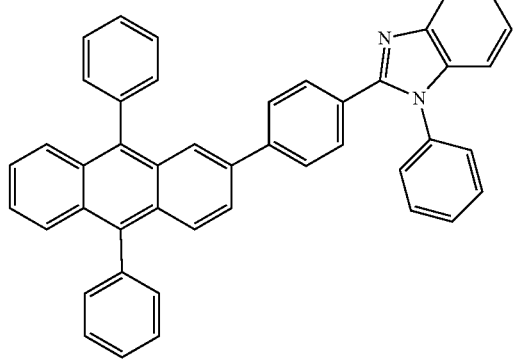

ET5
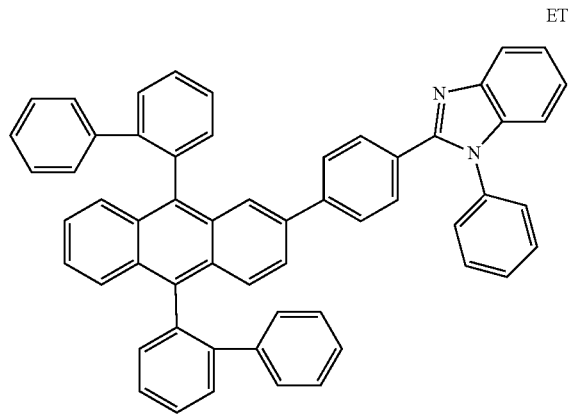
ET6
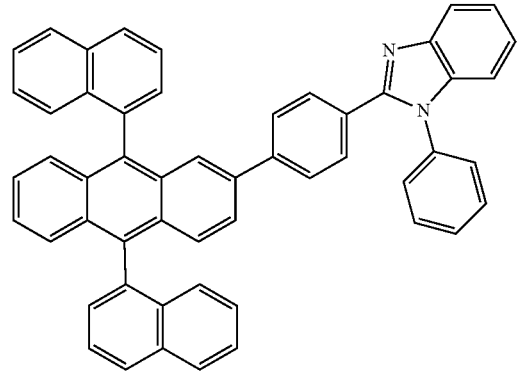
ET7
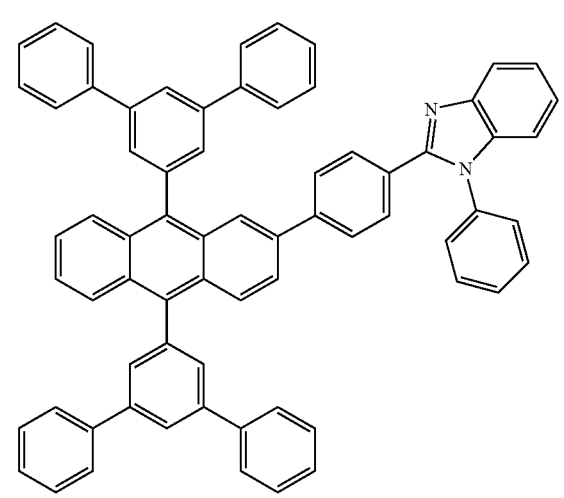
ET8
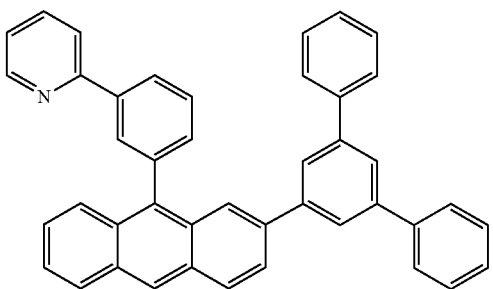
ET9
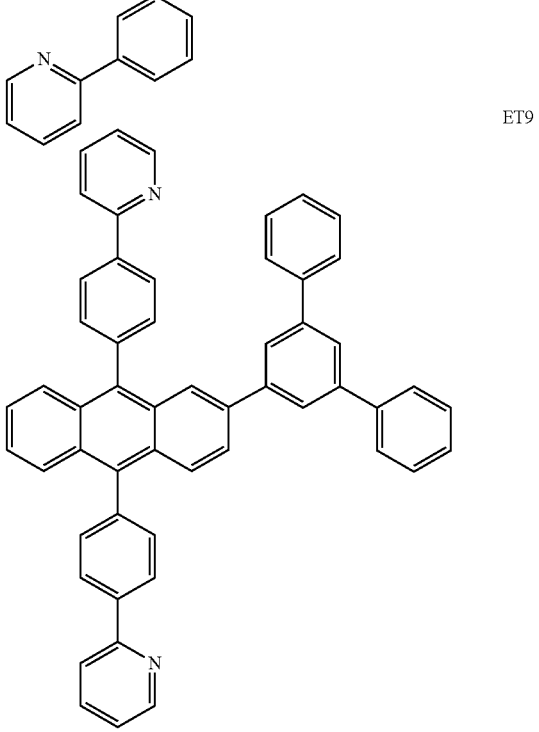
ET10
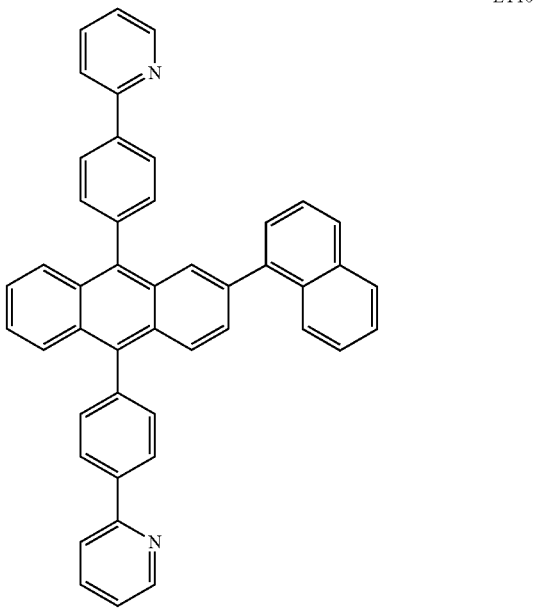

ET11
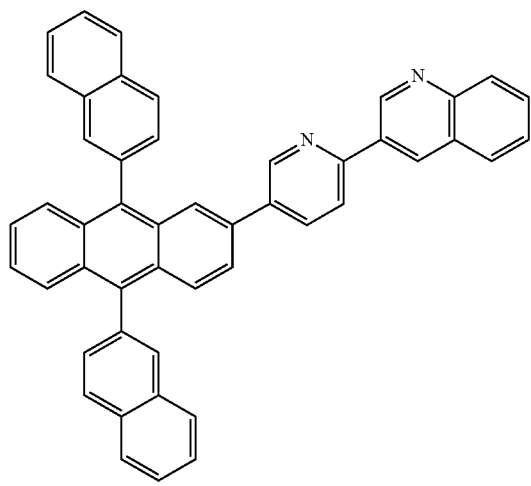
ET12
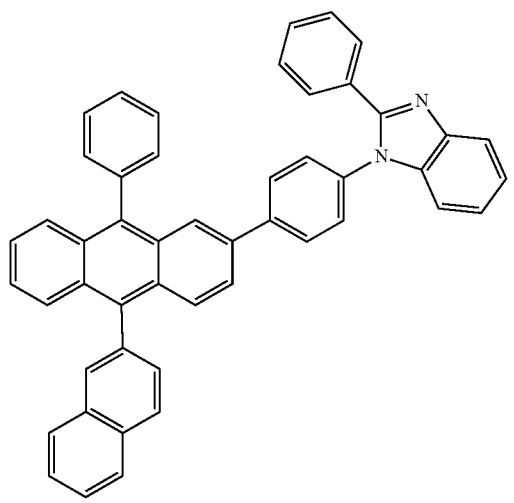
ET13
ET14
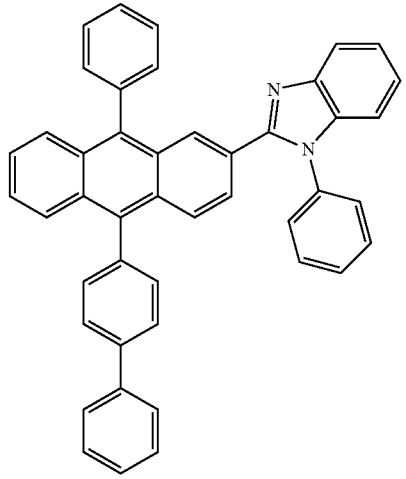
ET15
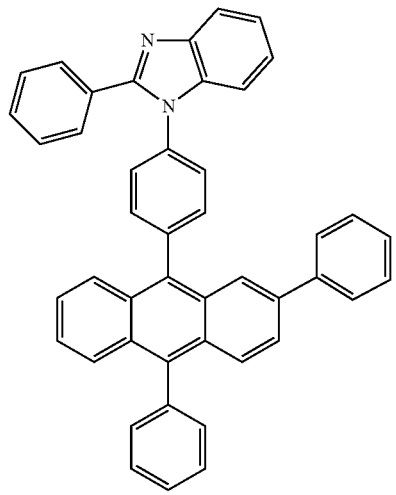
ET16

157
-continued
ET17
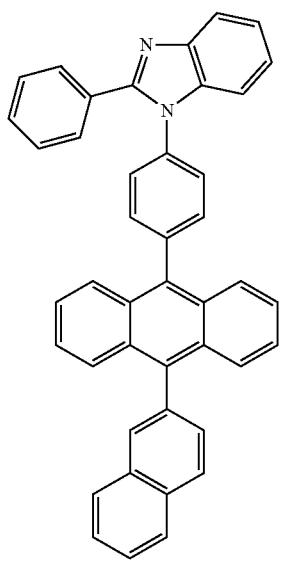
ET18
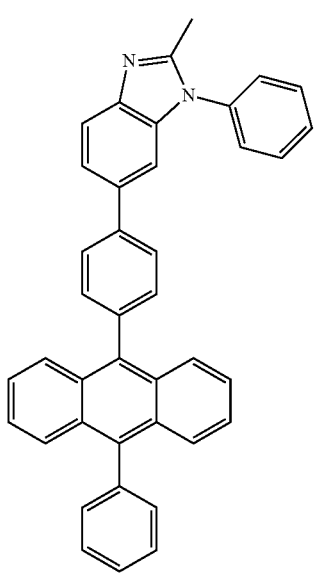
ET19
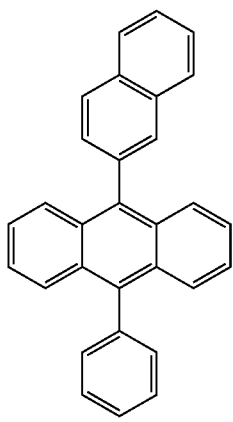
158
-continued
ET20
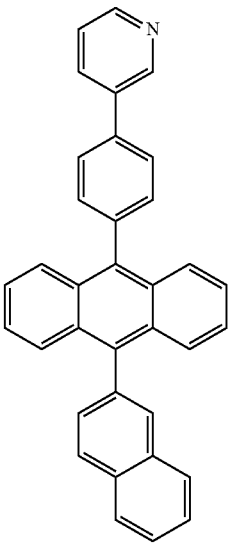
ET21
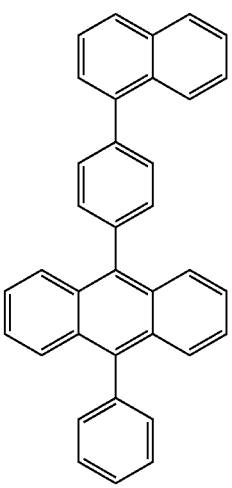
ET22
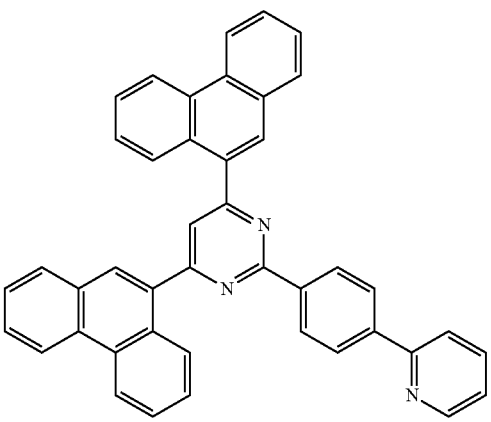

ET23
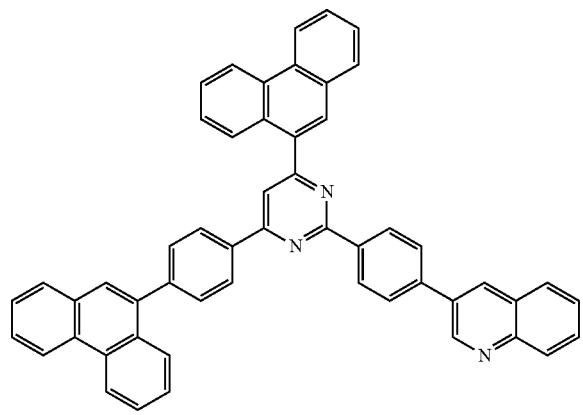
ET24
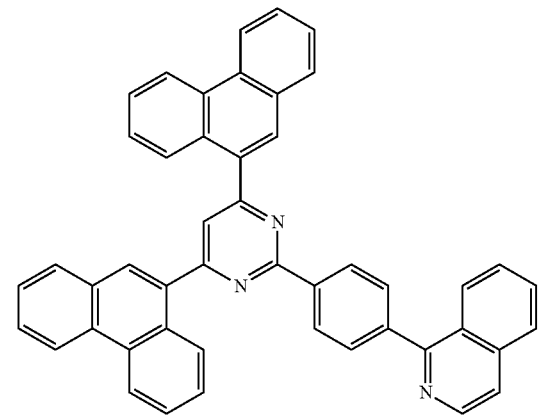
ET25
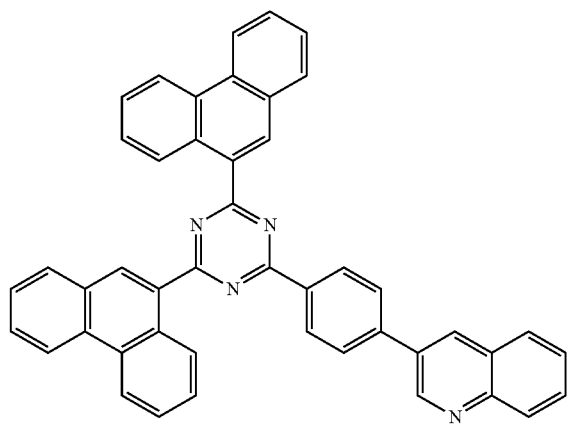
ET26
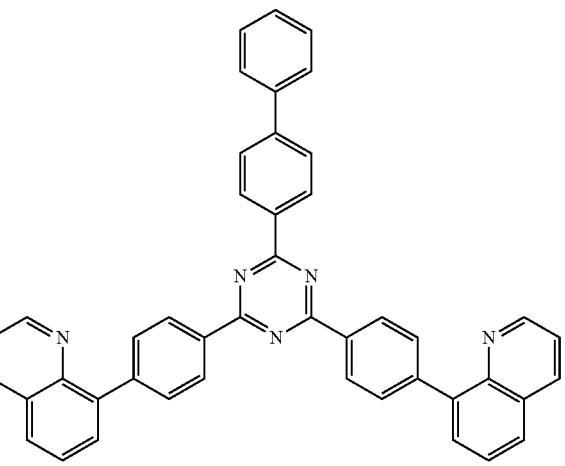
ET27
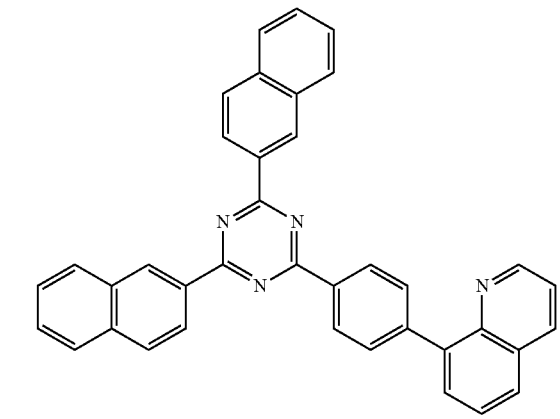
ET28
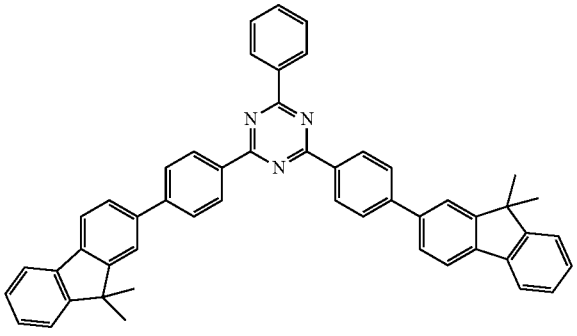

ET29
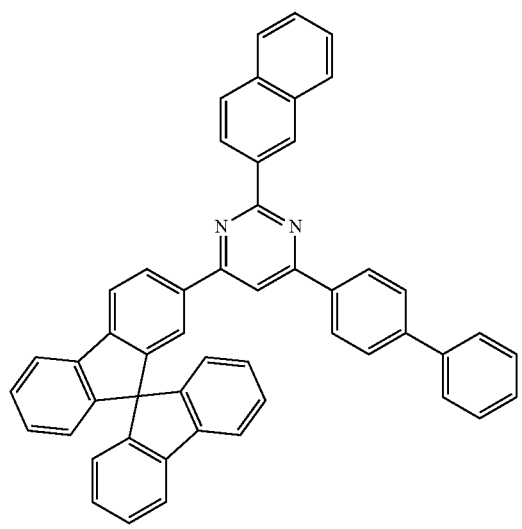
ET30
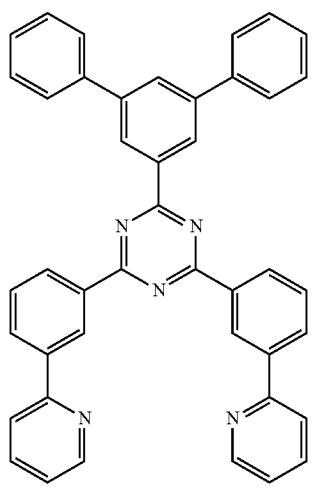
ET31
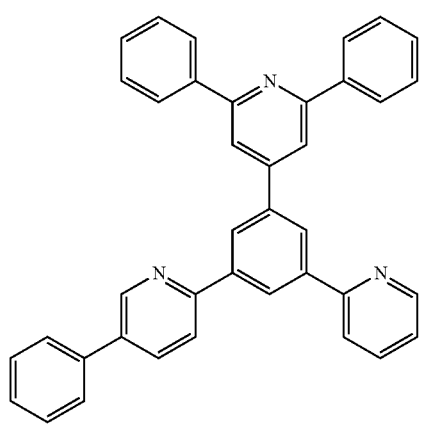
ET32
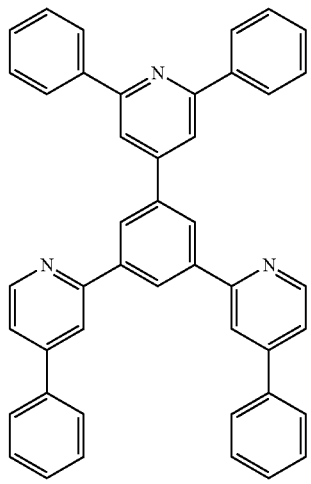
ET33
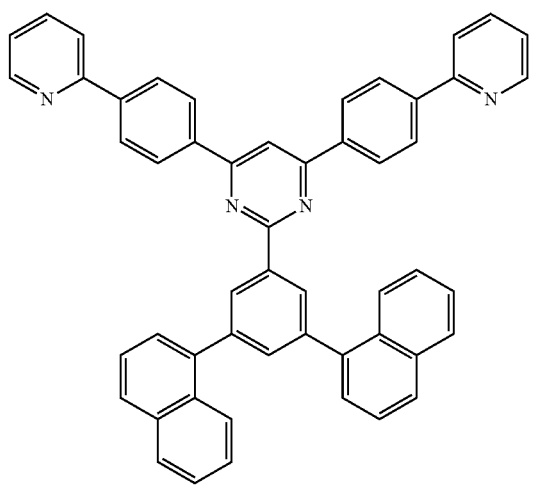
ET34
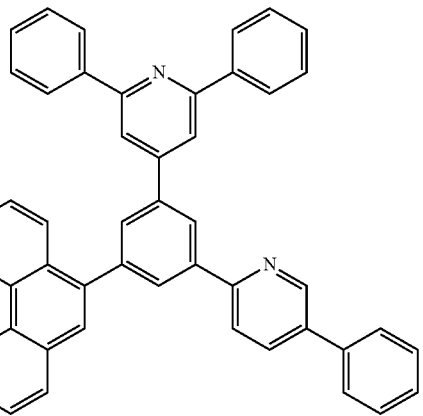

ET35
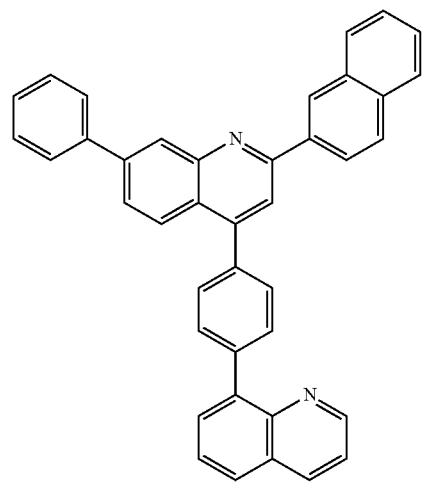
ET36
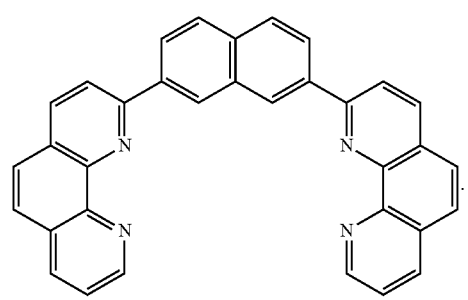
ET37
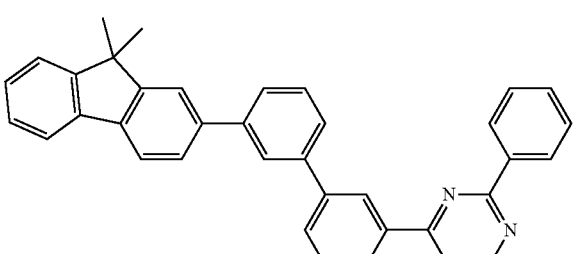
ET38
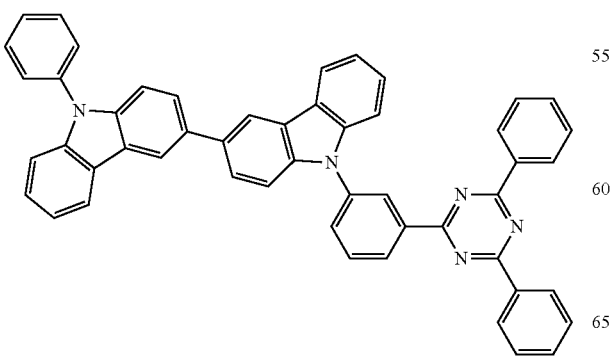
ET39
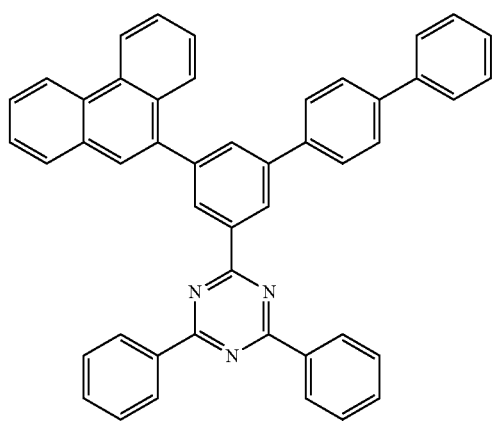
ET40
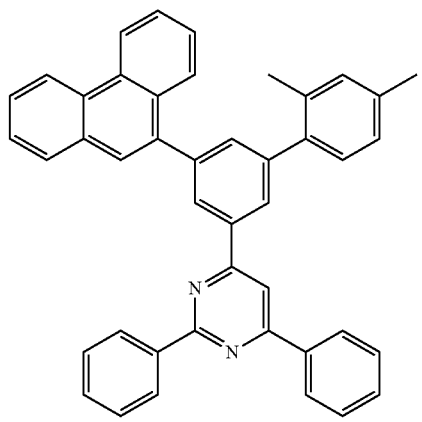
ET41
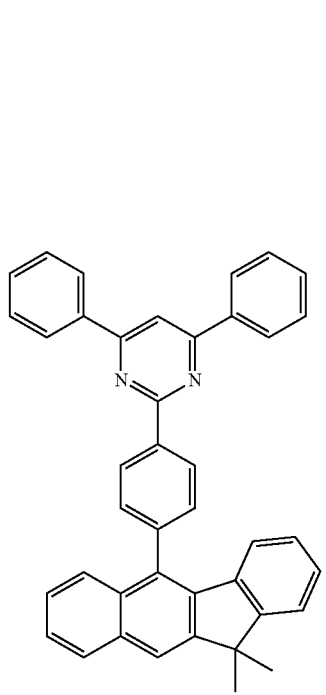

-continued

ET42

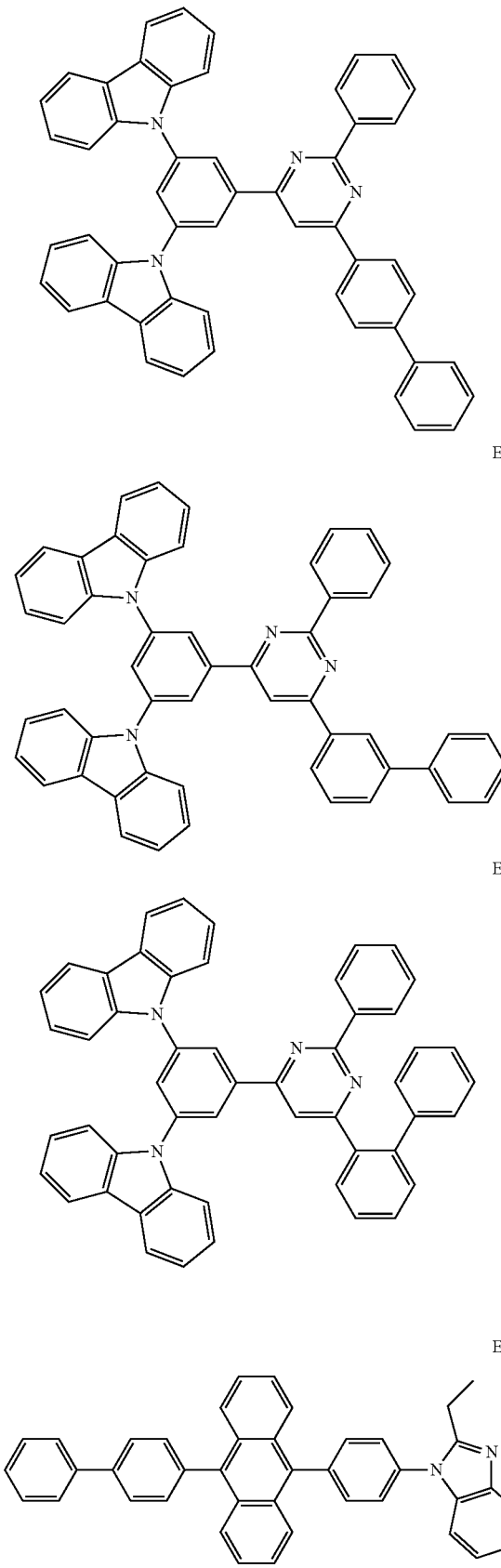

ET43

ET44

ET45

-continued

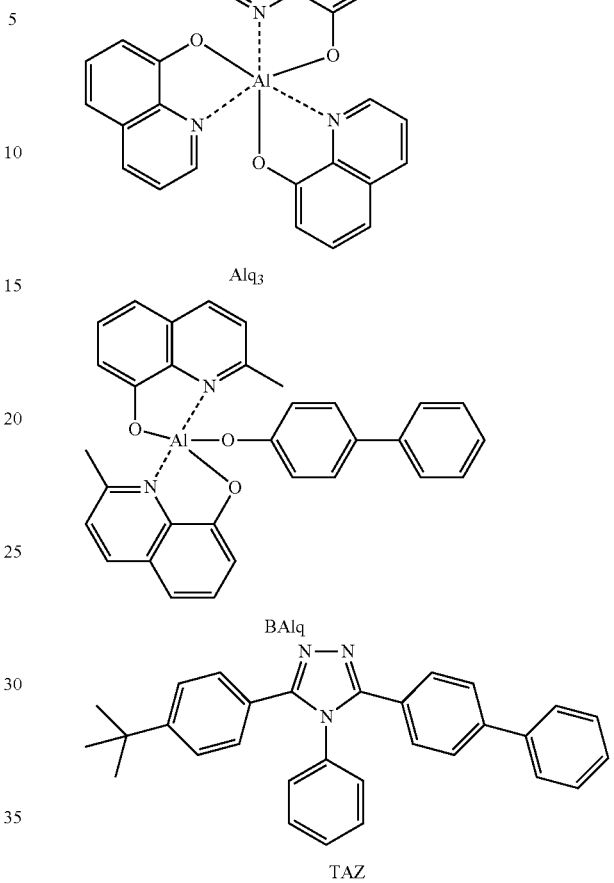

Alq₃

BAlq

TAZ

NTAZ

A thickness of the electron transport region may be in a range of about 160 Å to about 5,000 Å. For example, the thickness of the electron transport region may be in a range of about 100 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be in a range of about 20 Å to about 1,000 Å, and a thickness of the electron transport layer may be in a range of about 100 Å to about 1,000 Å. For example, the thicknesses of the buffer layer, the hole blocking layer, or the electron control layer may each independently be in a range of about 30 Å to about 300 Å. For example, the thickness of the electron transport layer may be in a range of about 150 Å to about 500 Å. When the thicknesses of the buffer layer, the hole blocking layer, the electron control layer, and/or the electron transport layer are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. The metal ion of an alkali metal complex may be a Li ion, a Na ion, a K ion, a Rb ion, or a Cs ion, and the metal ion of an alkaline earth metal complex may be a Be ion, a Mg ion, a Ca ion, a Sr ion, or a Ba ion. A ligand coordinated with the metal ion of the alkali metal complex or of the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) or ET-D2:

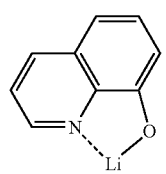

ET-D1

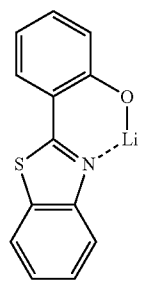

ET-D2

The electron transport region may include an electron injection layer that facilitates the injection of electrons from the second electrode 150. The electron injection layer may directly contact the second electrode 150.

The electron injection layer may have a structure consisting of a layer consisting of a single material, a structure consisting of a layer consisting of different materials, or a multi-layered structure including layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, or iodides), or tellurides of the alkali metal, the alkaline earth metal, and the rare earth metal, or any combination thereof.

The alkali metal-containing compound may include alkali metal oxides, such as $Li_2O$, $Cs_2O$, or $K_2O$, or alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $Ba_xSr_{1-x}O$ (x is a real number satisfying the condition of 0<x<1), $Ba_xCa_{1-x}O$ (x is a real number satisfying the condition of 0<x<1), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In embodiments, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include one of ions of the alkali metal, ions of the alkaline earth metal, and ions of the rare earth metal and a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In embodiments, the electron injection layer may further include an organic material (for example, a compound represented by Formula 601).

In embodiments, the electron injection layer may consist of an alkali metal-containing compound (for example, an alkali metal halide); or the electron injection layer may consist of an alkali metal-containing compound (for example, an alkali metal halide), and an alkali metal, an alkaline earth metal, a rare earth metal, or any combination thereof. In embodiments, the electron injection layer may be a KI:Yb co-deposited layer, an RbI:Yb co-deposited layer, or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within the range described above, the electron injection layer may have satisfactory electron injection characteristics without a substantial increase in driving voltage.

[Second Electrode 150]

The second electrode 150 may be disposed on the organic layer 130 described above. The second electrode 150 may be a cathode, which is an electron injection electrode, and as the material for the second electrode 150, a metal, an alloy, an electrically conductive compound, or any combination thereof, each having a low work function, may be used.

In embodiments, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including two or more layers.

[Capping Layer]

A first capping layer may be located outside the first electrode 110, and/or a second capping layer may be located outside the second electrode 150. In embodiments, the organic light-emitting device 10 may have a structure in which the first capping layer, the first electrode 110, the organic layer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the organic layer 130, the second electrode 150, and the second capping layer are stacked in this stated order.

Light generated in the emission layer 133 of the organic layer 130 of the organic light-emitting device 10 may be extracted toward the outside through the first electrode 110 (which may be a semi-transmissive electrode or a transmissive electrode) and through the first capping layer. Light generated in the emission layer 133 of the organic layer 130 of the organic light-emitting device 10 may be extracted toward the outside through the second electrode 150 (which may be a semi-transmissive electrode or a transmissive electrode) and through the second capping layer.

The first capping layer and the second capping layer may each increase external emission efficiency according to the principle of constructive interference. Accordingly, the light extraction efficiency of the organic light-emitting device 10 may be increased, so that the luminescence efficiency of the organic light-emitting device 10 may be improved.

Each of the first capping layer and the second capping layer may include a material having a refractive index (at a wavelength of about 589 nm) equal to or greater than about 1.6.

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may each independently be optionally substituted with a substituent containing O, N, S, Se, Si, F, Cl, Br, I, or any combination thereof. In embodiments, at least one of the first capping layer and the second capping layer may each independently include an amine group-containing compound.

In embodiments, at least one of the first capping layer and the second capping layer may each independently include a compound represented by Formula 201, a compound represented by Formula 202, or any combination thereof.

In embodiments, at least one of the first capping layer and the second capping layer may each independently include one of Compounds HT28 to HT33, one of Compounds CP1 to CP6, β-NPB, or any combination thereof:

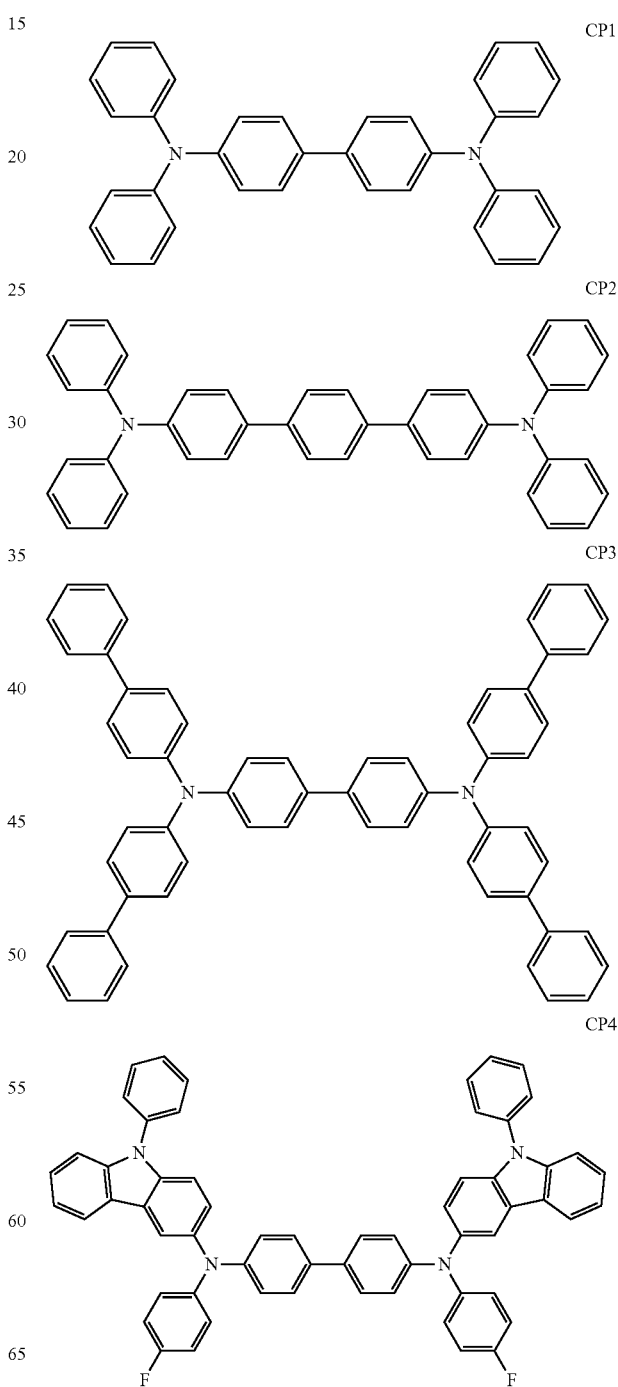

-continued

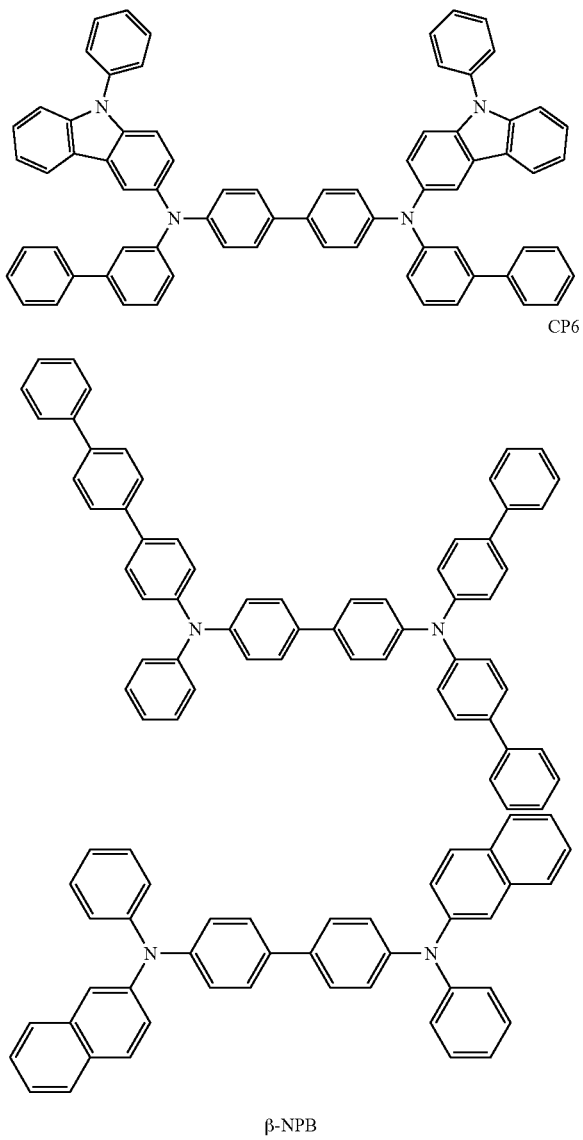

β-NPB

[Electronic Apparatus]

The organic light-emitting device may be included in various electronic apparatuses. In an embodiment, the electronic apparatus including the organic light-emitting device may be a light-emitting apparatus, an authentication apparatus, or the like.

The electronic apparatus (for example, the light-emitting apparatus) may further include, in addition to the organic light-emitting device, a color filter, a color conversion layer, or a color filter and a color conversion layer. The color filter and/or the color conversion layer may be located in at least one traveling direction of light emitted from the organic light-emitting device. For example, the light emitted from the organic light-emitting device may be blue light or white light. The organic light-emitting device may be the same as described above. In embodiments, the color conversion layer may include quantum dots. The quantum dot may be, for example, a quantum dot-containing material as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be located among the subpixels to define each of the subpixels.

The color filter may further include color filter areas and light-shielding patterns located among the color filter areas, and the color conversion layer may include color conversion areas and light-shielding patterns located among the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In embodiments, the first color light may be red light, the second color light may be green light, and the third color light may be blue light. In embodiments, the color filter areas (or the color conversion areas) may include quantum dots. For example, the first area may include a red quantum dot, the second area may include a green quantum dot, and the third area may not include a quantum dot. The quantum dot may be the same as described in the specification. The first area, the second area, and/or the third area may each include a scatterer.

For example, the organic light-emitting device may emit first light, the first area may absorb the first light to emit a first first-color light, the second area may absorb the first light to emit a second first-color light, and the third area may absorb the first light to emit a third first-color light. In this regard, the first first-color light, the second first-color light, and the third first-color light may each have different maximum emission wavelengths. For example, the first light may be blue light, the first first-color light may be red light, the second first-color light may be green light, and the third first-color light may be blue light.

The electronic apparatus may further include a thin-film transistor in addition to the organic light-emitting device as described above. The thin-film transistor may include a source electrode, a drain electrode, and an active layer, wherein any one of the source electrode and the drain electrode may be electrically connected to any one of the first electrode and the second electrode of the organic light-emitting device.

The thin-film transistor may further include a gate electrode, a gate insulating film, etc.

The active layer may include crystalline silicon, amorphous silicon, organic semiconductor, oxide semiconductor, or the like.

The electronic apparatus may further include a sealing portion for sealing the organic light-emitting device. The sealing portion may be located between the color filter and/or the color conversion layer and the organic light-emitting device. The sealing portion may allow light from the organic light-emitting device to be extracted to the outside, and may simultaneously prevent ambient air and moisture from penetrating into the organic light-emitting device. The sealing portion may be a sealing substrate including a transparent glass substrate or a plastic substrate. The sealing portion may be a thin-film encapsulation layer including at least one of an organic layer and/or an inorganic layer. When the sealing portion is a thin film encapsulation layer, the electronic apparatus may be flexible.

Various functional layers may be additionally located on the sealing portion, in addition to the color filter and/or the color conversion layer, according to the use of the electronic apparatus. The functional layers may include a touch screen layer, a polarizing layer, an authentication apparatus, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the organic light-emitting device, a biometric information collector.

The electronic apparatus may be applied to various displays, such as light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
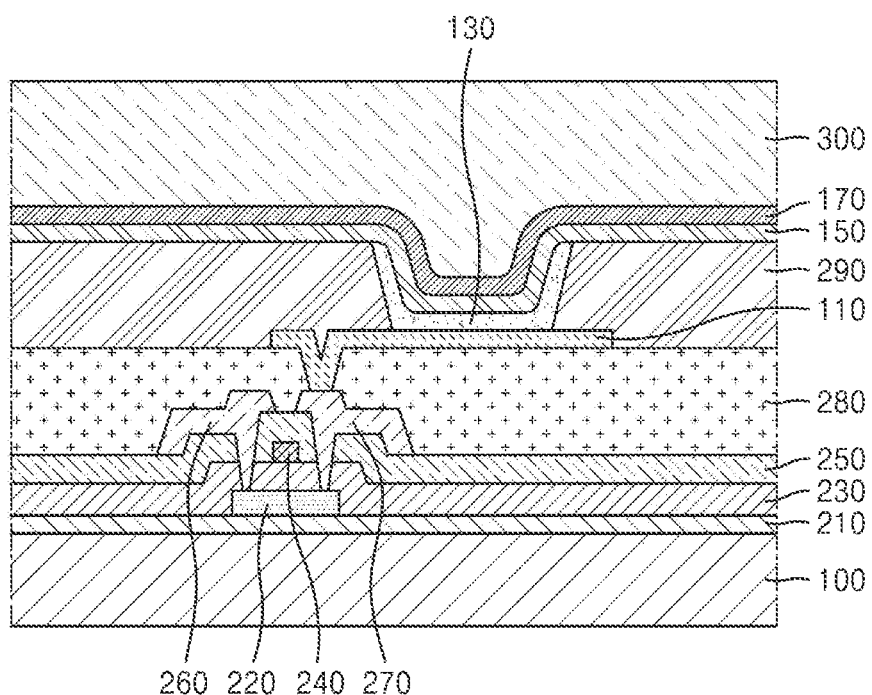
FIG. 2 is a schematic cross-sectional view of a light-emitting apparatus according to an embodiment of the disclosure.
Figure 3:
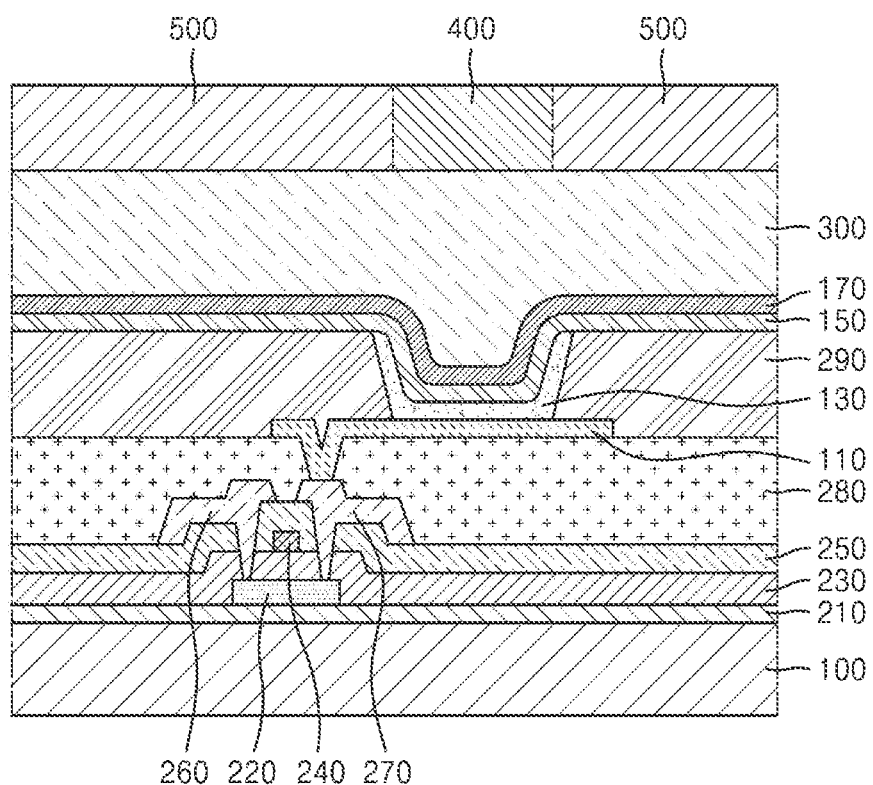
FIG. 3 is a schematic cross-sectional view of a light-emitting apparatus according to another embodiment of the disclosure.

[Description of FIGS. 2 and 3]

FIG. 2 is a schematic cross-sectional view showing an electronic apparatus according to an embodiment.

The electronic apparatus of FIG. 2 includes a substrate 100, a thin-film transistor (TFT), an organic light-emitting device, and an encapsulation portion 300 that seals the organic light-emitting device.

The substrate 100 may be a flexible substrate, a glass substrate, or a metal substrate. A buffer layer 210 may be formed on the substrate 100. The buffer layer 210 may prevent penetration of impurities through the substrate 100 and may provide a flat surface on the substrate 100.

A TFT may be located on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be located on the active layer 220, and the gate electrode 240 may be located on the gate insulating film 230.

An interlayer insulating film 250 is located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the active layer 220, and the source electrode 260 and the drain electrode 270 may be in contact with the exposed portions of the source region and the drain region of the active layer 220.

The TFT is electrically connected to the organic light-emitting device to drive the organic light-emitting device, and is protected by being covered by a passivation layer 280. The passivation layer 280 may include an inorganic insulating film, an organic insulating film, or any combination thereof. The organic light-emitting device is provided on the passivation layer 280. The organic light-emitting device includes a first electrode 110, an organic layer 130, and a second electrode 150.

The first electrode 110 may be formed on the passivation layer 280. The passivation layer 280 does not completely cover the drain electrode 270 and may expose a portion of the drain electrode 270, and the first electrode 110 may be electrically connected to the exposed portion of the drain electrode 270.

A pixel defining layer 290 containing an insulating material may be located on the first electrode 110. The pixel defining layer 290 may expose a region of the first electrode 110, and the organic layer 130 may be formed in the exposed region of the first electrode 110. The pixel defining layer 290 may be a polyimide or polyacrylic organic film. Although not shown in FIG. 2, at least some layers of the organic layer 130 may extend beyond the upper portion of the pixel defining layer 290 and may thus be provided in the form of a common layer.

The second electrode 150 may be located on the organic layer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on the organic light-emitting device to protect the organic light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or any combination thereof or any combination of the inorganic film and the organic film.

FIG. 3 is a schematic cross-sectional view showing an electronic apparatus according to an embodiment of the disclosure;

The light-emitting apparatus of FIG. 3 is the same as the light-emitting apparatus of FIG. 2, except that a light-shielding pattern 500 and a functional region 400 are additionally located on the encapsulation portion 300. The functional region 400 may be a color filter area, a color conversion area, or a combination of the color filter area and the color conversion area. In an embodiment, the organic light-emitting device included in the electronic apparatus of FIG. 3 may be a tandem light-emitting device.

Respective layers included in the hole transport region, the emission layer, and the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer 133, and layers constituting the electron transport region are formed by vacuum deposition, the deposition may be performed at a deposition temperature of about 100° C. to about 500° C., a vacuum degree of about 10-8 torr to about 10-3 torr, and a deposition speed of about 0.01 Å/sec to about 100 Å/sec, depending on a material to be included in a layer to be formed and the structure of a layer to be formed.

[Definitions of Terms]

The term "$C_3$-$C_{60}$ carbocyclic group" as used herein may be a cyclic group consisting only of carbon as a ring-forming atom and having three to sixty carbon atoms, and the term "$C_1$-$C_{60}$ heterocyclic group" as used herein may be a cyclic group that has one to sixty carbon atoms and further has, in addition to carbon, at least one heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, a $C_1$-$C_{60}$ heterocyclic group may have 3 to 61 ring-forming atoms.

The term "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein may be a cyclic group that has three to sixty carbon atoms and may not include *—N=*' as a ring-forming moiety, and the term "π electron-deficient nitrogen-containing $C_1$-$C_{60}$ cyclic group" as used herein may be a heterocyclic group that has one to sixty carbon atoms and may include *—N=*' as a ring-forming moiety.

For example, the $C_3$-$C_{60}$ carbocyclic group may be a T1 group or a condensed cyclic group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be a T2 group, a condensed cyclic group in which two or more T2 groups are condensed with each other, or a condensed cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be a T1 group, a condensed cyclic group in which two or more T1 groups T1 are condensed with each other, a T3 group, a condensed cyclic group in which two or more T3 groups are condensed with each other, or a condensed cyclic group in which at least one T3 group and at least one T1 group are condensed with each other (for example, the $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be a T4 group, a condensed cyclic group in which two or more T4 groups are condensed with each other, a condensed cyclic group in which at least one T4 group and at least one T1 group are condensed with each other, a condensed cyclic group in which at least one T4 group and at least one T3 group are condensed with each other, or a condensed cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group," "$C_3$-$C_{60}$ carbocyclic group," "$C_1$-$C_{60}$ heterocyclic group," "π electron-rich $C_3$-$C_{60}$ cyclic group," or "π electron-deficient nitrogen-containing $C_1$-$C_{60}$ cyclic group" as used herein may be a group condensed to any cyclic group or a polyvalent group (for example, a divalent group, a trivalent group, a tetravalent group, etc.), depending on the structure of a formula in connection with which the terms are used. In embodiments, "a benzene group" may be a benzo group, a phenyl group, a phenylene group, or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the monovalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein may be a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at the terminus of the $C_2$-$C_{60}$ alkyl group, and examples thereof may include an ethenyl group, a propenyl group, and a butenyl group. The term "$C_2$-$C_{60}$ alkenylene group" as used herein refers to a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at the terminus of the $C_2$—$C_{60}$ alkyl group, and examples thereof may include an ethynyl group and a propynyl group. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by —O$A_{101}$ (wherein $A_{101}$ is a $C_1$-$C_{60}$ alkyl group), and examples thereof may include a methoxy group, an ethoxy group, and an isopropyloxy group.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group that further includes, in addition to a carbon atom, at least one heteroatom as a ring-forming atom and has 1 to 10 carbon atoms, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" as used herein may be a monovalent cyclic group that has three to ten carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein may be a divalent group having a same structure as the $C_3$-$C_{10}$ cycloalkenyl group.

The term "$C_1$-$C_{10}$ heterocycloalkenyl group" as used herein may be a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system having six to sixty carbon atoms, and the term "$C_6$-$C_{60}$ arylene group" as used herein may be a divalent group having a carbocyclic aromatic system having six to sixty carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as used herein may be a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein may be a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein may be a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group may include an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein may be a divalent group having a same structure as a monovalent non-aromatic condensed polycyclic group.

The term "monovalent non-aromatic condensed heteropolycyclic group" as used herein may be a monovalent group (for example, having 1 to 60 carbon atoms) having two or more rings condensed to each other, at least one heteroatom other than carbon atoms, as a ring-forming atom, and non-aromaticity in its entire molecular structure. Examples of the monovalent non-aromatic condensed heteropolycyclic group may include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein may be a divalent group having a same structure as a monovalent non-aromatic condensed heteropolycyclic group.

The term "$C_6$-$C_{60}$ aryloxy group" as used herein may be represented by —$OA_{102}$ (wherein $A_{102}$ is a $C_6$-$C_{60}$ aryl group), and the term "$C_6$-$C_{60}$ arylthio group" as used herein may be represented by —$SA_{103}$ (wherein $A_{103}$ is a $C_6$-$C_{60}$ aryl group).

The term "$R_{10a}$" as used herein may be:
deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof, or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein may be any atom other than a carbon atom or a hydrogen atom. Examples of the heteroatom may include O, S, N, P, Si, B, Ge, Se, and any combination thereof.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, and the term "OMe" as used herein refers to a methoxy group.

The term "biphenyl group" as used herein may be "a phenyl group substituted with a phenyl group." For example, the "biphenyl group" may be a substituted phenyl group having a $C_6$-$C_{60}$ aryl group as a substituent.

The term "terphenyl group" as used herein may be "a phenyl group substituted with a biphenyl group". For example, the "terphenyl group" may be a substituted phenyl group having, as a substituent, a $C_6$-$C_{60}$ aryl group substituted with a $C_6$-$C_{60}$ aryl group.

In the specification, * and *' as used herein, unless defined otherwise, each represent a binding site to a neighboring atom in a corresponding formula.

EXAMPLES

Example 1

As an anode, an ITO substrate was cut to a size of 50 mm×50 mm×0.5 mm, sonicated with acetone, isopropyl alcohol, and pure water each for 15 minutes, and cleaned by exposure to ultraviolet rays and ozone for 30 minutes. The ITO substrate was provided to a vacuum deposition apparatus.

HT1 was deposited on the ITO substrate to form a hole injection layer having a thickness of 120 nm, Compound 1-3 was vacuum-deposited on the hole injection layer to form a hole transport layer having a thickness of 5 nm, Compounds 1-3 and 1-4 were co-deposited on the hole transport layer to a weight ratio of 1:1 to form an auxiliary layer having a thickness of 5 nm, and Compounds 1-3, 2-16, 3-11, and 4-1 were co-deposited to a weight ratio of 7:3:1:0.1 to form an emission layer of 30 nm. Compound ET1 was deposited on the emission layer to form a first electron transport layer having a thickness of 5 nm, and Compound ET2 and LiQ were co-deposited on the first buffer layer to a weight ratio of 5:5 to form a second electron transport layer having a thickness of 20 nm. LiQ was deposited on the second electron transport layer to form an electron injection layer having a thickness of 1 nm. Mg and Ag were co-deposited on the electron injection layer to a weight ratio of 5:5 to form a cathode having a thickness of 10 nm, thereby completing the manufacture of an organic light-emitting device.

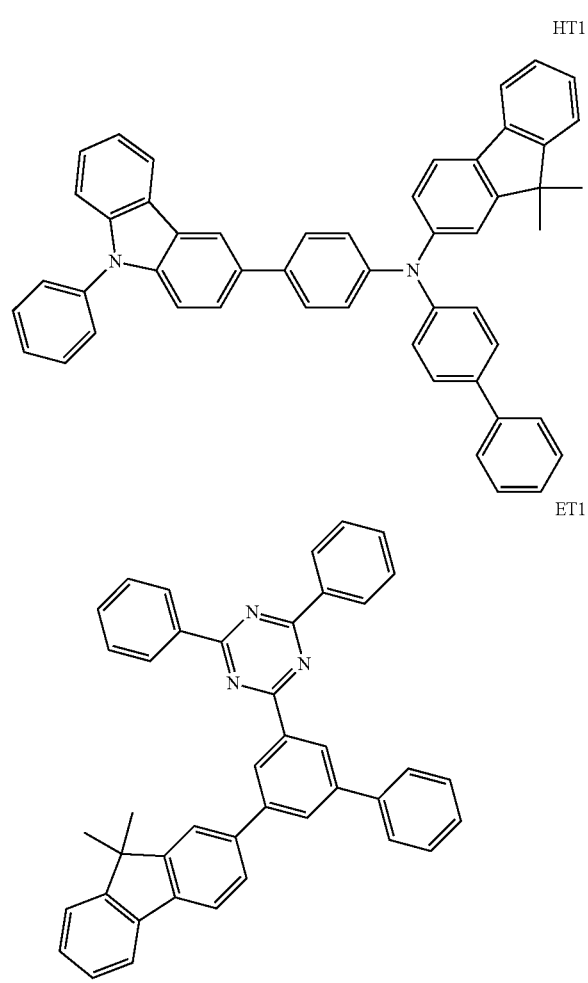

HT1

ET1

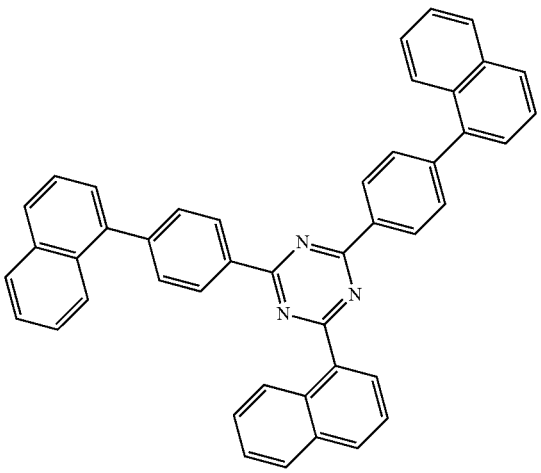

ET2

Example 2

Organic light-emitting devices were manufactured in the same manner as in Example 1, except that, in forming the auxiliary layer, Compound 2-6 was used instead of Compound 1-4.

Comparative Example 1

Organic light-emitting devices were manufactured in the same manner as in Example 1, except that the auxiliary layer was not formed.

Comparative Example 2

Organic light-emitting devices were manufactured in the same manner as in Example 1, except that, instead of forming the auxiliary layer of Example 1, TCTA was deposited on the hole transport layer to form an auxiliary layer having a thickness of 5 nm.

Comparative Example 3

Organic light-emitting devices were manufactured in the same manner as in Example 1, except that, instead of forming the auxiliary layer of Example 1, mCBP was deposited on the hole transport layer to form an auxiliary layer having a thickness of 5 nm.

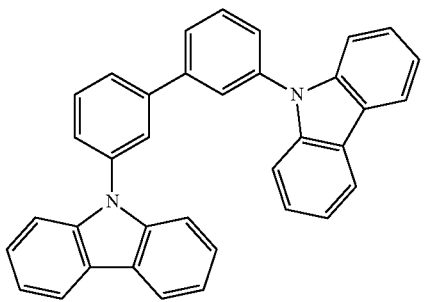

[mCBP]

Comparative Example 4

Organic light-emitting devices were manufactured in the same manner as in Example 1, except that, instead of forming the auxiliary layer of Example 1, Compound 1-3 was deposited on the hole transport layer to form an auxiliary layer having a thickness of 5 nm.

Evaluation Example 1

The lifespan and driving voltage of the organic light-emitting devices manufactured according to Examples 1 and 2 and Comparative Examples 1 to 4 were measured at a current density of 20 mA/cm² by using Keithley SMU 236 and a luminance meter PR650, and results thereof are shown in Table 1. The lifespan indicates an amount of time that lapsed for the luminance to reach 90% of initial luminance (100%). The lifespan is shown in percentage values relative to Comparative Example 1.

TABLE 1

|  | Lifespan | Driving voltage |
|---|---|---|
| Comparative Example 1 | 100% | 5.0 V |
| Comparative Example 2 | 110% | 4.9 V |
| Comparative Example 3 | 105% | 4.9 V |
| Comparative Example 4 | 120% | 4.8 V |
| Example 1 | 135% | 4.5 V |
| Example 2 | 130% | 4.3 V |

Table 1 shows that the organic light-emitting devices manufactured according to Examples 1 and 2 are more excellent and the driving voltages thereof are lower compared to those of the organic light-emitting devices manufactured according to Comparative Examples 1 to 4.

The organic light-emitting device includes an auxiliary layer including a host between an emission layer and a hole transport region and adjusts hole injection while controlling the light-emitting region, thereby exhibiting a low driving voltage and a long lifespan through the control of exciton concentration and distribution in the emission layer.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. An organic light-emitting device comprising:
a first electrode;
a second electrode; and
an organic layer disposed between the first electrode and the second electrode,
wherein the organic layer includes:
an emission layer;
a first region between the first electrode and the emission layer;
a second region between the emission layer and the second electrode; and
an auxiliary layer between the first region and the emission layer,
the emission layer includes a first compound, a second compound, a third compound, and a fourth compound,
the first compound is a hole transporting host compound,
the second compound is an electron transporting host compound or a bipolar host compound,
the third compound is a thermally activated delayed fluorescence (TADF) compound satisfying Equation 1 or an organometallic complex,
the fourth compound is a fluorescent dopant,
the auxiliary layer includes two different fifth compounds, and
the fifth compounds are each independently the first compound or the second compound:

$$\Delta E_{ST}(C3) \le 0.3 \text{ eV} \quad \text{[Equation 1]}$$

wherein in Equation 1,
$\Delta E_{ST}(C3)$ is a difference between a lowest singlet excitation energy level ($E_{S1}(C3)$) of the third compound and a lowest triplet excitation energy level ($E_{T1}(C3)$) of the third compound.

2. The organic light-emitting device of claim 1, wherein the first electrode is an anode,
the second electrode is a cathode,
the first region is a hole transport region including a hole injection layer, a hole transport layer, an emission auxiliary layer, an electron blocking layer, or a combination thereof, and
the second region is an electron transport region including a hole blocking layer, a buffer layer, an electron transport layer, an electron injection layer, or a combination thereof.

3. The organic light-emitting device of claim 1, wherein the auxiliary layer directly contacts the emission layer.

4. The organic light-emitting device of claim 1, wherein the auxiliary layer includes a first compound and a second compound, or
the auxiliary layer includes two different first compounds, or
the auxiliary layer includes two different second compounds.

5. The organic light-emitting device of claim 1, wherein the first compound, the second compound, and the third compound are different from each other.

6. The organic light-emitting device of claim 1, wherein a distance between a maximum peak wavelength of an absorption spectrum of the fourth compound and a maximum peak wavelength of an emission spectrum of the fourth compound is equal to or less than about 35 nm.

7. The organic light-emitting device of claim 1, wherein a concentration of the fourth compound in the emission layer is equal to or less than about ⅓ of a concentration of the third compound in the emission layer.

8. The organic light-emitting device of claim 1, wherein the second region includes a first layer and a second layer that each include an organic compound.

9. The organic light-emitting device of claim 1, wherein the first compound is represented by Formula 1:

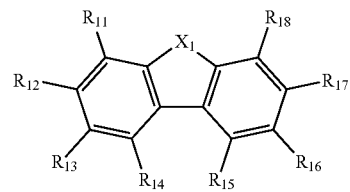

wherein in Formula 1, $X_{11}$ is selected from O, S, $N(R_{19})$, and $C(R_{19})(R_{20})$, $R_{11}$ to $R_{20}$ are each independently selected from:

a group represented by *-$(L_{11})_{a11}$-$A_{11}$, hydrogen, deuterium, a $C_1$-$C_{60}$ alkyl group, a π electron-deficient nitrogen-free cyclic group, —$C(Q_1)(Q_2)(Q_3)$, —$Si(Q_1)(Q_2)(Q_3)$, —$B(Q_1)(Q_2)$, and —$N(Q_1)(Q_2)$;

a π electron-deficient nitrogen-free cyclic group substituted with at least one selected from deuterium, a $C_1$-$C_{60}$ alkyl group, a π electron-deficient nitrogen-free cyclic group, —$C(Q_{31})(Q_{32})(Q_{33})$, —$Si(Q_{31})(Q_{32})(Q_{33})$, —$B(Q_{31})(Q_{32})$, and —$N(Q_{31})(Q_{32})$; and a π electron-deficient nitrogen-free cyclic group substituted with a π electron-deficient nitrogen-free cyclic group substituted with at least one selected from deuterium, a $C_1$-$C_{60}$ alkyl group, a π electron-deficient nitrogen-free cyclic group, —$C(Q_{21})(Q_{22})(Q_{23})$, —$Si(Q_{21})(Q_{22})(Q_{23})$, —$B(Q_{21})(Q_{22})$, and —$N(Q_{21})(Q_{22})$, $L_{11}$ is selected from:

a π electron-deficient nitrogen-free cyclic group, —$C(Q_1)(Q_2)$-, —$Si(Q_1)(Q_2)$-, —$B(Q_1)$-, and —$N(Q_1)$-; and a π electron-deficient nitrogen-free cyclic group substituted with at least one selected from deuterium, a $C_1$-$C_{60}$ alkyl group, a π electron-deficient nitrogen-free cyclic group, —$C(Q_{31})(Q_{32})(Q_{33})$, —$Si(Q_{31})(Q_{32})(Q_{33})$, —$B(Q_{31})(Q_{32})$, and —$N(Q_{31})(Q_{32})$, a11 is selected from 1, 2, and 3, $A_{11}$ is selected from:

a π electron-deficient nitrogen-free cyclic group;

a π electron-deficient nitrogen-free cyclic group substituted with at least one selected from deuterium, a $C_1$-$C_{60}$ alkyl group, a π electron-deficient nitrogen-free cyclic group, —$C(Q_{31})(Q_{32})(Q_{33})$, —$Si(Q_{31})(Q_{32})(Q_{33})$, —$B(Q_{31})(Q_{32})$, and —$N(Q_{31})(Q_{32})$; and a π electron-deficient nitrogen-free cyclic group substituted with a π electron-deficient nitrogen-free cyclic group substituted with at least one selected from deuterium, a $C_1$-$C_{60}$ alkyl group, a n electron-deficient nitrogen-free cyclic group, —$C(Q_{21})(Q_{22})(Q_{23})$, —$Si(Q_{21})(Q_{22})(Q_{23})$, —$B(Q_{21})(Q_{22})$, and —$N(Q_{21})(Q_{22})$, and any two or more neighboring groups of $R_{11}$ to $R_{20}$ are optionally linked to each other to form a group selected from:

a π electron-deficient nitrogen-free cyclic group; and a π electron-deficient nitrogen-free cyclic group substituted with at least one selected from deuterium, a $C_1$-$C_{60}$ alkyl group, a π electron-deficient nitrogen-free cyclic group, —$C(Q_{31})(Q_{32})(Q_{33})$, —$Si(Q_{31})(Q_{32})(Q_{33})$, —$B(Q_{31})(Q_{32})$, and —$N(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —$C_1$; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

10. The organic light-emitting device of claim 9, wherein $A_{11}$ is selected from:

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_{31})(Q_{32})(Q_{33})$, —$Si(Q_{31})(Q_{32})(Q_{33})$, —$B(Q_{31})(Q_{32})$, and —$N(Q_{31})(Q_{32})$; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_{21})(Q_{22})(Q_{23})$, —$Si(Q_{21})(Q_{22})(Q_{23})$, —$B(Q_{21})(Q_{22})$, and —$N(Q_{21})(Q_{22})$, wherein $Q_{21}$ to $Q_{23}$ and $Q_{31}$ to $Q_{33}$ are each independently: hydrogen; deuterium; —F; —$C_1$; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

11. The organic light-emitting device of claim 1, wherein
the electron transporting host compound comprises an
electron withdrawing group (EWG), and
the bipolar host compound comprises an EWG and an
electron donating group (EDG).

12. The organic light-emitting device of claim 1, wherein
the second compound is represented by one of Formulae 2-1
and 2-2:

[Formula 2-1]

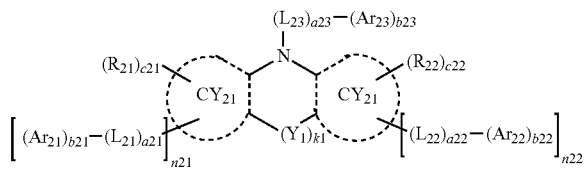

[Formula 2A]

[Formula 2-2]

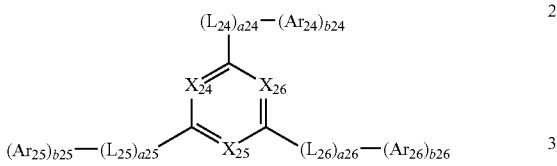

wherein in Formulae 2-1, 2A, and 2-2,

Y is selected from a single bond, —O—, —S—, —C($R_{24}$)
($R_{25}$)—, —N($R_{24}$)—, Si($R_{24}$)($R_{25}$)—, —C(=O)—,
—S(=O)$_2$—, —B($R_{24}$)—, —P($R_{24}$)—, and —P(=O)
($R_{24}$)($R_{25}$)—, k1 is 0 or 1, $CY_{21}$ and $CY_{22}$ are each independently a $C_3$-$C_{60}$ carbocyclic group or a $C_1$-$C_{60}$ heterocyclic group, $L_{21}$ to $L_{27}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $Ar_{21}$ to $Ar_{27}$ are each independently selected from a group represented by Formula 2A, a $C_3$-$C_{60}$ carbocyclic group unsubstituted or substituted with at least one $R_{10a}$, and a $C_1$-$C_{60}$ heterocyclic group unsubstituted or substituted with at least one $R_{10a}$, at least one of $Ar_{21}$ to $Ar_{23}$ is a group represented by Formula 2A, a21 to a27 are each independently an integer from 0 to 3,
b21 to b27 are each independently an integer from 1 to 8,
c21 and c22 are each independently an integer from 1 to 20,
n21 and n22 are each independently an integer from 1 to 8, $X_{21}$ to $X_{23}$ are each independently C or N, when each of $X_{21}$ to $X_{23}$ is C, at least one selected from $R_{21}$ to $R_{23}$ is —F; a cyano group; or a $C_1$-$C_{60}$ alkyl group substituted with at least one selected from –F and a cyano group, $X_{24}$ to $X_{26}$ are each independently C($R_{26}$) or N,
at least one selected from $X_{24}$ to $X_{26}$ is N, $R_{21}$ to $R_{26}$ are each independently selected from *-($L_{27}$)$_{a27}$-($Ar_{27}$)$_{b27}$, hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), and —P(=O)($Q_1$)($Q_2$), any two or more neighboring groups of $Ar_{21}$ to $Ar_{27}$ and $R_{21}$ to $R_{26}$ are optionally bonded to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and * indicates a binding site to a neighboring atom, wherein $Q_1$ to $Q_3$ are each independently selected from: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; and a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

13. The organic light-emitting device of claim 1, wherein the third compound is represented by one of Formulae 3 or 4-1 to 4-3:

$$M_{31}(L_{31})_{n31}(L_{32})_{n32}$$ [Formula 3]

[Formula 3A]

[Formula 3B]

[Formula 3C]

-continued

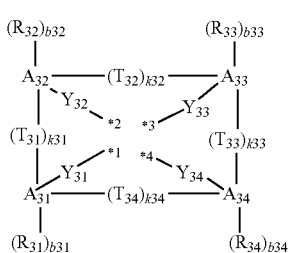

[Formula 3D]

$(D_{41})_{n41}\text{-}(L_{41})_{a41}\text{-}(A_{41})_{m41}$ [Formula 4-1]

$(D_{41})_{n41}\text{-}(L_{41})_{a41}\text{-}(A_{41})_{m41}\text{-}(L_{42})_{a42}\text{-}(D_{42})_{n42}$ [Formula 4-2]

$(A_{41})_{m41}\text{-}(L_{41})_{a41}\text{-}(D_{41})_{n41}\text{-}(L_{42})_{a42}\text{-}(A_{42})_{m42}$, [Formula 4-3]

wherein in Formulae 3, 3A to 3D, and 4-1 to 4-3, $M_{31}$ is selected from a first-row transition metal of the Periodic Table of Elements, a second-row transition metal of the Periodic Table of Elements, and a third-row transition metal of the Periodic Table of Elements, $L_{31}$ is a ligand represented by one of Formulae 3A to 3D, $L_{32}$ is selected from a monodentate ligand, a bidentate ligand, and a tridentate ligand, n31 is selected from 1 and 2, n32 is selected from 0, 1, 2, 3, and 4, $A_{31}$ to $A_{34}$ are each independently selected from a $C_5$-$C_{30}$ carbocyclic group and a $C_1$-$C_{30}$ heterocyclic group, $T_{31}$ to $T_{34}$ are each independently selected from a single bond, a double bond, *—O—*', *—S—*', *—C(=O)—*', *—S(=O)—*', *—C($R_{35}$)($R_{36}$)—*', *—C($R_{35}$)—C($R_{36}$)—*', *—C($R_{35}$)—*', *—Si($R_{35}$)($R_{36}$)—*', *—B($R_{35}$)—*', *—N($R_{35}$)—*', and *—P($R_{35}$)—*', k31 to k34 are each independently selected from 1, 2, and 3, $Y_{31}$ to $Y_{34}$ are each independently selected from a single bond, *—O—*', *—S—*', *—C($R_{37}$)($R_{38}$)—*''', *—Si($R_{37}$)($R_{38}$)—*', *—B($R_{37}$)—*', *—N($R_{37}$)—*', and *—P($R_{37}$)—*',

*$_1$, *$_2$, *$_3$, and *$_4$ each indicate a binding site to $M_{31}$, $R_{31}$ to $R_{38}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), $R_{31}$ to $R_{38}$ are optionally bonded to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, b31 to b34 are each independently an integer from 0 to 10, and $A_{41}$ and $A_{42}$ are each independently selected from:

a π electron-deficient nitrogen-containing cyclic group, —Si($R_{41}$)($R_{42}$)($R_{43}$), —B($R_{41}$)($R_{42}$), and —N($R_{41}$)($R_{42}$);

a π electron-deficient nitrogen-containing cyclic group substituted with at least one selected from deuterium, a $C_1$-$C_{60}$ alkyl group, a π electron-deficient nitrogen-containing cyclic group, —C($Q_{31}$)($Q_{32}$)($Q_{33}$), —Si($Q_{31}$)($Q_{32}$)($Q_{33}$), —B($Q_{31}$)($Q_{32}$), and —N($Q_{31}$)($Q_{32}$); and a π electron-deficient nitrogen-containing cyclic group substituted with a π electron-deficient nitrogen-containing cyclic group substituted with at least one selected from deuterium, a $C_1$-$C_{60}$ alkyl group, a π electron-deficient nitrogen-containing cyclic group, —C($Q_{21}$)($Q_{22}$)($Q_{23}$), —Si($Q_{21}$)($Q_{22}$)($Q_{23}$), —B($Q_{21}$)($Q_{22}$), and —N($Q_{21}$)($Q_{22}$), $R_{41}$ to $R_{43}$ are each independently optionally bonded with $L_{41}$ or $L_{42}$ through *—($Z_{41}$)—*' to form a $C_5$-$C_{30}$ carbocyclic group or a $C_1$-$C_{30}$ heterocyclic group, $Z_{41}$ is selected from a single bond, O, S, N, Se, Si($R_{44}$)($R_{45}$), and C($R_{44}$)($R_{45}$), $R_{41}$ to $R_{45}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group unsubstituted or substituted with at least one $R_{10a}$, a $C_2$-$C_{60}$ alkenyl group unsubstituted or substituted with at least one $R_{10}$, a $C_2$-$C_{60}$ alkynyl group unsubstituted or substituted with at least one $R_{10}$, a $C_1$-$C_{60}$ alkoxy group unsubstituted or substituted with at least one $R_{10}$, a $C_6$-$C_{60}$ aryloxy group unsubstituted or substituted with at least one $R_{10}$, a $C_6$-$C_{60}$ arylthio group unsubstituted or substituted with at least one $R_{10}$, a $C_3$-$C_{60}$ carbocyclic group unsubstituted or substituted with at least one $R_{10}$, a $C_1$-$C_{60}$ heterocyclic group unsubstituted or substituted with at least one $R_{10}$, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), m41 and m42 are each independently selected from 1, 2, and 3, $D_{41}$ and $D_{42}$ are each independently selected from:

—F, a cyano group, a π electron-deficient nitrogen-free cyclic group, a group containing C(=O), a group containing P(=O), and a group containing P(=S);

a π electron-deficient nitrogen-free cyclic group, a group containing C(=O), a group containing P(=O), and a group containing P(=S), each substituted with at least one selected from deuterium, —F, a cyano group, a $C_1$-$C_{60}$ alkyl group, and a π electron-deficient nitrogen-free cyclic group;

a $C_1$-$C_{60}$ alkyl group and a π electron-deficient nitrogen-free cyclic group, each substituted with at least one selected from deuterium, —F, a cyano group, and a π electron-deficient nitrogen-free cyclic group;

a π electron-deficient nitrogen-free cyclic group, a group containing C(=O), a group containing P(=O), and a group containing P(=S), each substituted with at least one from a $C_1$-$C_{60}$ alkyl group and a π electron-deficient nitrogen-free cyclic group that are each substituted with at least one selected from deuterium, —F, a cyano group, a $C_1$-$C_{60}$ alkyl group, and a π electron-deficient nitrogen-free cyclic group;

a $C_1$-$C_{60}$ alkyl group and a π electron-deficient nitrogen-free cyclic group, each substituted with a π electron-deficient nitrogen-free cyclic group substituted with at least one selected from deuterium, —F, a cyano group, a $C_1$-$C_{60}$ alkyl group, and a π electron-deficient nitrogen-free cyclic group; and a $C_1$-$C_{60}$ alkyl group and a π electron-deficient nitrogen-free cyclic group, each substituted with at least one selected from a $C_1$-$C_{60}$ alkyl group and a π electron-deficient nitrogen-free cyclic group that are each substituted with at least one selected from deuterium, —F, a cyano group, and a π electron-deficient nitrogen-free cyclic group, n41 and n42 are each independently selected from 1, 2, and 3, $L_{41}$ and $L_{42}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and a11 is selected from 0, 1, 2, and 3, wherein $Q_1$ to $Q_3$ are each independently selected from: hydrogen; deuterium; —F; —$C_1$; —Br; I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; and a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

14. The organic light-emitting device of claim 13, wherein the third compound is represented by one of Formulae 3-1 and 3-2:

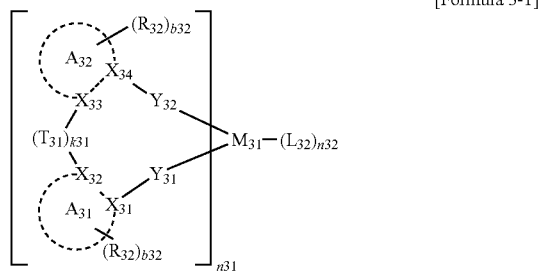

[Formula 3-1]

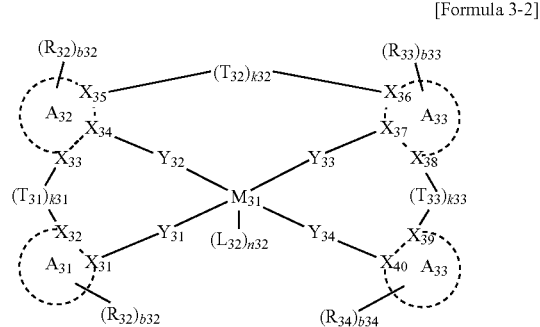

[Formula 3-2]

wherein in Formulae 3-1 and 3-2, $X_{31}$ to $X_{40}$ are each independently selected from N and C, and $M_{31}$, $L_{32}$, n31, n32, $A_{31}$ to $A_{34}$, $T_{31}$ to $T_{33}$, k31 to k33, $Y_{31}$ to $Y_{34}$, $R_{32}$ to $R_{38}$, b32 to b34 are the same as defined in connection with Formulae 3 and 3A to 3D.

15. The organic light-emitting device of claim 13, wherein $D_{41}$ and $D_{42}$ in Formulae 4-1 to 4-3 are each independently a group represented by Formula 12:

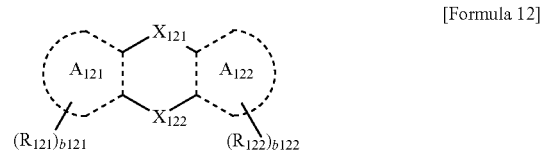

[Formula 12]

wherein in Formula 12, $X_{121}$ is selected from O, S, N($R_{123}$), and C($R_{123}$)($R_{124}$), $X_{122}$ is selected from a single bond, O, S, N($R_{125}$), and C($R_{125}$)($R_{126}$), $A_{121}$ and $A_{122}$ are each independently a n electron-deficient nitrogen-free cyclic group, $R_{121}$ to $R_{126}$ are each independently selected from:

a binding site, hydrogen, deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —Si($Q_{31}$)($Q_{32}$)($Q_{33}$), —B($Q_{31}$)($Q_{32}$), and —N($Q_{31}$)($Q_{32}$); and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —Si($Q_{21}$)($Q_{22}$)($Q_{23}$), —B($Q_{21}$)($Q_{22}$), and —N($Q_{21}$)($Q_{22}$), $R_{123}$ and $R_{124}$ are optionally linked to each other to form a π electron-deficient nitrogen-free cyclic group, $R_{125}$ and $R_{126}$ are optionally linked to each other to form a π electron-deficient nitrogen-free cyclic group, at least one selected from $R_{121}$ to $R_{126}$ is a binding site, and b121 and b122 are each independently selected from 1, 2, 3, 4, 5, and 6, wherein $Q_{21}$ to $Q_{23}$ and $Q_{31}$ to $Q_{33}$ are each independently: hydrogen; deuterium; —F; —$C_1$; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

16. The organic light-emitting device of claim 1, wherein the fourth compound is represented by one of Formulae 5(1), 5(2), 5(3), and 501:

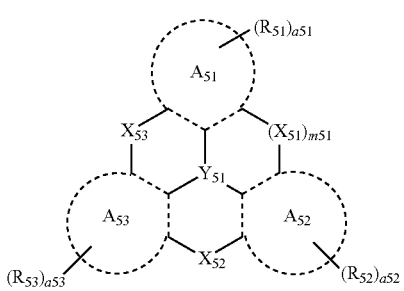

[Formula 5(1)]

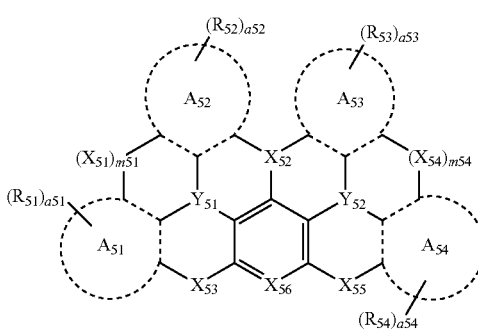

[Formula 5(2)]

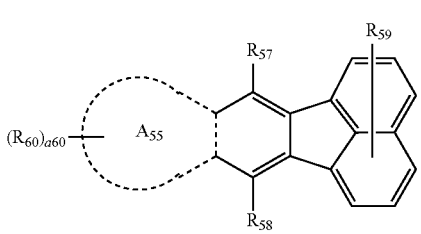

[Formula 5(3)]

$$Ar_{501}\!-\!\!\left[(L_{503})_{xd3}\!-\!N\!\!\begin{array}{c}(L_{501})_{xd1}\!-\!R_{501}\\ \\ (L_{502})_{xd2}\!-\!R_{502}\end{array}\right]_{xd4}$$

[Formula 501]

wherein in Formulae 5(1) to 5(3), $Y_{51}$ and $Y_{52}$ are each independently N, B, or P, $X_{51}$ to $X_{55}$ are each independently a single bond, O, S, $N(R_{55})$, $C(R_{55})(R_{56})$, or $Si(R_{55})(R_{56})$, m51 and m52 are each independently 0, 1, or 2, when m51 is 0, $A_{51}$ and $A_{52}$ are not linked to each other, when m54 is 0, $A_{53}$ and $A_{54}$ are not linked to each other, $A_{51}$ to $A_{55}$ are each independently a $C_5$-$C_{60}$ carbocyclic group or a $C_1$-$C_{60}$ heterocyclic group, and $R_{51}$ to $R_{60}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_1$)($Q_2$)($Q_3$), —B($Q_1$)($Q_2$), —C(=O)($Q_1$), —N($Q_1$)($Q_2$), —P(=O)($Q_1$)($Q_2$), and —S(=O)$_2$($Q_1$)($Q_2$), wherein in Formula 501, $Ar_{501}$, $L_{501}$ to $L_{503}$, $R_{501}$, and $R_{502}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 are each independently 0, 1, 2, or 3, and xd4 is 1, 2, 3, 4, 5, or 6, wherein $Q_1$ to $Q_3$ are each independently: hydrogen; deuterium; —F; —$C_1$; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

17. The organic light-emitting device of claim 1, wherein the first compound is selected from compounds of Group I, the second compound is selected from compounds of Group II, the third compound is selected from compounds of Group III-1 and Group III-2, and the fourth compound is selected from compounds of Group IV:

[Group I]

1-1

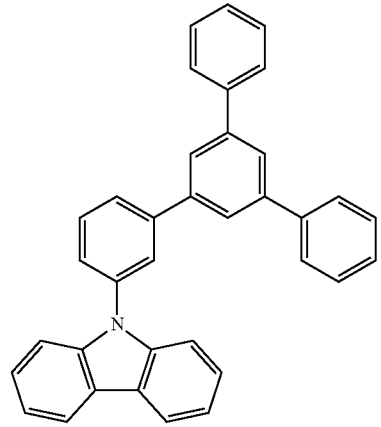

1-2
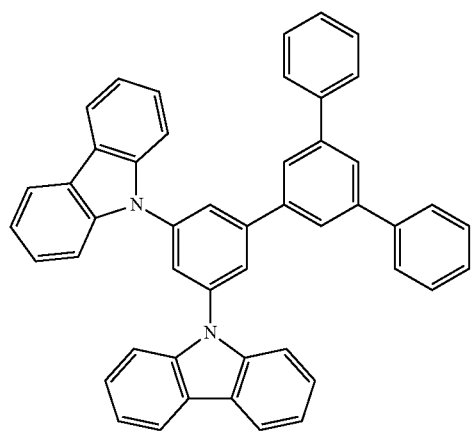
1-3
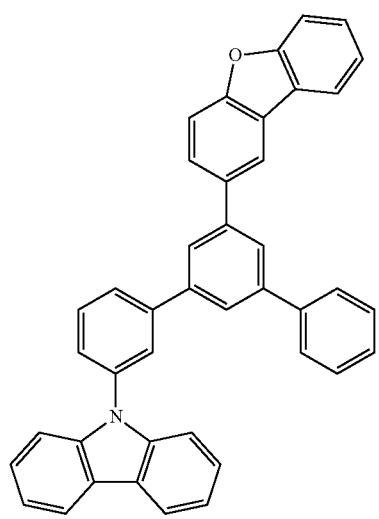
1-4
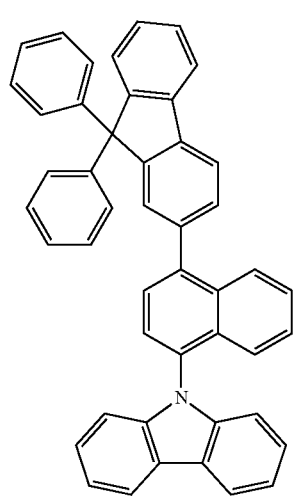
1-5
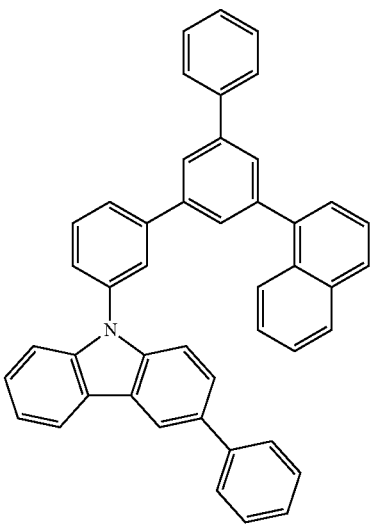
1-6
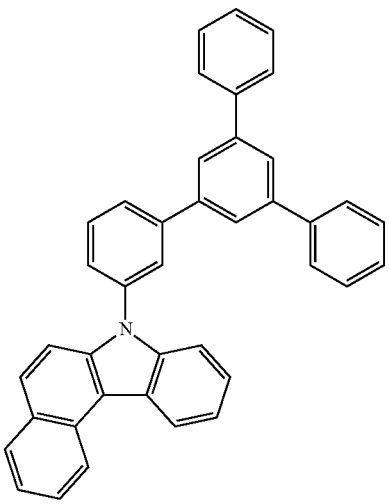
1-7
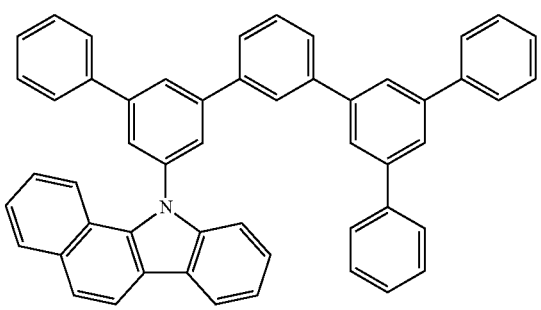

197
-continued
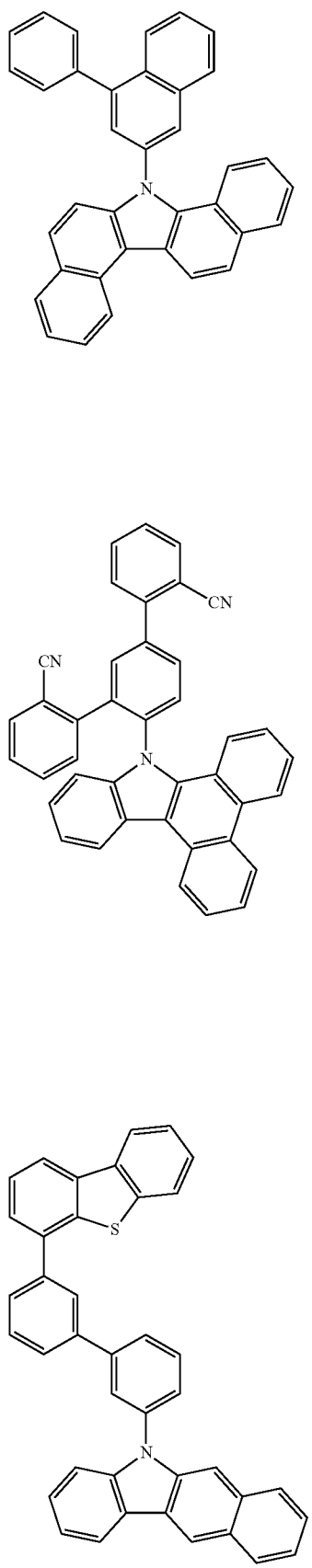
1-8
1-9
1-10
198
-continued
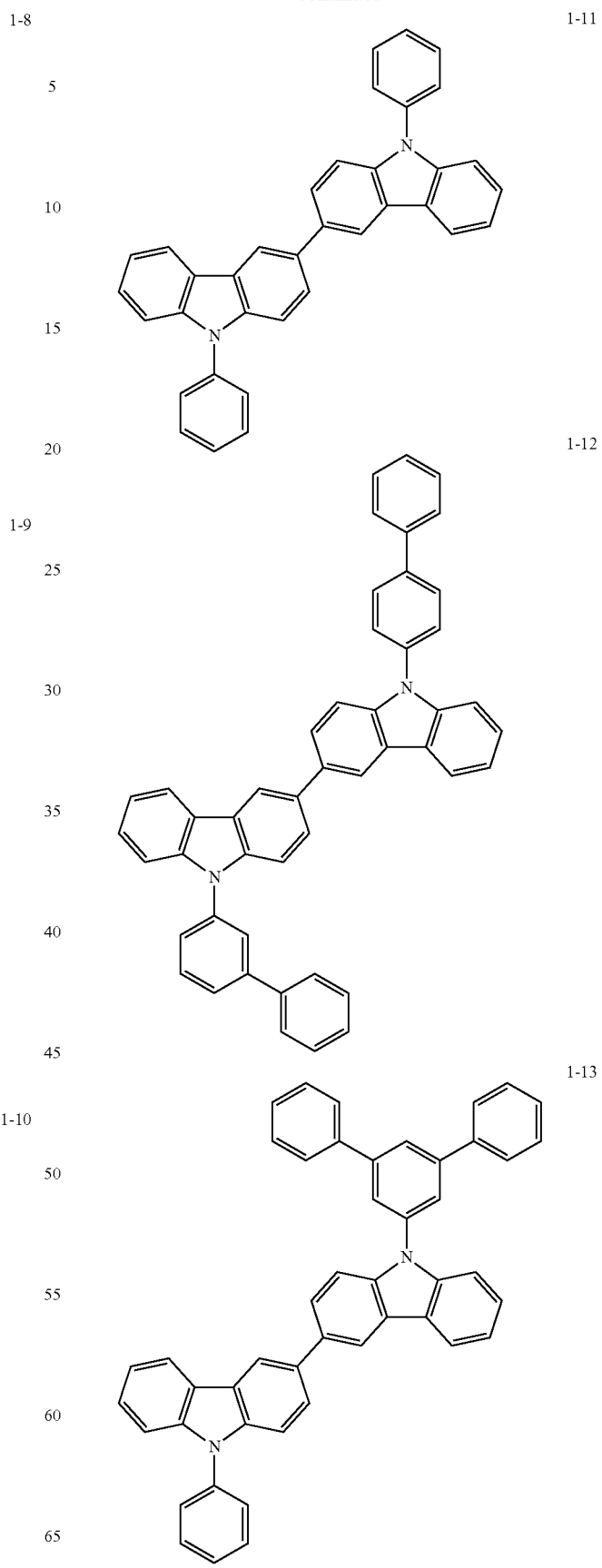
1-11
1-12
1-13

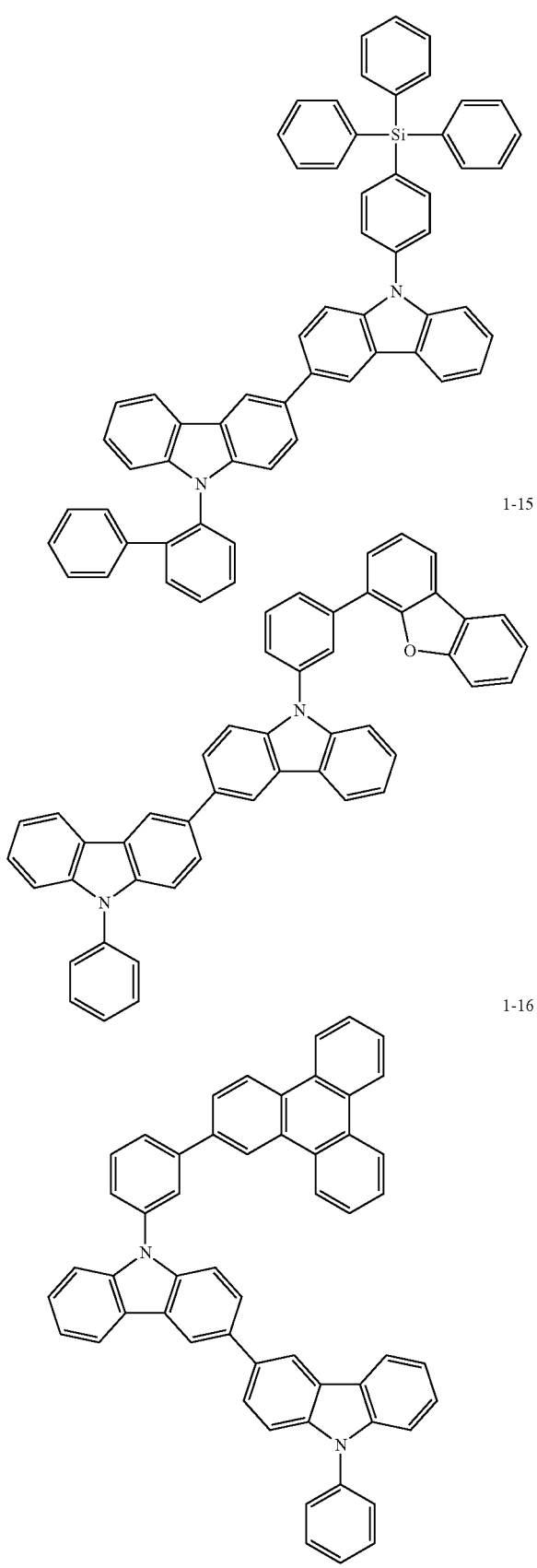
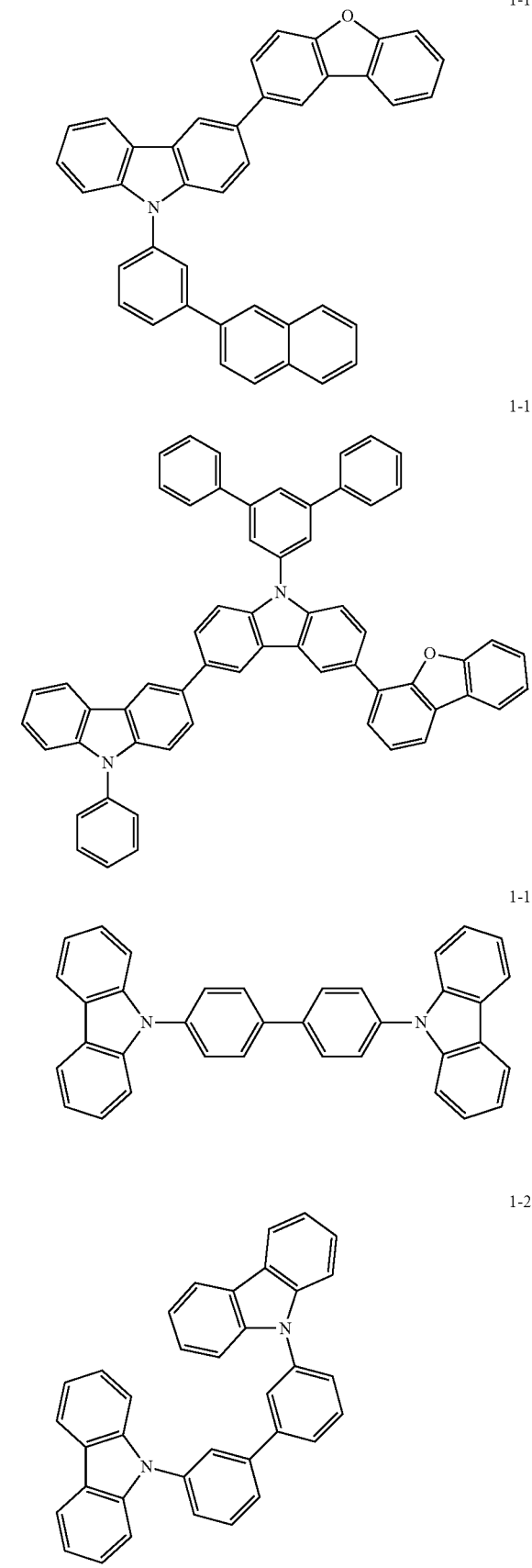

1-21
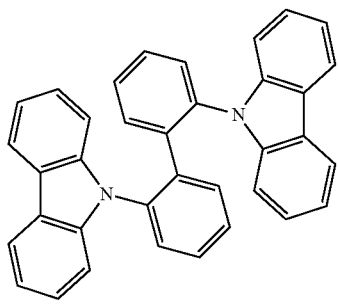
1-22
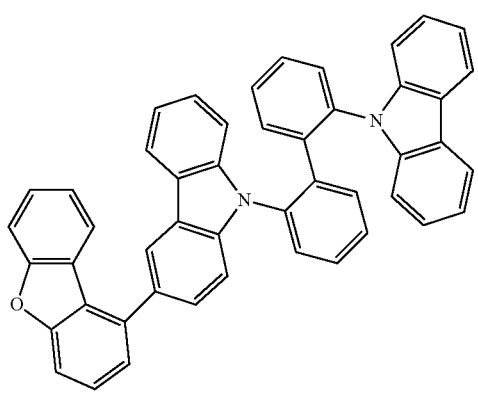
[Group II]
2-1
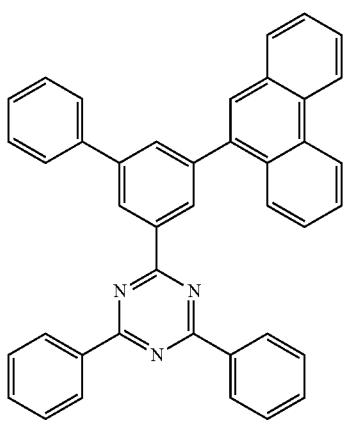
2-2
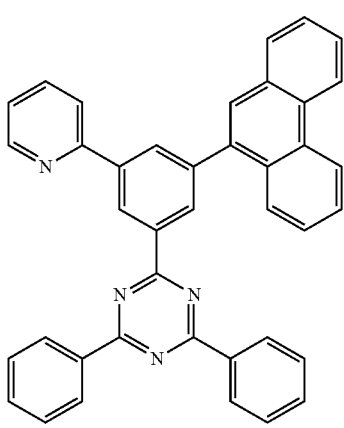
2-3
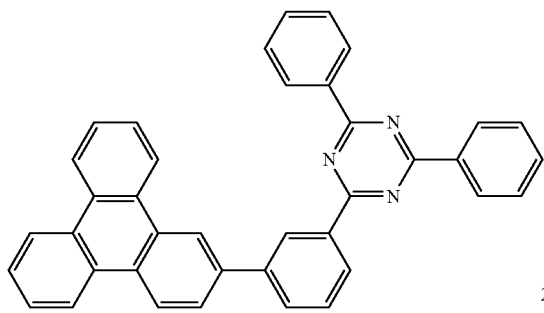
2-4
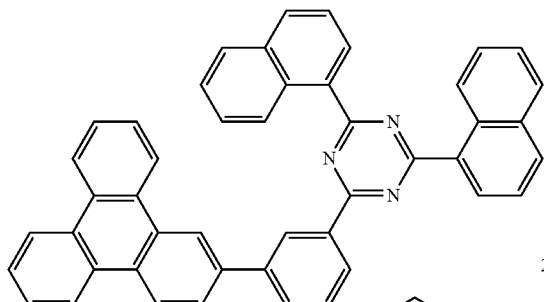
2-5
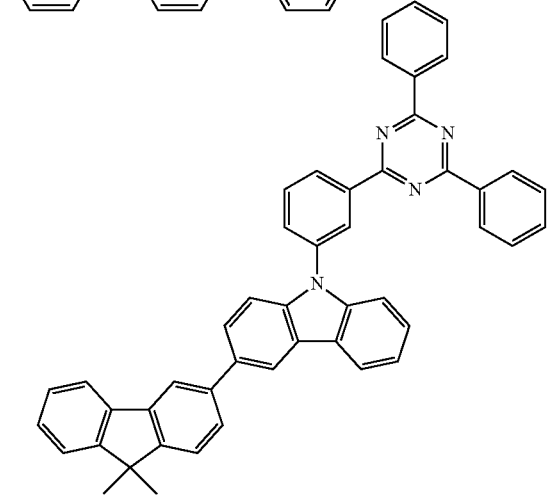
2-6
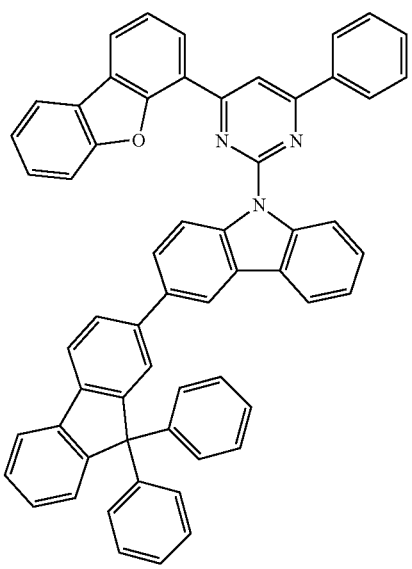

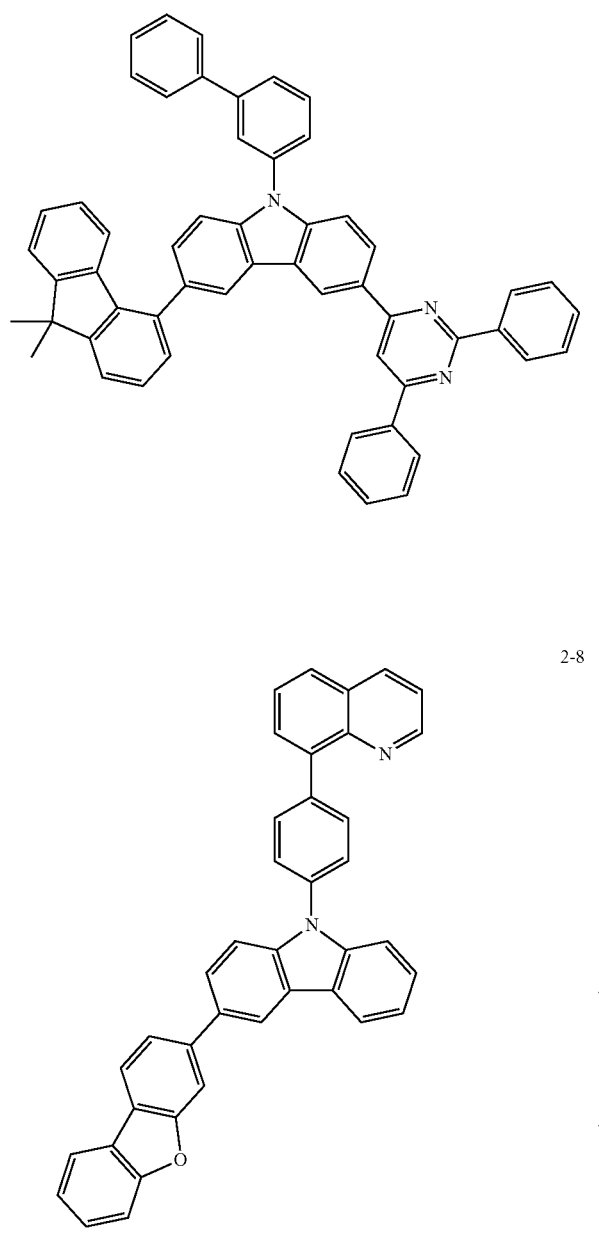
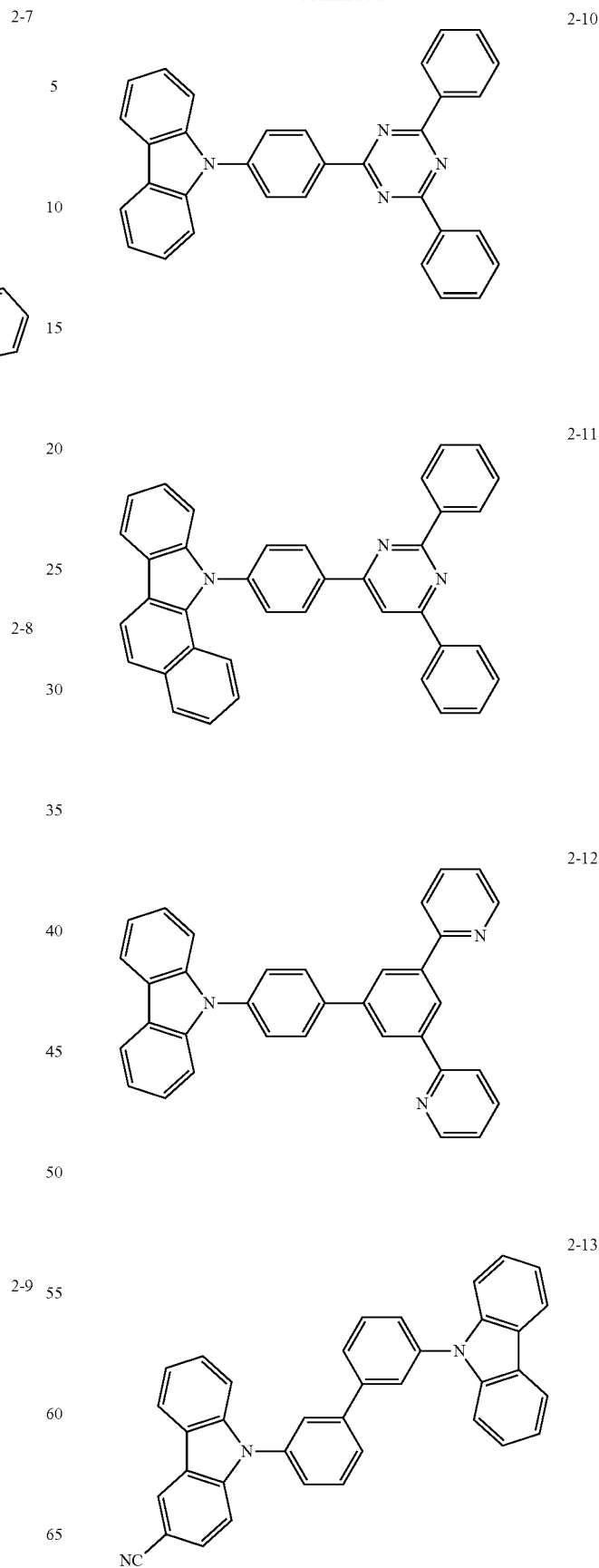

-continued
2-14
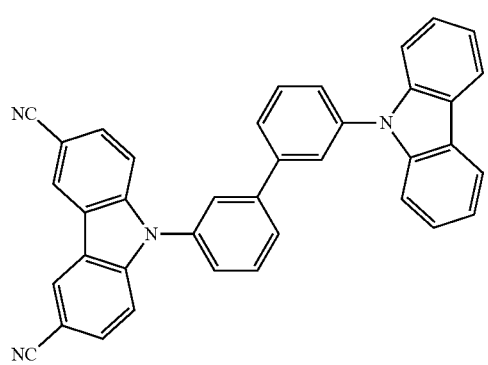
2-15
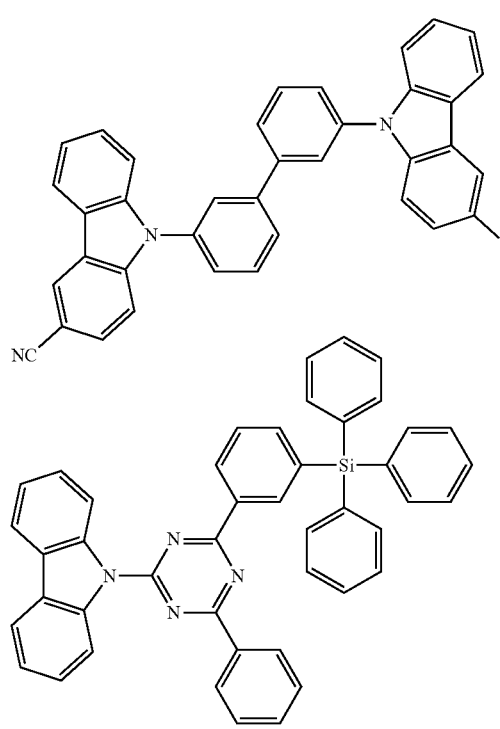
2-16
2-17
-continued
2-18
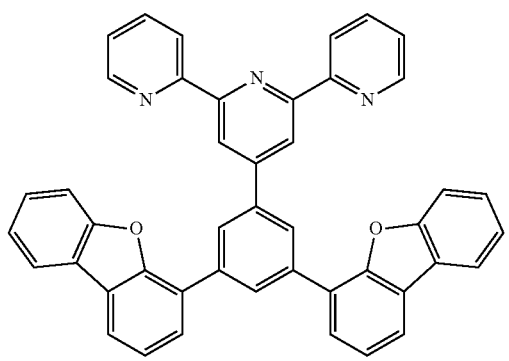
2-19
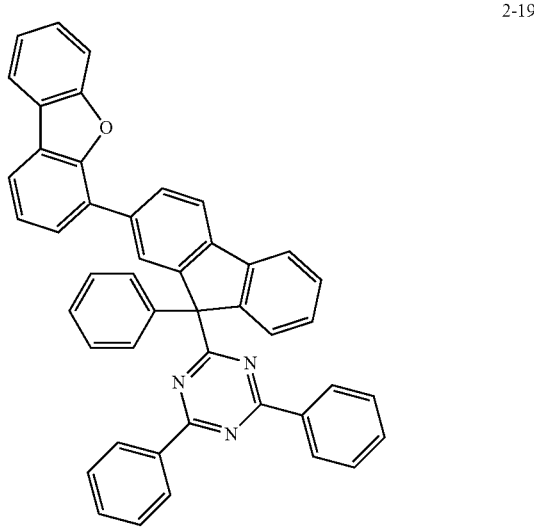
2-20
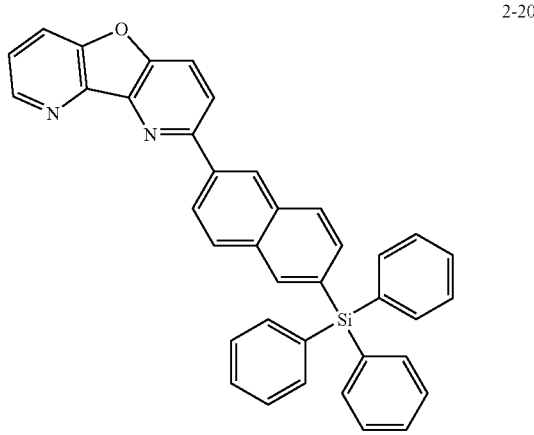

2-21
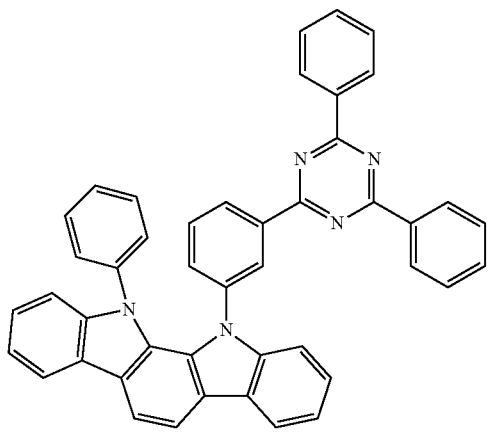
2-24
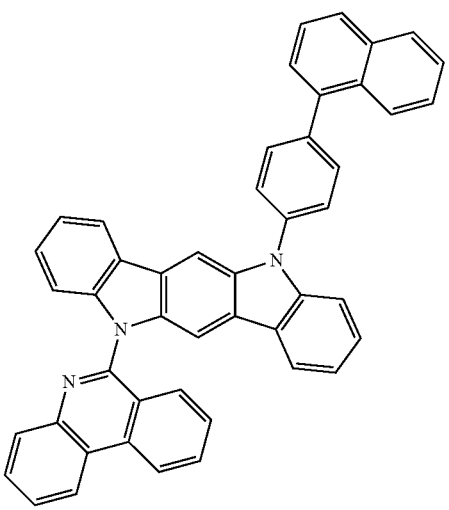
2-22
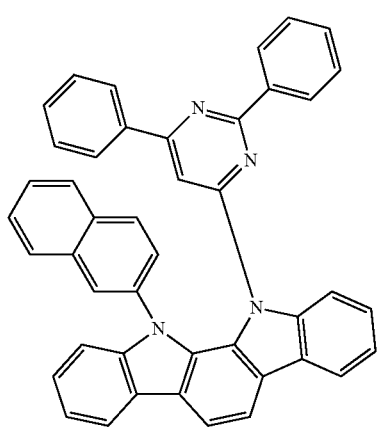
2-25
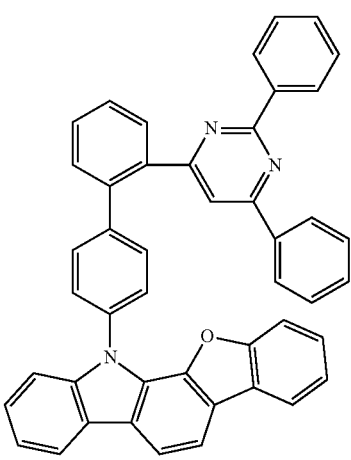
2-23
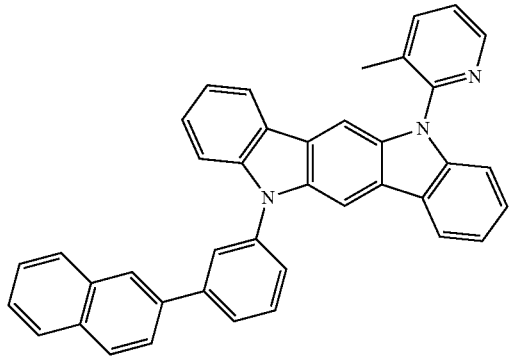
2-26
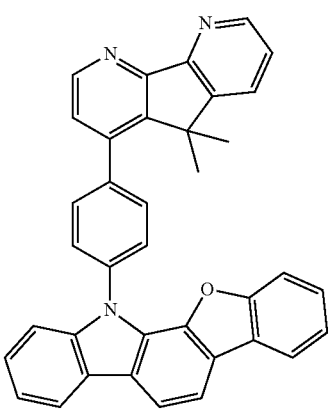

2-27
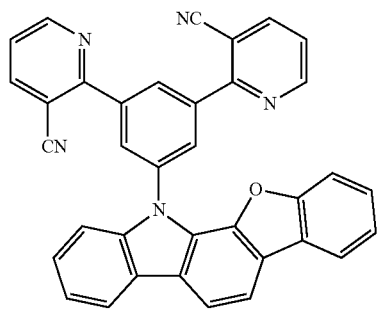
2-28
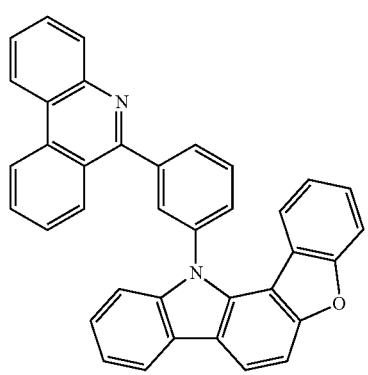
2-29
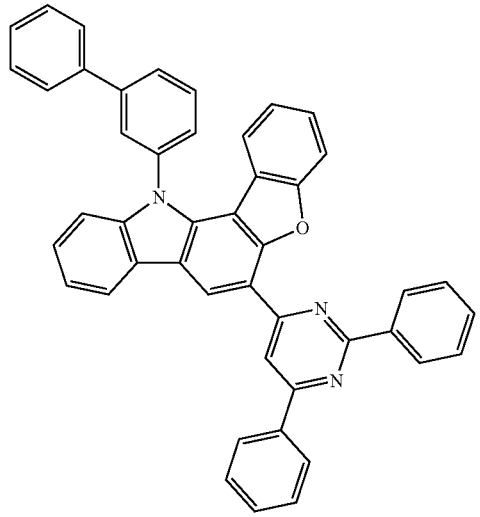
[Group III-1]
3-1
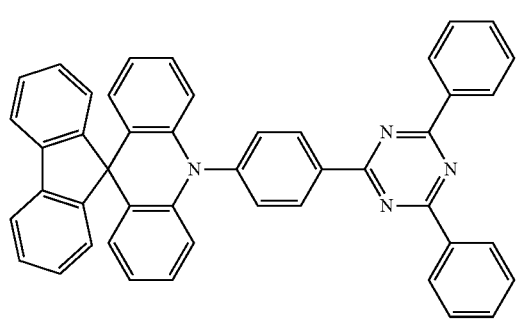
3-2
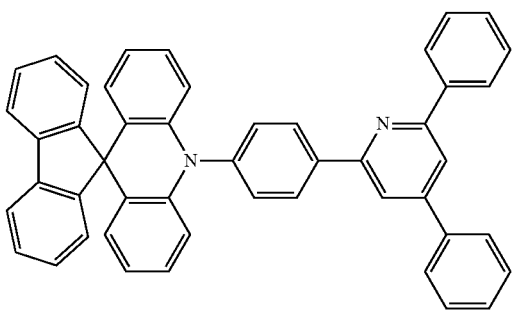
3-3
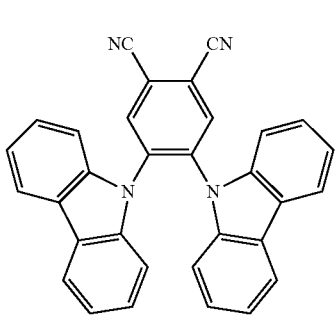
3-4
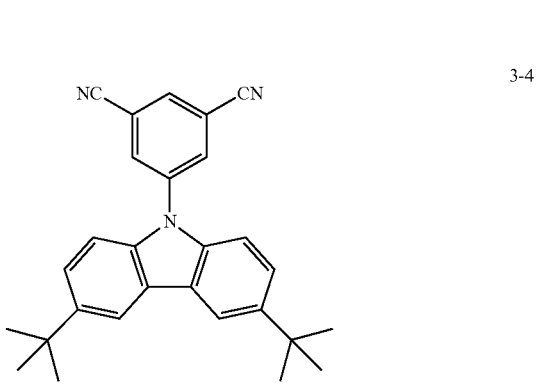
3-5
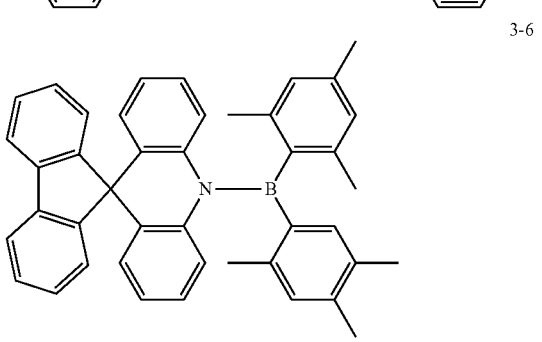
3-6
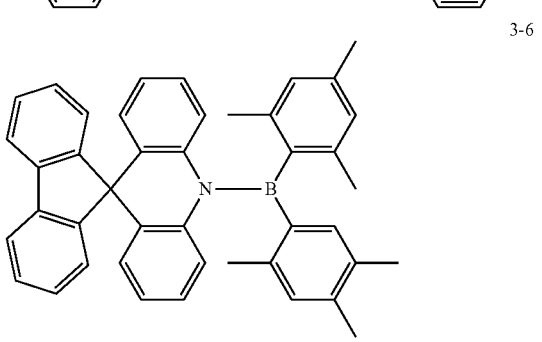

-continued
3-7
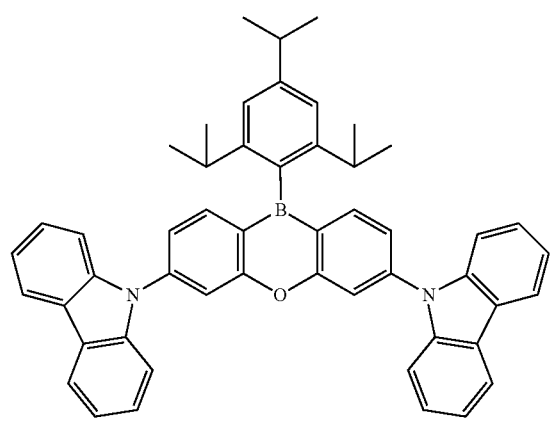
3-8
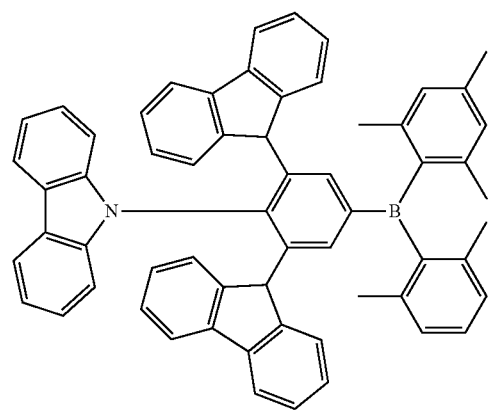
3-9
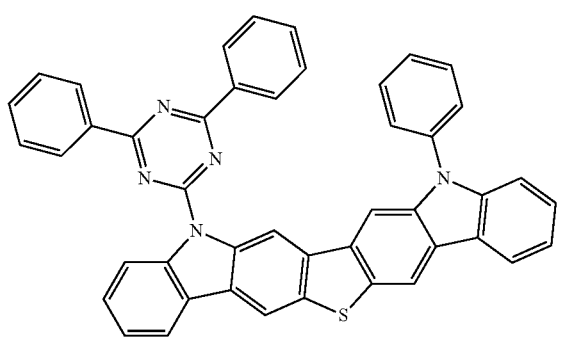
3-10
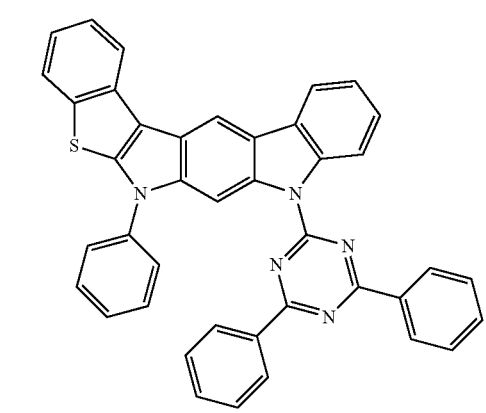
[Group III-2]
3-11
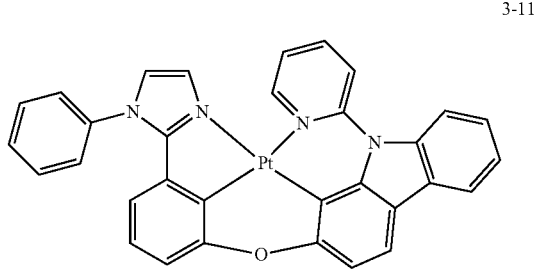
3-12
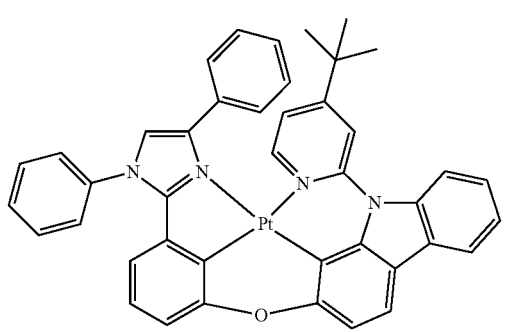
3-13
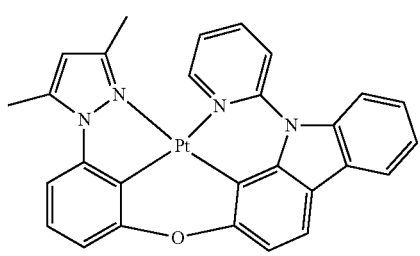
3-14
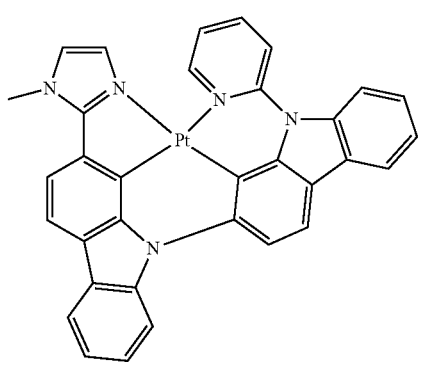
3-15
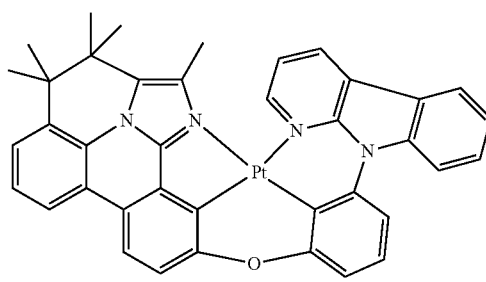

3-16
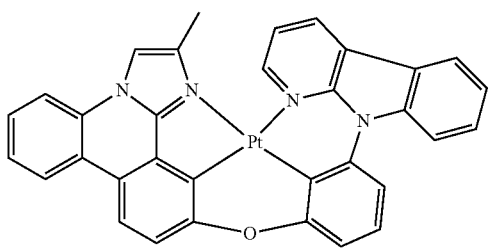
3-17
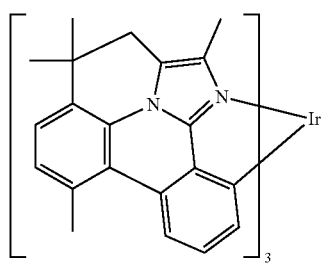
3-18
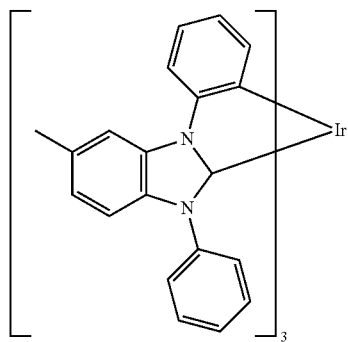
[Group IV]
4-1
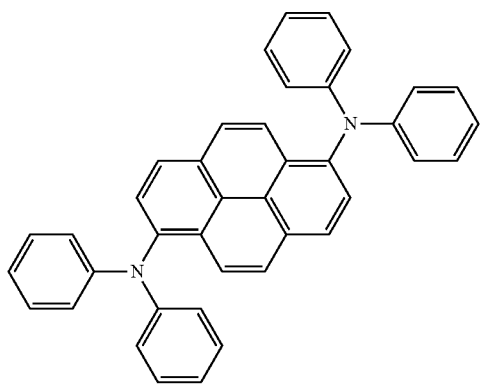
4-2
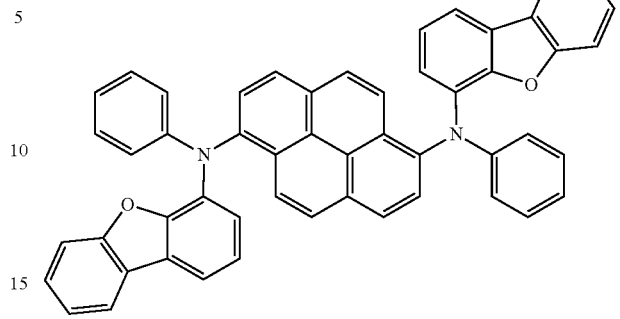
4-3
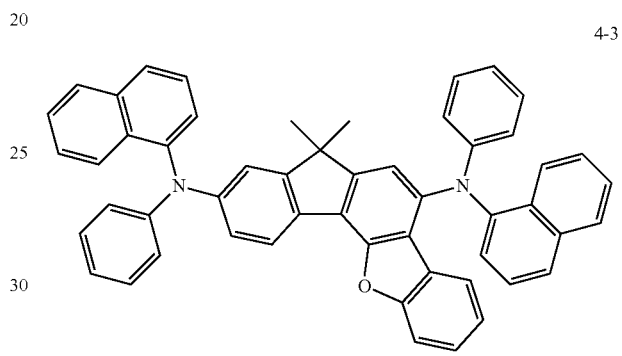
4-4
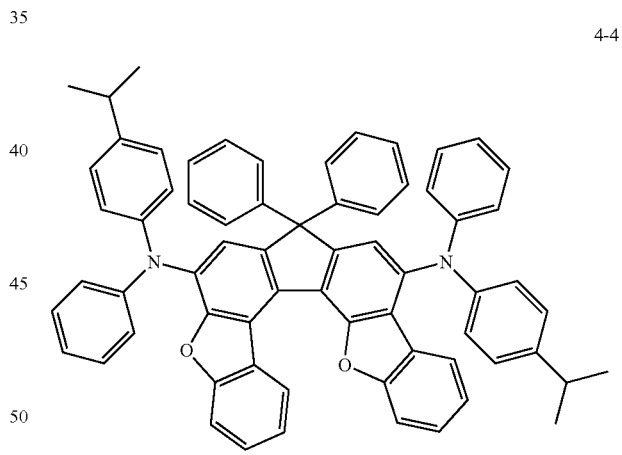
4-5
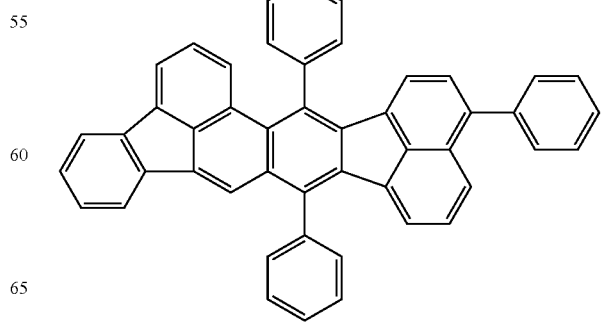

-continued 4-6

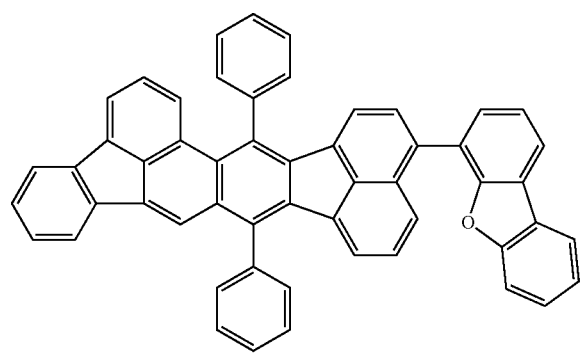

4-7

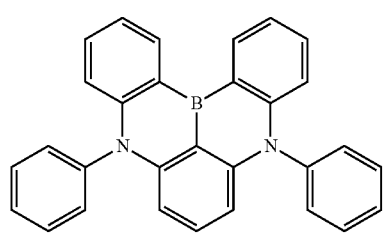

4-8

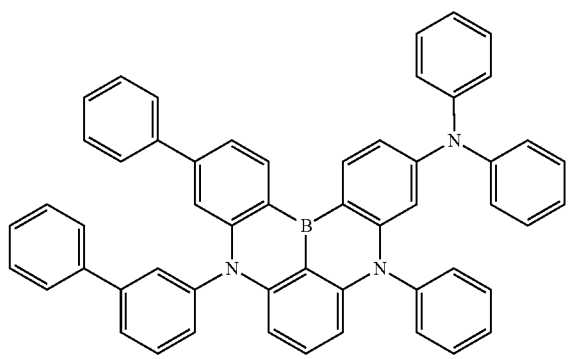

4-9

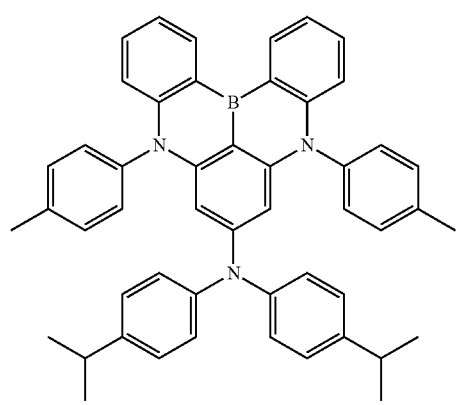

-continued 4-10

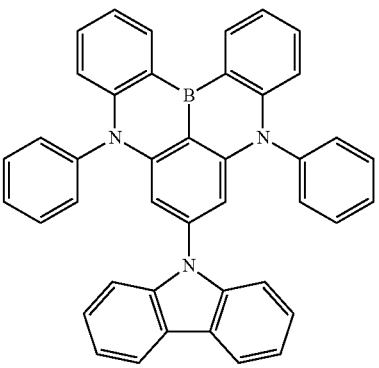

4-11

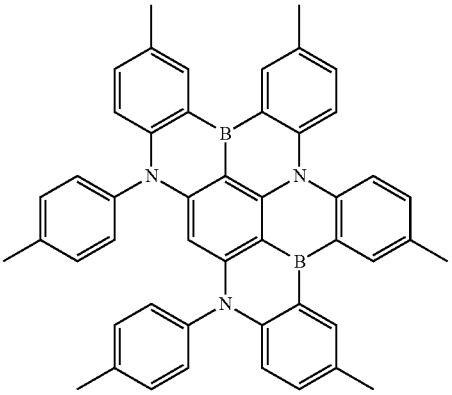

4-12

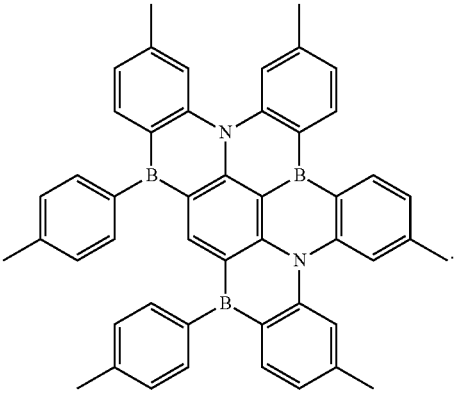

18. An electronic apparatus comprising the organic light-emitting device of claim 1.

19. The electronic apparatus of claim 18, further comprising a thin-film transistor, wherein
   the thin-film transistor includes a source electrode and a drain electrode, and
   the first electrode of the organic light-emitting device is electrically connected to at least one of the source electrode and the drain electrode of the thin-film transistor.

20. The electronic apparatus of claim 18, further comprising a color filter, a color conversion layer, a touch screen layer, a polarizing layer, or a combination thereof.

* * * * *